US011751415B2

(12) United States Patent
Chang et al.

(10) Patent No.: US 11,751,415 B2
(45) Date of Patent: Sep. 5, 2023

(54) MATERIALS FOR FORMING A NUCLEATION-INHIBITING COATING AND DEVICES INCORPORATING SAME

(71) Applicant: OTI LUMIONICS, INC., Toronto (CA)

(72) Inventors: Yi-Lu Chang, Scarborough (CA); Qi Wang, North York (CA); Scott Nicholas Genin, Unionville (CA); Michael Helander, Toronto (CA); Jacky Qiu, Toronto (CA); Zhibin Wang, Toronto (CA); Benoit Lessard, Ottawa (CA)

(73) Assignee: OTI Lumionics Inc., Mississauga (CA)

( * ) Notice: Subject to any disclaimer, the term of this patent is extended or adjusted under 35 U.S.C. 154(b) by 575 days.

(21) Appl. No.: 16/965,585

(22) PCT Filed: Jan. 2, 2019

(86) PCT No.: PCT/IB2019/050839

§ 371 (c)(1),
(2) Date: Jul. 28, 2020

(87) PCT Pub. No.: WO2019/150327

PCT Pub. Date: Aug. 8, 2019

(65) Prior Publication Data

US 2021/0047536 A1 Feb. 18, 2021

Related U.S. Application Data

(60) Provisional application No. 62/770,360, filed on Nov. 21, 2018, provisional application No. 62/625,710, (Continued)

(51) Int. Cl.
*H10K 50/824* (2023.01)
*H10K 85/00* (2023.01)
*H10K 85/60* (2023.01)

(52) U.S. Cl.
CPC .......... *H10K 50/824* (2023.02); *H10K 85/00* (2023.02); *H10K 85/622* (2023.02)

(58) Field of Classification Search
None
See application file for complete search history.

(56) References Cited

U.S. PATENT DOCUMENTS 4,022,928 A 5/1977 Piwcyzk
4,119,635 A 10/1978 Omodei-Sale et al.
(Continued)

FOREIGN PATENT DOCUMENTS

CA 2890253 A1 5/2014
CN 101299419 A 11/2008
(Continued)

OTHER PUBLICATIONS

"Forrest, James A.""Reductions of the glass transition temperature in thin polymer films: Probing the length scale of cooperative dynamics."" Physical Review E 61.1 (2000): R53-6."
(Continued)

*Primary Examiner* — Gregory D Clark
(74) *Attorney, Agent, or Firm* — Foley & Lardner LLP

(57) ABSTRACT

An opto-electronic device includes a substrate, a first electrode disposed over the substrate, a semiconducting layer disposed over the first electrode, a second electrode disposed over the semiconducting layer, the second electrode having a first portion and a second portion, a nucleation inhibition coating disposed over the first portion of the second electrode; and a conductive coating disposed over the second portion of the second electrode, wherein the nucleation inhibition coating is a compound of Formula (I).
(Continued)

(Formula I)

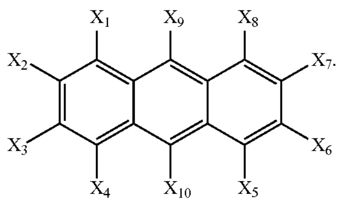

32 Claims, 60 Drawing Sheets

Related U.S. Application Data filed on Feb. 2, 2018, provisional application No. 62/625,722, filed on Feb. 2, 2018.

(56) References Cited

U.S. PATENT DOCUMENTS 4,188,486 A 2/1980 Tsukamoto et al.
4,379,155 A 4/1983 Omodei-Sale et al.
4,512,997 A 4/1985 Meier et al.
5,232,635 A 8/1993 Van Moer et al.
5,399,936 A 3/1995 Namiki et al.
5,550,290 A 8/1996 Mizuta et al.
5,834,130 A 11/1998 Kido
5,935,721 A 8/1999 Shi et al.
6,016,033 A 1/2000 Jones et al.
6,171,715 B1 1/2001 Sato et al.
6,285,039 B1 9/2001 Kobori et al.
6,361,886 B2 3/2002 Shi et al.
6,407,408 B1 6/2002 Zhou et al.
6,465,115 B2 10/2002 Shi et al.
6,538,374 B2 3/2003 Hosokawa
6,635,364 B1 10/2003 Igarashi
6,638,644 B2 10/2003 Zheng
6,682,785 B2 1/2004 Wingen et al.
6,787,468 B2 9/2004 Kim et al.
6,835,950 B2 12/2004 Brown et al.
6,852,429 B1 2/2005 Li et al.
6,878,469 B2 4/2005 Yoon et al.
6,899,963 B1 5/2005 Zheng et al.
6,900,470 B2 5/2005 Kobayashi et al.
6,995,035 B2 2/2006 Cok et al.
7,018,713 B2 3/2006 Padiyath
7,053,255 B2 5/2006 Ikeda et al.
7,056,601 B2 6/2006 Cosimbescu et al.
7,099,299 B2 8/2006 Liang et al.
7,105,298 B2 9/2006 Liu et al.
7,166,240 B2 1/2007 Ishida et al.
7,169,482 B2 1/2007 Aziz
7,173,276 B2 2/2007 Choi et al.
7,175,815 B2 2/2007 Yamasaki et al.
7,192,659 B2 3/2007 Ricks et al.
7,252,893 B2 8/2007 Ricks et al.
7,326,371 B2 2/2008 Conley et al.
7,361,796 B2 4/2008 Ikeda et al.
7,363,308 B2 4/2008 Dillon et al.
7,402,948 B2 7/2008 Yamazaki et al.
7,427,783 B2 9/2008 Lee et al.
7,491,975 B2 2/2009 Kubota
7,495,389 B2 2/2009 Noguchi et al.
7,504,526 B2 3/2009 Kubota et al.
7,651,787 B2 1/2010 Seo et al.
7,674,914 B2 3/2010 Egawa et al.
7,701,132 B2 4/2010 Oh
7,728,510 B2 6/2010 Oh
7,733,009 B2 6/2010 Kondakov et al.
7,776,457 B2 8/2010 Lee et al.
7,790,892 B2 9/2010 Ikeda et al.
7,816,861 B2 10/2010 Choi et al.
7,820,864 B2 10/2010 Umemoto
7,833,632 B2 11/2010 Kawamura et al.
7,839,074 B2 11/2010 Ikeda et al.
7,839,083 B2 11/2010 Kubota
7,851,071 B2 12/2010 Yamamoto et al.
7,867,629 B2 1/2011 Yamamoto et al.
7,887,931 B2 2/2011 Cosimbescu
7,910,687 B2 3/2011 Busing et al.
7,947,519 B2 5/2011 Lee et al.
7,956,351 B2 6/2011 Choi
7,973,306 B2 7/2011 Kim et al.
7,986,672 B2 7/2011 Tiedemann et al.
7,998,540 B2 8/2011 Goulding et al.
7,999,459 B2 8/2011 Chun et al.
8,004,180 B2 8/2011 Seo
8,025,815 B2 9/2011 Kawamura et al.
8,030,838 B2 10/2011 Kwak et al.
8,044,580 B2 10/2011 Yamazaki et al.
8,071,226 B2 12/2011 Je et al.
8,076,839 B2 12/2011 Kuma et al.
8,089,066 B2 1/2012 Yamazaki et al.
8,097,349 B2 1/2012 Yamamoto et al.
8,101,771 B2 1/2012 Nomura et al.
8,115,376 B2 2/2012 Fujioka et al.
8,174,185 B2 5/2012 Park et al.
8,217,570 B2 7/2012 Kawamura et al.
8,222,634 B2 7/2012 Lee
8,232,350 B2 7/2012 Fujita et al.
8,237,351 B2 8/2012 Sung et al.
8,257,620 B2 9/2012 Cranor et al.
8,310,149 B2 11/2012 Lifka et al.
8,318,995 B2 11/2012 Kubota et al.
8,343,637 B2 1/2013 Parham et al.
8,362,469 B2 1/2013 Suh
8,383,932 B2 2/2013 Jung et al.
8,399,720 B2 3/2013 Umemoto
8,541,113 B2 9/2013 Je et al.
8,568,902 B2 10/2013 Kubota et al.
8,586,202 B2 11/2013 Imai et al.
8,592,053 B2 11/2013 Kawakami
8,679,647 B2 3/2014 Pflumm et al.
8,729,530 B2 5/2014 Nagao et al.
8,759,818 B2 6/2014 Lecloux
8,766,306 B2 7/2014 Lifka et al.
8,779,655 B2 7/2014 Nishimura
8,795,847 B2 8/2014 Heil et al.
8,795,855 B2 8/2014 Klubek et al.
8,809,838 B2 8/2014 Jeong et al.
8,852,756 B2 10/2014 Vestweber et al.
8,853,675 B2 10/2014 Kubota et al.
8,872,206 B2 10/2014 Chung et al.
8,877,356 B2 11/2014 Spindler et al.
8,883,324 B2 11/2014 Yabunouchi et al.
8,895,972 B2 11/2014 Chung et al.
8,940,568 B2 1/2015 Mohan et al.
8,957,413 B2 2/2015 Song et al.
8,963,137 B2 2/2015 Lee et al.
8,963,414 B2 2/2015 Sawa8e
8,986,852 B2 3/2015 Stoessel et al.
8,987,516 B2 3/2015 Umemoto
8,993,123 B2 3/2015 Buesing et al.
8,994,010 B2 3/2015 Choi et al.
9,018,621 B2 4/2015 Park et al.
9,024,301 B2 5/2015 Kawamura et al.
9,024,307 B2 5/2015 Lee
9,064,755 B2 6/2015 Park et al.
9,076,993 B2 7/2015 Kim et al.
9,088,004 B2 7/2015 Chung et al.
9,093,403 B2 7/2015 Kim et al.
9,093,669 B2 7/2015 Park et al.
9,105,865 B2 8/2015 Chung et al.
9,105,867 B2 8/2015 Verschuuren et al.
9,113,536 B2 8/2015 Oka et al.
9,126,970 B2 9/2015 Pflumm
9,169,274 B2 10/2015 Mizuki et al.
9,214,636 B2 12/2015 Takashima et al.
9,219,234 B2 12/2015 Kubota et al.
9,231,030 B2 1/2016 Choi et al.

(56) References Cited

U.S. PATENT DOCUMENTS

| | | | |
|---|---|---|---|
| 9,245,934 | B2 | 1/2016 | Chung et al. |
| 9,246,105 | B2 | 1/2016 | Sun |
| 9,257,654 | B2 | 2/2016 | Kawakami |
| 9,276,220 | B2 | 3/2016 | Kim et al. |
| 9,287,339 | B2 | 3/2016 | Lee et al. |
| 9,293,515 | B2 | 3/2016 | Choi |
| 9,331,308 | B2 | 5/2016 | Choi et al. |
| 9,353,027 | B2 | 5/2016 | Kawamura et al. |
| 9,444,064 | B2 | 9/2016 | Kaiser et al. |
| 9,450,027 | B2 | 9/2016 | Pang et al. |
| 9,478,591 | B2 | 10/2016 | Nam et al. |
| 9,515,280 | B2 | 12/2016 | Yun |
| 9,548,456 | B2 | 1/2017 | Lee et al. |
| 9,570,471 | B2 | 2/2017 | Heo et al. |
| 9,583,716 | B2 | 2/2017 | Ikeda |
| 9,595,681 | B2 | 3/2017 | Mujica-Fernaud |
| 9,608,207 | B2 | 3/2017 | Takaku et al. |
| 9,624,193 | B2 | 4/2017 | Aihara |
| 9,660,195 | B2 | 5/2017 | Kawamura et al. |
| 9,666,812 | B2 | 5/2017 | Lee et al. |
| 9,680,108 | B2 | 6/2017 | Ito et al. |
| 9,711,734 | B2 | 7/2017 | Kim |
| 9,711,751 | B2 | 7/2017 | Prushinskiy et al. |
| 9,728,726 | B2 | 8/2017 | Takaku |
| 9,748,318 | B2 | 8/2017 | Shim et al. |
| 9,786,846 | B2 | 10/2017 | Kubota |
| 9,793,491 | B2 | 10/2017 | Hwang et al. |
| 9,812,657 | B2 | 11/2017 | Kravchuk et al. |
| 9,831,457 | B2 | 11/2017 | Kang et al. |
| 9,859,520 | B2 | 1/2018 | Kim |
| 9,882,140 | B2 | 1/2018 | Han et al. |
| 9,896,621 | B2 | 2/2018 | Kim et al. |
| 9,954,039 | B2 | 4/2018 | Im et al. |
| 9,960,216 | B2 | 5/2018 | Lee et al. |
| 9,966,554 | B2 | 5/2018 | Lee et al. |
| 10,026,906 | B2 | 7/2018 | Jung et al. |
| 10,032,843 | B2 | 7/2018 | Lee et al. |
| 10,062,850 | B2 | 8/2018 | Jung et al. |
| 10,084,019 | B2 | 9/2018 | Shim et al. |
| 10,084,150 | B1 | 9/2018 | Lou |
| 10,090,370 | B2 | 10/2018 | Lee et al. |
| 10,147,769 | B2 | 12/2018 | Lee et al. |
| 10,153,450 | B2 | 12/2018 | Kawamura |
| 10,177,206 | B2 | 1/2019 | Jung et al. |
| 10,181,573 | B2 | 1/2019 | Im |
| 10,186,568 | B2 | 1/2019 | Kim et al. |
| 10,205,101 | B2 | 2/2019 | Kubota et al. |
| 10,224,386 | B2 | 3/2019 | Rieutort-Louis et al. |
| 10,240,084 | B2 | 3/2019 | Molaire |
| 10,263,185 | B2 | 4/2019 | Matsueda et al. |
| 10,269,879 | B2 | 4/2019 | Shim et al. |
| 10,276,641 | B2 | 4/2019 | Lou |
| 10,700,304 | B2 | 6/2020 | Helander et al. |
| 2002/0090811 | A1 | 7/2002 | Kim et al. |
| 2002/0189392 | A1 | 12/2002 | Molstad |
| 2003/0196987 | A1 | 10/2003 | Kung et al. |
| 2003/0219625 | A1 | 11/2003 | Wolk et al. |
| 2004/0018383 | A1 | 1/2004 | Aziz et al. |
| 2004/0058193 | A1 | 3/2004 | Hatwar |
| 2005/0181232 | A1 | 8/2005 | Ricks et al. |
| 2005/0211958 | A1 | 9/2005 | Conley et al. |
| 2005/0271899 | A1 | 12/2005 | Brown et al. |
| 2006/0019116 | A1 | 1/2006 | Conley et al. |
| 2006/0043858 | A1 | 3/2006 | Ikeda et al. |
| 2006/0078757 | A1 | 4/2006 | Boerner |
| 2006/0125390 | A1 | 6/2006 | Oh |
| 2006/0147747 | A1 | 7/2006 | Yamamoto et al. |
| 2006/0154105 | A1 | 7/2006 | Yamamoto et al. |
| 2006/0182993 | A1 | 8/2006 | Ogata et al. |
| 2006/0210830 | A1 | 9/2006 | Funahashi et al. |
| 2006/0246315 | A1 | 11/2006 | Begley et al. |
| 2007/0003785 | A1 | 1/2007 | Slusarek et al. |
| 2007/0077349 | A1 | 4/2007 | Newman et al. |
| 2007/0252517 | A1 | 11/2007 | Owczarczyk et al. |
| 2007/0252521 | A1 | 11/2007 | Kondakov et al. |
| 2008/0001123 | A1 | 1/2008 | Inoue et al. |
| 2008/0012475 | A1 | 1/2008 | Oyamada et al. |
| 2008/0093986 | A1 | 4/2008 | Inoue et al. |
| 2008/0103315 | A1 | 5/2008 | Egawa et al. |
| 2008/0166593 | A1 | 7/2008 | Stoessel et al. |
| 2008/0203905 | A1 | 8/2008 | Je et al. |
| 2008/0286607 | A1 | 11/2008 | Nomura et al. |
| 2008/0286610 | A1 | 11/2008 | Deaton et al. |
| 2008/0303422 | A1 | 12/2008 | Vestweber et al. |
| 2009/0053557 | A1* | 2/2009 | Spindler .............. H10K 85/626 428/690 |
| 2009/0066239 | A1 | 3/2009 | Yabunouchi |
| 2009/0093641 | A1 | 4/2009 | Dolbier et al. |
| 2009/0145483 | A1 | 6/2009 | Kim et al. |
| 2009/0153037 | A1 | 6/2009 | Kim et al. |
| 2009/0153039 | A1 | 6/2009 | Kim et al. |
| 2009/0153040 | A1 | 6/2009 | Kim et al. |
| 2009/0159130 | A1 | 6/2009 | Eum et al. |
| 2009/0165860 | A1 | 7/2009 | Kim et al. |
| 2009/0174316 | A1 | 7/2009 | Kim et al. |
| 2009/0179196 | A1 | 7/2009 | Adachi et al. |
| 2009/0179555 | A1 | 7/2009 | Kim et al. |
| 2009/0184631 | A1 | 7/2009 | Kim et al. |
| 2009/0199903 | A1 | 8/2009 | Oyamada et al. |
| 2009/0200926 | A1 | 8/2009 | Lee et al. |
| 2009/0233125 | A1 | 9/2009 | Choi et al. |
| 2009/0236973 | A1 | 9/2009 | Yabe et al. |
| 2009/0252990 | A1 | 10/2009 | Kim et al. |
| 2010/0019657 | A1 | 1/2010 | Eum et al. |
| 2010/0052526 | A1 | 3/2010 | Je et al. |
| 2010/0078628 | A1 | 4/2010 | Chi et al. |
| 2010/0108997 | A1 | 5/2010 | Kim et al. |
| 2010/0117028 | A1 | 5/2010 | Takeshima et al. |
| 2010/0193768 | A1 | 8/2010 | Habib |
| 2010/0244197 | A1 | 9/2010 | Arena et al. |
| 2010/0314615 | A1 | 12/2010 | Mizuki et al. |
| 2010/0327240 | A1 | 12/2010 | Cranor et al. |
| 2011/0006289 | A1 | 1/2011 | Mizuki et al. |
| 2011/0094889 | A1 | 4/2011 | Shin et al. |
| 2011/0156016 | A1 | 6/2011 | Kawamura et al. |
| 2011/0186820 | A1 | 8/2011 | Kim et al. |
| 2011/0198582 | A1 | 8/2011 | Horiuchi et al. |
| 2011/0204772 | A1 | 8/2011 | Egawa |
| 2011/0220886 | A1 | 9/2011 | Takeshima et al. |
| 2011/0285276 | A1 | 11/2011 | Kadoma et al. |
| 2011/0297923 | A1 | 12/2011 | Mizuki et al. |
| 2011/0306798 | A1 | 12/2011 | Umemoto |
| 2011/0309307 | A1 | 12/2011 | Zeika et al. |
| 2012/0003484 | A1 | 1/2012 | Roehrig et al. |
| 2012/0018770 | A1 | 1/2012 | Lu et al. |
| 2012/0023556 | A1 | 1/2012 | Schultz et al. |
| 2012/0043533 | A1 | 2/2012 | Mizuki et al. |
| 2012/0056165 | A1 | 3/2012 | Kawamura et al. |
| 2012/0091885 | A1 | 4/2012 | Kim et al. |
| 2012/0104422 | A1 | 5/2012 | Lee et al. |
| 2012/0112169 | A1 | 5/2012 | Mizuki et al. |
| 2012/0146030 | A1 | 6/2012 | You et al. |
| 2012/0181520 | A1 | 7/2012 | Kim et al. |
| 2012/0181922 | A1 | 7/2012 | Kawamura et al. |
| 2012/0187541 | A1 | 7/2012 | Arena et al. |
| 2013/0020561 | A1 | 1/2013 | Suzuki et al. |
| 2013/0049024 | A1 | 2/2013 | Choi et al. |
| 2013/0056784 | A1 | 3/2013 | Lee et al. |
| 2013/0153878 | A1 | 6/2013 | Mizuki et al. |
| 2013/0175509 | A1 | 7/2013 | Kim et al. |
| 2013/0187143 | A1 | 7/2013 | Nishimura et al. |
| 2013/0221338 | A1 | 8/2013 | Kawamura et al. |
| 2014/0014925 | A1 | 1/2014 | Jung et al. |
| 2014/0070236 | A1 | 3/2014 | Chen et al. |
| 2014/0110680 | A1 | 4/2014 | Choe |
| 2014/0148877 | A1 | 5/2014 | Pan et al. |
| 2014/0159011 | A1 | 6/2014 | Suzuki et al. |
| 2014/0183500 | A1 | 7/2014 | Ikeda et al. |
| 2014/0186983 | A1 | 7/2014 | Kim et al. |
| 2014/0225085 | A1 | 8/2014 | Hayashi et al. |
| 2014/0231761 | A1 | 8/2014 | Kim et al. |
| 2014/0239273 | A1 | 8/2014 | Mizutani et al. |
| 2014/0246657 | A1 | 9/2014 | Kim et al. |
| 2014/0291653 | A1 | 10/2014 | Ikeda et al. |

(56) References Cited

U.S. PATENT DOCUMENTS

| | | | |
|---|---|---|---|
| 2014/0299866 | A1 | 10/2014 | Ruske et al. |
| 2014/0319511 | A1 | 10/2014 | Mizuki et al. |
| 2014/0326985 | A1 | 11/2014 | Mizuki et al. |
| 2014/0332772 | A1 | 11/2014 | Han et al. |
| 2014/0346406 | A1 | 11/2014 | Lee et al. |
| 2014/0346482 | A1 | 11/2014 | Mizuki et al. |
| 2014/0353601 | A1 | 12/2014 | Cho et al. |
| 2014/0367654 | A1 | 12/2014 | Kim et al. |
| 2015/0090989 | A1 | 4/2015 | Matsumoto et al. |
| 2015/0097171 | A1 | 4/2015 | Kim et al. |
| 2015/0144902 | A1 | 5/2015 | Do et al. |
| 2015/0171337 | A1 | 6/2015 | Jung et al. |
| 2015/0194614 | A1 | 7/2015 | Kravchuk et al. |
| 2015/0284580 | A1 | 10/2015 | Kawakami et al. |
| 2015/0287846 | A1 | 10/2015 | Helander et al. |
| 2015/0333266 | A1 | 11/2015 | Ito et al. |
| 2015/0376768 | A1 | 12/2015 | Veres et al. |
| 2016/0005976 | A1 | 1/2016 | Mizuki et al. |
| 2016/0013438 | A1 | 1/2016 | Im et al. |
| 2016/0043325 | A1 | 2/2016 | Gorohmaru et al. |
| 2016/0079543 | A1 | 3/2016 | Park et al. |
| 2016/0099411 | A1 | 4/2016 | Kim et al. |
| 2016/0104859 | A1 | 4/2016 | Kim et al. |
| 2016/0133846 | A1 | 5/2016 | Ishii et al. |
| 2016/0149156 | A1 | 5/2016 | Kim et al. |
| 2016/0155952 | A1 | 6/2016 | Hwang et al. |
| 2016/0180763 | A1 | 6/2016 | Park et al. |
| 2016/0181527 | A1 | 6/2016 | Mizuki et al. |
| 2016/0181543 | A1 | 6/2016 | Ito et al. |
| 2016/0211454 | A1 | 7/2016 | Kim et al. |
| 2016/0211458 | A1 | 7/2016 | Ito et al. |
| 2016/0211459 | A1 | 7/2016 | Ito et al. |
| 2016/0225992 | A1 | 8/2016 | Ito et al. |
| 2016/0233437 | A1 | 8/2016 | Suzuki et al. |
| 2016/0260901 | A1 | 9/2016 | Kim et al. |
| 2016/0268520 | A1 | 9/2016 | Mizuki et al. |
| 2016/0284998 | A1 | 9/2016 | Kawamura et al. |
| 2016/0293888 | A1 | 10/2016 | Shim et al. |
| 2016/0308137 | A1 | 10/2016 | Park et al. |
| 2016/0351638 | A1 | 12/2016 | Im et al. |
| 2016/0351818 | A1 | 12/2016 | Kim et al. |
| 2016/0372524 | A1 | 12/2016 | Yun et al. |
| 2016/0380198 | A1 | 12/2016 | Mizuki et al. |
| 2017/0012221 | A1 | 1/2017 | Buesing et al. |
| 2017/0018733 | A1 | 1/2017 | Jin et al. |
| 2017/0033166 | A1 | 2/2017 | Shim et al. |
| 2017/0062755 | A1 | 3/2017 | Im et al. |
| 2017/0100607 | A1 | 4/2017 | Pan et al. |
| 2017/0104166 | A1 | 4/2017 | Jeong et al. |
| 2017/0117469 | A1 | 4/2017 | Ito et al. |
| 2017/0117478 | A1 | 4/2017 | Kim et al. |
| 2017/0125495 | A1 | 5/2017 | Lee et al. |
| 2017/0125506 | A1 | 5/2017 | Kim |
| 2017/0125687 | A1 | 5/2017 | Ikeda et al. |
| 2017/0125703 | A1 | 5/2017 | Suzuki et al. |
| 2017/0155078 | A1 | 6/2017 | Lee |
| 2017/0170246 | A1 | 6/2017 | Im et al. |
| 2017/0179397 | A1 | 6/2017 | Kim et al. |
| 2017/0179402 | A1 | 6/2017 | Kim et al. |
| 2017/0183291 | A1 | 6/2017 | Ito et al. |
| 2017/0186831 | A1 | 6/2017 | Nam et al. |
| 2017/0222155 | A1 | 8/2017 | Cha et al. |
| 2017/0237023 | A1 | 8/2017 | Kim et al. |
| 2017/0256722 | A1 | 9/2017 | Shim et al. |
| 2017/0309822 | A1 | 10/2017 | Mizuki et al. |
| 2017/0313650 | A1 | 11/2017 | Stoessel et al. |
| 2017/0317154 | A1 | 11/2017 | Heo |
| 2017/0317284 | A1 | 11/2017 | Mizuki et al. |
| 2017/0324045 | A1 | 11/2017 | Takahashi et al. |
| 2017/0338438 | A1 | 11/2017 | Kwon et al. |
| 2017/0342318 | A1 | 11/2017 | Kim et al. |
| 2018/0006239 | A1 | 1/2018 | Yokoyama et al. |
| 2018/0006264 | A1 | 1/2018 | Lee et al. |
| 2018/0019398 | A1 | 1/2018 | Mizuki et al. |
| 2018/0019408 | A1 | 1/2018 | Ko |
| 2018/0040685 | A1 | 2/2018 | Yeo et al. |
| 2018/0061323 | A1 | 3/2018 | Kwon et al. |
| 2018/0062088 | A1 | 3/2018 | Cho et al. |
| 2018/0083217 | A1 | 3/2018 | Chung et al. |
| 2018/0090063 | A1 | 3/2018 | Ying et al. |
| 2018/0102499 | A1 | 4/2018 | Pyo et al. |
| 2018/0123054 | A1 | 5/2018 | Gorohmaru et al. |
| 2018/0123055 | A1 | 5/2018 | Park et al. |
| 2018/0123078 | A1 | 5/2018 | Byun et al. |
| 2018/0127385 | A1 | 5/2018 | Jung et al. |
| 2018/0130949 | A1 | 5/2018 | Kim et al. |
| 2018/0145262 | A1 | 5/2018 | Zeng et al. |
| 2018/0158881 | A1 | 6/2018 | Lim et al. |
| 2018/0166518 | A1 | 6/2018 | Kim |
| 2018/0198076 | A1 | 7/2018 | Takahashi et al. |
| 2018/0198080 | A1 | 7/2018 | Noh et al. |
| 2018/0212060 | A1 | 7/2018 | Kang et al. |
| 2018/0219058 | A1 | 8/2018 | Xiang et al. |
| 2018/0226455 | A1 | 8/2018 | Kim et al. |
| 2018/0240990 | A1 | 8/2018 | Choi et al. |
| 2018/0261797 | A1 | 9/2018 | Lee |
| 2018/0265777 | A1 | 9/2018 | Ambrosek et al. |
| 2018/0273563 | A1 | 9/2018 | Choi et al. |
| 2018/0294436 | A1 | 10/2018 | Choi et al. |
| 2018/0309058 | A1 | 10/2018 | Mizuki et al. |
| 2018/0309064 | A1 | 10/2018 | Aldred et al. |
| 2018/0309071 | A1 | 10/2018 | Jeon et al. |
| 2018/0309085 | A1 | 10/2018 | Park et al. |
| 2018/0323377 | A1 | 11/2018 | Mizuki et al. |
| 2018/0337219 | A1 | 11/2018 | Rhee et al. |
| 2018/0340032 | A1 | 11/2018 | Campbell et al. |
| 2018/0342682 | A1 | 11/2018 | Park et al. |
| 2018/0366678 | A1 | 12/2018 | Chi et al. |
| 2019/0013342 | A1 | 1/2019 | Kato et al. |
| 2019/0081111 | A1 | 3/2019 | Lee et al. |
| 2019/0088204 | A1 | 3/2019 | Zhang et al. |
| 2019/0130822 | A1 | 5/2019 | Jung et al. |
| 2019/0237517 | A1 | 8/2019 | Hack |
| 2019/0250450 | A1 | 8/2019 | Li |
| 2019/0253591 | A1 | 8/2019 | Chen et al. |
| 2019/0273125 | A1 | 9/2019 | Takechi |
| 2019/0317629 | A1 | 10/2019 | Jung et al. |
| 2019/0325805 | A1 | 10/2019 | Moon et al. |
| 2019/0340980 | A1 | 11/2019 | Yum et al. |
| 2019/0341435 | A1 | 11/2019 | Chang et al. |
| 2019/0341575 | A1 | 11/2019 | Chung et al. |
| 2019/0348627 | A1 | 11/2019 | Lee et al. |
| 2020/0035951 | A1 | 1/2020 | Cheon et al. |
| 2020/0044197 | A1 | 2/2020 | Shedletsky et al. |
| 2020/0064968 | A1 | 2/2020 | Kim et al. |
| 2020/0075683 | A1 | 3/2020 | Polyakov et al. |
| 2020/0099836 | A1 | 3/2020 | Chao |
| 2020/0105843 | A1 | 4/2020 | Baek et al. |
| 2020/0111401 | A1 | 4/2020 | Zhao et al. |
| 2020/0136077 | A1 | 4/2020 | Lee et al. |
| 2020/0159284 | A1 | 5/2020 | Mathew et al. |
| 2020/0194676 | A1 | 6/2020 | Chang et al. |
| 2020/0194730 | A1 | 6/2020 | Park et al. |
| 2020/0212130 | A1 | 7/2020 | Kim et al. |
| 2020/0357871 | A1 | 11/2020 | Chung et al. |

FOREIGN PATENT DOCUMENTS

| | | | |
|---|---|---|---|
| CN | 100526288 | C | 8/2009 |
| CN | 101617064 | A | 12/2009 |
| CN | 101730938 | A | 6/2010 |
| CN | 1625552 | B | 9/2011 |
| CN | 1784388 | B | 2/2012 |
| CN | 101812021 | B | 12/2012 |
| CN | 103467396 | A | 12/2013 |
| CN | 101267022 | B | 8/2014 |
| CN | 104037359 | A | 9/2014 |
| CN | 104769149 | A | 7/2015 |
| CN | 101503393 | B | 8/2015 |
| CN | 105094451 | A | 11/2015 |
| CN | 105097877 | A | 11/2015 |
| CN | 105206650 | A | 12/2015 |
| CN | 105206753 | A | 12/2015 |
| CN | 106206995 | A | 12/2016 |

(56) References Cited

FOREIGN PATENT DOCUMENTS

| | | | |
|---|---|---|---|
| CN | 106317025 | A | 1/2017 |
| CN | 103788087 | B | 5/2017 |
| CN | 106992267 | A | 7/2017 |
| CN | 107564945 | A | 1/2018 |
| CN | 107808895 | A | 3/2018 |
| CN | 105849930 | B | 6/2018 |
| CN | 108376019 | A | 8/2018 |
| CN | 108389878 | A | 8/2018 |
| CN | 108418928 | A | 8/2018 |
| CN | 105359289 | B | 9/2018 |
| CN | 108630830 | A | 10/2018 |
| CN | 108767136 | A | 11/2018 |
| CN | 108881531 | A | 11/2018 |
| CN | 108900659 | A | 11/2018 |
| CN | 109299631 | A | 2/2019 |
| CN | 109461758 | A | 3/2019 |
| CN | 109599030 | A | 4/2019 |
| CN | 109742132 | A | 5/2019 |
| CN | 109817672 | A | 5/2019 |
| CN | 109817694 | A | 5/2019 |
| CN | 109830495 | A | 5/2019 |
| CN | 109920931 | A | 6/2019 |
| CN | 109950293 | A | 6/2019 |
| CN | 106432200 | B | 7/2019 |
| CN | 110112182 | A | 8/2019 |
| CN | 110144551 | A | 8/2019 |
| CN | 110265474 | A | 9/2019 |
| CN | 110391348 | A | 10/2019 |
| CN | 110416269 | A | 11/2019 |
| CN | 110429117 | A | 11/2019 |
| CN | 110444125 | A | 11/2019 |
| CN | 110459175 | A | 11/2019 |
| CN | 110473898 | A | 11/2019 |
| CN | 110473988 | A | 11/2019 |
| CN | 110491917 | A | 11/2019 |
| CN | 110491918 | A | 11/2019 |
| CN | 110492018 | A | 11/2019 |
| CN | 110518034 | A | 11/2019 |
| CN | 110570774 | A | 12/2019 |
| CN | 110634930 | A | 12/2019 |
| CN | 110718580 | A | 1/2020 |
| CN | 110727142 | A | 1/2020 |
| CN | 110752249 | A | 2/2020 |
| CN | 110767662 | A | 2/2020 |
| CN | 110767682 | A | 2/2020 |
| CN | 110767708 | A | 2/2020 |
| CN | 110767709 | A | 2/2020 |
| CN | 110767713 | A | 2/2020 |
| CN | 110767736 | A | 2/2020 |
| CN | 110767830 | A | 2/2020 |
| CN | 110767835 | A | 2/2020 |
| CN | 110767836 | A | 2/2020 |
| CN | 110767844 | A | 2/2020 |
| CN | 110780375 | A | 2/2020 |
| CN | 110783484 | A | 2/2020 |
| CN | 110783485 | A | 2/2020 |
| CN | 110783486 | A | 2/2020 |
| CN | 110828699 | A | 2/2020 |
| CN | 110867527 | A | 3/2020 |
| CN | 110914891 | A | 3/2020 |
| CN | 110923625 | A | 3/2020 |
| CN | 110928453 | A | 3/2020 |
| CN | 110956925 | A | 4/2020 |
| CN | 110989861 | A | 4/2020 |
| CN | 111009619 | A | 4/2020 |
| CN | 111020489 | A | 4/2020 |
| CN | 111029381 | A | 4/2020 |
| CN | 111029382 | A | 4/2020 |
| CN | 111046599 | A | 4/2020 |
| CN | 111048564 | A | 4/2020 |
| CN | 111142180 | A | 5/2020 |
| CN | 111155055 | A | 5/2020 |
| CN | 111180490 | A | 5/2020 |
| CN | 111223908 | A | 6/2020 |
| CN | 111261641 | A | 6/2020 |
| CN | 111292617 | A | 6/2020 |
| CN | 111293235 | A | 6/2020 |
| CN | 111293236 | A | 6/2020 |
| CN | 111312795 | A | 6/2020 |
| CN | 111341936 | A | 6/2020 |
| CN | 210668382 | U | 6/2020 |
| CN | 111403621 | A | 7/2020 |
| CN | 111524460 | A | 8/2020 |
| CN | 111524469 | A | 8/2020 |
| CN | 111584725 | A | 8/2020 |
| CN | 111584748 | A | 8/2020 |
| CN | 111640882 | A | 9/2020 |
| CN | 111668240 | A | 9/2020 |
| CN | 111682055 | A | 9/2020 |
| CN | 111682120 | A | 9/2020 |
| CN | 111725288 | A | 9/2020 |
| CN | 111739921 | A | 10/2020 |
| CN | 111739924 | A | 10/2020 |
| CN | 111755493 | A | 10/2020 |
| CN | 111755623 | A | 10/2020 |
| CN | 111799374 | A | 10/2020 |
| CN | 111834547 | A | 10/2020 |
| CN | 111862875 | A | 10/2020 |
| CN | 111863900 | A | 10/2020 |
| DE | 19748109.6 | A1 | 5/1999 |
| EP | 0 444 822 | B1 | 9/1994 |
| EP | 1 465 874 | A2 | 10/2004 |
| EP | 1 551 206 | A1 | 7/2005 |
| EP | 1 213 337 | B1 | 11/2005 |
| EP | 1 816 114 | A1 | 8/2007 |
| EP | 2 055 709 | A2 | 5/2009 |
| EP | 2 055 710 | A1 | 5/2009 |
| EP | 2 067 766 | A1 | 6/2009 |
| EP | 2 067 767 | A1 | 6/2009 |
| EP | 2 075 309 | A2 | 7/2009 |
| EP | 2 080 795 | A1 | 7/2009 |
| EP | 2 175 005 | A1 | 4/2010 |
| EP | 2 066 150 | B1 | 5/2010 |
| EP | 2 182 040 | A2 | 5/2010 |
| EP | 2 202 283 | A1 | 6/2010 |
| EP | 2 062 958 | B1 | 7/2010 |
| EP | 1 602 648 | B1 | 4/2013 |
| EP | 2 028 249 | B1 | 5/2013 |
| EP | 1 621 597 | B1 | 9/2013 |
| EP | 2 270 897 | B1 | 12/2014 |
| EP | 1 009 044 | B1 | 7/2015 |
| EP | 2 462 203 | B1 | 3/2016 |
| EP | 2 998 997 | A1 | 3/2016 |
| EP | 3 089 232 | A1 | 11/2016 |
| EP | 2 197 979 | B1 | 12/2016 |
| EP | 3 182 477 | A1 | 6/2017 |
| EP | 3 185 325 | A1 | 6/2017 |
| EP | 3 240 036 | A1 | 11/2017 |
| EP | 3 316 311 | A1 | 5/2018 |
| EP | 3 331 045 | A1 | 6/2018 |
| EP | 3 336 899 | A1 | 6/2018 |
| EP | 2 434 558 | B1 | 7/2018 |
| EP | 3 499 576 | A1 | 6/2019 |
| GB | 1 096 600 | A | 12/1967 |
| IN | 229083 | B | 8/2007 |
| JP | 2002-212163 | A | 7/2002 |
| JP | 3588978 | B2 | 11/2004 |
| JP | 2005-041843 | A | 2/2005 |
| JP | 2007-188854 | A | 7/2007 |
| JP | 4025111 | B2 | 12/2007 |
| JP | 4025136 | B2 | 12/2007 |
| JP | 4025137 | B2 | 12/2007 |
| JP | 2008-133263 | A | 6/2008 |
| JP | 2008-214332 | A | 9/2008 |
| JP | 4185097 | B2 | 11/2008 |
| JP | 2008-291006 | A | 12/2008 |
| JP | 4308663 | B2 | 8/2009 |
| JP | 2009-535813 | A | 10/2009 |
| JP | 2010-258410 | A | 11/2010 |
| JP | 2011-173972 | A | 9/2011 |
| JP | 4846982 | B2 | 12/2011 |
| JP | 2012-119592 | A | 6/2012 |
| JP | 4970934 | B2 | 7/2012 |
| JP | 4972844 | B2 | 7/2012 |

(56) References Cited

FOREIGN PATENT DOCUMENTS

| | | | |
|---|---|---|---|
| JP | 2012-531426 | A | 12/2012 |
| JP | 5093879 | B2 | 12/2012 |
| JP | 5166961 | B2 | 3/2013 |
| JP | 5198657 | B2 | 5/2013 |
| JP | 5233074 | B2 | 7/2013 |
| JP | 2013-173771 | A | 9/2013 |
| JP | 2013-219278 | A | 10/2013 |
| JP | 5572134 | B2 | 8/2014 |
| JP | 5645849 | B2 | 12/2014 |
| KR | 100691543 | B1 | 3/2007 |
| KR | 100826364 | B1 | 5/2008 |
| KR | 100858816 | B1 | 9/2008 |
| KR | 1020090128427 | A | 12/2009 |
| KR | 1020100041043 | A | 4/2010 |
| KR | 1020100054630 | A | 5/2010 |
| KR | 1020100066424 | A | 6/2010 |
| KR | 1020100123735 | A | 11/2010 |
| KR | 100998838 | B1 | 12/2010 |
| KR | 101020350 | B1 | 3/2011 |
| KR | 101036391 | B1 | 5/2011 |
| KR | 1020110123701 | A | 11/2011 |
| KR | 1020130077276 | A | 7/2013 |
| KR | 101317511 | B1 | 10/2013 |
| KR | 1020140062258 | A | 5/2014 |
| KR | 1020140126108 | A | 10/2014 |
| KR | 101530266 | B1 | 6/2015 |
| KR | 1020150103510 | A | 9/2015 |
| KR | 101561479 | B1 | 10/2015 |
| KR | 1020150120906 | A | 10/2015 |
| KR | 1020150127368 | A | 11/2015 |
| KR | 101640772 | B1 | 7/2016 |
| KR | 101661925 | B1 | 10/2016 |
| KR | 1020170030168 | A | 3/2017 |
| KR | 1020170075865 | A | 7/2017 |
| KR | 1020180115655 | A | 10/2018 |
| KR | 1020180121304 | A | 11/2018 |
| KR | 1020190020930 | A | 3/2019 |
| TW | 227655 | B | 2/2005 |
| TW | 201105775 | A | 2/2011 |
| TW | 363054 | B | 5/2012 |
| TW | 485137 | B | 5/2015 |
| TW | 499653 | B | 9/2015 |
| TW | 201929219 | A | 7/2019 |
| WO | WO-95/33732 | A1 | 12/1995 |
| WO | WO-2006/070712 | A1 | 7/2006 |
| WO | WO-2008/010377 | A1 | 1/2008 |
| WO | WO-2008/069586 | A1 | 6/2008 |
| WO | WO-2008/105294 | A1 | 9/2008 |
| WO | WO-2009/099133 | A1 | 8/2009 |
| WO | WO-2009/102054 | A1 | 8/2009 |
| WO | WO-2010/064871 | A1 | 6/2010 |
| WO | WO-2010/094378 | A1 | 8/2010 |
| WO | WO-2010/114256 | A2 | 10/2010 |
| WO | WO-2010/114263 | A2 | 10/2010 |
| WO | WO-2010/122810 | A1 | 10/2010 |
| WO | WO-2010/134350 | A1 | 11/2010 |
| WO | WO-2010/151006 | A1 | 12/2010 |
| WO | WO-2011/012212 | A1 | 2/2011 |
| WO | WO-2011/049284 | A1 | 4/2011 |
| WO | WO-2011/074252 | A1 | 6/2011 |
| WO | WO-2011/074253 | A1 | 6/2011 |
| WO | WO-2011/115378 | A1 | 9/2011 |
| WO | WO-2011/129096 | A1 | 10/2011 |
| WO | WO-2012/070535 | A1 | 5/2012 |
| WO | WO-2013/109030 | A1 | 7/2013 |
| WO | WO-2013/100724 | A4 | 10/2013 |
| WO | WO-2013/180456 | A1 | 12/2013 |
| WO | WO-2013/183851 | A1 | 12/2013 |
| WO | WO-2013/187007 | A1 | 12/2013 |
| WO | WO-2014/024880 | A1 | 2/2014 |
| WO | WO-2014/104144 | A1 | 7/2014 |
| WO | WO-2014/163228 | A1 | 10/2014 |
| WO | WO-2015/005440 | A1 | 1/2015 |
| WO | WO-2015/033559 | A1 | 3/2015 |
| WO | WO-2015/041352 | A1 | 3/2015 |
| WO | WO-2016/042781 | A1 | 3/2016 |
| WO | WO-2016/056364 | A1 | 4/2016 |
| WO | WO-2017/072678 | A1 | 5/2017 |
| WO | WO-2018/103747 | A1 | 6/2018 |
| WO | WO-2018/206575 | A1 | 11/2018 |
| WO | WO-2019/006749 | A1 | 1/2019 |
| WO | WO-2019/047126 | A1 | 3/2019 |
| WO | WO-2019/062221 | A1 | 4/2019 |
| WO | WO-2019/062236 | A1 | 4/2019 |
| WO | WO-2019/088594 | A2 | 5/2019 |
| WO | WO-2019/141198 | A1 | 7/2019 |
| WO | WO-2019/147012 | A1 | 8/2019 |
| WO | WO-2019/178782 | A1 | 9/2019 |
| WO | WO-2019/199131 | A1 | 10/2019 |
| WO | WO-2019/199139 | A1 | 10/2019 |
| WO | WO-2019/199693 | A1 | 10/2019 |
| WO | WO-2019/200862 | A1 | 10/2019 |
| WO | WO-2019/233298 | A1 | 12/2019 |
| WO | WO-2019/242510 | A1 | 12/2019 |
| WO | WO-2020/029559 | A1 | 2/2020 |
| WO | WO-2020/029612 | A1 | 2/2020 |
| WO | WO-2020/029621 | A1 | 2/2020 |
| WO | WO-2020/045262 | A1 | 3/2020 |
| WO | WO-2020/052232 | A1 | 3/2020 |
| WO | WO-2020/057208 | A1 | 3/2020 |
| WO | WO-2020/079456 | A1 | 4/2020 |
| WO | WO-2020/105015 | A1 | 5/2020 |
| WO | WO-2020/134914 | A1 | 7/2020 |
| WO | WO-2020/191889 | A1 | 10/2020 |
| WO | WO-2020/192051 | A1 | 10/2020 |
| WO | WO-2020/199445 | A1 | 10/2020 |
| WO | WO-2020/226383 | A1 | 11/2020 |
| WO | WO-2020/261191 | A1 | 12/2020 |

OTHER PUBLICATIONS

Abraham, Michael H., et al. "Determination of molar refractions and Abraham descriptors for tris(acetylacetonato)chromium(III), tris(acetylacetonato)iron(III) and tris(acetylacetonato)cobalt(III)." New Journal of Chemistry 41.23 (2017): 14259-14265.

Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.

Amat, Miguel A., et al. "Liquid-vapor equilibria and interfacial properties of -alkanes and perfluoroalkanes by molecular simulation." The Journal of chemical physics 132.11 (2010): 114704.

Aqra, Fathi, and Ahmed Ayyad. "Surface free energy of alkali and transition metal nanoparticles." Applied surface science 314 (2014): 308-313.

Baek, Jang-Yeol, et al. "New asymmetrical limb structured blue emitting material for OLED." Optical Materials Express 4.6 (2014): 1151-1158.

Baek, Seungin, et al. "74-2: Diffracted Image Retrieving with Deep Learning." SID Symposium Digest of Technical Papers. vol. 51. No. 1. 2020.

Balague, J., et al. "Synthesis of fluorinated telomers. Part 1. Telomerization of vinylidene fluoride with perfluoroalkyl iodides." Journal of Fluorine Chemistry 70.2 (1995): 215-223.

Bechtolsheim, C. V., V. Zaporojtchenko, and F. Faupel. "Interface structure and formation between gold and trimethylcyclohexane polycarbonate." Journal of materials research 14.9 (1999): 3538-3543.

Beier, Petr, et al. "Preparation of SF5 Aromatics by Vicarious Nucleophilic Substitution Reactions of Nitro(pentafluorosulfanyl)benzenes with Carbanions." Journal of Organic Chemistry 76.11 (2011): 4781-4786.

Ben'kovskii, V.G., et al. "Density, surface tension and refractive index of aromatic hydrocarbons at low temperatures." Chemistry and Technology of Fuels and Oils 2.1 (1966): 23-26.

Bernstein, M.P., et al. "Ultraviolet irradiation of the polycyclic aromatic hydrocarbon (PAH) naphthalene in H2O. Implications for meteorites and biogenesis." Advances in Space Research 30.6 (2002): 1501-1508.

(56) References Cited

OTHER PUBLICATIONS

Casas-Solvas, Juan M., et al. "Synthesis of substituted pyrenes by indirect methods." Organic & Biomolecular Chemistry 12.2 (2014): 212-232.
Chambrier, Isabelle, et al. "Synthesis of Porphyrin-CdSe Quantum Dot Assemblies: Controlling Ligand Binding by Substituent Effects." Inorganic chemistry 54.15 (2015): 7368-7380.
Chang, Li, et al. "A smart surface with switchable wettability by an ionic liquid." Nanoscale 9.18 (2017): 5822-5827.
Chen, Hsiao-Fan, et al. "1,3,5-Triazine derivatives as new electron transport-type host materials for highly efficient green phosphorescent OLEDs." Journal of Materials Chemistry 19.43 (2009): 8112-8118.
Chen, Yu-Hung, et al. "58.2: High-Performance Large-Size OLED Tv with Ultra Hd Resolution." SID Symposium Digest of Technical Papers. vol. 46. No. 1. 2015.
Ching, Suet Ying. "Plasmonic properties of silver-based alloy thin films." (2015). Open Access Theses and Dissertations. 194.
Ching, Suet Ying. "Plasmonic properties of silver-based alloy thin films." (2016).
Condorelli, Guglielmo G., et al. "Engineering of molecular architectures ß-diketonate precursors toward new advanced materials." Coordination chemistry reviews 251.13-14 (2007): 1931-1950.
Crowder, Gene A., et al. "Vapor pressures and triple point temperatures for several pure fluorocarbons." Journal of Chemical and Engineering Data 12.4 (1967): 481-485.
Cuny, Philippe, et al. "Phenanthrene degradation, emulsification and surface tension activities of a pseudomonas putida strain isolated from a coastal oil contaminated microbial mat." Ophelia, 58.3 (2004), 283-287.
Dalvi, Vishwanath H., Rossky, Peter J. "Molecular origins of fluorocarbon hydrophobicity." Proceedings of the National Academy of Sciences of the United States of America 107.31 (2010): 13603-13607.
Das, Prajwalita, et al. "Recent advancements in the synthesis of pentafluorosulfanyl (SF5)-containing heteroaromatic compounds." Tetrahedron Letters 58.52 (2017): 4803-4815.
David, Robert, Neumann, A. Wilhelm. "A Theory for the Surface Tensions and Contact Angles of HydrogenBonding Liquids." Langmuir 30.39 (2014): 11634-11639.
Dawood, Kamal M., et al. "Electrolytic fluorination of organic compounds." Tetrahedron 7.60 (2004): 1435-1451.
Dayneko, Sergey, et al. "Effect of surface ligands on the performance of organic light-emitting diodes containing quantum dots." Optoelectronic Devices and Integration V. vol. 9270. SPIE, 2014.
Dikarev, Evgeny V., et al. "Heterometallic Bismuth-Transition Metal Homoleptic ß-Diketonates." Journal of the American Chemical Society 127.17 (2005): 6156-6157.
Dolbier, William R. Jr., and Kanishchev, Oleksandr S. "Chapter One—SF5-Substituted Aromatic Heterocycles." Advances in Heterocyclic Chemistry 120 (2016): 1-42.
Dolbier, William R. Jr., and Zheng, Zhaoyun. "Use of 1,3-Dipolar Reactions for the Preparation of SF5-Substituted Five-Membered Ring Heterocycles. Pyrroles and Thiophenes." / Journal of Fluorine Chemistry 132.6(2011): 389-393.
Drake, Simon R., et al. "Lanthanide ß-diketonate glyme complexes exhibiting unusual co-ordination modes." Journal of the Chemical Society, Dalton Transactions 15 (1993): 2379-2386.
Drelich, Jaroslaw, et al. "Hydrophilic and Superhydrophilic Surfaces and Materials." Soft Matter, 7.21 (2011): 9804-9828.
Dubrovskii, Vladimir. "Fundamentals of Nucleation Theory." Nucleation Theory and Growth of Nanostructures. Springer, Berlin, Heidelberg, 2014. 1-73.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Ellis, David A., et al. "Degradation of Fluorotelomer Alcohols: A Likely Atmospheric Source of Perfluorinated Carboxylic Acids." Environmental science & technology 38.12 (2004): 3316-3321.
Ellis, David A., et al. "Partitioning of organofluorine compounds in the environment." Organofluorines. Springer, Berlin, Heidelberg, 2002. 63-83.
Emerton, Neil, David Ren, and Tim Large. "28-1: Image Capture Through TFT Arrays." SID Symposium Digest of Technical Papers. vol. 51. No. 1. 2020.
Evers, Robert C. "Low glass transition temperature fluorocarbon ether bibenzoxazole polymers." Journal of Polymer Science: Polymer Chemistry Edition 16.11 (1978): 2833-2848.
Faupel, F., et al. "Nucleation, growth, interdiffusion, and adhesion of metal films on polymers." AIP Conference Proceedings. vol. 491. No. 1. American Institute of Physics, 1999.
Feng, Zhengyu, et al. "28-3: Pixel Design for Transparent MicroLED Display with Low Blurring." SID Symposium Digest of Technical Papers. vol. 51. No. 1. 2020.
Flores-Camacho, Jose Manuel, et al. "Growth and optical properties of Ag clusters deposited on poly (ethylene terephthalate)." Nanotechnology 22.27 (2011): 275710.
Foreign Action other than Search Report on JP 2020-541978 dated Jul. 21, 2022.
Formica, Nadia, et al. "Ultrastable and Atomically Smooth Ultrathin Silver Films Grown on a Copper Seed Layer." ACS Applied Materials & Interfaces 5.8 (2013): 3048-3053.
Fowkes, Frederick M. "Attractive Forces at Interfaces." Industrial and Engineering Chemistry 56.12 (1964): 40-52.
Freire, Mara G., et al. "Surface Tension of Liquid Fluorocompounds." Journal of Chemical & Engineering Data 51.5 (2006): 1820-1824.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness." Macromolecules 34.16 (2001): 5627-5634.
Fusella, Michael A., et al. "Plasmonic enhancement of stability and brightness in organic light-emitting devices." Nature 585.7825 (2020): 379-382.
Gao, Lichao, et al. "Teflon is Hydrophilic. Comments on Definitions of Hydrophobic, Shear versus Tensile Hydrophobicity, and Wettability Characterization." Langmuir 24.17 (2008): 9183-9188.
Garrick, Lloyd M. "Novel , New Aromatic SF 5 Derivatives Prepared in High Yield via Highly Versatile & Cost Competitive Methods." (2019).
Gavrilenko, V. V., et al. "Synthesis of yttrium, lanthanum, neodymium, praseodymium, and lutetium alkoxides and acetylacetonates." Bulletin of the Russian Academy of Sciences, Division of chemical science 41.11 (1992): 1957-1959.
Golovin, Kevin, et al. "Low-interfacial toughness materials for effective large-scale deicing." Science 364.6438 (2019): 371-375.
Gray, Victor, et al. "Photophysical characterization of the 9,10-disubstituted anthracene chromophore and its applications in triplet-triplet annihilation photon upconversion." Journal of Materials Chemistry C 3.42 (2015): 11111-11121.
Green, Mark. "The nature of quantum dot capping ligands." Journal of Materials Chemistry 20.28 (2010): 5797-5809.
Grzyll, Lawrence R., et al. "Density, Viscosity, and Surface Tension of Liquid Quinoline, Naphthalene, Biphenyl, Decafluorobiphenyl, and 1,2-Diphenylbenzene from 300 to 400 C." Journal of Chemical & Engineering Data 41.3 (1996): 446-450.
Hammer, Nathan I., et al. "Quantum dots coordinated with conjugated organic ligands: new nanomaterials with novel photophysics." Nanoscale Research Letters 2.6 (2007): 282-290.
Han, Yoon Deok, et al. "Quantum dot and p-conjugated molecule hybrids: nanoscale luminescence and application to photoresponsive molecular electronics." NPG Asia Materials 6.6 (2014): e103-e103.
Heaney, James B. "Evaluation of commercially supplied silver coated Teflon for spacecraft temperature control usage." (1974).
Heinrich, Darina, et al. "Synthesis of Cyclopentadiene Ligands with Fluorinated Substituents by Reaction of Cobaltocene with Fluoroalkenes." European Journal of Inorganic Chemistry 2014.30 (2014): 5103-5106.

(56) References Cited

OTHER PUBLICATIONS

Herzog, Axel, et al. "A Perfluorinated Nanosphere: Synthesis and Structure of Perfluoro-deca-B-methyl-para-carborane." Angewandte Chemie International Edition 40.11 (2001): 2121-2123.
Hiroto, Satoru, et al. "Synthetic protocol for diarylethenes through Suzuki-Miyaura coupling." Chemical communications 47.25 (2011): 7149-7151.
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hoene, Joan Von, et al. "Thermal Decomposition of Metal Acetylacetonates: Mass Spectrometer Studies." The Journal of Physical Chemistry 62.9 (1958): 1098-1101.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Hughes, Russell P., Trujillo, Hernando A. "Selective Solubility of Organometallic Complexes in Saturated Fluorocarbons. Synthesis of Cyclopentadienyl Ligands with Fluorinated Ponytails." Organometallics 15.1 (1996): 286-294.
Hyre, Ariel S., Doerrer, Linda H. "A structural and spectroscopic overview of molecular lanthanide complexes with fluorinated O-donor ligands." Coordination Chemistry Reviews 404 (2020): 213098.
Jain, Akash, et al. "Estimation of Melting Points of Organic Compounds." Industrial & engineering chemistry research 43.23 (2004): 7618-7621.
Jarvis N.L., Zisman W.A. "Surface Chemistry of Fluorochemicals." U.S. Naval Research Laboratory (NRL); Washington, DC, USA, 1965.
Jean G. Riess. "Understanding the Fundamentals of Perfluorocarbons and Perfluorocarbon Emulsions Relevant to In Vivo Oxygen Delivery." Artificial Cells, Blood Substitutes, and Biotechnology 33.1 (2005): 47-63.
Jiao, Zhiqiang, et al. "61-2: Weakening Micro-Cavity Effects in White Top-Emitting WOLEDs with Semitransparent Metal Top Electrode." SID Symposium Digest of Technical Papers. vol. 49. No. 1. 2018.
Joliton, Adrien, and Carreira, Erick M. "Ir-Catalyzed Preparation of SF5-Substituted Potassium Aryl Trifluoro bo rates via C-H Borylation and Their Application in the Suzuki-Miyaura Reaction." Organic Letters 15.20 (2013): 5147-5149.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning." SID Symposium Digest of Technical Papers. vol. 46. No. 1. 2015.
Khetubol, Adis, et al. "Ligand exchange leads to efficient triplet energy transfer to CdSe/ZnS Q-dots in a poly(N-vinylcarbazole) matrix nanocomposite." Journal of Applied Physics 113.8 (2013): 083507.
Khetubol, Adis, et al. "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands." Journal of Polymer Science Part B: Polymer Physics 52.7 (2014): 539-551.
Kim, Beomjin, et al. "Synthesis and electroluminescence properties of highly efficient blue fluorescence emitters using dual core chromophores." Journal of Materials Chemistry C 1.3 (2013): 432-440.
Kim, Haewon, et al. "Analysis of Semi-Transparent Cathode Performance Based on Fabrication Methods." IDW'19. 2019.
Kim, Hyun-Chang, et al. "39-4: A Method of Panel-Current Limitation for Automotive OLED Displays." SID Symposium Digest of Technical Papers. vol. 51. No. 1. 2020.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kisin, Srdjan. Adhesion changes at metal-polymer interfaces: Study of the copper-(acrylonitrile-butadiene-styrene) system. Diss. Dissertation, Technische Universiteit Eindhoven, 2007.
Knight Jr, L. B., et al. "Unusual behavior of vaporized magnesium under low pressure conditions." The Journal of Physical Chemistry 79.12 (1975): 1183-1190.
Koma, N. et al. "44.2: Novel Front-light System Using Fine-pitch Patterned OLED." SID Symposium Digest of Technical Papers, 39: 655-658. 2008.
Korich, Andrew L, and Iovine, Peter M. "Boroxine chemistry and applications: A perspective." Dalton Transactions 39.6 (2010): 1423-1431.
Kota, Arun K. et al. "The design and applications of superomniphobic surfaces." NPG Asia Materials 6.7 (2014):e109-e109.
Kovacina, T. A., et al. "Syntheses and characterizations of poly(pentafluorosulfur diacetylenes)." Industrial & Engineering Chemistry Product Research and Development 22.2 (1983): 170-172.
Kovalchuk, N.M., et al. "Fluoro- vs hydrocarbon surfactants: Why do they differ in wetting performance " Advances in Colloid and Interface Science 210 (2014): 65-71.
Kwak, Sang Woo, et al. "Synthesis and Electroluminescence Properties of 3-(Trifluoromethyl)phenyl-Substituted 9,10-Diarylanthracene Derivatives for Blue Organic Light-Emitting Diodes." Applied Sciences 7.11 (2017): 1109-1120.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs." SID Symposium Digest of Technical Papers. vol. 46. No. 1. 2015.
Lee, Donggu, et al. "The influence of sequential ligand exchange and elimination on the performance of P3HT: CdSe quantum dot hybrid solar cells." Nanotechnology 26.46 (2015): 465401.
Li, Chong, et al. "Photocontrolled Intramolecular Charge/Energy Transfer and Fluorescence Switching of Tetraphenylethene-Dithienylethene-Perylenemonoimide Triad with Donor-Bridge-Acceptor Structure." Chem. Asian J., 9.1 (2014): 104-109.
Li, Lu, et al. "Fluorinated anthracene derivatives as deep-blue emitters and host materials for highly efficient organic light-emitting devices." RSC Advances 5.73 (2015): 59027-59036.
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Lund, L. G., et al. "514. Phosphonitrilic derivatives. Part I. The preparation of cyclic and linear phosphonitrilic chlorides." Journal of the Chemical Society (Resumed) (1960): 2542-2547.
Maderna, A., et al. "The Syntheses of Amphiphilic Camouflaged Carboranes as Modules for Supramolecular Construction." J. Am. Chem. Soc. 123. 42 (2001): 10423-10424.
Maissel, Leon I., and Maurice H. Francombe. An introduction to thin films. CRC Press, 1973. pp. 61-83, 198, 199.
Malandrino, Graziella, et al. "New Thermally Stable and Highly Volatile Precursors for Lanthanum MOCVD: Synthesis and Char-

(56) References Cited

OTHER PUBLICATIONS acterization of Lanthanum ß-Diketonate Glyme Complexes." Inorganic Chemistry 34.25 (1995): 6233-6234.
McDowell, Matthew, et al. "Semiconductor Nanocrystals Hybridized with Functional Ligands: New Composite Materials with Tunable Properties." Materials 3.1 (2010): 614-637.
McIntosh, Thomas J., et al. "Structure and Interactive Properties of Highly Fluorinated Phospholipid Bilayers." Biophysical Journal 71.4 (1996): 1853-1868.
Meinders, Marcel BJ, William Kloek, and Ton van Vliet. "Effect of surface elasticity on Ostwald ripening in emulsions." Langmuir 17.13 (2001): 3923-3929.
Michele Ricks. Advanced OLED Materials Enabling Large-Size OLED Displays by Ink Jet Printing. OLEDs World Summit, Sep. 2020.
Mishra, Shashank, Daniele, Stephane. "Metal-Organic Derivatives with Fluorinated Ligands as Precursors for Inorganic Nanomaterials." Chemical Reviews 115.16 (2015): 8379-8448.
Mittal, Kashmiri Lal, ed. Metallized plastics 3: fundamental and applied aspects. Springer Science & Business Media, 2012.
Morgenstern, Karina, Georg Rosenfeld, and George Comsa. "Decay of two-dimensional Ag islands on Ag (111)." Physical review letters 76.12 (1996): 2113.
Mucur, S.P., et al. "Conventional and inverted organic light emitting diodes based on bright green emmisive polyfluorene derivatives." Polymer 151.12 (2018): 101-107.
Murano, Sven, et al. "30.3: Invited Paper: AMOLED Manufacturing—Challenges and Solutions from a Material Makers Perspective." SID Symposium Digest of Technical Papers. vol. 45. No. 1. 2014.
Nakamura, Daiki, et al. "68-4: Top-emission OLED Kawara-type Multidisplay with Auxiliary Electrode." SID Symposium Digest of Technical Papers. vol. 49. No. 1. 2018.
Nittier, Laurent, et al. "Morphology study of small amounts of evaporated gold on polymers." Surface and interface analysis 44.8 (2012): 1072-1075.
Ohring, Milton. Materials science of thin films. Elsevier, 2001.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.
Pandharkar, Riddhish, et al. "A Computational Study of AIF3 and ACF Surfaces." Inorganics 6.4 (2018): 124.
Park, Chan II, et al. "54-1: Distinguished Paper: World 1st Large Size 77-inch Transparent Flexible OLED Display." SID Symposium Digest of Technical Papers. vol. 49. No. 1. 2018.
Park, Eun Ji, et al. "Fabrication of conductive, transparent and superhydrophobic thin films consisting of multi-walled carbon nanotubes." RSC Advances 4.57 (2014): 30368-30374.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Peters, Richard D., et al. "Using Self-Assembled Monolayers Exposed to X-rays To Control the Wetting Behavior of Thin Films of Diblock Copolymers." Langmuir 16.10 (2000): 4625-4631.
Piorecka, Kinga, et al. "Hydrophilic Polyhedral Oligomeric Silsesquioxane, Poss (Oh) 32, as a Complexing Nanocarrier for Doxorubicin and Daunorubicin." Materials 13.23 (2020): 5512.
Quan, Wei, et al. "69-2: Transparent Conductive Hybrid Cathode Structure for Top-Emitting Organic Light-Emitting Devices." SID Symposium Digest of Technical Papers. vol. 51. No. 1. 2020.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Rumyant ev, R.V., Fukin, G.K. "Intramolecular C—F Ln dative interactions in lanthanide complexes with fluorinated ligands." Russian Chemical Bulletin 66.9 (2017): 1557-1562.
Safonov, Alexey I., et al. "Deposition of thin composite films consisting of fluoropolymer and silver nanoparticles having surface plasmon resonance." Thin Solid Films 603 (2016): 313-316.
Sakka, Tetsuo, et al. "Surface tension of fluoroalkanes in a liquid phase." Journal of Fluorine Chemistry 126.3 (2005): 371-375.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schissel, Paul, and Alvin Warren Czanderna. "Reactions at the silver/polymer interface: a review." Solar Energy Materials 3.1-2 (1980): 225-245.
Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.
Senaweera, Sameera M., and Weaver, Jimmie D., "Selective Perfluoro- and Polyfluoroarylation of Meldrum's Acid". The Journal of Organic Chemistry 79.21 (2014): 10466-10476.
Shen, Mingmin, et al. "Destabilization of Ag nanoislands on Ag (100) by adsorbed sulfur." The Journal of chemical physics 135.15 (2011): 154701.
Shi, Shiming, et al. "56-1: Invited Paper: Research on Commercial Foldable AMOLED and Relevant Technologies." SID Symposium Digest of Technical Papers. vol. 51. No. 1. 2020.
Shin, Dong-Youn, and Inyoung Kim. "Self-patterning of fine metal electrodes by means of the formation of isolated silver nanoclusters embedded in polyaniline." Nanotechnology 20.41 (2009): 415301.
Shirasaki, Yasuhiro. Efficiency loss mechanisms in colloidal quantum-dot light-emitting diodes. Diss. Massachusetts Institute of Technology, 2013.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Snyder Jr, Carl E. "Structural Modifications of Fluoro-alkyl S-Triazines and Their Lubricant Properties." Asle Transactions 14.3 (1971): 237-242.
Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Syafiq, A., et al. "Superhydrophilic Smart Coating for Self-Cleaning Application on Glass Substrate." Journal of Nanomaterials 2018 (2018).
Szab , D nes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of Fluorine Chemistry 126.4 (2005): 639-650.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tarasevich, Y. I. "Surface energy of oxides and silicates." Theoretical and Experimental Chemistry 42 (2006): 145-161.

(56) References Cited

OTHER PUBLICATIONS

Thran, A., et al. "Condensation coefficients of Ag on polymers." Physical review letters 82.9 (1999): 1903.
Thurston, John H., et al. "Toward a General Strategy for the Synthesis of Heterobimetallic Coordination Complexes for Use as Precursors to Metal Oxide Materials: Synthesis, Characterization, and Thermal Decomposition of Bi2(Hsal)6 M(Acac)3 (M = Al, Co, V, Fe, Cr)." Inorganic chemistry 43.10 (2004): 3299-3305.
Tsai, Yu-Hsiang, et al. "P-202: A Flexible Transparent OLED Display with FlexUPTM Technology." SID Symposium Digest of Technical Papers. vol. 48. No. 1. 2017.
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Selective metal deposition on photoswitchable molecular surfaces." Journal of the American Chemical Society 130.32 (2008): 10740-10747.
Tsujioka, Tsuyoshi, Rie Takagi, and Takahiro Shiozawa. "Light-controlled metal deposition on photochromic polymer films." Journal of Materials Chemistry 20.43 (2010): 9623-9627.
Umemoto, Teruo, et al. "Discovery of practical production processes for arylsulfur pentafluorides and their higher homologues, bis- and tris(sulfur pentafluorides): Beginning of a new era of 'super-trifluoromethyl' arene chemistry and its industry." Beilstein Journal of Organic Chemistry 8 (2012): 461-471.
Varagnolo, Silvia, et al. "Embedded-grid silver transparent electrodes fabricated by selective metal condensation." Journal of Materials Chemistry C 8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vitos, Levente, et al. "The surface energy of metals." Surface science 411.1-2 (1998): 186-202.
Walker, Amy V., et al. "Dynamics of interaction of magnesium atoms on methoxy-terminated selfassembled monolayers: an example of a reactive metal with a low sticking probability." The Journal of Physical Chemistry C 111.2 (2007): 765-772.
Wang, Hailiang, et al. "P-132: An Under-Display Camera Optical Structure for Full-Screen LCD." SID Symposium Digest of Technical Papers. vol. 51. No. 1. 2020.
Wang, Zhibin, et al. "55-1: Invited Paper: Self-Assembled Cathode Patterning in AMOLED for Under-Display Camera." SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Weimer, P. K. "Physics of Thin Films, vol. 2.". Academic Press, (1964).
Wolf, Florian F., et al. "Hydrogen-bonding cyclodiphosphazanes: superior effects of 3,5-(CF3)2-substitution in anion-recognition and counter-ion catalysis." New J. Chem., 42.7 (2018): 4854-4870.
Wolfgang Decker, Vast Films, Ltd. "Pattern Metallization: Selective Deposition of Metals on Polymer Films for Functional Applications" AIMCAL Fall Conference 2005.
Wu, Zhongyuan, et al. "34-2: Distinguished Paper: Development of 55inch 8K AMOLED TV by Inkjet Printing Process." SID Symposium Digest of Technical Papers. vol. 51. No. 1. 2020.
Xia, Z. Y., et al. "High performance organic light-emitting diodes based on tetra(methoxy)-containing anthracene derivatives as a hole transport and electron-blocking layer." Journal of Materials Chemistry 20.38 (2010): 8382-8388.
Xu, Hua, et al. "Transparent AMOLED Display Derived by Metal Oxide Thin Film Transistor with Praseodymium Doping." Proceedings of the International Display Workshops vol. 26 (IDW'19). 2019.
Xu, Pengyun, et al. "Superhydrophobic ceramic coating: Fabrication by solution precursor plasma spray and investigation of wetting behavior." Journal of Colloid and Interface Science 523 (2018): 35-44.
Yamada, Toshikazu, et al. "Nanoparticle chemisorption printing technique for conductive silver patterning with submicron resolution." Nature communications 7.1 (2016): 1-9.
Yang, Jun-Yu, et al. "32-3: AMOLED IR Drop Compensation for Channel Length Modulation." SID Symposium Digest of Technical Papers. vol. 51. No. 1. 2020.
Yeung, Leo W.Y., et al. "Simultaneous analysis of perfluoroalkyl and polyfluoroalkyl substances including ultrashort-chain C2 and C3 compounds in rain and river water samples by ultra performance convergence chromatography." Journal of Chromatography A 1522 (2017): 78-85.
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method." Surface science 532 (2003): 300-305.
Zaporojtchenko, V., et al. "Determination of condensation coefficients of metals on polymer surfaces." Surface science 454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zeng, Yang, et al. "28-4: Investigation of Moir Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects." SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Tianzhan, et al. "Bio-inspired superhydrophilic coatings with high anti-adhesion against mineral scales." NPG Asia Materials 10.3 (2018): e471-e471.
Zhang, Xuan, et al. "Synthesis of extended polycyclic aromatic hydrocarbons by oxidative tandem spirocyclization and 1,2-aryl migration." Nature communications 8.1 (2017): 1-8.
Zhang, Zhenhua. "74-3: Image Deblurring of Camera Under Display by Deep Learning." SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.
Zheng, Dongxiao, et al. "Non-conjugated and p-conjugated functional ligands on semiconductive quantum dots." Composites Communications 11 (2019): 21-26.
International Search Report and Written Opinion of International Patent Application No. PCT/IB2019/050839, dated Apr. 29, 2019, 12 pages.

* cited by examiner

MATERIALS FOR FORMING A NUCLEATION-INHIBITING COATING AND DEVICES INCORPORATING SAME

CROSS-REFERENCE TO RELATED APPLICATIONS

This application is a U.S. National Phase Application under 35 U.S.C. § 371 of International Application No. PCT/IB2019/050839, filed on Feb. 1, 2019, which claims the benefit of priority to U.S. Provisional Patent Application Nos. 62/625,710, filed on Feb. 2, 2018; 62/625,722 filed on Feb. 2, 2018; and 62/770,360, filed on Nov. 21, 2018, the disclosures of which are incorporated herein by reference in their entirety for any and all purposes.

TECHNICAL FIELD

The following generally relates to materials for forming a nucleation inhibiting coating for use in selectively depositing an electrically conductive coating on a surface. Specifically, optoelectronic devices incorporating such nucleation inhibiting coating and conductive coating are described.

BACKGROUND

Organic light emitting diodes (OLEDs) typically include several layers of organic materials interposed between conductive thin film electrodes, with at least one of the organic layers being an electroluminescent layer. When a voltage is applied to electrodes, holes and electrons are injected from an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay through a radiative recombination process, in which a photon is released. Alternatively, an exciton may decay through a non-radiative recombination process, in which no photon is released. It is noted that, as used herein, internal quantum efficiency (IQE) will be understood to be a proportion of all electron-hole pairs generated in a device which decay through a radiative recombination process.

A radiative recombination process can occur as a fluorescence or phosphorescence process, depending on a spin state of an electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED device can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. Accordingly, an electrode that is proximal to the base substrate is generally made to be light transmissive (e.g., substantially transparent or semi-transparent) in a bottom-emission device, whereas, in a top-emission device, an electrode that is distal to the base substrate is generally made to be light transmissive in order to reduce attenuation of light. Depending on the specific device structure, either an anode or a cathode may act as a transmissive electrode in top-emission and bottom-emission devices.

An OLED device also may be a double-sided emission device, which is configured to emit light in both directions relative to a base substrate. For example, a double-sided emission device may include a transmissive anode and a transmissive cathode, such that light from each pixel is emitted in both directions. In another example, a double-sided emission display device may include a first set of pixels configured to emit light in one direction, and a second set of pixels configured to emit light in the other direction, such that a single electrode from each pixel is transmissive.

In addition to the above device configurations, a transparent or semi-transparent OLED device also can be implemented, in which the device includes a transparent portion which allows external light to be transmitted through the device. For example, in a transparent OLED display device, a transparent portion may be provided in a non-emissive region between each neighboring pixels. In another example, a transparent OLED lighting panel may be formed by providing a plurality of transparent regions between emissive regions of the panel. Transparent or semi-transparent OLED devices may be bottom-emission, top-emission, or double-sided emission devices.

While either a cathode or an anode can be selected as a transmissive electrode, a typical top-emission device includes a light transmissive cathode. Materials which are typically used to form the transmissive cathode include transparent conducting oxides (TCOs), such as indium tin oxide (ITO) and zinc oxide (ZnO), as well as thin films, such as those formed by depositing a thin layer of silver (Ag), aluminum (Al), or various metallic alloys such as magnesium silver (Mg:Ag) alloy and ytterbium silver (Yb:Ag) alloy with compositions ranging from about 1:9 to about 9:1 by volume. A multi-layered cathode including two or more layers of TCOs and/or thin metal films also can be used.

Particularly in the case of thin films, a relatively thin layer thickness of up to about a few tens of nanometers contributes to enhanced transparency and favorable optical properties (e.g., reduced microcavity effects) for use in OLEDs. However, a reduction in the thickness of a transmissive electrode is accompanied by an increase in its sheet resistance. An electrode with a high sheet resistance is generally undesirable for use in OLEDs, since it creates a large current-resistance (IR) drop when a device is in use, which is detrimental to the performance and efficiency of OLEDs. The IR drop can be compensated to some extent by increasing a power supply level; however, when the power supply level is increased for one pixel, voltages supplied to other components are also increased to maintain proper operation of the device, and thus is unfavorable.

In order to reduce power supply specifications for top-emission OLED devices, solutions have been proposed to form busbar structures or auxiliary electrodes on the devices. For example, such an auxiliary electrode may be formed by depositing a conductive coating in electrical communication with a transmissive electrode of an OLED device. Such an auxiliary electrode may allow current to be carried more effectively to various regions of the device by lowering a sheet resistance and an associated IR drop of the transmissive electrode.

Since an auxiliary electrode is typically provided on top of an OLED stack including an anode, one or more organic layers, and a cathode, patterning of the auxiliary electrode is traditionally achieved using a shadow mask with mask apertures through which a conductive coating is selectively deposited, for example by a physical vapor deposition (PVD) process. However, since masks are typically metal masks, they have a tendency to warp during a high-temperature deposition process, thereby distorting mask apertures and a resulting deposition pattern. Furthermore, a mask is typically degraded through successive depositions, as a conductive coating adheres to the mask and obfuscates features of the mask. Consequently, such a mask should either be cleaned using time-consuming and expensive processes or should be disposed once the mask is deemed to be ineffective at producing the desired pattern, thereby rendering such process highly costly and complex. Accordingly, a shadow mask process may not be commercially feasible for mass production of OLED devices. Moreover, an aspect ratio of features which can be produced using the shadow mask process is typically constrained due to shadowing effects and a mechanical (e.g., tensile) strength of the metal mask, since large metal masks are typically stretched during a shadow mask deposition process.

Another challenge of patterning a conductive coating onto a surface through a shadow mask is that certain, but not all, patterns can be achieved using a single mask. As each portion of the mask is physically supported, not all patterns are possible in a single processing stage. For example, where a pattern specifies an isolated feature, a single mask processing stage typically cannot be used to achieve the desired pattern. In addition, masks which are used to produce repeating structures (e.g., busbar structures or auxiliary electrodes) spread across an entire device surface include a large number of perforations or apertures formed on the masks. However, forming a large number of apertures on a mask can compromise the structural integrity of the mask, thus leading to significant warping or deformation of the mask during processing, which can distort a pattern of deposited structures.

In addition to the above, when a common electrode having a substantially uniform thickness is provided as the top-emission cathode in an OLED display device, the optical performance of the device cannot readily be fine tuned according to the emission spectrum associated each subpixel. In a typical OLED display device, red, green, and blue subpixels are provided to form the pixels of the display device. The top-emission electrode used in such OLED display device is typically a common electrode coating a plurality of pixels. For example, such common electrode may be a relatively thin conductive layer having a substantially uniform thickness across the device. While efforts have been made to tune the optical microcavity effects associated with each subpixel color by varying the thickness of organic layers disposed within different subpixels, such approach may not provide sufficient degree of tuning of the optical microcavity effects in at least some cases. In addition, such approach may be difficult to implement in an OLED display production environment.

BRIEF DESCRIPTION OF THE DRAWINGS

Some embodiments will now be described by way of example with reference to the appended drawings.

FIG. 29B is a diagram illustrating a cross-sectional profile of the device, according to another embodiment of FIG. 29A.

DETAILED DESCRIPTION

Figure 1:
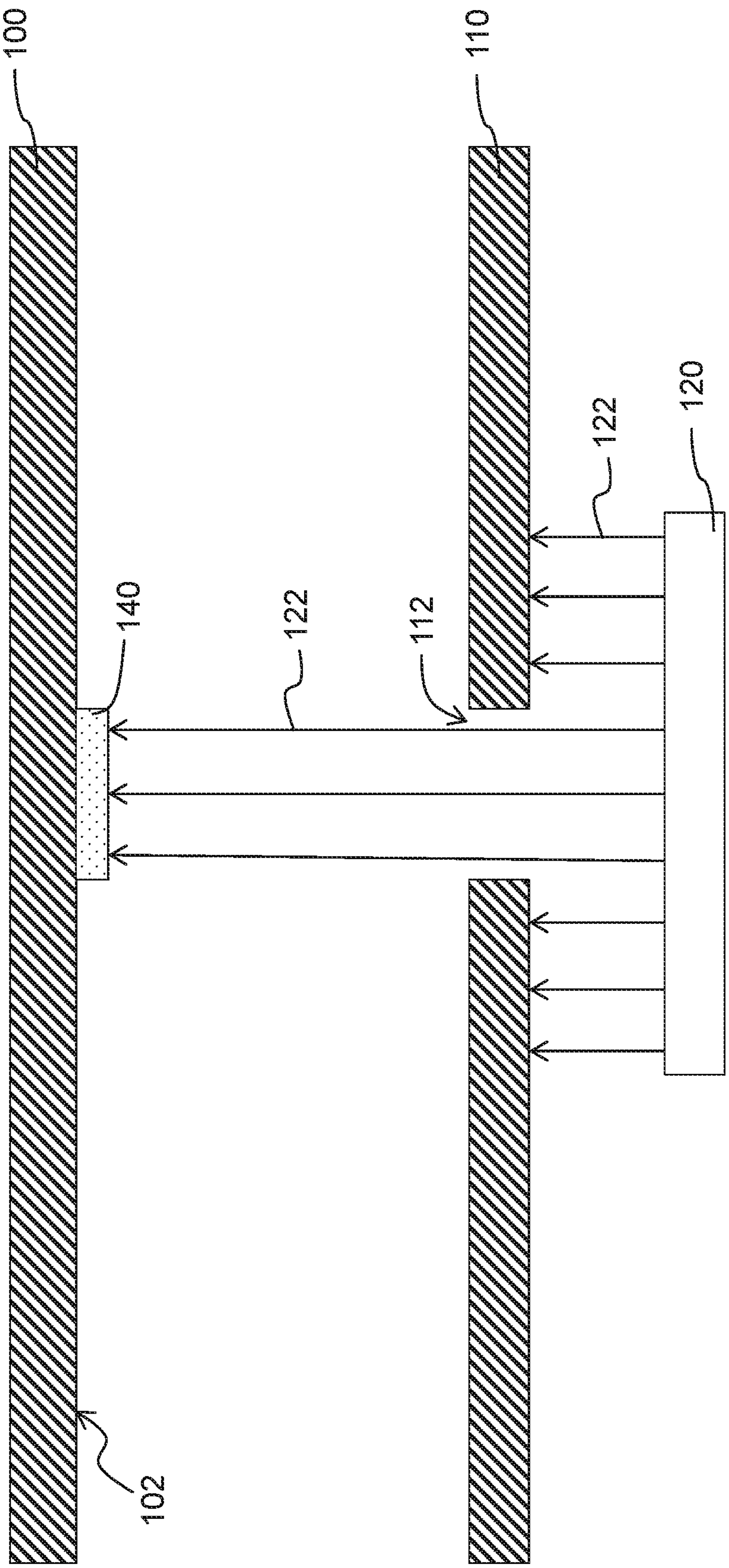
FIG. 1 is a schematic diagram illustrating a shadow mask deposition of a nucleation inhibiting coating, according to one embodiment.

It will be appreciated that for simplicity and clarity of illustration, where considered appropriate, reference numerals may be repeated among the figures to indicate corresponding or analogous components. In addition, numerous specific details are set forth in order to provide a thorough understanding of example embodiments described herein. However, it will be understood by those of ordinary skill in the art that the example embodiments described herein may be practiced without some of those specific details. In other instances, certain methods, procedures and components have not been described in detail so as not to obscure the example embodiments described herein.

In one aspect according to some embodiments, a method for depositing an electrically conductive coating on a surface is provided. In some embodiments, the method is performed in the context of a manufacturing method of an opto-electronic device. In some embodiments, the method is performed in the context of a manufacturing method of another device. In some embodiments, the method includes depositing a nucleation inhibiting coating on a first region of a substrate to produce a patterned substrate. The patterned substrate includes the first region covered by the nucleation inhibiting coating, and a second region of the substrate that is exposed from, or is substantially free of or is substantially uncovered by, the nucleation inhibiting coating. The method also includes treating the patterned substrate to deposit the conductive coating on the second region of the substrate. In some embodiments, a material of the conductive coating includes magnesium. In some embodiments, treating the patterned substrate includes treating both the nucleation inhibiting coating and the second region of the substrate to deposit the conductive coating on the second region of the substrate, while the nucleation inhibiting coating remains exposed from, or is substantially free of or is substantially uncovered by, the conductive coating. In some embodiments, treating the patterned substrate includes performing evaporation or sublimation of a source material used to form the conductive coating, and exposing both the nucleation inhibiting coating and the second region of the substrate to the evaporated source material.

As used herein, the term "nucleation inhibiting" is used to refer to a coating or a layer of a material having a surface which exhibits a relatively low affinity towards deposition of an electrically conductive material, such that the deposition of the conductive material on the surface is inhibited, while the term "nucleation promoting" is used to refer to a coating or a layer of a material having a surface which exhibits a relatively high affinity towards deposition of an electrically conductive material, such that the deposition of the conductive material on the surface is facilitated. One measure of nucleation inhibiting or nucleation promoting property of a surface is an initial sticking probability of the surface for an electrically conductive material, such as magnesium. For example, a nucleation inhibiting coating with respect to magnesium can refer to a coating having a surface which exhibits a relatively low initial sticking probability for magnesium vapor, such that deposition of magnesium on the surface is inhibited, while a nucleation promoting coating with respect to magnesium can refer to a coating having a surface which exhibits a relatively high initial sticking probability for magnesium vapor, such that deposition of magnesium on the surface is facilitated. As used herein, the terms "sticking probability" and "sticking coefficient" may be used interchangeably. Another measure of nucleation inhibiting or nucleation promoting property of a surface is an initial deposition rate of an electrically conductive material, such as magnesium, on the surface relative to an initial deposition rate of the conductive material on another (reference) surface, where both surfaces are subjected or exposed to an evaporation flux of the conductive material.

As used herein, the terms "evaporation" and "sublimation" are interchangeably used to generally refer to deposition processes in which a source material is converted into a vapor (e.g., by heating) to be deposited onto a target surface in, for example, a solid state.

As used herein, a surface (or a certain area of the surface) which is "substantially free of" or "is substantially uncovered by" a material refers to a substantial absence of the material on the surface (or the certain area of the surface). Specifically, regarding an electrically conductive coating, one measure of an amount of an electrically conductive material on a surface is a light transmittance, since electrically conductive materials, such as metals including magnesium, attenuate and/or absorb light. Accordingly, a surface can be deemed to be substantially free of an electrically conductive material if the light transmittance is greater than 90%, greater than 92%, greater than 95%, or greater than 98% in the visible portion of the electromagnetic spectrum. Another measure of an amount of a material on a surface is a percentage coverage of the surface by the material, such as where the surface can be deemed to be substantially free of the material if the percentage coverage by the material is no greater than 10%, no greater than 8%, no greater than 5%, no greater than 3%, or no greater than 1%. Surface coverage can be assessed using imaging techniques, such as using transmission electron microscopy, atomic force microscopy, or scanning electron microscopy.

Selective Deposition

FIG. 1 is a schematic diagram illustrating a process of depositing a nucleation inhibiting coating 140 onto a surface 102 of a substrate 100 according to one embodiment. In the embodiment of FIG. 1, a source 120 including a source material is heated under vacuum to evaporate or sublime the source material. The source material includes or substantially consists of a material used to form the nucleation inhibiting coating 140. The evaporated source material then travels in a direction indicated by arrow 122 towards the substrate 100. A shadow mask 110 having an aperture or slit 112 is disposed in the path of the evaporated source material such that a portion of a flux travelling through the aperture 112 is selectively incident on a region of the surface 102 of the substrate 100, thereby forming the nucleation inhibiting coating 140 thereon.

Figure 2B:
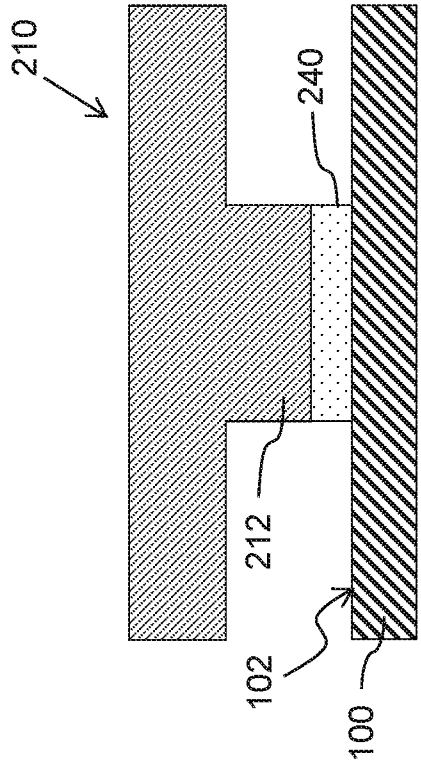
FIG. 2A, FIG. 2B, and FIG. 2C are schematic diagrams illustrating a micro-contact transfer printing process of a nucleation inhibiting coating, according to one embodiment.
Figure 2A:
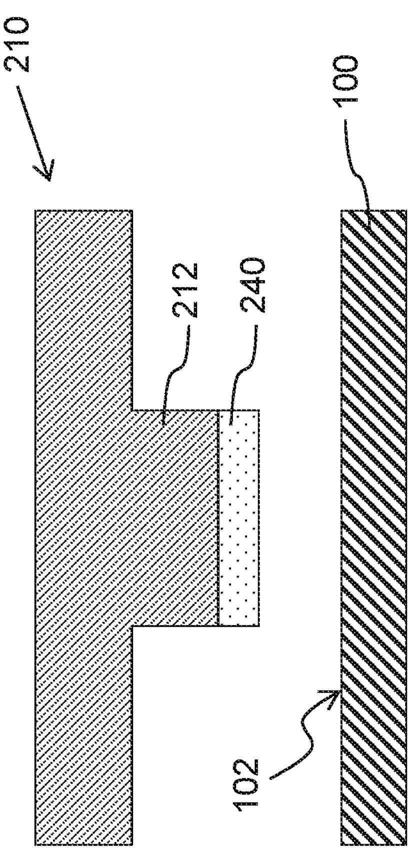
Figure 2C:
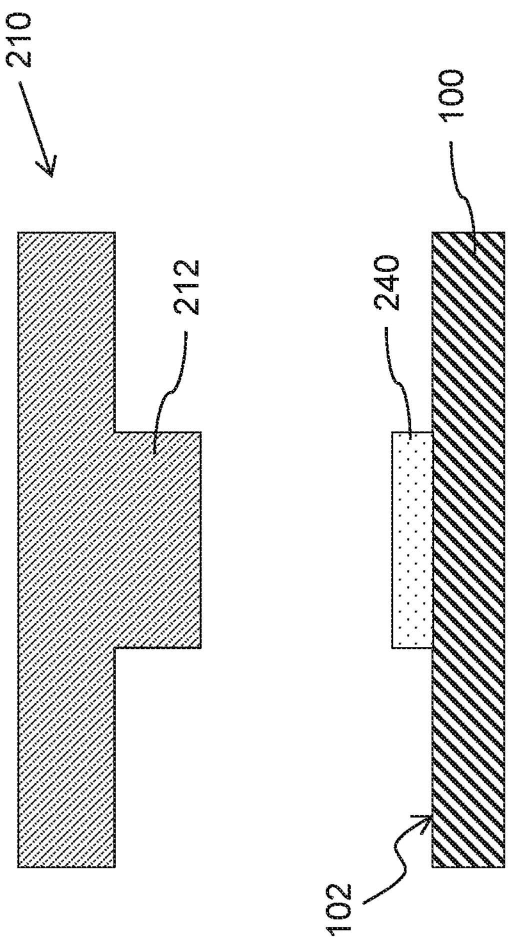

FIGS. 2A-2C illustrate a micro-contact transfer printing process for depositing a nucleation inhibiting coating on a surface of a substrate in one embodiment. Similarly, to a shadow mask process, the micro-contact printing process may be used to selectively deposit the nucleation inhibiting coating on a region of a substrate surface.

FIG. 2A illustrates a first stage of the micro-contact transfer printing process, wherein a stamp 210 including a protrusion 212 is provided with a nucleation inhibiting coating 240 on a surface of the protrusion 212. As will be understood by persons skilled in the art, the nucleation inhibiting coating 240 may be deposited on the surface of the protrusion 212 using various suitable processes.

As illustrated in FIG. 2B, the stamp 210 is then brought into proximity of a substrate 100, such that the nucleation inhibiting coating 240 deposited on the surface of the protrusion 212 is in contact with a surface 102 of the substrate 100. Upon the nucleation inhibiting coating 240 contacting the surface 102, the nucleation inhibiting coating 240 adheres to the surface 102 of the substrate 100.

As such, when the stamp 210 is moved away from the substrate 100 as illustrated in FIG. 2C, the nucleation inhibiting coating 240 is effectively transferred onto the surface 102 of the substrate 100.

Figure 3:
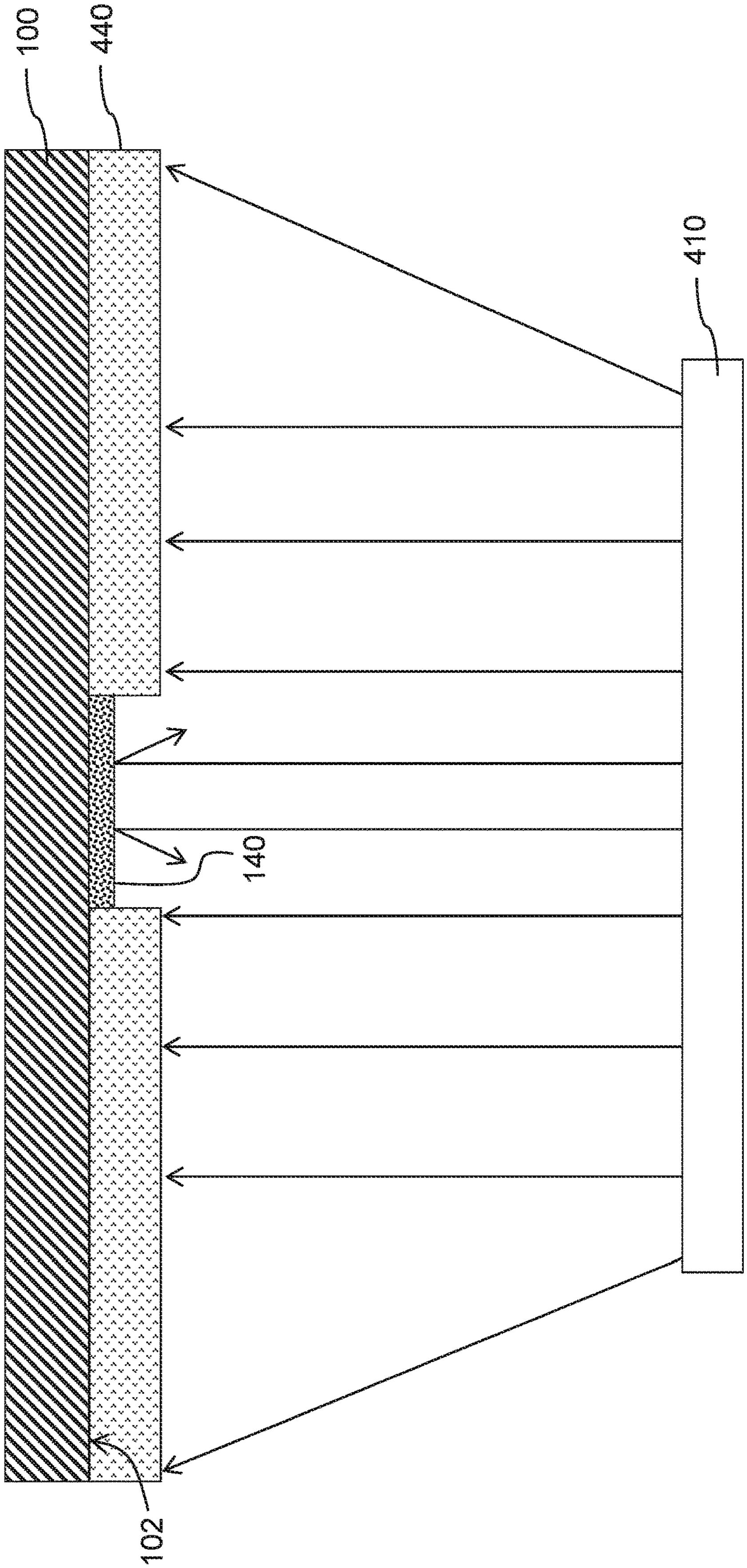
FIG. 3 is a schematic diagram illustrating the deposition of a conductive coating on a patterned surface, according to one embodiment.

Once a nucleation inhibiting coating has been deposited on a region of a surface of a substrate, a conductive coating may be deposited on remaining uncovered region(s) of the surface where the nucleation inhibiting coating is not present. Turning to FIG. 3, a conductive coating source 410 is illustrated as directing an evaporated conductive material towards a surface 102 of a substrate 100. As illustrated in FIG. 3, the conducting coating source 410 may direct the evaporated conductive material such that it is incident on both covered or treated areas (namely, region(s) of the surface 102 with the nucleation inhibiting coating 140 deposited thereon) and uncovered or untreated areas of the surface 102. However, since a surface of the nucleation inhibiting coating 140 exhibits a relatively low initial sticking coefficient compared to that of the uncovered surface 102 of the substrate 100, a conductive coating 440 selectively deposits onto the areas of the surface 102 where the nucleation inhibiting coating 140 is not present. For example, an initial deposition rate of the evaporated conductive material on the uncovered areas of the surface 102 may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of the evaporated conductive material on the surface of the nucleation inhibiting coating 140. The conductive coating 440 may include, for example, pure or substantially pure magnesium.

It will be appreciated that although shadow mask patterning and micro-contact transfer printing processes have been illustrated and described above, other processes may be used for selectively patterning a substrate by depositing a nucleation inhibiting material. Various additive and subtractive processes of patterning a surface may be used to selectively deposit a nucleation inhibiting coating. Examples of such processes include, but are not limited to, photolithography, printing (including ink or vapor jet printing and reel-to-reel printing), organic vapor phase deposition (OVPD), and laser induced thermal imaging (LM) patterning, and combinations thereof.

In some applications, it may be desirable to deposit a conductive coating having specific material properties onto a substrate surface on which the conductive coating cannot be readily deposited. For example, pure or substantially pure magnesium typically cannot be readily deposited onto some organic surface due to low sticking coefficients of magnesium on some organic surfaces. Accordingly, in some embodiments, the substrate surface is further treated by depositing a nucleation promoting coating thereon prior to depositing the conductive coating.

Based on findings and experimental observations, it is postulated that fullerenes and other nucleation promoting materials, as will be explained further herein, act as nucleation sites for the deposition of a conductive coating including magnesium. For example, in cases where magnesium is deposited using an evaporation process on a fullerene treated surface, the fullerene molecules act as nucleation sites that promote formation of stable nuclei for magnesium deposition. Less than a monolayer of fullerene or other nucleation promoting material may be provided on the treated surface to act as nucleation sites for deposition of magnesium in some cases. As will be understood, treating the surface by depositing several monolayers of a nucleation promoting material may result in a higher number of nucleation sites, and thus a higher initial sticking probability. Other examples of nucleation promoting materials include, but are not limited to, metals such as Ag and Yb, and metal oxides such as ITO (indium tin oxide) and IZO (indium zinc oxide).

It will also be appreciated that an amount of fullerene or other material deposited on a surface may be more, or less, than one monolayer. For example, the surface may be treated by depositing 0.1 monolayer, 1 monolayer, 10 monolayers, or more of a nucleation promoting material or a nucleation inhibiting material. As used herein, depositing 1 monolayer of a material refers to an amount of the material to cover a desired area of a surface with a single layer of constituent molecules or atoms of the material. Similarly, as used herein, depositing 0.1 monolayer of a material refers to an amount of the material to cover 10% of a desired area of a surface with a single layer of constituent molecules or atoms of the material. Due to, for example, possible stacking or clustering of molecules or atoms, an actual thickness of a deposited material may be non-uniform. For example, depositing 1 monolayer of a material may result in some regions of a surface being uncovered by the material, while other regions of the surface may have multiple atomic or molecular layers deposited thereon. In some embodiments, the thickness of the nucleation promoting coating may be between about 1 nm and about 5 nm or between about 1 nm and about 3 nm.

As used herein, the term "fullerene" refers to a material including carbon molecules. Examples of fullerene molecules include carbon cage molecules including a three-dimensional skeleton that includes multiple carbon atoms, which form a closed shell, and which can be spherical or semi-spherical in shape. A fullerene molecule can be designated as $C_n$, where n is an integer corresponding to a number of carbon atoms included in a carbon skeleton of the fullerene molecule. Examples of fullerene molecules include $C_n$, where n is in the range of 50 to 250, such as $C_{60}$, $C_{70}$, $C_{72}$, $C_{74}$, $C_{76}$, $C_{78}$, $C_{80}$, $C_{82}$, and $C_{84}$. Additional examples of fullerene molecules include carbon molecules in a tube or cylindrical shape, such as single-walled carbon nanotubes and multi-walled carbon nanotubes.

Figure 4:
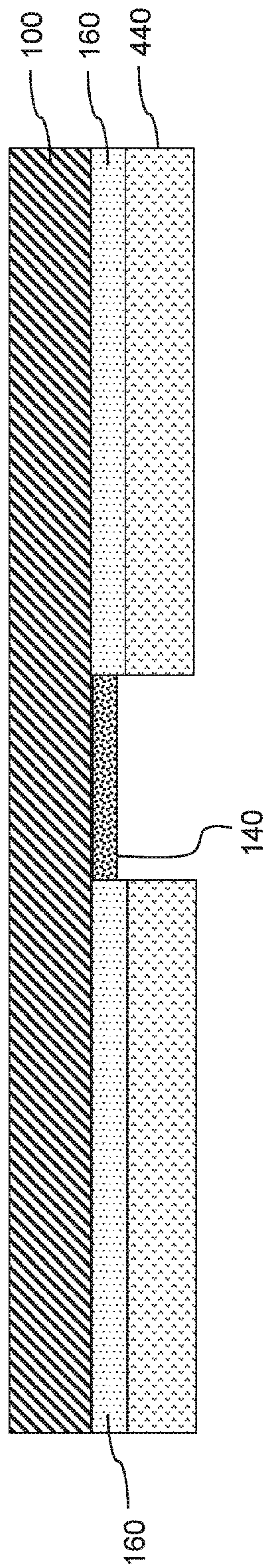
FIG. 4 is a diagram illustrating a device produced, according to one embodiment of a process.

FIG. 4 illustrates an embodiment of a device in which a nucleation promoting coating 160 is deposited prior to the deposition of a conductive coating 440. As illustrated in FIG. 4, the nucleation promoting coating 160 is deposited over regions of the substrate 100 that are uncovered by a nucleation inhibiting coating 140. Accordingly, when the conductive coating 440 is deposited, the conductive coating 440 forms preferentially over the nucleation promoting coating 160. For example, an initial deposition rate of a material of the conductive coating 440 on a surface of the nucleation promoting coating 160 may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of the material on a surface of the nucleation inhibiting coating 140. In general, the nucleation promoting coating 160 may be deposited on the substrate 100 prior to, or following, the deposition of the nucleation inhibiting coating 140. Various processes for selectively depositing a material on a surface may be used to deposit the nucleation promoting coating 160 including, but not limited to, evaporation (including thermal evaporation and electron beam evaporation), photolithography, printing (including ink or vapor jet printing, reel-to-reel printing, and micro-contact transfer printing), OVPD, LITI patterning, and combinations thereof.

Figure 5A:
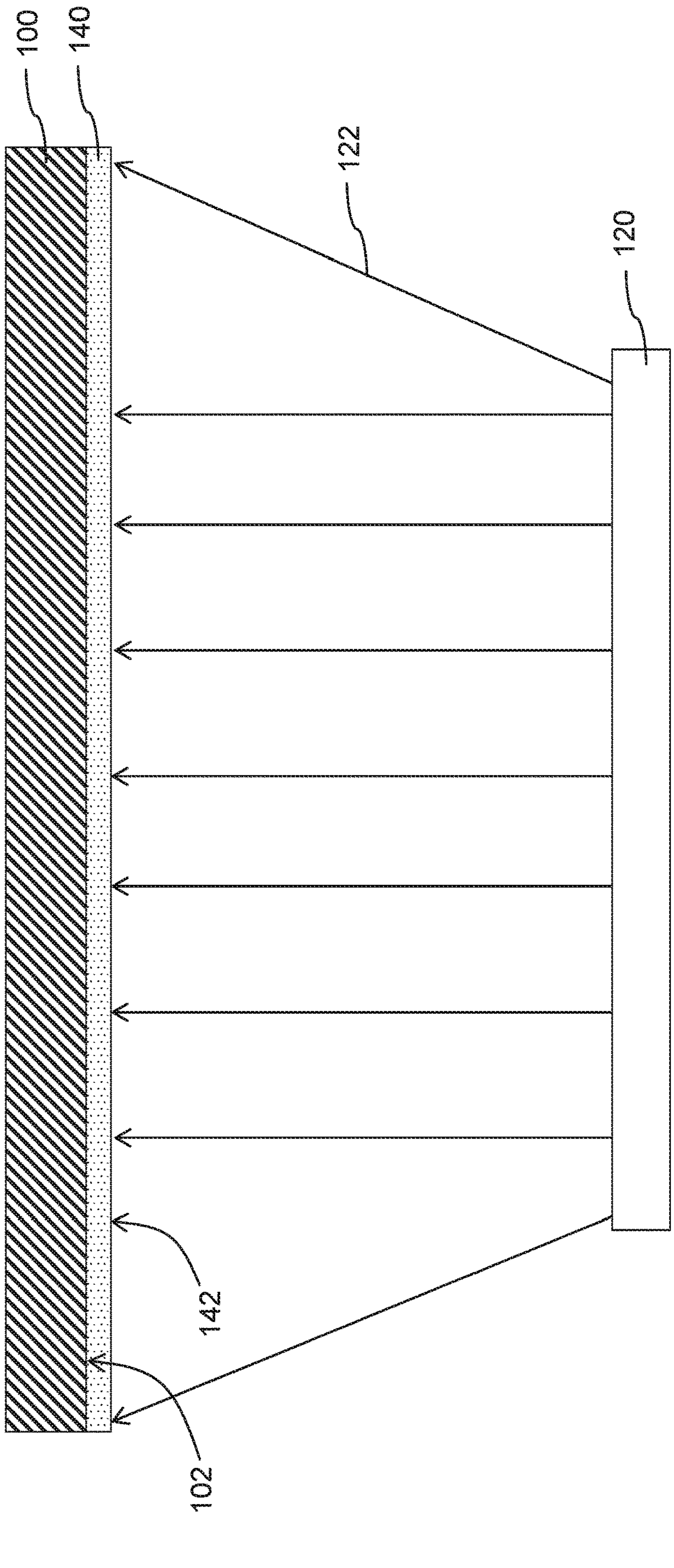
FIGS. 5A-5C are schematic diagrams illustrating a process for selectively depositing a conductive coating according to one embodiment.
Figure 5B:
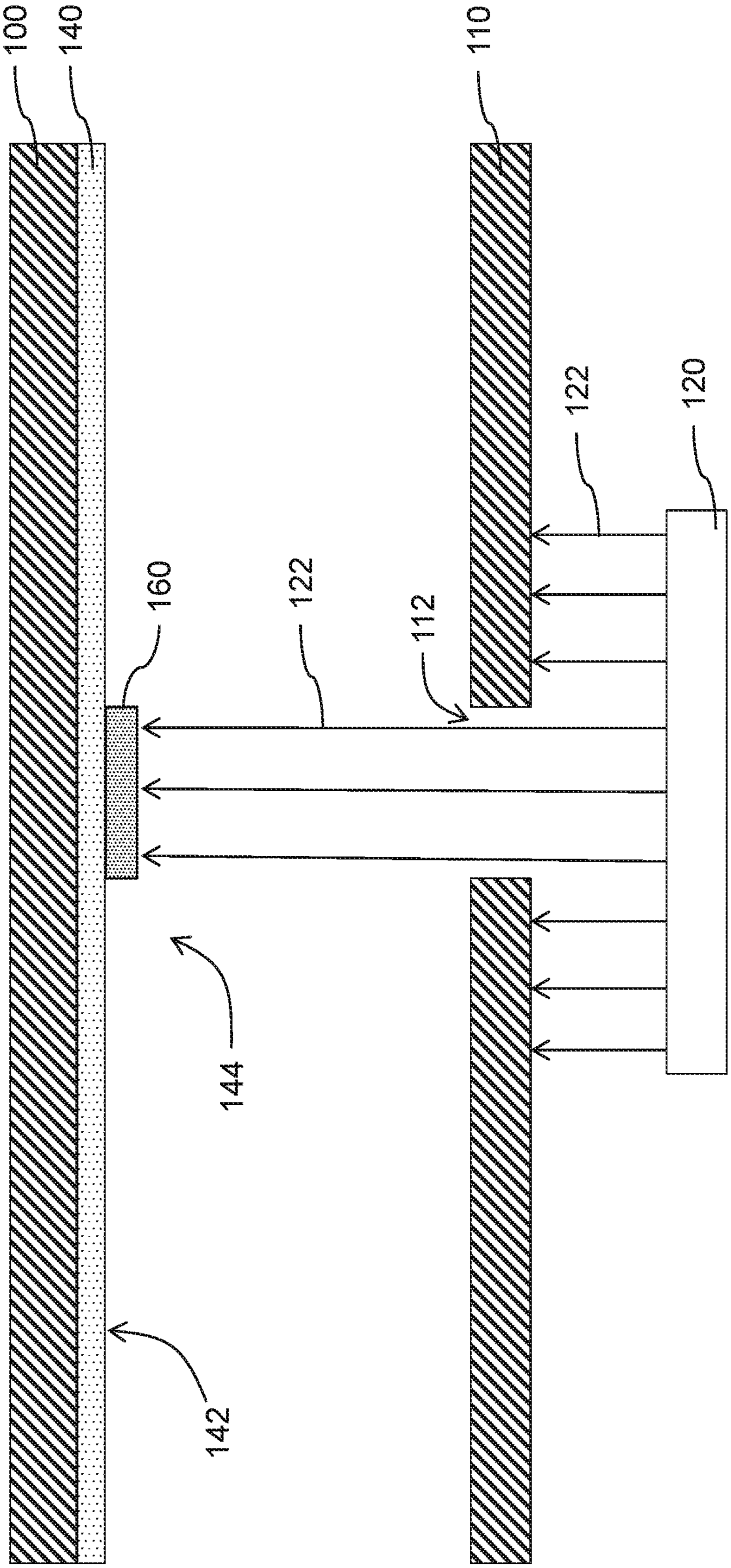
Figure 5C:
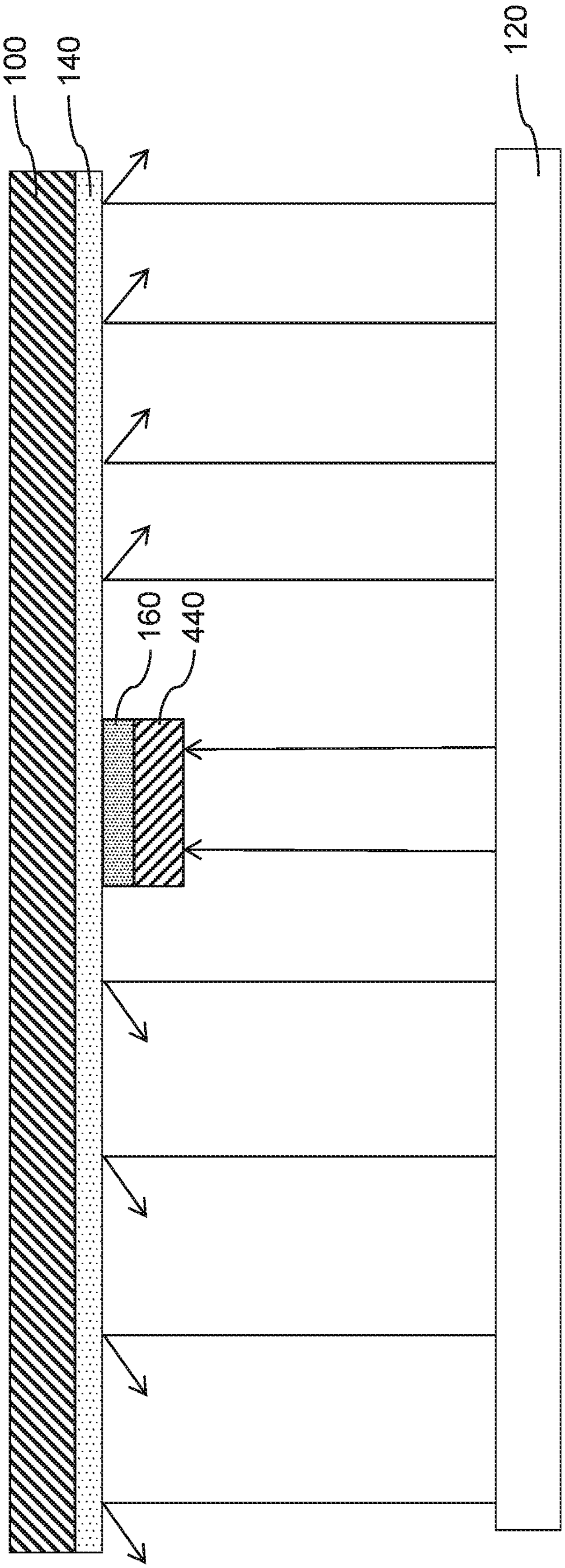

FIGS. 5A-5C illustrate a process for depositing a conductive coating onto a surface of a substrate in one embodiment.

In FIG. 5A, a surface 102 of a substrate 100 is treated by depositing a nucleation inhibiting coating 140 thereon. Specifically, in the illustrated embodiment, deposition is achieved by evaporating a source material inside a source 120, and directing the evaporated source material towards the surface 102 to be deposited thereon. The general direction in which the evaporated flux is directed towards the surface 102 is indicated by arrow 122. As illustrated, deposition of the nucleation inhibiting coating 140 may be performed using an open mask or without a mask, such that the nucleation inhibiting coating 140 substantially covers the entire surface 102 to produce a treated surface 142. Alternatively, the nucleation inhibiting coating 140 may be selectively deposited onto a region of the surface 102 using, for example, a selective deposition technique described above.

While the nucleation inhibiting coating 140 is illustrated as being deposited by evaporation, it will be appreciated that other deposition and surface coating techniques may be used, including but not limited to spin coating, dip coating, printing, spray coating, OVPD, LITI patterning, physical vapor deposition (PVD) (including sputtering), chemical vapor deposition (CVD), and combinations thereof.

In FIG. 5B, a shadow mask 110 is used to selectively deposit a nucleation promoting coating 160 on the treated surface 142. As illustrated, an evaporated source material travelling from the source 120 is directed towards the substrate 100 through the mask 110. The mask includes an aperture or slit 112 such that a portion of the evaporated source material incident on the mask 110 is prevented from traveling past the mask 110, and another portion of the evaporated source material directed through the aperture 112 of the mask 110 selectively deposits onto the treated surface 142 to form the nucleation promoting coating 160. Accordingly, a patterned surface 144 is produced upon completing the deposition of the nucleation promoting coating 160.

FIG. 5C illustrates a stage of depositing a conductive coating 440 onto the patterned surface 144. The conductive coating 440 may include, for example, pure or substantially pure magnesium. As will be explained further below, a material of the conductive coating 440 exhibits a relatively low initial sticking coefficient with respect to the nucleation inhibiting coating 140 and a relatively high initial sticking coefficient with respect to the nucleation promoting coating 160. Accordingly, the deposition may be performed using an open mask or without a mask to selectively deposit the conductive coating 440 onto regions of the substrate 100 where the nucleation promoting coating 160 is present. As illustrated in FIG. 5C, an evaporated material of the conductive coating 440 that is incident on a surface of the nucleation inhibiting coating 140 may be largely or substantially prevented from being deposited onto the nucleation inhibiting coating 140.

Figure 5D:
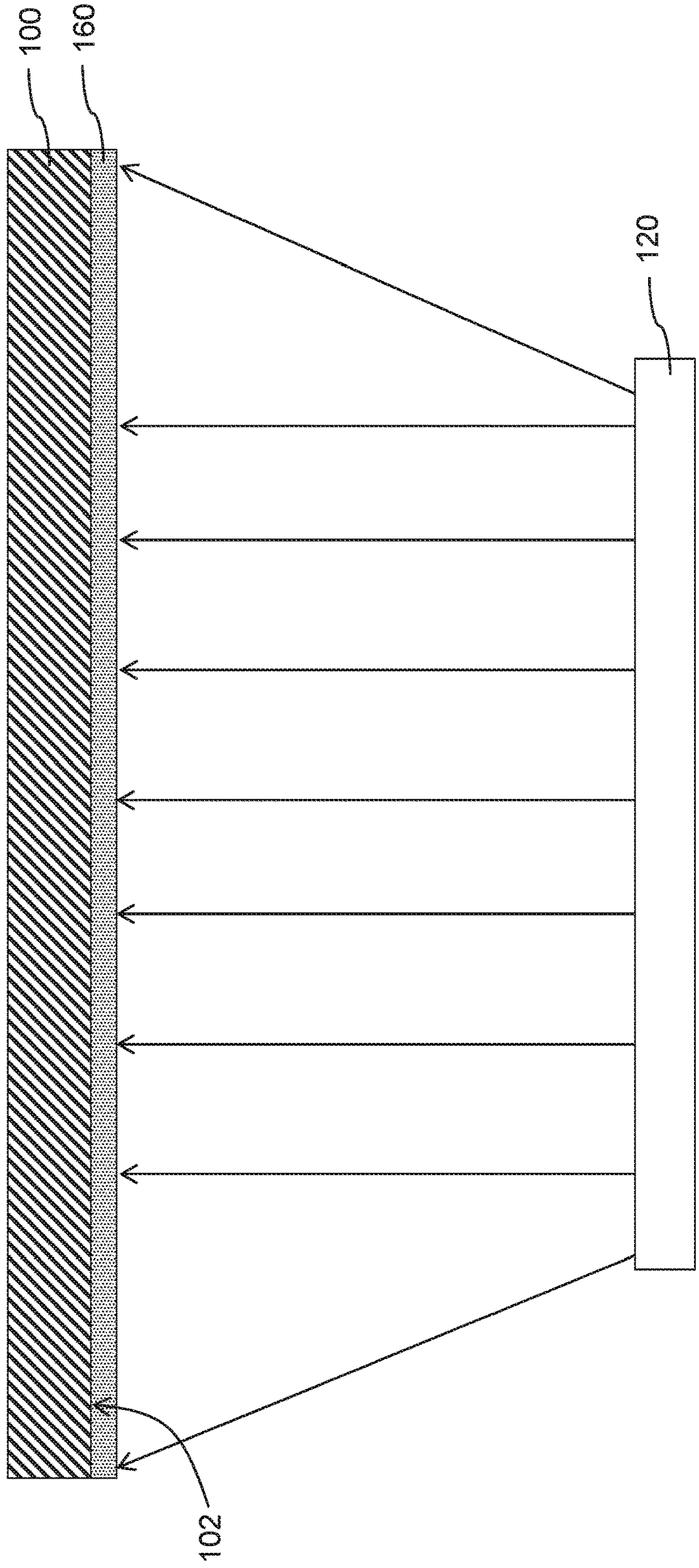
FIGS. 5D-5F are schematic diagrams illustrating a process for selectively depositing a conductive coating, according to another embodiment.
Figure 5E:
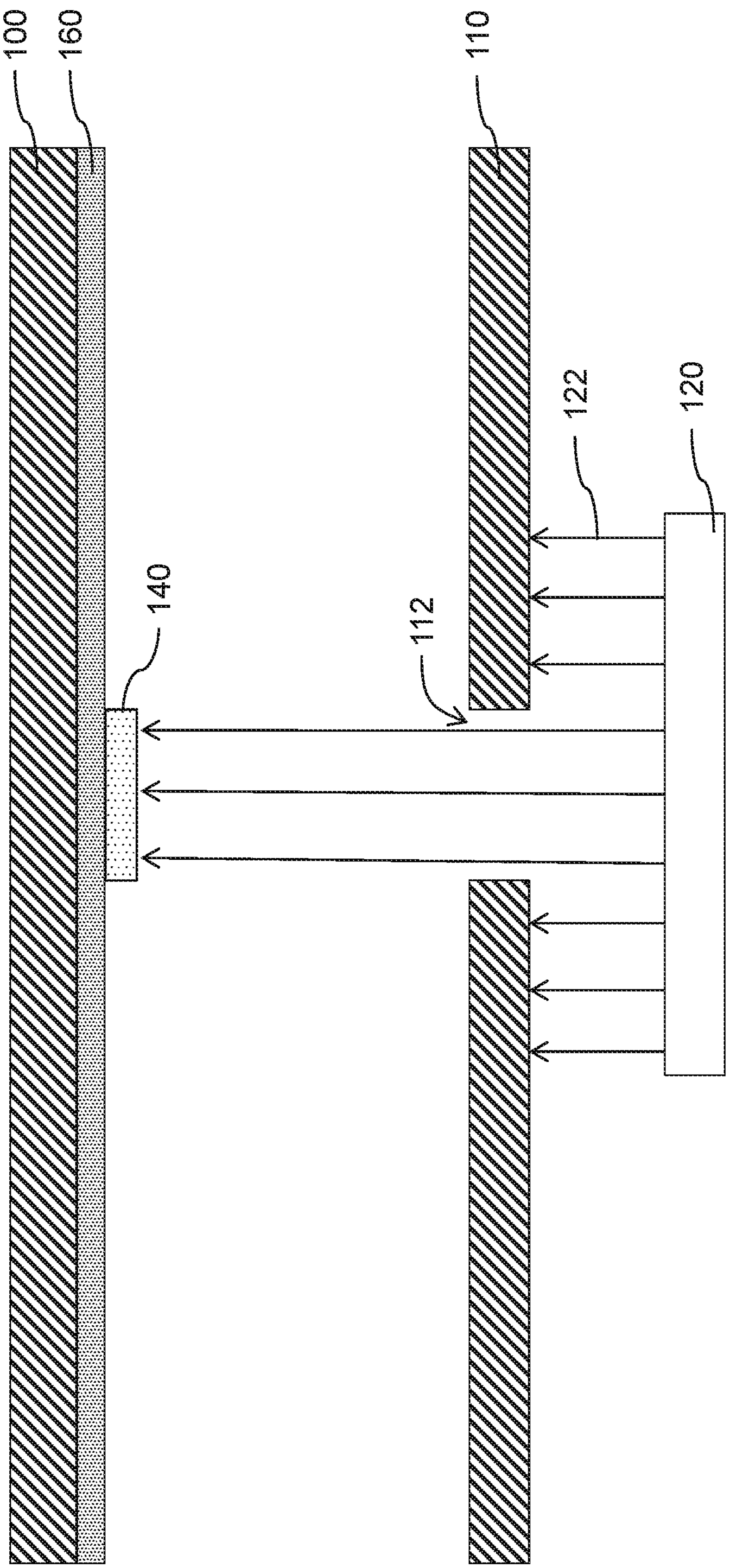
Figure 5F:
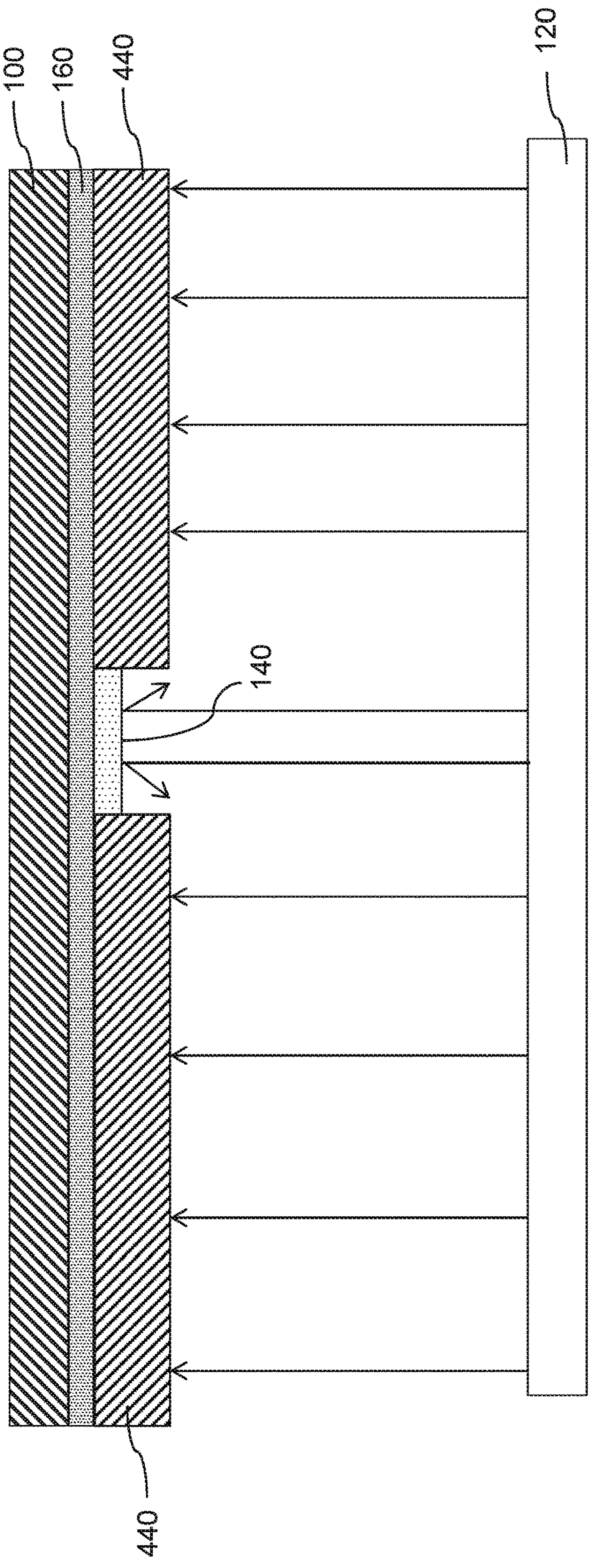

FIGS. 5D-5F illustrate a process for depositing a conductive coating onto a surface of a substrate in another embodiment.

In FIG. 5D, a nucleation promoting coating 160 is deposited on a surface 102 of a substrate 100. For example, the nucleation promoting coating 160 may be deposited by thermal evaporation using an open mask or without a mask. Alternatively, other deposition and surface coating techniques may be used, including but not limited to spin coating, dip coating, printing, spray coating, OVPD, LITI patterning, PVD (including sputtering), CVD, and combinations thereof.

In FIG. 5E, a nucleation inhibiting coating 140 is selectively deposited over a region of the nucleation promoting coating 160 using a shadow mask 110. Accordingly, a patterned surface is produced upon completing the deposition of the nucleation inhibiting coating 140. Then in FIG. 5F, a conductive coating 440 is deposited onto the patterned surface using an open mask or a mask-free deposition process, such that the conductive coating 440 is formed over exposed regions of the nucleation promoting coating 160.

In the foregoing embodiments, it will be appreciated that the conductive coating 440 formed by the processes may be used as an electrode or a conductive structure for an electronic device. For example, the conductive coating 440 may be an anode or a cathode of an organic opto-electronic device, such as an OLED device or an organic photovoltaic (OPV) device. In addition, the conductive coating 440 may also be used as an electrode for opto-electronic devices including quantum dots as an active layer material. For example, such a device may include an active layer disposed between a pair of electrodes with the active layer including quantum dots. The device may be, for example, an electroluminescent quantum dot display device in which light is emitted from the quantum dot active layer as a result of current provided by the electrodes. The conductive coating 440 may also be a busbar or an auxiliary electrode for any of the foregoing devices.

Accordingly, it will be appreciated that the substrate 100 onto which various coatings are deposited may include one or more additional organic and/or inorganic layers not specifically illustrated or described in the foregoing embodiments. For example, in the case of an OLED device, the substrate 100 may include one or more electrodes (e.g., an anode and/or a cathode), charge injection and/or transport layers, and an electroluminescent layer. The substrate 100 may further include one or more transistors and other electronic components such as resistors and capacitors, which are included in an active-matrix or a passive-matrix OLED device. For example, the substrate 100 may include one or more top-gate thin-film transistors (TFTs), one or more bottom-gate TFTs, and/or other TFT structures. A TFT may be an n-type TFT or a p-type TFT. Examples of TFT structures include those including amorphous silicon (a-Si), indium gallium zinc oxide (IGZO), and low-temperature polycrystalline silicon (LTPS).

The substrate 100 may also include a base substrate for supporting the above-identified additional organic and/or inorganic layers. For example, the base substrate may be a flexible or rigid substrate. The base substrate may include, for example, silicon, glass, metal, polymer (e.g., polyimide), sapphire, or other materials suitable for use as the base substrate.

The surface 102 of the substrate 100 may be an organic surface or an inorganic surface. For example, if the conductive coating 440 is for use as a cathode of an OLED device, the surface 102 may be a top surface of a stack of organic layers (e.g., a surface of an electron injection layer). In another example, if the conductive coating 440 is for use as an auxiliary electrode of a top-emission OLED device, the surface 102 may be a top surface of an electrode (e.g., a common cathode). Alternatively, such an auxiliary electrode may be formed directly beneath a transmissive electrode on top of a stack of organic layers.

Figure 6:
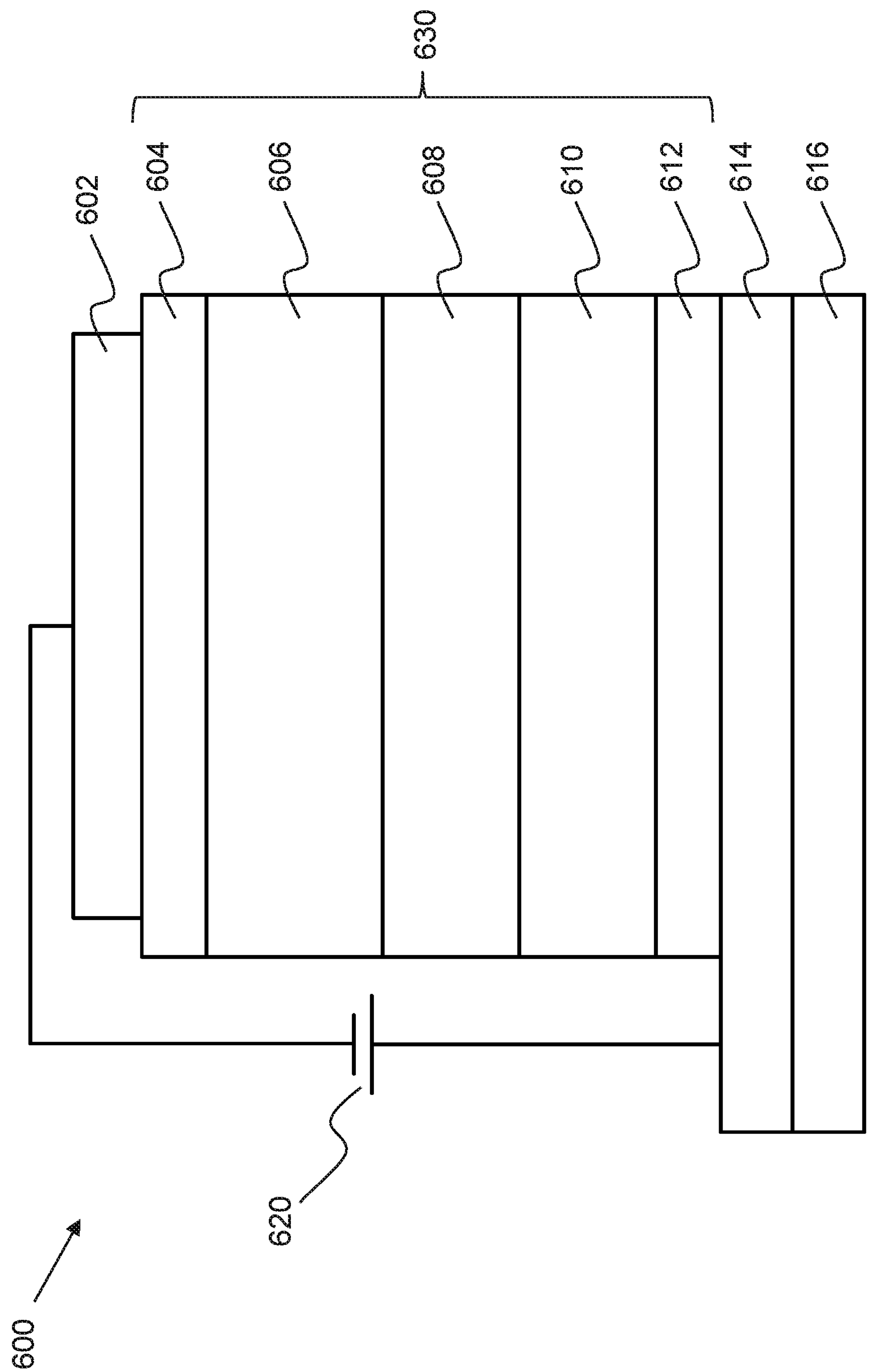
FIG. 6 is a diagram illustrating an electroluminescent device, according to one embodiment.

FIG. 6 illustrates an electroluminescent (EL) device 600 according to one embodiment. The EL device 600 may be, for example, an OLED device or an electroluminescent quantum dot device. In one embodiment, the device 600 is an OLED device including a base substrate 616, an anode 614, semiconducting layers 630, and a cathode 602. In the illustrated embodiment, the semiconducting layers 630 include a hole injection layer 612, a hole transport layer 610, an electroluminescent layer 608, an electron transport layer 606, and an electron injection layer 604. Since the semiconducting layers 630 in an OLED device typically includes organic semiconducting materials, the semiconducting layers 630 may be interchangeably referred to as organic layers herein.

The hole injection layer 612 may be formed using a hole injection material which generally facilitates the injection of holes by the anode 614. The hole transport layer 610 may be formed using a hole transport material, which is generally a material that exhibits high hole mobility.

The electroluminescent layer 608 may be formed, for example, by doping a host material with an emitter material. The emitter material may be a fluorescent emitter, a phosphorescent emitter, or a TADF emitter, for example. A plurality of emitter materials may also be doped into the host material to form the electroluminescent layer 608.

The electron transport layer 606 may be formed using an electron transport material which generally exhibits high electron mobility. The electron injection layer 604 may be formed using an electron injection material, which generally acts to facilitate the injection of electrons by the cathode 602.

It will be understood that the structure of the device 600 may be varied by omitting or combining one or more layers. Specifically, one or more of the hole injection layer 612, the hole transport layer 610, the electron transport layer 606, and the electron injection layer 604 may be omitted from the device structure. One or more additional layers may also be present in the device structure. Such additional layers include, for example, a hole blocking layer, an electron blocking layer, and additional charge transport and/or injection layers. Each layer may further include any number of sub-layers, and each layer and/or sub-layer may include various mixtures and composition gradients. It will also be appreciated that the device 600 may include one or more layers containing inorganic and/or organometallic materials, and is not limited to devices composed solely of organic materials. For example, the device 600 may include quantum dots.

The device 600 may be connected to a power source 620 for supplying current to the device 600.

In another embodiment where the device 600 is an EL quantum dot device, the EL layer 608 generally includes quantum dots, which emit light when current is supplied.

Figure 7:
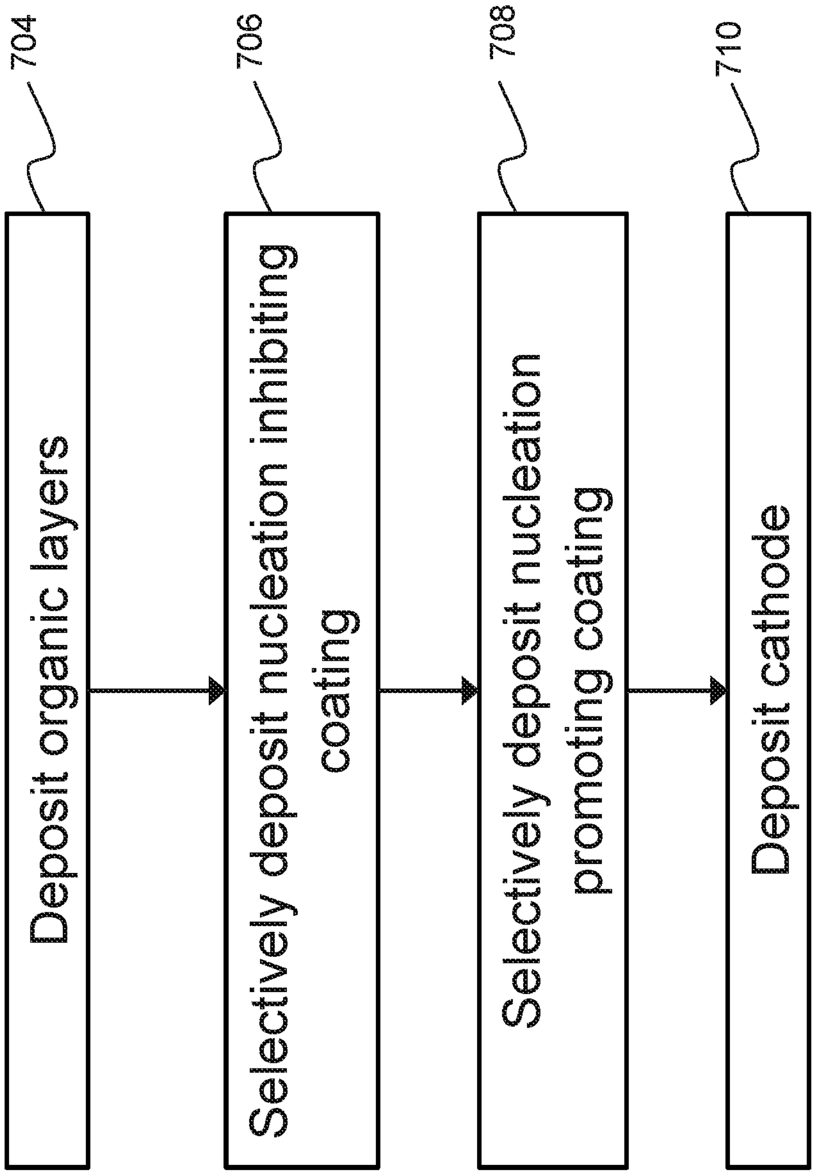
FIG. 7 is a flow diagram showing process stages, according to one embodiment.

FIG. 7 is a flow diagram outlining stages of fabricating an OLED device according to one embodiment. In 704, organic layers are deposited on a target surface. For example, the target surface may be a surface of an anode that has been deposited on top of a base substrate, which may include, for example, glass, polymer, and/or metal foil. As discussed above, the organic layers may include, for example, a hole injection layer, a hole transport layer, an electroluminescence layer, an electron transport layer, and an electron injection layer. A nucleation inhibiting coating is then deposited on top of the organic layers in stage 706 using a selective deposition or patterning process. In stage 708, a nucleation promoting coating is selectively deposited on the nucleation inhibiting coating to produce a patterned surface. For example, the nucleation promoting coating and the nucleation inhibiting coating may be selectively deposited by evaporation using a mask, micro-contact transfer printing process, photolithography, printing (including ink or vapor jet printing and reel-to-reel printing), OVPD, or LITI patterning. A conductive coating is then deposited on the patterned surface using an open mask or a mask-free deposition process in stage 710. The conductive coating may serve as a cathode or another conductive structure of the OLED device.

In another embodiment, deposition of the nucleation inhibiting coating in stage 706 may be conducted using an open mask, or without a mask. In yet another embodiment, deposition of the nucleation promoting coating in step 708 may be conducted prior to deposition of the nucleation inhibiting coating in step 706. In yet another embodiment, deposition of the nucleation promoting coating in step 708 may be conducted using an open mask, or without a mask, prior to selective deposition of the nucleation inhibiting coating in step 706.

For the sake of simplicity and clarity, details of deposited materials including thickness profiles and edge profiles have been omitted from the process diagrams.

In accordance with the above-described embodiments, a conductive coating may be selectively deposited on target regions using an open mask or a mask-free deposition process, through the use of a nucleation inhibiting coating or a combination of nucleation inhibiting and nucleation promoting coatings.

It will also be appreciated that an open mask used for deposition of any of various layers or coatings, including a conductive coating, a nucleation inhibiting coating, and a nucleation promoting coating, may "mask" or prevent deposition of a material on certain regions of a substrate. However, unlike a fine metal mask (FMM) used to form relatively small features with a feature size on the order of tens of microns or smaller, a feature size of an open mask is generally comparable to the size of an OLED device being manufactured. For example, the open mask may mask edges of a display device during manufacturing, which would result in the open mask having an aperture that approximately corresponds to a size of the display device (e.g. about 1 inch for micro-displays, about 4-6 inches for mobile displays, about 8-17 inches for laptop or tablet displays, and so forth). For example, the feature size of an open mask may be on the order of about 1 cm or greater. Accordingly, an aperture formed in an open mask is typically sized to encompass a plurality of emissive regions or pixels, which together form the display device.

Figure 8A:
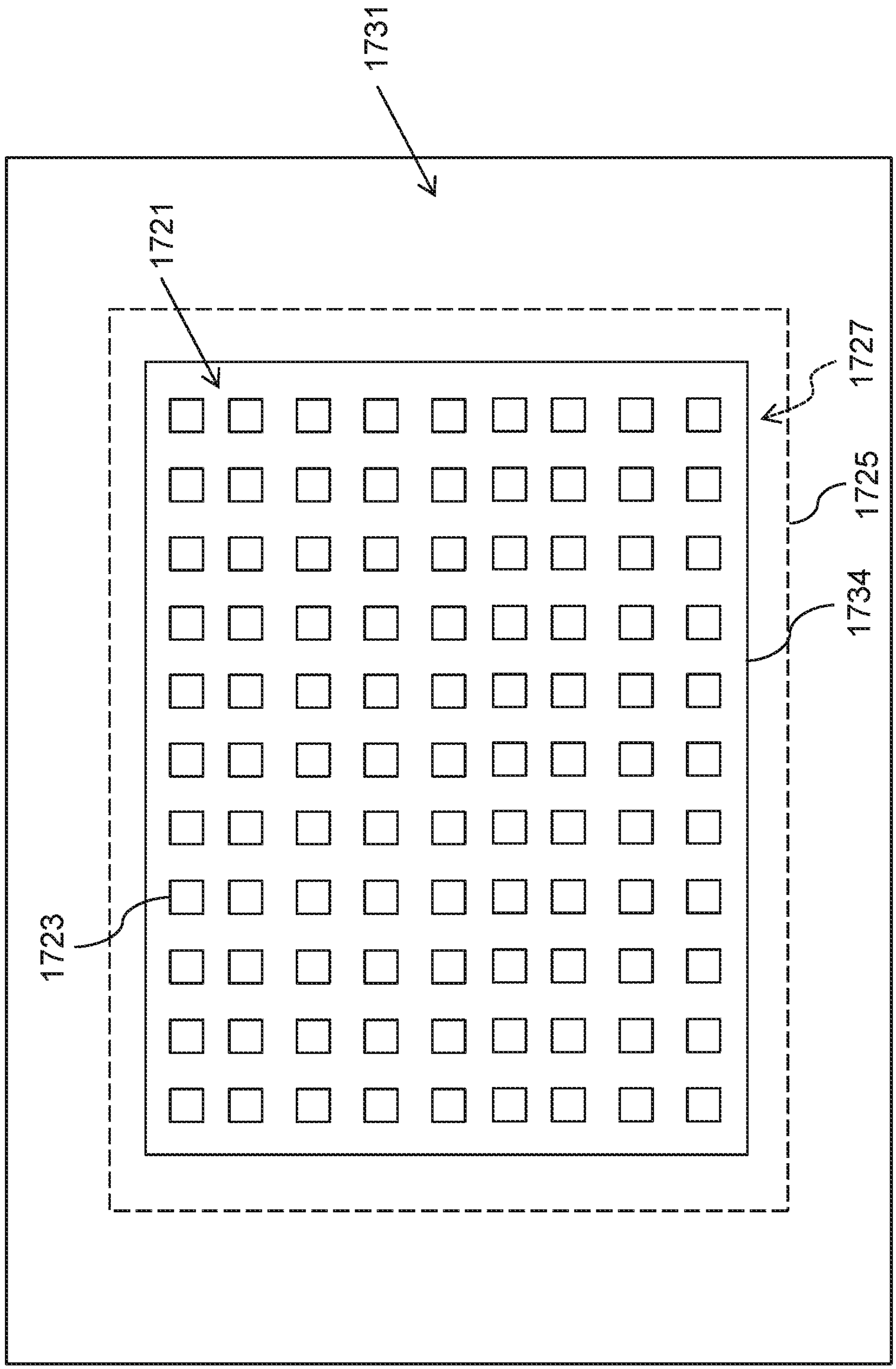
FIG. 8A is a top view illustrating an open mask, according to one example.

FIG. 8A illustrates an example of an open mask 1731 having or defining an aperture 1734 formed therein. In the illustrated example, the aperture 1734 of the mask 1731 is smaller than a size of a device 1721, such that, when the mask 1731 is overlaid, the mask 1731 covers edges of the device 1721. Specifically, in the illustrated embodiments, all or substantially all emissive regions or pixels 1723 of the device 1721 are exposed through the aperture 1734, while an unexposed region 1727 is formed between outer edges 1725 of the device 1721 and the aperture 1734. As would be appreciated, electrical contacts or other device components may be located in the unexposed region 1727 such that these components remain unaffected through the open mask deposition process.

Figure 8B:
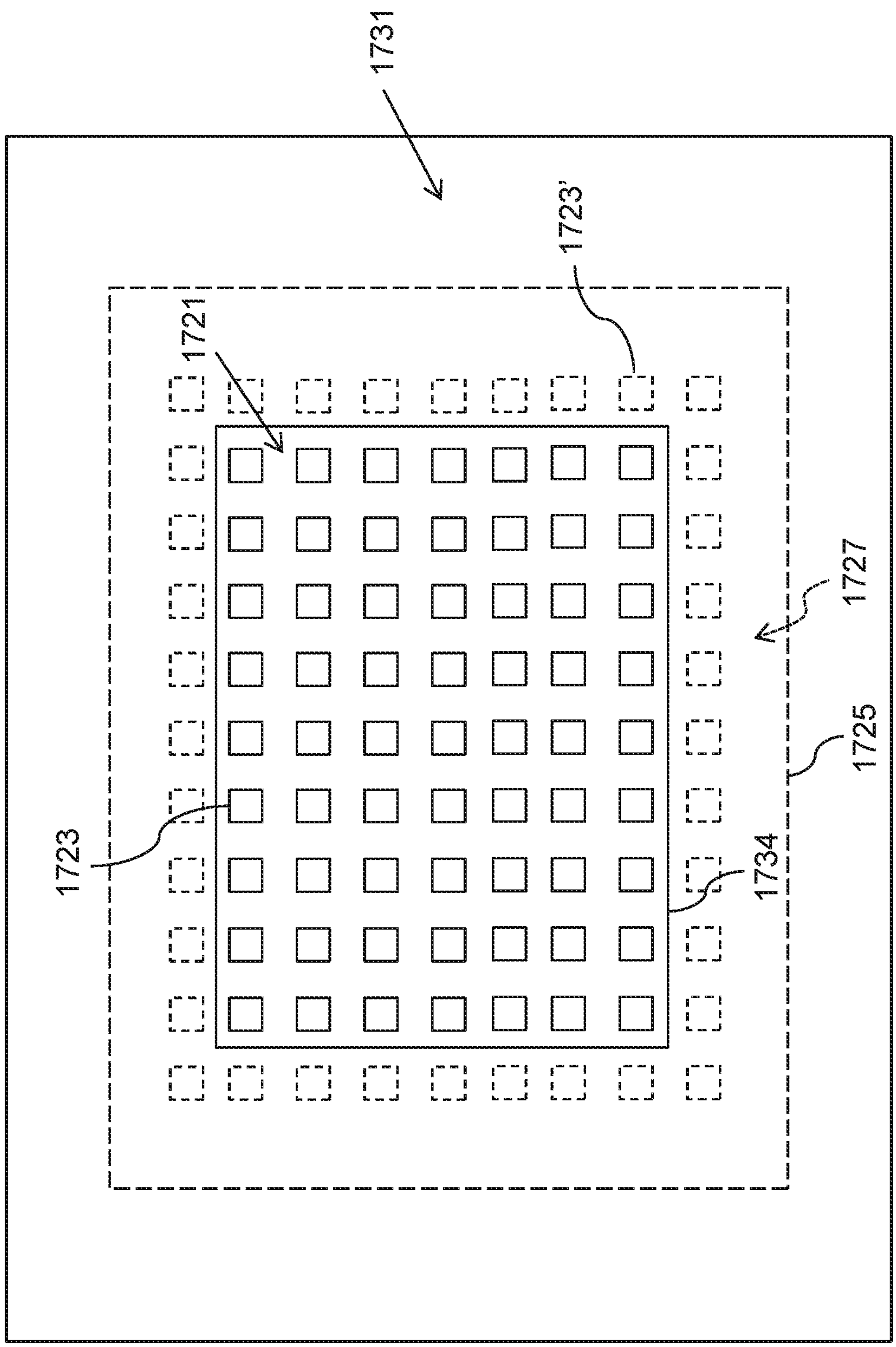
FIG. 8B is a top view illustrating an open mask, according to another example.

FIG. 8B illustrates another example of an open mask 1731 where an aperture 1734 of the mask 1731 is smaller than that of FIG. 16B, such that the mask 1731 covers at least some emissive regions or pixels 1723 of a device 1721 when overlaid. Specifically, outer-most pixels 1723' are illustrated as being located within an unexposed region 1727 of the device 1721 formed between the aperture 1734 of the mask 1731 and outer edges 1725 of the device 1721.

Figure 8C:
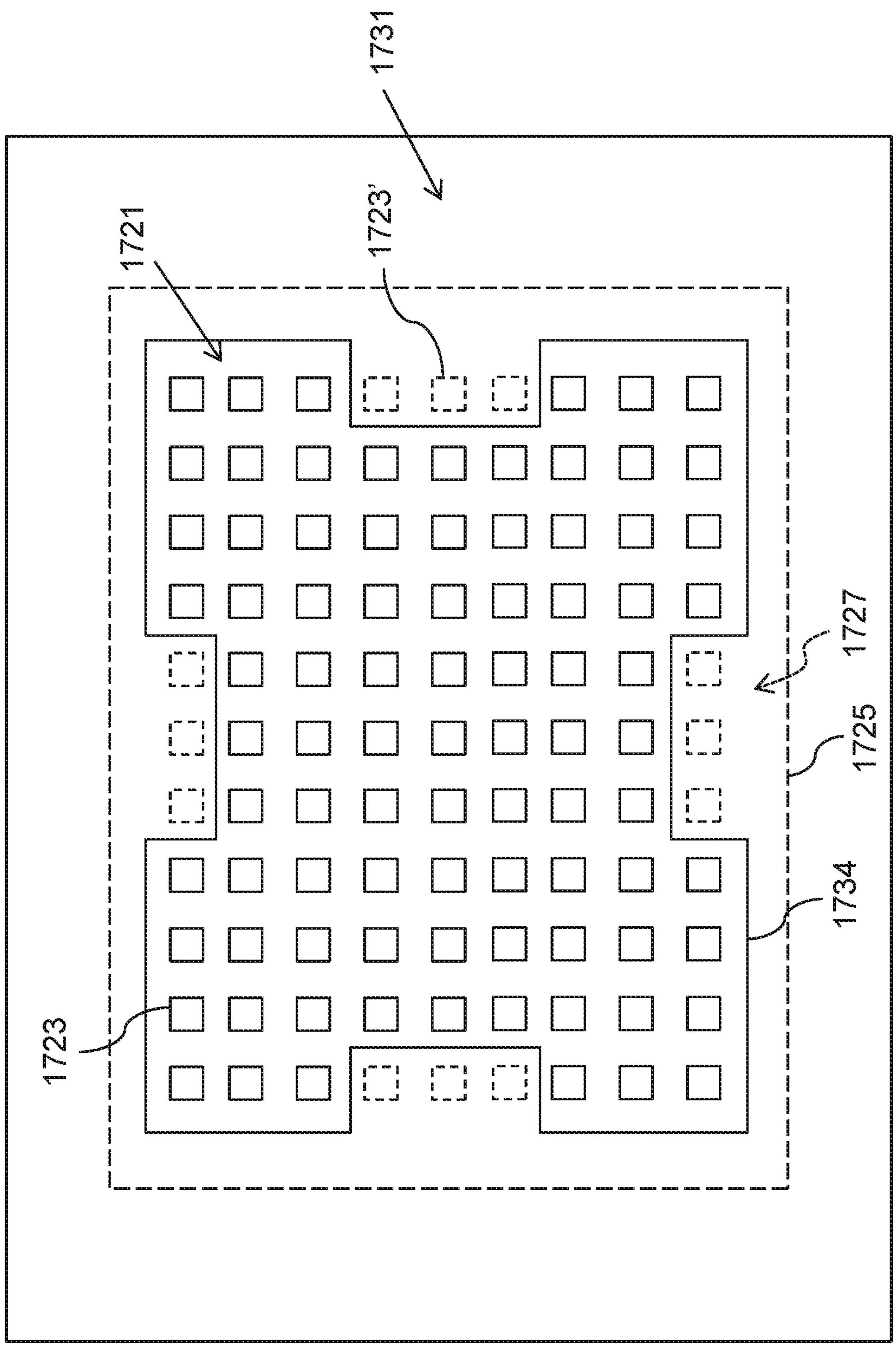
FIG. 8C is a top view illustrating an open mask, according to yet another example.

FIG. 8C illustrates yet another example of an open mask 1731 wherein an aperture 1734 of the mask 1731 defines a pattern, which covers some pixels 1723' while exposing other pixels 1723 of a device 1721. Specifically, the pixels 1723' located within an unexposed region 1727 of the device 1721 (formed between the aperture 1734 and outer edges 1725) are masked during the deposition process to inhibit a vapor flux from being incident on the unexposed region 1727.

While outer-most pixels have been illustrated as being masked in the examples of FIGS. 8A-8C, it will be appreciated that an aperture of an open mask may be shaped to mask other emissive and non-emissive regions of a device. Furthermore, while an open mask has been illustrated in the foregoing examples as having one aperture, the open mask may also include additional apertures for exposing multiple regions of a substrate or a device.

Figure 8D:
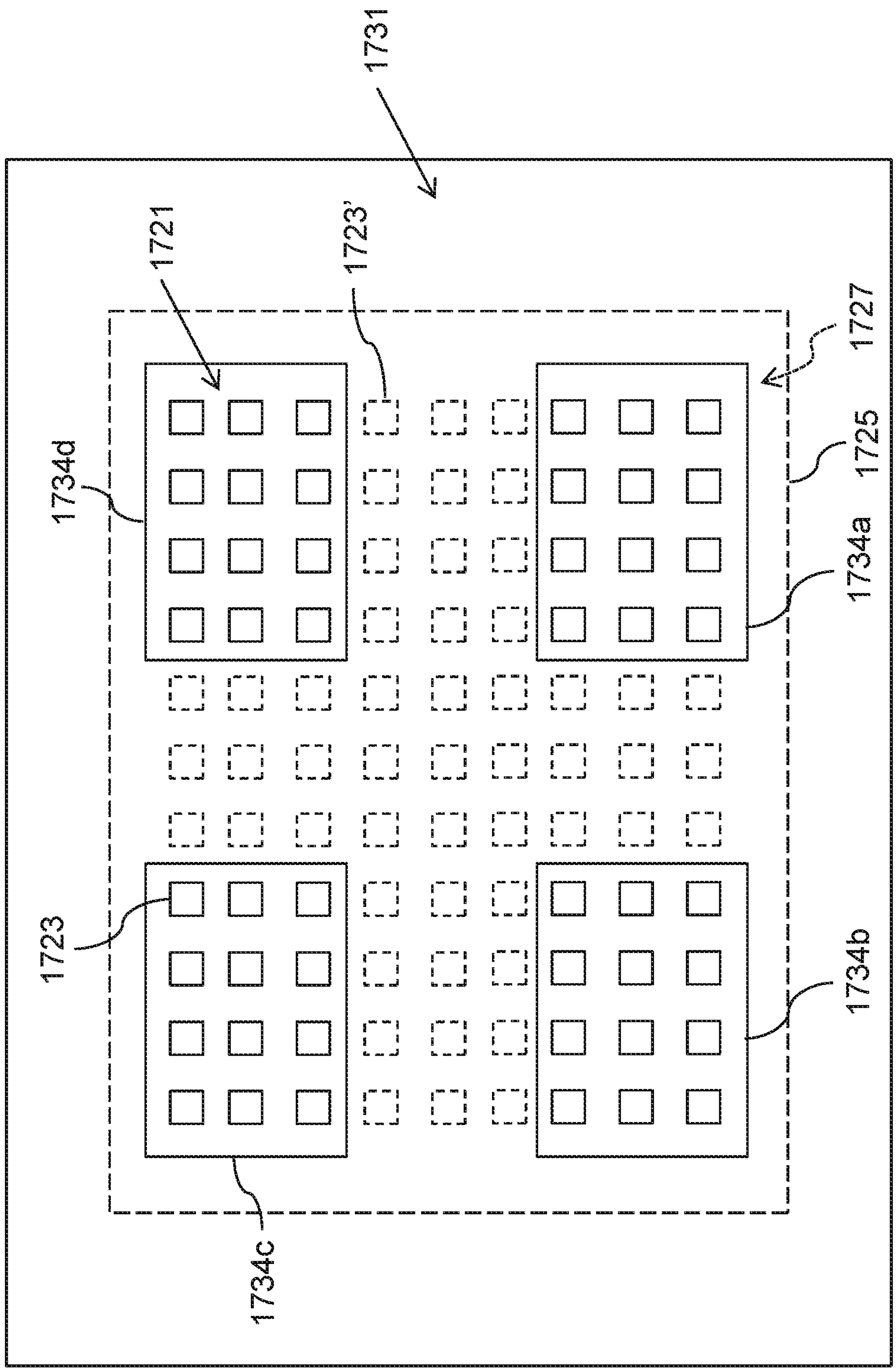
FIG. 8D is a top view illustrating an open mask, according to yet another example.

FIG. 8D illustrates another example of an open mask 1731, where the mask 1731 has or defines a plurality of apertures 1734*a*-1734*d*. The apertures 1734*a*-1734*d* are positioned such that they selectively expose certain regions of a device 1721 while masking other regions. For example, certain emissive regions or pixels 1723 are exposed through the apertures 1734*a-d*, while other pixels 1723' located within an unexposed region 1727 are masked.

In various embodiments described herein, it will be understood that the use of an open mask may be omitted, if desired. Specifically, an open mask deposition process described herein may alternatively be conducted without the use of a mask, such that an entire target surface is exposed.

At least some of the above embodiments have been described in reference to various layers or coatings, including a nucleation promoting coating, a nucleation inhibiting coating, and a conductive coating, being formed using an evaporation process. As will be understood, an evaporation process is a type of PVD process where one or more source materials are evaporated or sublimed under a low pressure (e.g., vacuum) environment and deposited on a target surface through de-sublimation of the one or more evaporated source materials. A variety of different evaporation sources may be used for heating a source material, and, as such, it will be appreciated that the source material may be heated in various ways. For example, the source material may be heated by an electric filament, electron beam, inductive heating, or by resistive heating. In addition, such layers or coatings may be deposited and/or patterned using other suitable processes, including photolithography, printing, OVPD, LM patterning, and combinations thereof. These processes may also be used in combination with a shadow mask to achieve various patterns.

Although certain processes have been described with reference to evaporation for purposes of depositing a nucleation promoting material, a nucleation inhibiting material, and the conductive coating, it will be appreciated that various other processes may be used to deposit these materials. For example, deposition may be conducted using other PVD processes (including sputtering), CVD processes (including plasma enhanced chemical vapor deposition (PECVD)), or other suitable processes for depositing such materials. In some embodiments, the conductive coating is deposited by heating a source material for forming the conductive coating using a resistive heater. In other embodiments, the conductive coating source material may be loaded in a heated crucible, a heated boat, a Knudsen cell (e.g., an effusion evaporator source), or any other type of evaporation source.

A deposition source material used to deposit a conductive coating may be a mixture or a compound, and, in some embodiments, at least one component of the mixture or compound is not deposited on a substrate during deposition (or is deposited in a relatively small amount compared to, for example, magnesium). In some embodiments, the source material may be a copper-magnesium (Cu—Mg) mixture or a Cu—Mg compound. In some embodiments, the source material for a magnesium deposition source includes magnesium and a material with a lower vapor pressure than magnesium, such as, for example, Cu. In other embodiments, the source material for a magnesium deposition source is substantially pure magnesium. Specifically, substantially pure magnesium can exhibit substantially similar properties (e.g., initial sticking probabilities on nucleation inhibiting and promoting coatings) compared to pure magnesium (99.99% and higher purity magnesium). For example, an initial sticking probability of substantially pure magnesium on a nucleation inhibiting coating can be within ±10% or within ±5% of an initial sticking probability of 99.99% purity magnesium on the nucleation inhibiting coating. Purity of magnesium may be about 95% or higher, about 98% or higher, about 99% or higher, or about 99.9% or higher. Deposition source materials used to deposit a conductive coating may include other metals in place of, or in combination with, magnesium. For example, a source material may include high vapor pressure materials, such as ytterbium (Yb), cadmium (Cd), zinc (Zn), or any combination thereof.

Furthermore, it will be appreciated that the processes of various embodiments may be performed on surfaces of other various organic or inorganic materials used as an electron injection layer, an electron transport layer, an electroluminescent layer, and/or a pixel definition layer (PDL) of an organic opto-electronic device. Examples of such materials include organic molecules as well as organic polymers such as those described in PCT Publication No. WO 2012/016074. It will also be understood by persons skilled in the art that organic materials doped with various elements and/or inorganic compounds may still be considered to be an organic material. It will further be appreciated by those skilled in the art that various organic materials may be used, and the processes described herein are generally applicable to an entire range of such organic materials.

It will also be appreciated that an inorganic substrate or surface can refer to a substrate or surface primarily including an inorganic material. For greater clarity, an inorganic material will generally be understood to be any material that is not considered to be an organic material. Examples of inorganic materials include metals, glasses, and minerals. Specifically, a conductive coating including magnesium may be deposited using a process according to the present disclosure on surfaces of lithium fluoride (LiF), glass and silicon (Si). Other surfaces on which the processes according to the present disclosure may be applied include those of silicon or silicone-based polymers, inorganic semiconductor materials, electron injection materials, salts, metals, and metal oxides.

It will be appreciated that a substrate may include a semiconductor material, and, accordingly, a surface of such a substrate may be a semiconductor surface. A semiconductor material may be described as a material which generally exhibits a band gap. For example, such a band gap may be formed between a highest occupied molecular orbital (HOMO) and a lowest unoccupied molecular orbital (LUMO). Semiconductor materials thus generally possess electrical conductivity that is less than that of a conductive material (e.g., a metal) but greater than that of an insulating material (e.g., a glass). It will be understood that a semiconductor material may be an organic semiconductor material or an inorganic semiconductor material.

Selective Deposition of an Electrode

Figure 9:
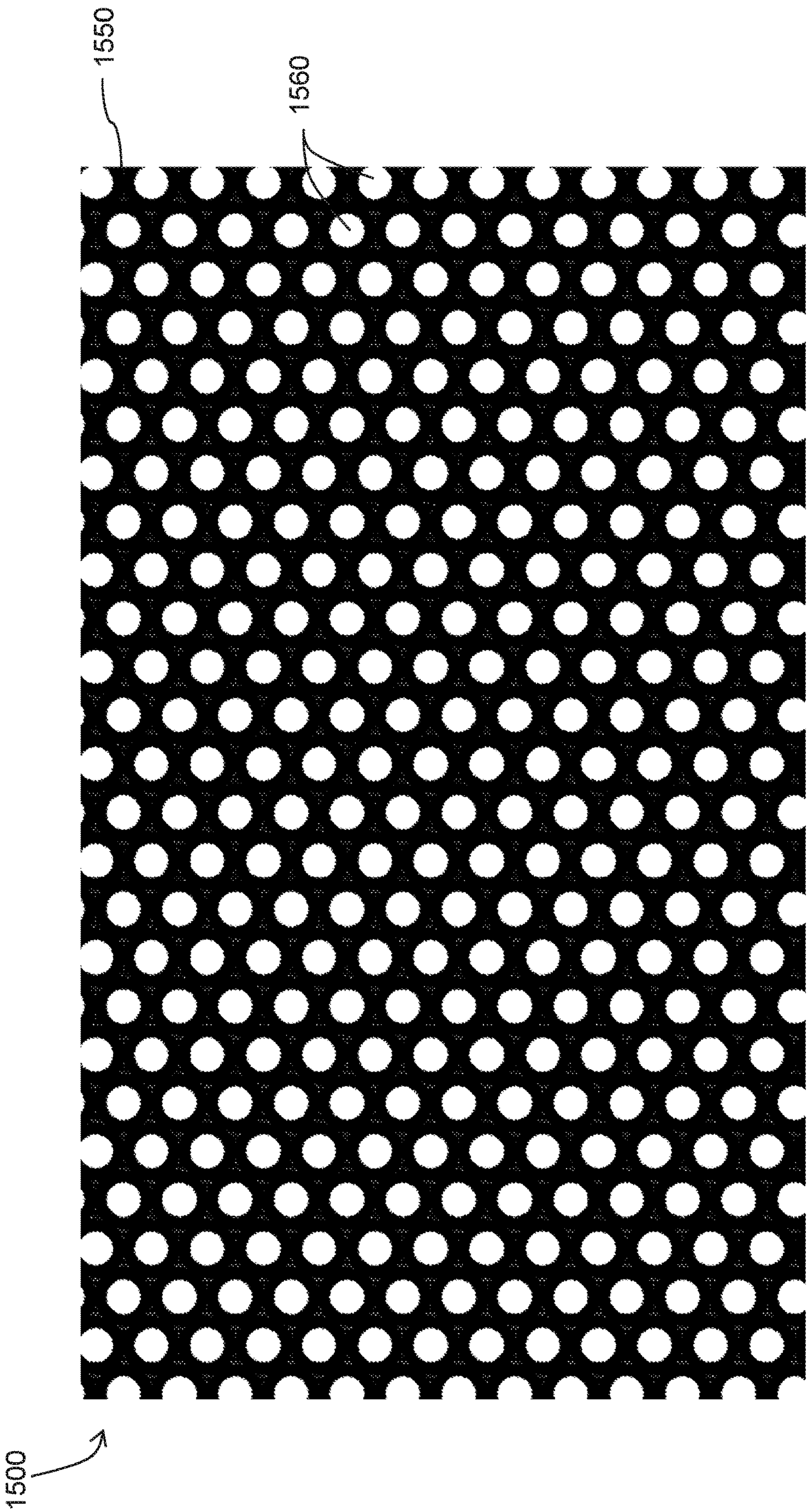
FIG. 9 is a top view of an OLED device, according to one embodiment.
Figure 10:
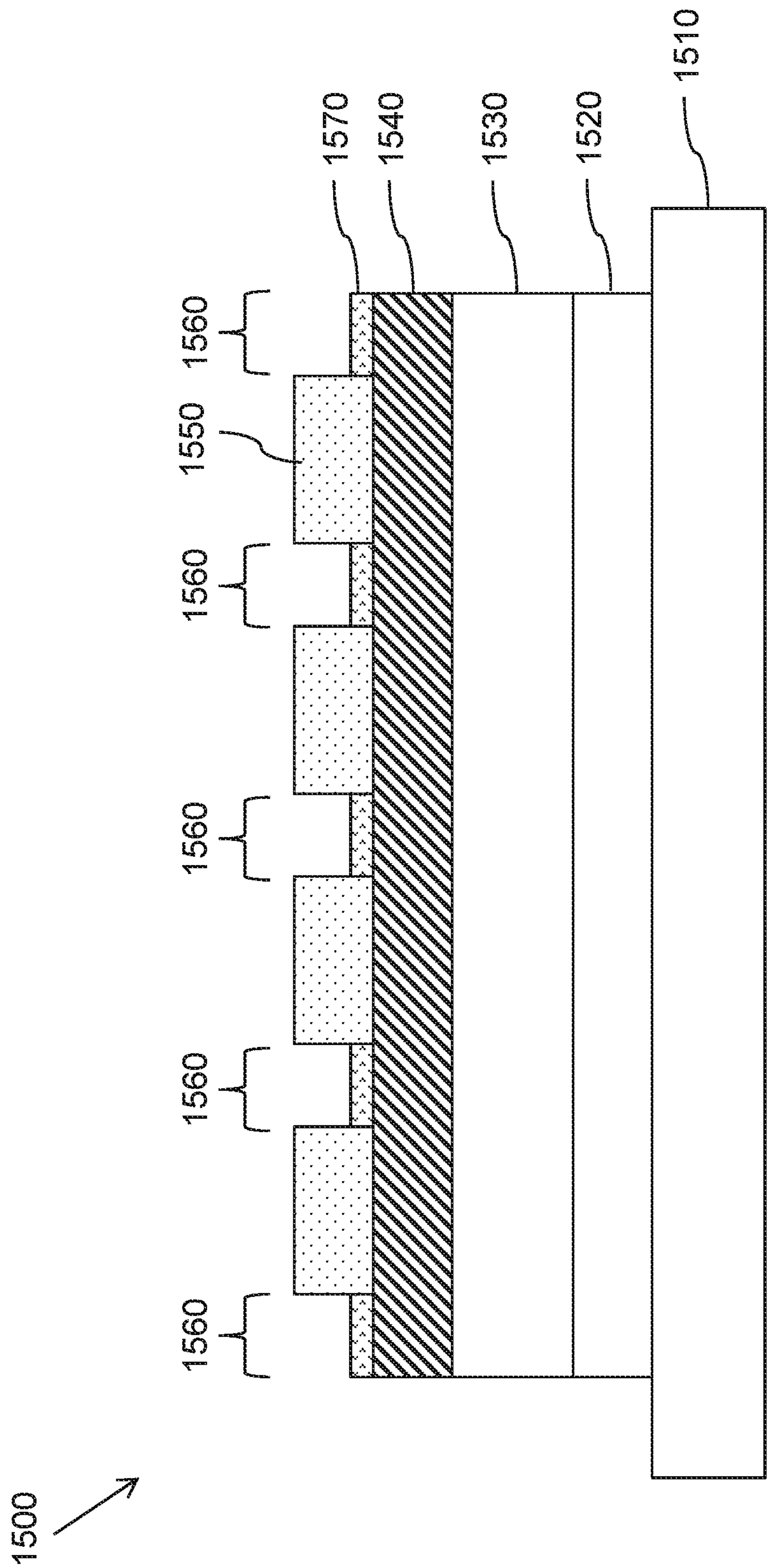
FIG. 10 is a cross-sectional view of the OLED device of FIG. 14.

FIGS. 9 and 10 illustrates an OLED device 1500 according to one embodiment. Specifically, FIG. 9 shows a top view of the OLED device 1500, and FIG. 10 illustrates a cross-sectional view of a structure of the OLED device 1500. In FIG. 9, a cathode 1550 is illustrated as a single monolithic or continuous structure having or defining a plurality of apertures or holes 1560 formed therein, which correspond to regions of the device 1500 where a cathode material was not deposited. This is further illustrated in FIG. 10, which shows the OLED device 1500 including a base substrate 1510, an anode 1520, organic layers 1530, a nucleation promoting coating 1540, a nucleation inhibiting coating 1570 selectively deposited over certain regions of the nucleation promoting coating 1540, and the cathode 1550 deposited over other regions of the nucleation promoting coating 1540 where the nucleation inhibiting coating 1570 is not present. More specifically, by selectively depositing the nucleation inhibiting coating 1570 to cover certain regions of a surface of the nucleation promoting coating 1540 during the fabrication of the device 1500, the cathode material is selectively deposited on exposed regions of the surface of the nucleation promoting coating 1540 using an open mask or a mask-free deposition process. The transparency or transmittance of the OLED device 1500 may be adjusted or modified by changing various parameters of an imparted pattern, such as an average size of the holes 1560 and a density of the holes 1560 formed in the cathode 1550. Accordingly, the OLED device 1500 may be a substantially transparent OLED device, which allows at least a portion of an external light incident on the OLED device to be transmitted there through. For example, the OLED device 1500 may be a substantially transparent OLED lighting panel. Such OLED lighting panel may be, for example, configured to emit light in one direction (e.g., either towards or away from the base substrate 1510) or in both directions (e.g., towards and away from the base substrate 1510).

Figure 11:
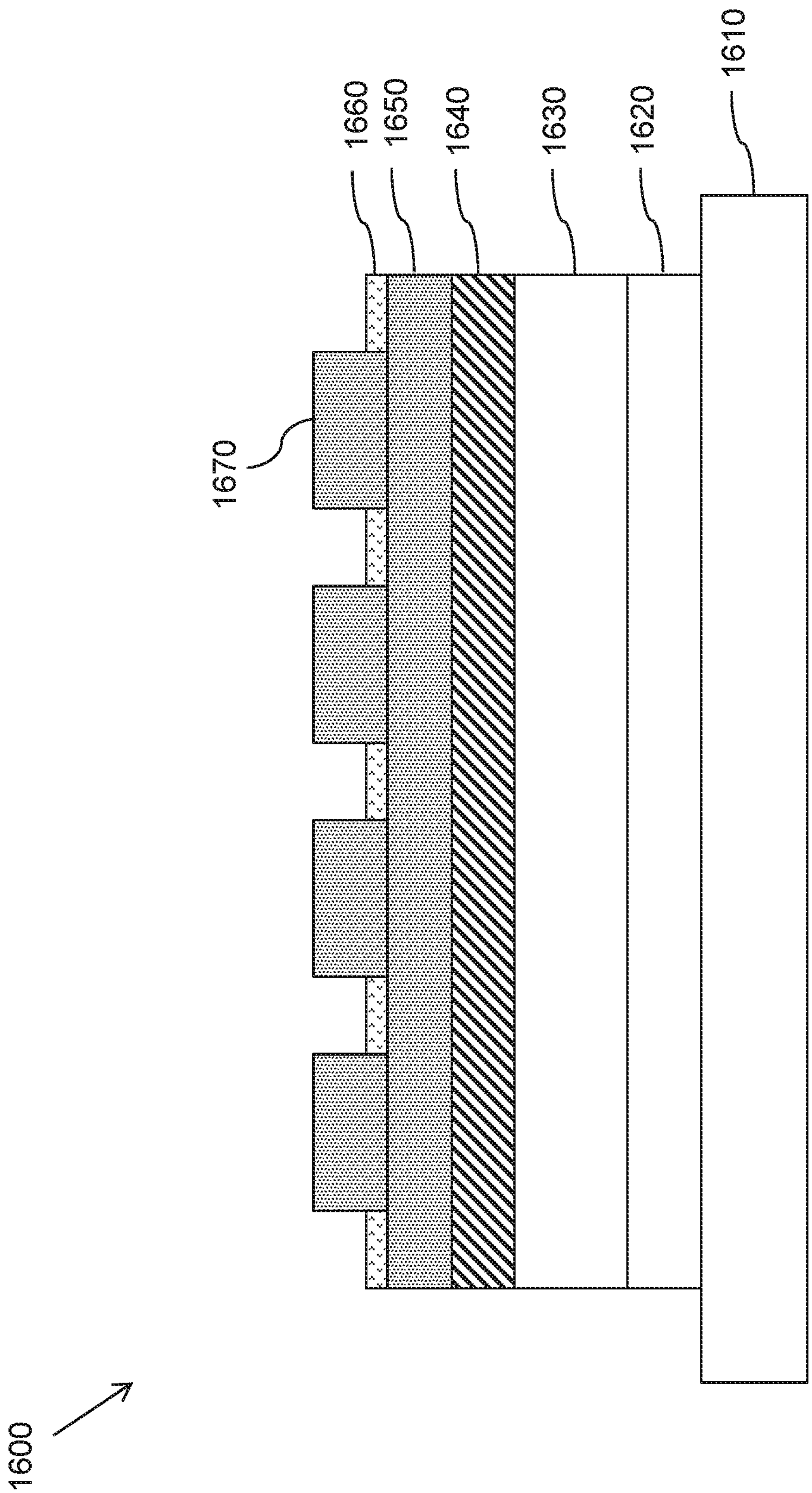
FIG. 11 is a cross-sectional view of an OLED device, according to another embodiment.

FIG. 11 illustrates an OLED device 1600 according to another embodiment in which a cathode 1650 substantially covers an entire device area. Specifically, the OLED device 1600 includes a base substrate 1610, an anode 1620, organic layers 1630, a nucleation promoting coating 1640, the cathode 1650, a nucleation inhibiting coating 1660 selectively deposited over certain regions of the cathode 1650, and an auxiliary electrode 1670 deposited over other regions of the cathode 1650 where the nucleation inhibiting coating 1660 is not pre sent.

The auxiliary electrode 1670 is electrically connected to the cathode 1650. Particularly in a top-emission configuration, it is desirable to deposit a relatively thin layer of the cathode 1650 to reduce optical interference (e.g., attenuation, reflection, diffusion, and so forth) due to the presence of the cathode 1650. However, a reduced thickness of the cathode 1650 generally increases a sheet resistance of the cathode 1650, thus reducing the performance and efficiency of the OLED device 1600. By providing the auxiliary electrode 1670 that is electrically connected to the cathode 1650, the sheet resistance and thus the IR drop associated with the cathode 1650 can be decreased. Furthermore, by selectively depositing the auxiliary electrode 1670 to cover certain regions of the device area while other regions remain uncovered, optical interference due to the presence of the auxiliary electrode 1670 may be controlled and/or reduced.

While the advantages of auxiliary electrodes have been explained in reference to top-emission OLED devices, it may also be advantageous to selectively deposit an auxiliary electrode over a cathode of a bottom-emission or double-sided emission OLED device. For example, while the cathode may be formed as a relatively thick layer in a bottom-emission OLED device without substantially affecting optical characteristics of the device, it may still be advantageous to form a relatively thin cathode. For example, in a transparent or semi-transparent display device, layers of the entire device including a cathode can be formed to be substantially transparent or semi-transparent. Accordingly, it may be beneficial to provide a patterned auxiliary electrode which cannot be readily detected by a naked eye from a typical viewing distance. It will also be appreciated that the described processes may be used to form busbars or auxiliary electrodes for decreasing a resistance of electrodes for devices other than OLED devices.

Figure 12A:
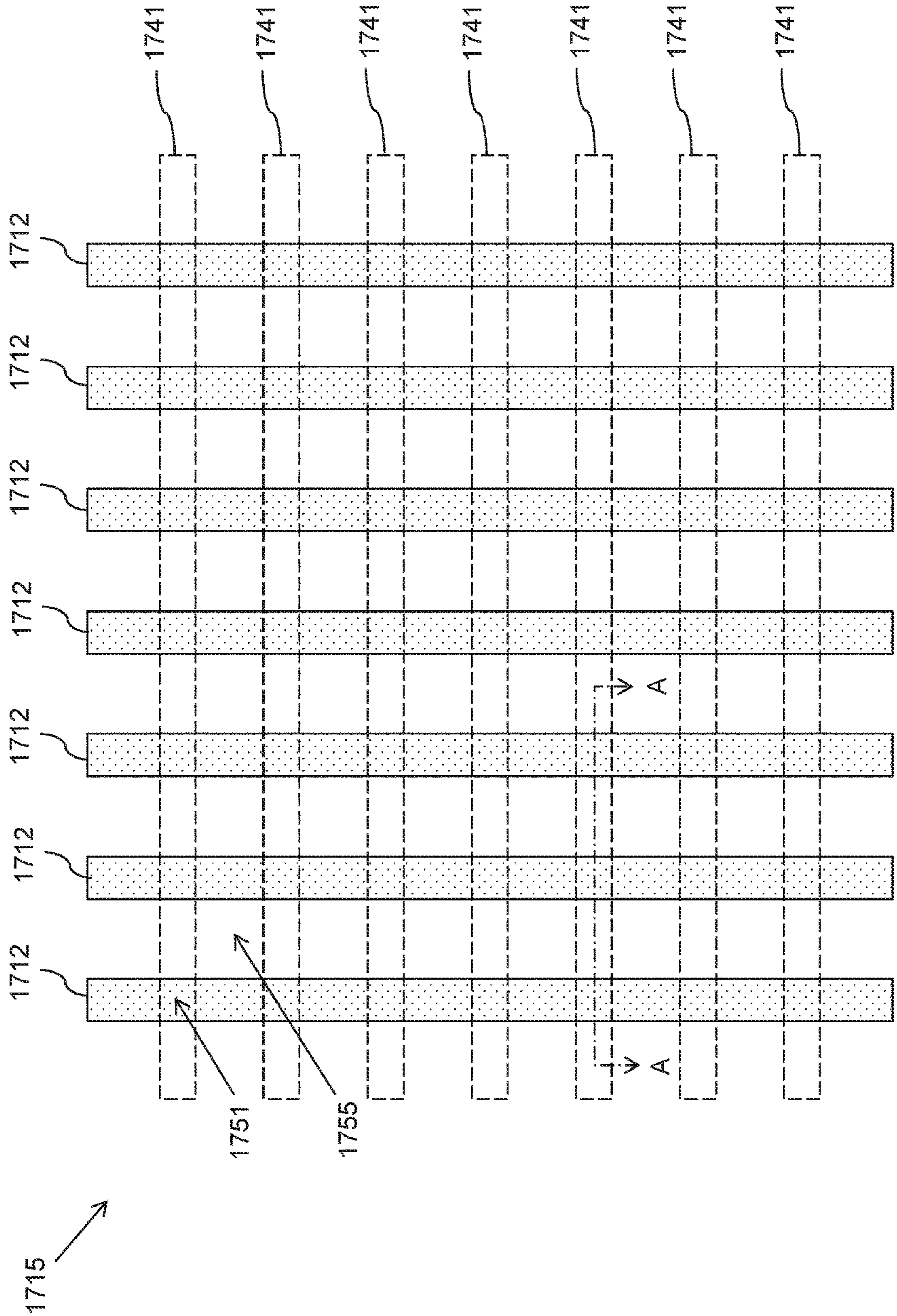
FIG. 12A is a schematic diagram illustrating a top view of a passive matrix OLED device, according to one embodiment.

FIG. 12A shows a patterned cathode 1712 according to one embodiment, in which the cathode 1712 includes a plurality of spaced apart and elongated conductive strips. For example, the cathode 1712 may be used in a passive matrix OLED device (PMOLED) 1715. In the PMOLED device 1715, emissive regions or pixels are generally formed at regions where counter-electrodes overlap. Accordingly, in the embodiment of FIG. 12A, emissive regions or pixels 1751 are formed at overlapping regions of the cathode 1712 and an anode 1741, which includes a plurality of spaced apart and elongated conductive strips. Non-emissive regions 1755 are formed at regions where the cathode 1712 and the anode 1741 do not overlap. Generally, the strips of the cathode 1712 and the strips of the anode 1741 are oriented substantially perpendicular to each other in the PMOLED device 1715 as illustrated. The cathode 1712 and the anode 1741 may be connected to a power source and associated driving circuitry for supplying current to the respective electrodes.

Figure 12B:
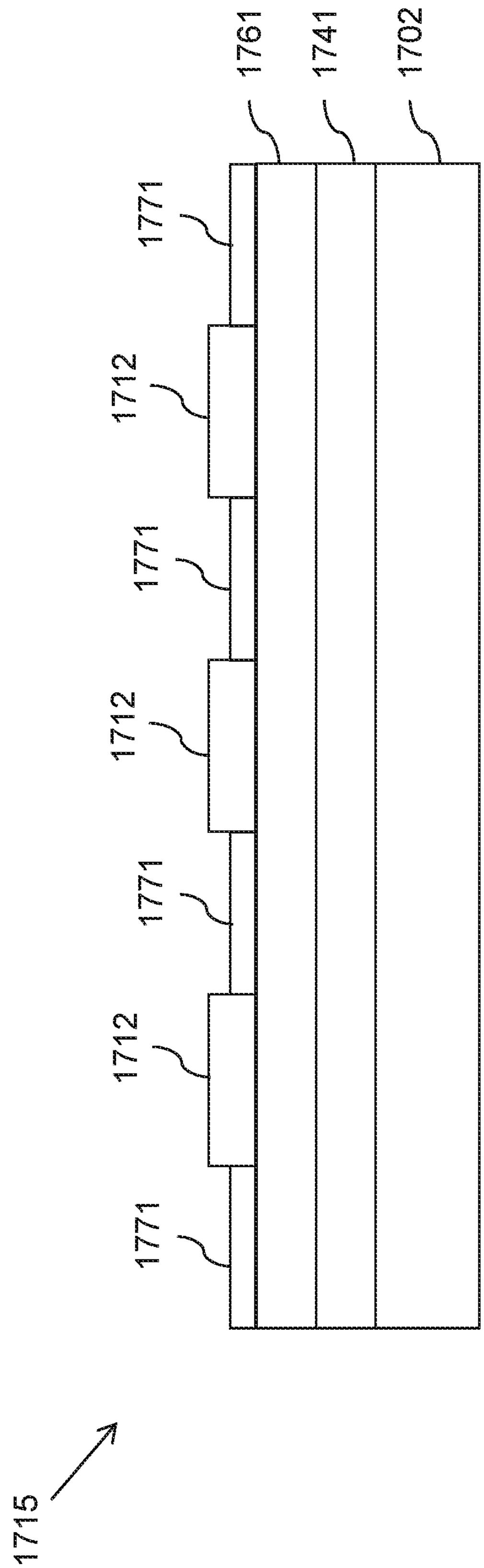
FIG. 12B is a schematic cross-sectional view of the passive matrix OLED device of FIG. 17A.

FIG. 12B illustrates a cross-sectional view taken along line A-A in FIG. 12A. In FIG. 12B, a base substrate 1702 is provided, which may be, for example, a transparent substrate. The anode 1741 is provided over the base substrate 1702 in the form of strips as illustrated in FIG. 12A. One or more organic layers 1761 are deposited over the anode 1741. For example, the organic layers 1761 may be provided as a common layer across the entire device, and may include any number of layers of organic and/or inorganic materials described herein, such as hole injection and transport layers, an electroluminescence layer, and electron transport and injection layers. Certain regions of a top surface of the organic layers 1761 are illustrated as being covered by a nucleation inhibition coating 1771, which is used to selectively pattern the cathode 1712 in accordance with the deposition processes described above. The cathode 1712 and the anode 1741 may be connected to their respective drive circuitry (not shown), which controls emission of light from the pixels 1751.

While thicknesses of the nucleation inhibiting coating 1771 and the cathode 1712 may be varied depending on the desired application and performance, at least in some embodiments, the thickness of the nucleation inhibiting coating 1771 may be comparable to, or substantially less than, the thickness of the cathode 1712 as illustrated in FIG. 12B. The use of a relatively thin nucleation inhibiting coating to achieve patterning of a cathode may be particularly advantageous for flexible PMOLED devices, since it can provide a relatively planar surface onto which a barrier coating may be applied.

Figure 12C:
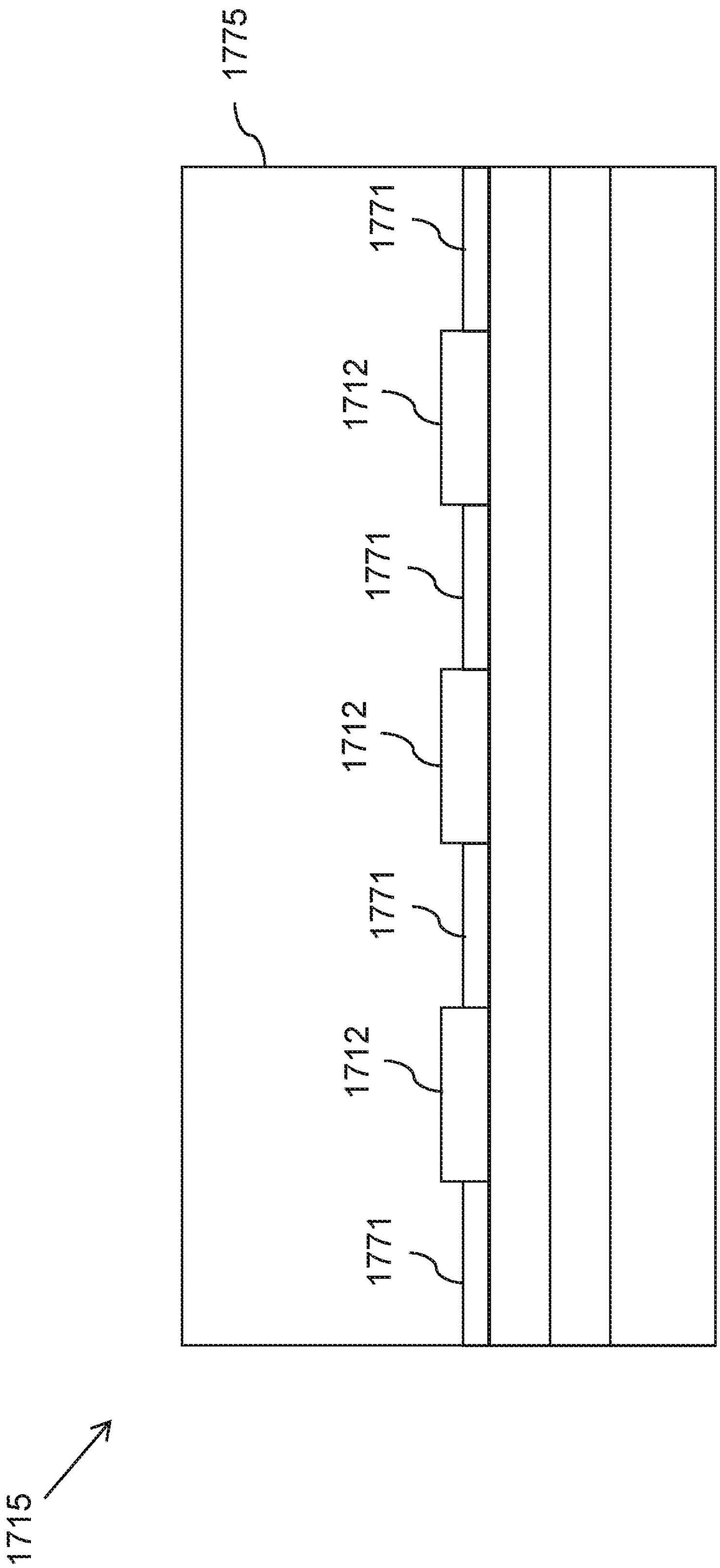
FIG. 12C is a schematic cross-sectional view of the passive matrix OLED device of FIG. 17B after encapsulation.

FIG. 12C illustrates the PMOLED device 1715 of FIG. 12B with a barrier coating 1775 applied over the cathode 1712 and the nucleation inhibiting coating 1771. As will be appreciated, the barrier coating 1775 is generally provided to inhibit the various device layers, including organic layers and the cathode 1712 which may be prone to oxidation, from being exposed to moisture and ambient air. For example, the barrier coating 1775 may be a thin film encapsulation formed by printing, CVD, sputtering, atomic-layer deposition (ALD), any combinations of the foregoing, or by any other suitable methods. The barrier coating 1775 may also be provided by laminating a pre-formed barrier film onto the device 1715 using an adhesive (not shown). For example, the barrier coating 1775 may be a multi-layer coating comprising organic materials, inorganic materials, or combination of both. The barrier coating 1775 may further comprise a getter material and/or a desiccant.

Figure 12D:
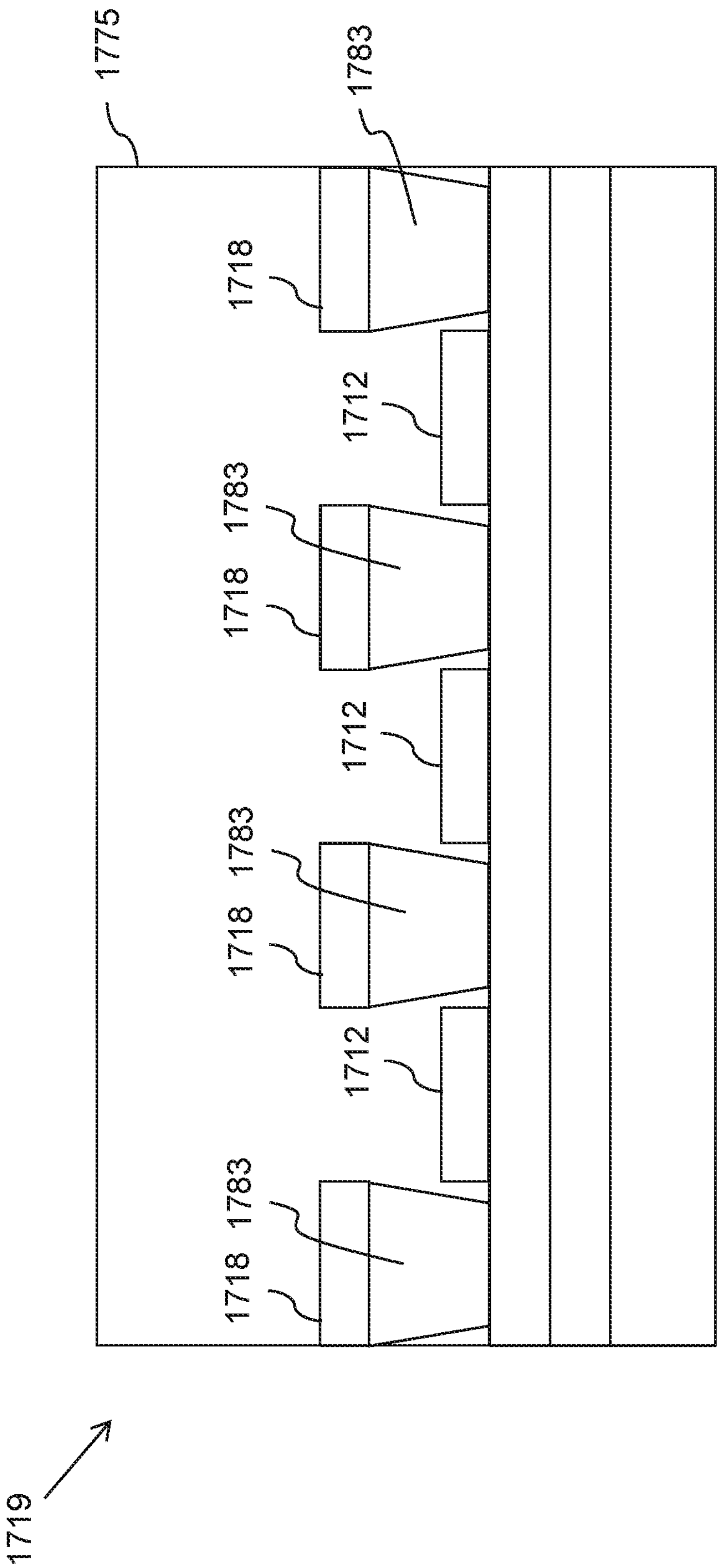
FIG. 12D is a schematic cross-sectional view of a comparative passive matrix OLED device.

For comparative purposes, an example of a comparative PMOLED device 1719 is illustrated in FIG. 12D. In the comparative example of FIG. 12D, a plurality of pixel definition structures 1783 are provided in non-emissive regions of the device 1719, such that when a conductive material is deposited using an open mask or a mask-free deposition process, the conductive material is deposited on both emissive regions located between neighboring pixel definition structures 1783 to form the cathode 1712, as well as on top of the pixel definition structures 1783 to form conductive strips 1718. However, in order to ensure that each segment of the cathode 1712 is electrically isolated from the conductive strips 1718, a thickness or height of the pixel definition structures 1783 are formed to be greater than a thickness of the cathode 1712. The pixel definition structures 1783 may also have an undercut profile to further decrease the likelihood of the cathode 1712 coming in electrical contact with the conductive strips 1718. The barrier coating 1775 is provided to cover the PMOLED device 1719 including the cathode 1712, the pixel definition structures 1783, and the conductive strips 1718.

In the comparative PMOLED device 1719 illustrated in FIG. 12D, the surface onto which the barrier coating 1775 is applied is non-uniform due to the presence of the pixel definition structures 1783. This makes the application of the barrier coating 1775 difficult, and even upon the application of the barrier coating 1775, the adhesion of the barrier coating 1775 to the underlying surface may be relatively poor. Poor adhesion increases the likelihood of the barrier coating 1775 peeling off the device 1719, particularly when the device 1719 is bent or flexed. Additionally, there is a relatively high probability of air pockets being trapped between the barrier coating 1775 and the underlying surface during the application procedure due to the non-uniform surface. The presence of air pockets and/or peeling of the barrier coating 1775 can cause or contribute to defects and partial or total device failure, and thus is highly undesirable. These factors are mitigated or reduced in the embodiment of FIG. 12C.

While the patterned cathode 1712 shown in FIG. 12A may be used to form a cathode of an OLED device, it is appreciated that a similar patterning or selective deposition technique may be used to form an auxiliary electrode for an OLED device. Specifically, such an OLED device may be provided with a common cathode, and an auxiliary electrode deposited on top of, or beneath, the common cathode such that the auxiliary electrode is in electrical communication with the common cathode. For example, such an auxiliary electrode may be implemented in an OLED device including a plurality of emissive regions (e.g., an AMOLED device) such that the auxiliary electrode is formed over non-emissive regions, and not over the emissive regions. In another example, an auxiliary electrode may be provided to cover non-emissive regions as well as at least some emissive regions of an OLED device.

Selective Deposition of an Auxiliary Electrode

Figure 13B:
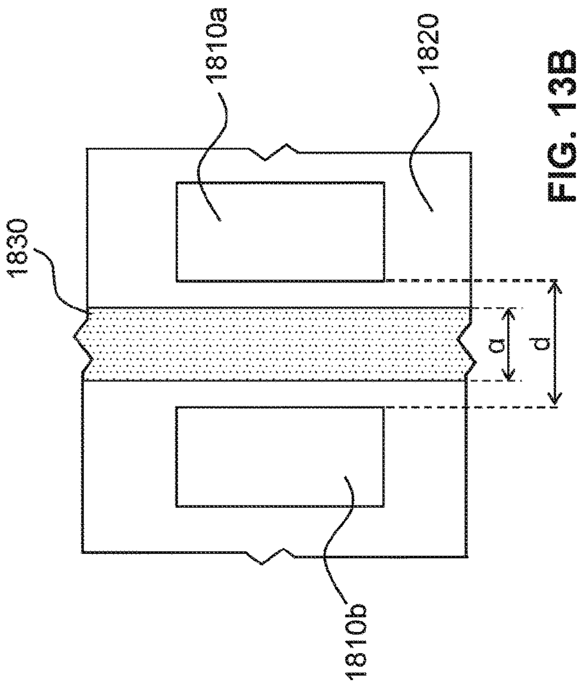
FIGS. 13A-13D illustrate portions of auxiliary electrodes, according to various embodiments.
Figure 13D:
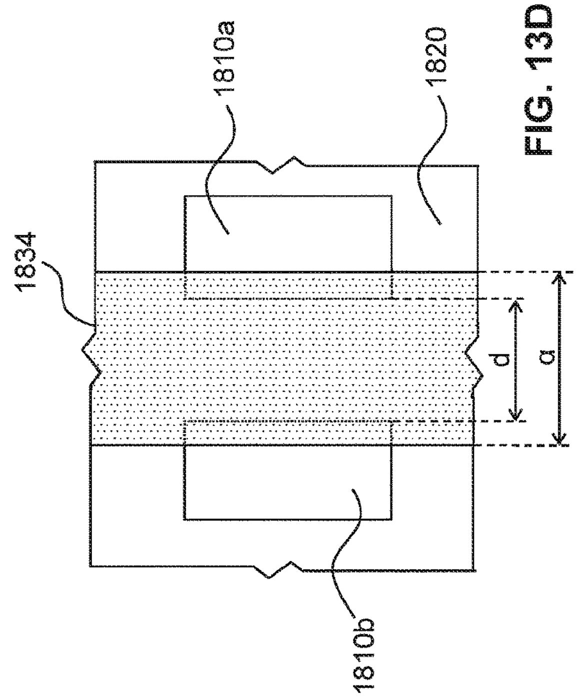
Figure 13A:
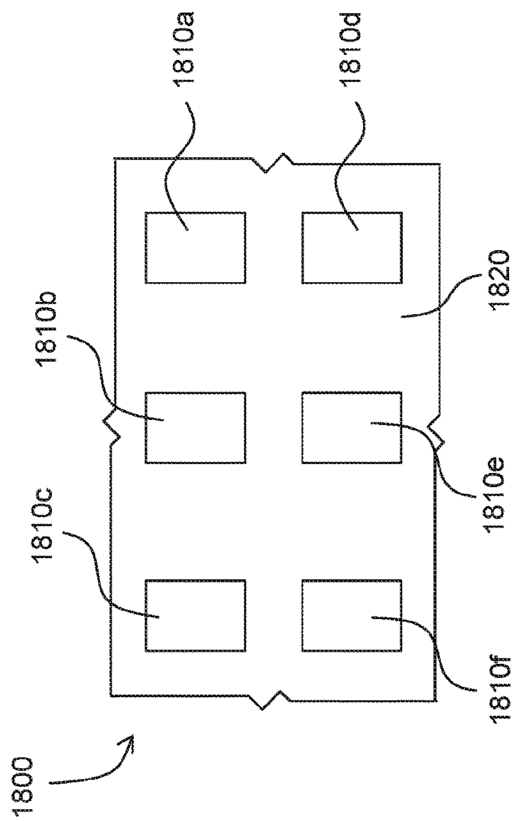
Figure 13C:
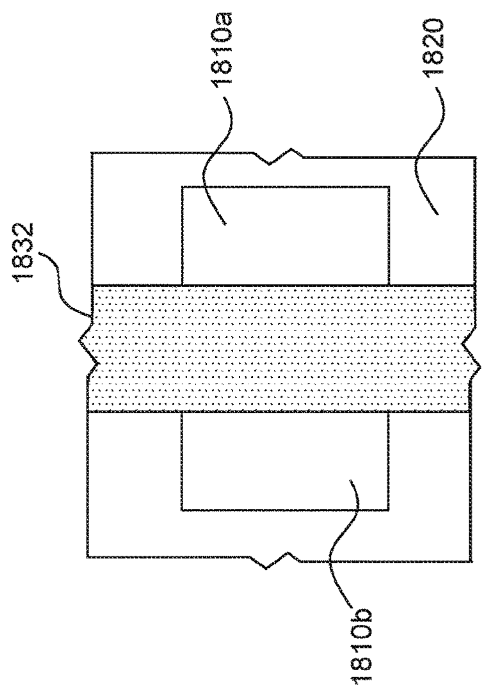

FIG. 13A depicts a portion of an OLED device 1800 including a plurality of emissive regions 1810*a*-1810*f* and a non-emissive region 1820. For example, the OLED device 1800 may be an AMOLED device, and each of the emissive regions 1810*a*-1810*f* may correspond to a pixel or a subpixel of such a device. For sake of simplicity, FIGS. 13B-13D depict a portion of the OLED device 1800. Specifically, FIGS. 13B-13D show a region surrounding a first emissive region 1810*a* and a second emissive region 1810*b*, which are two neighboring emissive regions. While not explicitly illustrated, a common cathode may be provided that substantially covers both emissive regions and non-emissive regions of the device 1800.

In FIG. 13B, an auxiliary electrode 1830 according to one embodiment is shown, in which the auxiliary electrode 1830 is disposed between the two neighboring emissive regions 1810*a* and 1810*b*. The auxiliary electrode 1830 is electrically connected to the common cathode (not shown). Specifically, the auxiliary electrode 1830 is illustrated as having a width (a), which is less than a separation distance (d) between the neighboring emissive regions 1810*a* and 1810*b*, thus creating a non-emissive gap region on each side of the auxiliary electrode 1830. For example, such an arrangement may be desirable in the device 1800 where the separation distance between the neighboring emissive regions 1810*a* and 1810*b* are sufficient to accommodate the auxiliary electrode 1830 of sufficient width, since the likelihood of the auxiliary electrode 1830 interfering with an optical output of the device 1800 can be reduced by providing the non-emissive gap regions. Furthermore, such an arrangement may be particularly beneficial in cases where the auxiliary electrode 1830 is relatively thick (e.g., greater than several hundred nanometers or on the order a few microns thick). For example, a ratio of a height or a thickness of the auxiliary electrode 1830 relative to its width (namely, an aspect ratio) may be greater than about 0.05, such as about 0.1 or greater, about 0.2 or greater, about 0.5 or greater, about 0.8 or greater, about 1 or greater, or about 2 or greater. For example, the height or the thickness of the auxiliary electrode 1830 may be greater than about 50 nm, such as about 80 nm or greater, about 100 nm or greater, about 200 nm or greater, about 500 nm or greater, about 700 nm or greater, about 1000 nm or greater, about 1500 nm or greater, about 1700 nm or greater, or about 2000 nm or greater.

In FIG. 13C, an auxiliary electrode 1832 according to another embodiment is shown. The auxiliary electrode 1832 is electrically connected to the common cathode (not shown). As illustrated, the auxiliary electrode 1832 has substantially the same width as the separation distance between the two neighboring emissive regions 1810*a* and 1810*b*, such that the auxiliary electrode 1832 substantially fully occupies the entire non-emissive region provided between the neighboring emissive regions 1810*a* and 1810*b*. Such an arrangement may be desirable, for example, in cases where the separation distance between the two neighboring emissive regions 1810*a* and 1810*b* is relatively small, such as in a high pixel density display device.

In FIG. 13D, an auxiliary electrode 1834 according to yet another embodiment is illustrated. The auxiliary electrode 1834 is electrically connected to the common cathode (not shown). The auxiliary electrode 1834 is illustrated as having a width (a), which is greater than the separation distance (d) between the two neighboring emissive regions 1810*a* and 1810*b*. Accordingly, a portion of the auxiliary electrode 1834 overlaps a portion of the first emissive region 1810*a* and a portion of the second emissive region 1810*b*. Such an arrangement may be desirable, for example, in cases where the non-emissive region between the neighboring emissive regions 1810*a* and 1810*b* is not sufficient to fully accommodate the auxiliary electrode 1834 of the desired width. While the auxiliary electrode 1834 is illustrated in FIG. 13D as overlapping with the first emissive region 1810*a* to substantially the same degree as the second emissive region 1810*b*, the extent to which the auxiliary electrode 1834 overlaps with an adjacent emissive region may be modulated in other embodiments. For example, in other embodiments, the auxiliary electrode 1834 may overlap to a greater extent with the first emissive region 1810*a* than the second emissive region 1810*b* and vice versa. Furthermore, a profile of overlap between the auxiliary electrode 1834 and an emissive region can also be varied. For example, an overlapping portion of the auxiliary electrode 1834 may be shaped such that the auxiliary electrode 1834 overlaps with a portion of an emissive region to a greater extent than it does with another portion of the same emissive region to create a non-uniform overlapping region.

Figure 14:
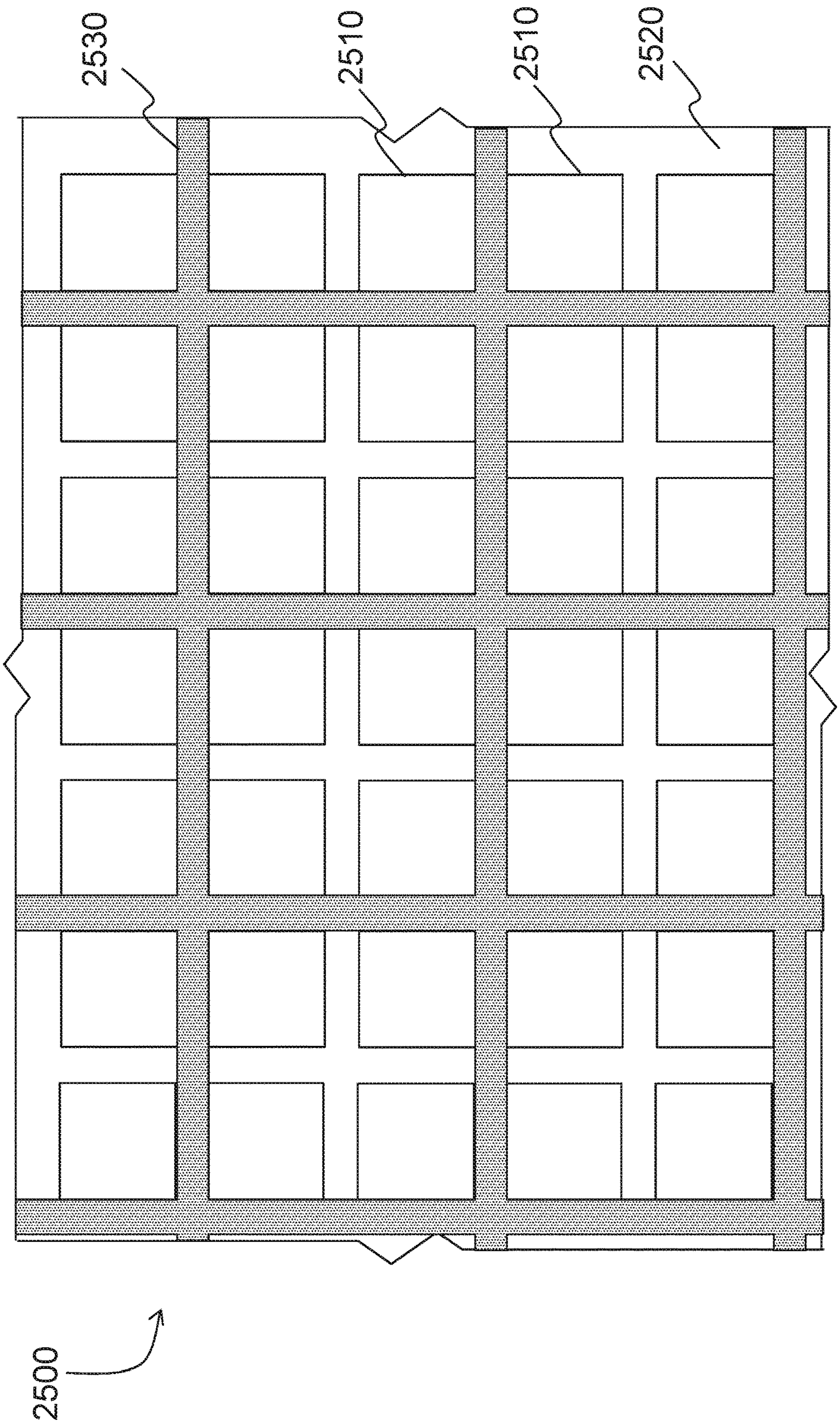
FIG. 14 illustrate an auxiliary electrode pattern formed on an OLED device, according to one embodiment.

FIG. 14 illustrates an embodiment in which an auxiliary electrode 2530 is formed as a grid over an OLED device 2500. As illustrated, the auxiliary electrode is 2530 provided over a non-emissive region 2520 of the device 2500, such that it does not substantially cover any portion of emissive regions 2510. For example, the emissive regions 2510 may correspond to pixels or subpixels of the OLED device 2500.

While the auxiliary electrode has been illustrated as being formed as a connected and continuous structure in the embodiment of FIG. 14, it will be appreciated that in some embodiments, the auxiliary electrode may be provided in the form of discrete auxiliary electrode units wherein the discrete auxiliary electrode units are not physically connected to one another. However, even in such cases, the auxiliary electrode units may be nevertheless in electrical communication with one another via a common electrode. For example, providing discrete auxiliary electrode units, which are indirectly connected to one another via the common electrode, may still substantially lower a sheet resistance and thus increase an efficiency of an OLED device without substantially interfering with optical characteristics of the device.

Auxiliary electrodes may be used in display devices with various pixel or sub-pixel arrangements. For example, auxiliary electrodes may be provided on a display device in which a diamond pixel arrangement is used. Examples of such pixel arrangements are illustrated in FIGS. 15-17.

Figure 15:
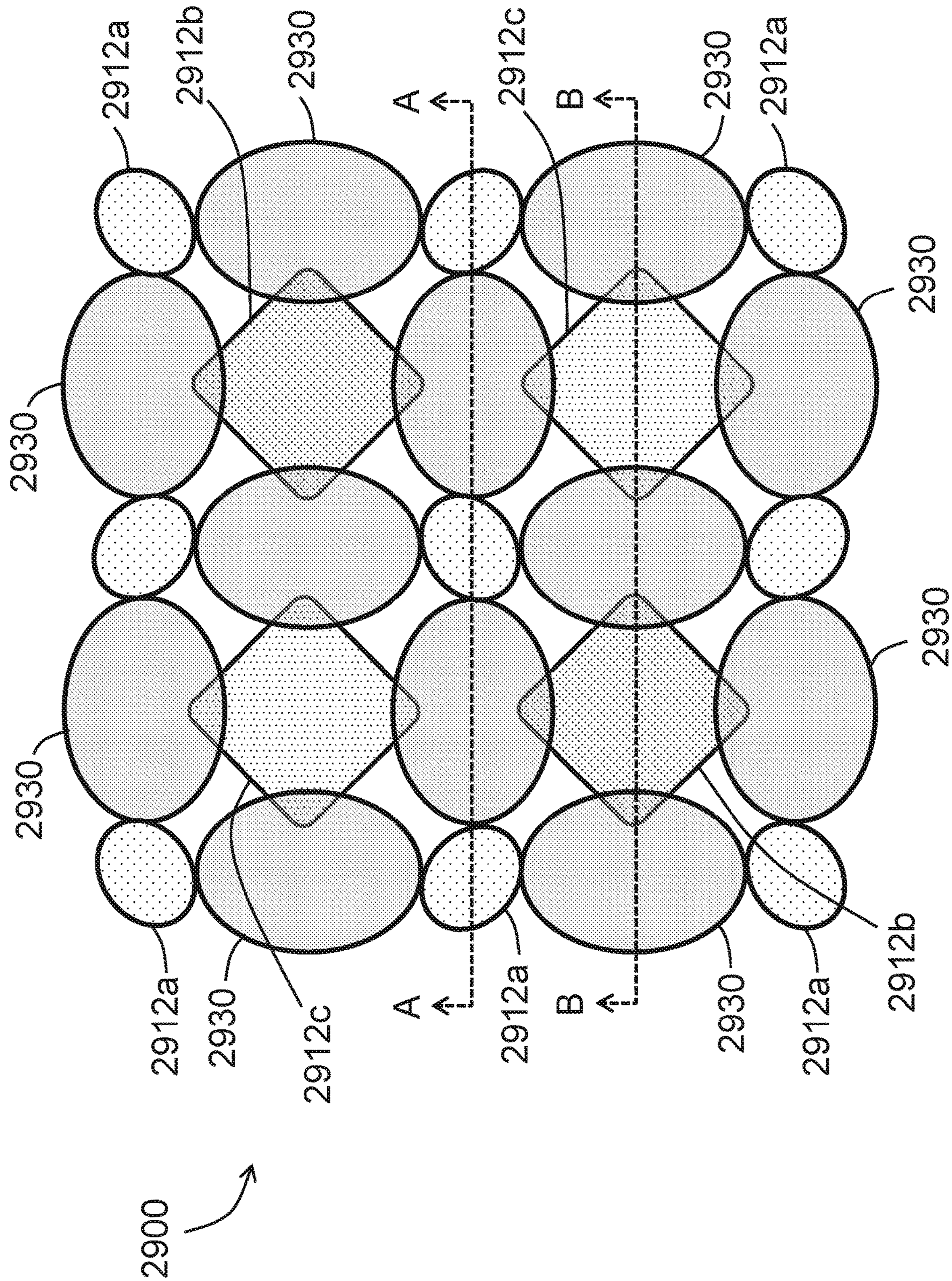
FIG. 15 illustrate a portion of a device with a pixel arrangement, according to one embodiment.

FIG. 15 is a schematic illustration of an OLED device 2900 having a diamond pixel arrangement according to one embodiment. The OLED device 2900 includes a plurality of pixel definition layers (PDLs) 2930 and emissive regions 2912 (sub-pixels) disposed between neighboring PDLs 2930. The emissive regions 2912 include those corresponding to first sub-pixels 2912*a*, which may, for example, correspond to green sub-pixels, second sub-pixels 2912*b*, which may, for example, correspond to blue sub-pixels, and third sub-pixels 2912*c*, which may, for example, correspond to red sub-pixels.

Figure 16:
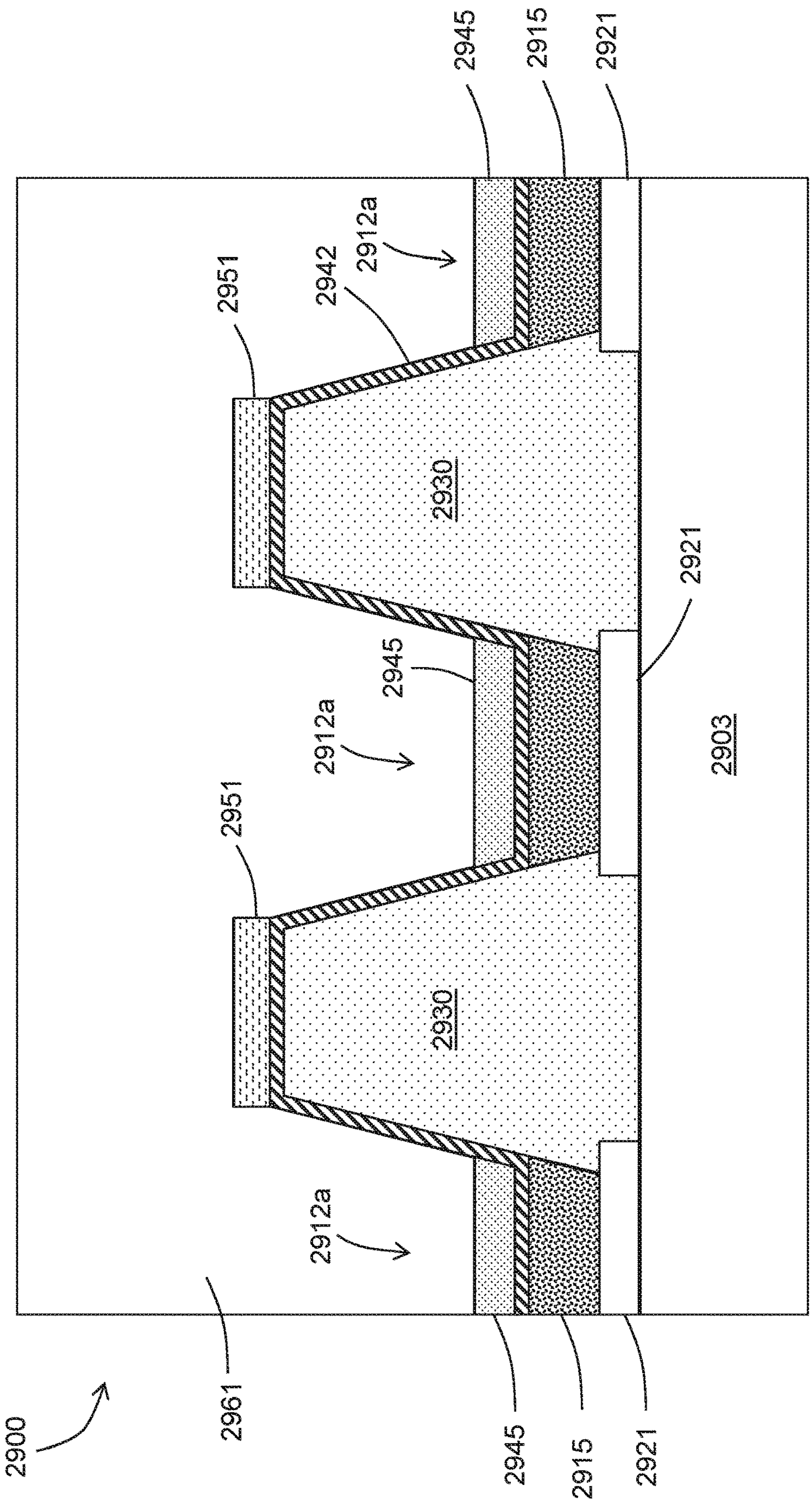
FIG. 16 is a cross-sectional diagram taken along line A-A of the device according to FIG. 15.

FIG. 16 is a schematic illustration of the OLED device 2900 taken along line A-A shown in FIG. 15. As more clearly illustrated in FIG. 16, the device 2900 includes a substrate 2903 and a plurality of anode units 2921 formed on a surface of the base substrate 2903. The substrate 2903 may further include a plurality of transistors and a base substrate, which have been omitted from the figure for sake of simplicity. An organic layer 2915 is provided on top of each anode unit 2921 in a region between neighboring PDLs 2930, and a common cathode 2942 is provided over the organic layer 2915 and the PDLs 2930 to form the first sub-pixels 2912*a*. The organic layer 2915 may include a plurality of organic and/or inorganic layers. For example, such layers may include a hole transport layer, a hole injection layer, an electroluminescence layer, an electron injection layer, and/or an electron transport layer. A nucleation inhibiting coating 2945 is provided over regions of the common cathode 2942 corresponding to the first sub-pixels 2912*a* to allow selective deposition of an auxiliary electrode 2951 over uncovered regions of the common cathode 2942 corresponding to substantially planar regions of the PDLs 2930. The nucleation inhibiting coating 2945 may also act as an index-matching coating or an outcoupling layer. A thin film encapsulation layer 2961 may optionally be provided to encapsulate the device 2900.

Figure 17:
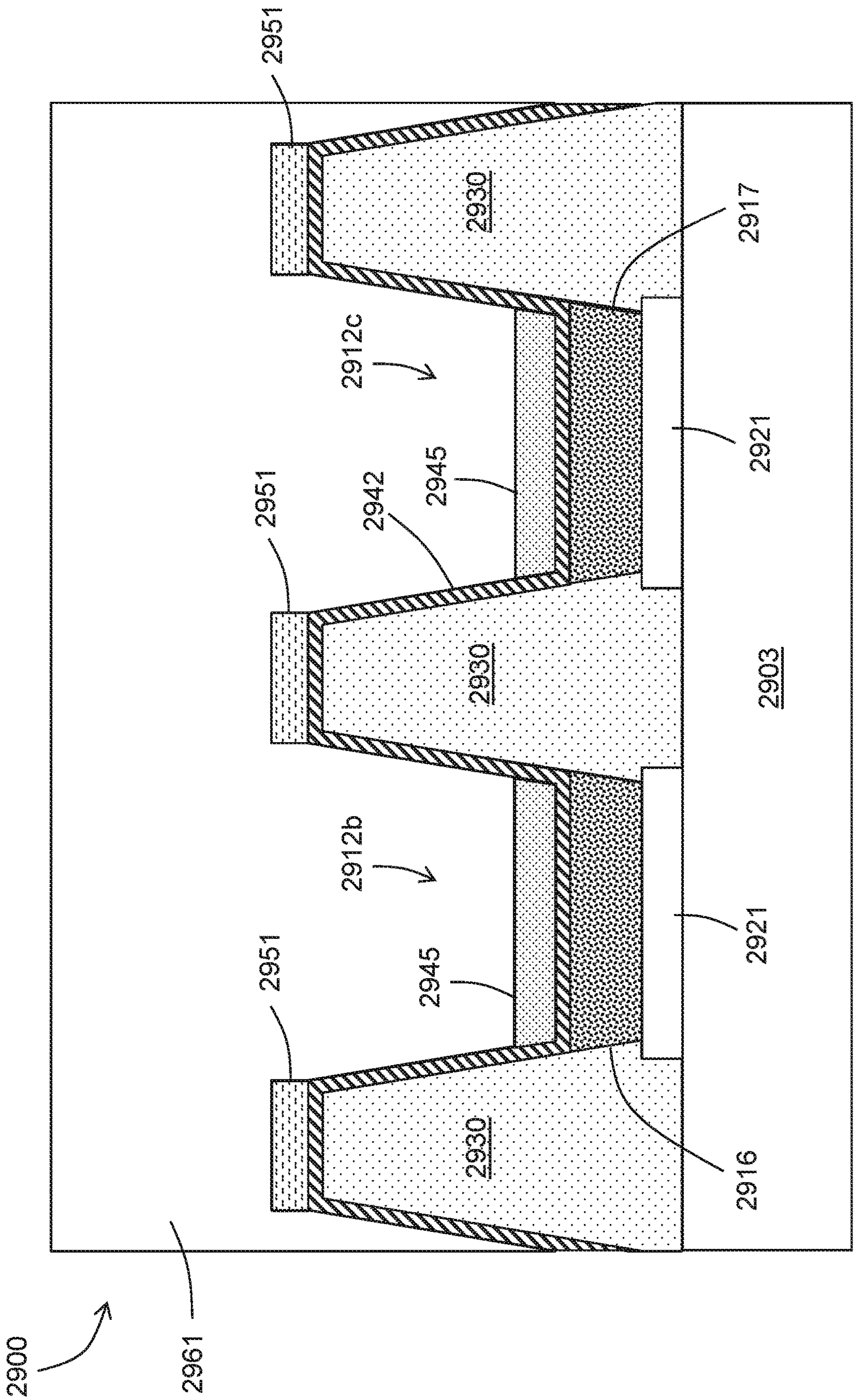
FIG. 17 is a cross-sectional diagram taken along line B-B of the device according to FIG. 15.

FIG. 17 shows a schematic illustration of the OLED device 2900 taken along line B-B indicated in FIG. 15. The device 2900 includes the plurality of anode units 2921 formed on the surface of the substrate 2903, and an organic layer 2916 or 2917 provided on top of each anode unit 2921 in a region between neighboring PDLs 2930. The common cathode 2942 is provided over the organic layers 2916 and 2917 and the PDLs 2930 to form the second sub-pixel 2912*b* and the third sub-pixel 2912*c*, respectively. The nucleation inhibiting coating 2945 is provided over regions of the common cathode 2942 corresponding to the sub-pixels 2912*b* and 2912*c* to allow selective deposition of the auxiliary electrode 2951 over uncovered regions of the common cathode 2942 corresponding to the substantially planar regions of the PDLs 2930. The nucleation inhibiting coating 2945 may also act as an index-matching coating. The thin film encapsulation layer 2961 may optionally be provided to encapsulate the device 2900.

In another aspect according to some embodiments, a device is provided. In some embodiments, the device is an opto-electronic device. In some embodiments, the device is another electronic device or other product. In some embodiments, the device includes a substrate, a nucleation inhibiting coating, and a conductive coating. The nucleation inhibiting coating covers a first region of the substrate. The conductive coating covers a second region of the substrate, and partially overlaps the nucleation inhibiting coating such that at least a portion of the nucleation inhibiting coating is exposed from, or is substantially free of or is substantially uncovered by, the conductive coating. In some embodiments, the conductive coating includes a first portion and a second portion, the first portion of the conductive coating covers the second region of the substrate, and the second portion of the conductive coating overlaps a portion of the nucleation inhibiting coating. In some embodiments, the second portion of the conductive coating is spaced from the nucleation inhibiting coating by a gap. In some embodiments, the nucleation inhibiting coating includes an organic material. In some embodiments, the first portion of the conductive coating and the second portion of the conductive coating are formed integral or continuous with one another to provide a single monolithic structure.

In another aspect according to some embodiments, a device is provided. In some embodiments, the device is an opto-electronic device. In some embodiments, the device is another electronic device or other product. In some embodiments, the device includes a substrate and a conductive coating. The substrate includes a first region and a second region. The conductive coating covers the second region of the substrate, and partially overlaps the first region of the substrate such that at least a portion of the first region of the substrate is exposed from, or is substantially free of or is substantially uncovered by, the conductive coating. In some embodiments, the conductive coating includes a first portion and a second portion, the first portion of the conductive coating covers the second region of the substrate, and the second portion of the conductive coating overlaps a portion of the first region of the substrate. In some embodiments, the second portion of the conductive coating is spaced from the first region of the substrate by a gap. In some embodiments, the first portion of the conductive coating and the second portion of the conductive coating are integrally formed with one another.

Figure 18:
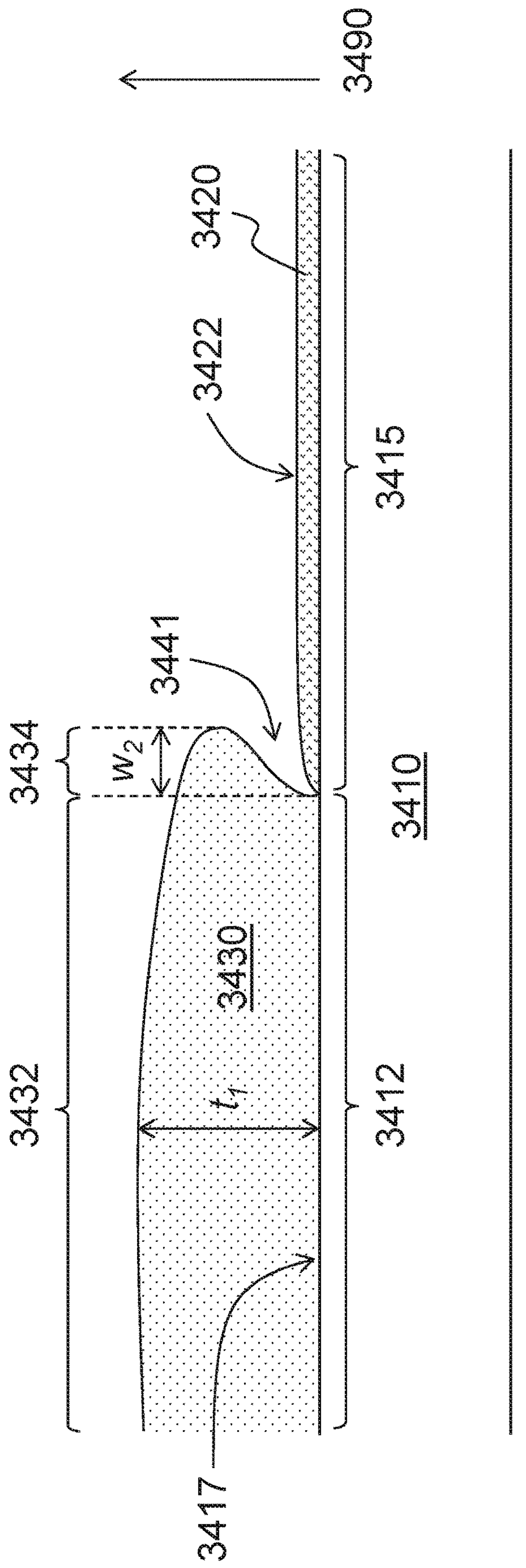
FIG. 18 is a diagram illustrating a cross-sectional profile around an interface of a conductive coating and a nucleation inhibiting coating, according to one embodiment.

FIG. 18 illustrates a portion of a device according to one embodiment. The device includes a substrate 3410 having a surface 3417. A nucleation inhibiting coating 3420 covers a first region 3415 of the surface 3417 of the substrate 3410, and a conductive coating 3430 covers a second region 3412 of the surface 3417 of the substrate 3410. As illustrated in FIG. 18, the first region 3415 and the second region 3412 are distinct and non-overlapping regions of the surface 3417 of the substrate 3410. The conductive coating 3430 includes a first portion 3432 and a second portion 3434. As illustrated in the figure, the first portion 3432 of the conductive coating 3430 covers the second region 3412 of the substrate 3410, and the second portion 3434 of the conductive coating 3430 partially overlaps a portion of the nucleation inhibiting coating 3420. Specifically, the second portion 3434 is illustrated as overlapping the portion of the nucleation inhibiting coating 3420 in a direction that is perpendicular (or normal) to the underlying substrate surface 3417.

Particularly in the case where the nucleation inhibiting coating 3420 is formed such that its surface 3422 exhibits a relatively low affinity or initial sticking probability against a material used to form the conductive coating 3430, there is a gap 3441 formed between the overlapping, second portion 3434 of the conductive coating 3430 and the surface 3422 of the nucleation inhibiting coating 3420. Accordingly, the second portion 3434 of the conductive coating 3430 is not in direct physical contact with the nucleation inhibiting coating 3420, but is spaced from the nucleation inhibiting coating 3420 by the gap 3441 along the direction perpendicular to the surface 3417 of the substrate 3410 as indicated by arrow 3490. Nevertheless, the first portion 3432 of the conductive coating 3430 may be in direct physical contact with the nucleation inhibiting coating 3420 at an interface or a boundary between the first region 3415 and the second region 3412 of the substrate 3410.

In some embodiments, the overlapping, second portion 3434 of the conductive coating 3430 may laterally extend over the nucleation inhibiting coating 3420 by a comparable extent as a thickness of the conductive coating 3430. For example, in reference to FIG. 18, a width $w_2$ (or a dimension along a direction parallel to the surface 3417 of the substrate 3410) of the second portion 3434 may be comparable to a thickness $t_1$ (or a dimension along a direction perpendicular to the surface 3417 of the substrate 3410) of the first portion 3432 of the conductive coating 3430. For example, a ratio of $w_2$:$t_1$ may be in a range of about 1:1 to about 1:3, about 1:1 to about 1:1.5, or about 1:1 to about 1:2. While the thickness $t_1$ would generally be relatively uniform across the conductive coating 3430, the extent to which the second portion 3434 overlaps with the nucleation inhibiting coating 3420 (namely, $w_2$) may vary to some extent across different portions of the surface 3417.

Figure 19:
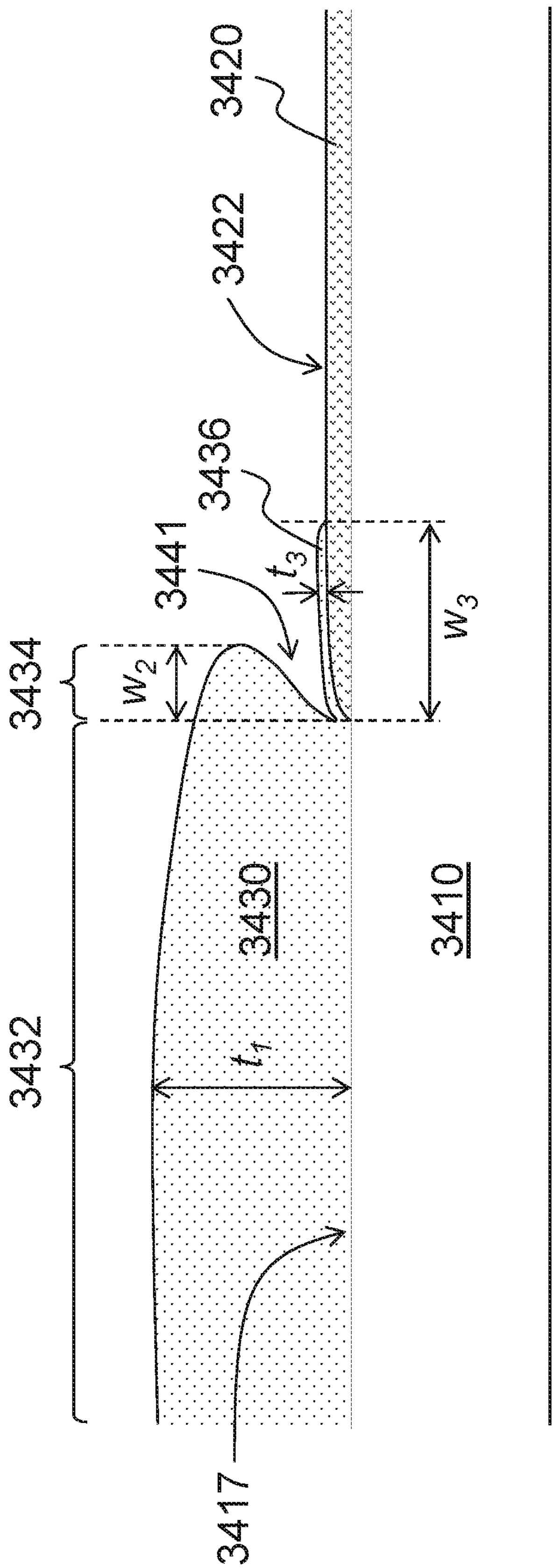
FIG. 19 is a diagram illustrating a cross-sectional profile around an interface of a conductive coating and a nucleation inhibiting coating, according to another embodiment.

In another embodiment illustrated in FIG. 19, the conductive coating 3430 further includes a third portion 3436 disposed between the second portion 3434 and the nucleation inhibiting coating 3420. As illustrated, the second portion 3434 of the conductive coating 3430 laterally extends over and is spaced from the third portion 3436 of the conductive coating 3430, and the third portion 3436 may be in direct physical contact with the surface 3422 of the nucleation inhibiting coating 3420. A thickness $t_3$ of the third portion 3436 may be less, and, in some cases, substantially less than the thickness $t_1$ of the first portion 3432 of the conductive coating 3430. Furthermore, at least in some embodiments, a width $w_3$ of the third portion 3436 may be greater than the width $w_2$ of the second portion 3434. Accordingly, the third portion 3436 may extend laterally to overlap with the nucleation inhibiting coating 3420 to a greater extent than the second portion 3434. For example, a ratio of $w_3$:$t_1$ may be in a range of about 1:2 to about 3:1 or about 1:1.2 to about 2.5:1. While the thickness $t_1$ would generally be relatively uniform across the conductive coating 3430, the extent to which the third portion 3436 overlaps with the nucleation inhibiting coating 3420 (namely, $w_3$) may vary to some extent across different portions of the surface 3417. The thickness $t_3$ of the third portion 3436 may be no greater than or less than about 5% of the thickness $t_1$ of the first portion 3432. For example, $t_3$ may be no greater than or less than about 4%, no greater than or less than about 3%, no greater than or less than about 2%, no greater than or less than about 1%, or no greater than or less than about 0.5% of $t_1$. Instead of, or in addition to, the third portion 3436 being formed as a thin film as shown in FIG. 19, the material of the conductive coating 3430 may form as islands or disconnected clusters on a portion of the nucleation inhibiting coating 3420. For example, such islands or disconnected clusters may include features which are physically separated from one another, such that the islands or clusters are not formed as a continuous layer.

Figure 20A:
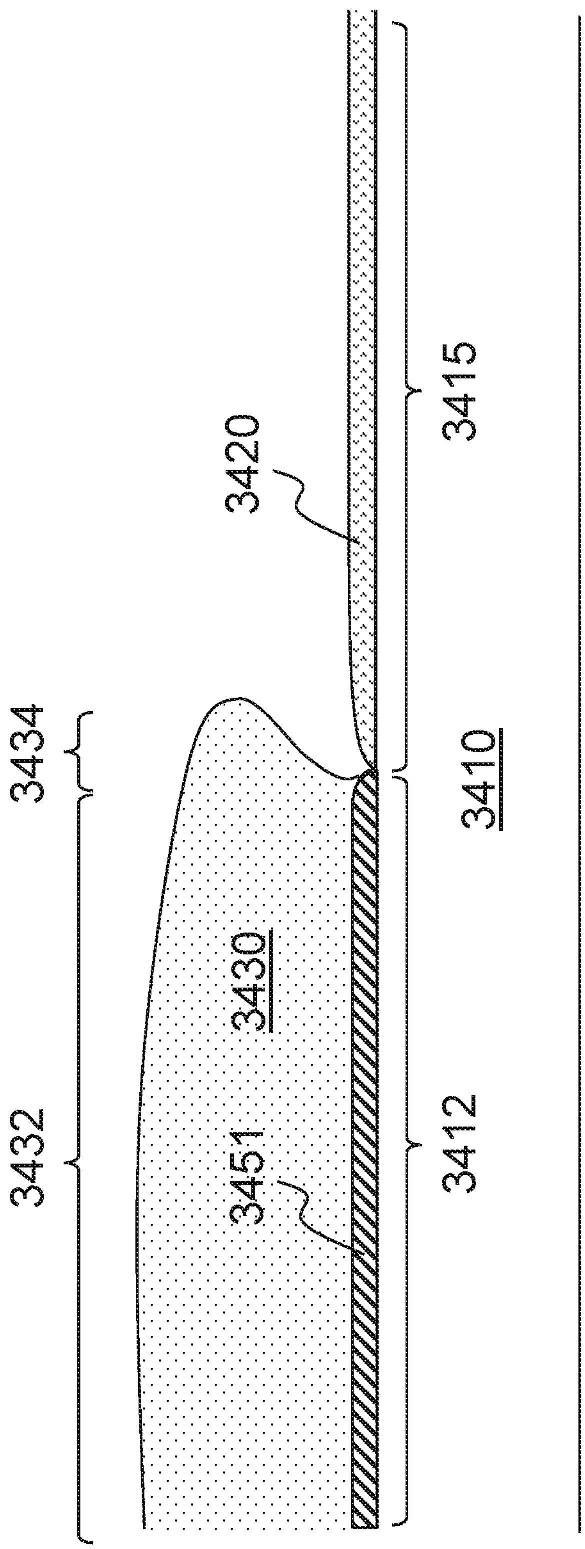
FIG. 20A is a diagram illustrating a cross-sectional profile around an interface of a conductive coating, a nucleation inhibiting coating, and a nucleation promoting coating, according to one embodiment.

In yet another embodiment illustrated in FIG. 20A, a nucleation promoting coating 3451 is disposed between the substrate 3410 and the conductive coating 3430. Specifically, the nucleation promoting coating 3451 is disposed between the first portion 3432 of the conducting coating 3430 and the second region 3412 of the substrate 3410. The nucleation promoting coating 3451 is illustrated as being disposed on the second region 3412 of the substrate 3410, and not on the first region 3415 where the nucleation inhibiting coating 3420 is deposited. The nucleation promoting coating 3451 may be formed such that, at an interface or a boundary between the nucleation promoting coating 3451 and the conductive coating 3430, a surface of the nucleation promoting coating 3451 exhibits a relatively high affinity or initial sticking probability for the material of the conductive coating 3430. As such, the presence of the nucleation promoting coating 3451 may promote the formation and growth of the conductive coating 3430 during deposition. Various features of the conductive coating 3430 (including the dimensions of the first portion 3432 and the second portion 3434) and other coatings of FIG. 20A can be similar to those described above for FIGS. 18-19 and are not repeated for brevity.

Figure 20B:
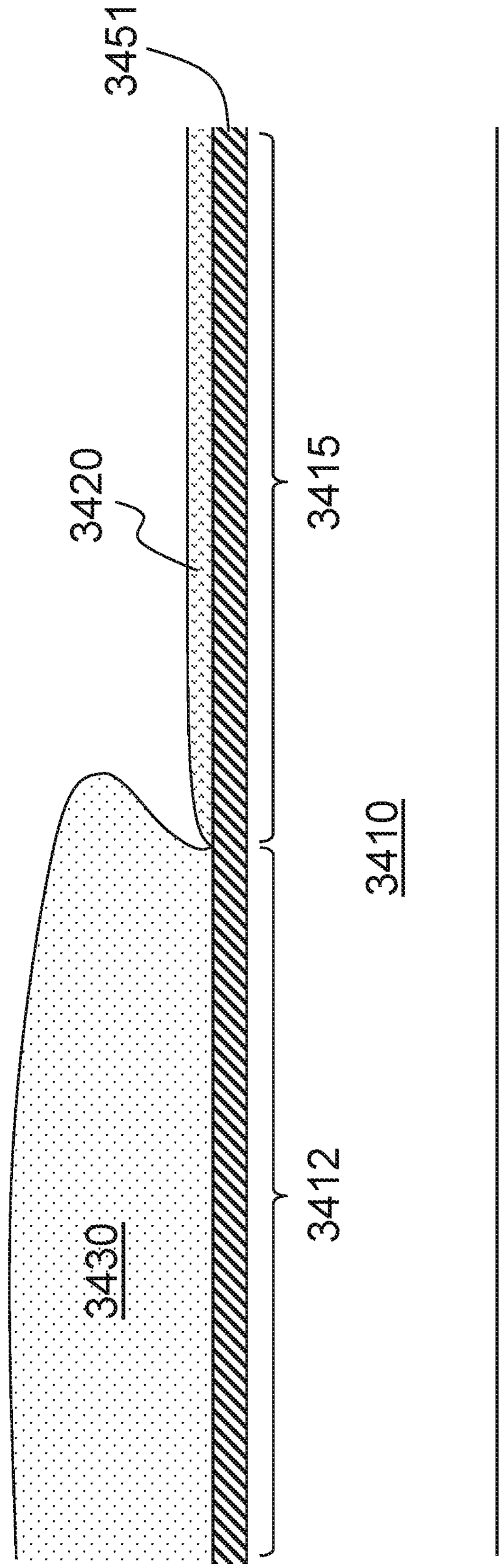
FIG. 20B is a diagram illustrating a cross-sectional profile around an interface of a conductive coating, a nucleation inhibiting coating, and a nucleation promoting coating, according to another embodiment.

In yet another embodiment illustrated in FIG. 20B, the nucleation promoting coating 3451 is disposed on both the first region 3415 and the second region 3412 of the substrate 3410, and the nucleation inhibiting coating 3420 covers a portion of the nucleation promoting coating 3451 disposed on the first region 3415. Another portion of the nucleation promoting coating 3451 is exposed from, or is substantially free of or is substantially uncovered by, the nucleation inhibiting coating 3420, and the conductive coating 3430 covers the exposed portion of the nucleation promoting coating 3451. Various features of the conducting coating 3430 and other coatings of FIG. 20B can be similar to those described above for FIGS. 18-19 and are not repeated for brevity.

Figure 21:
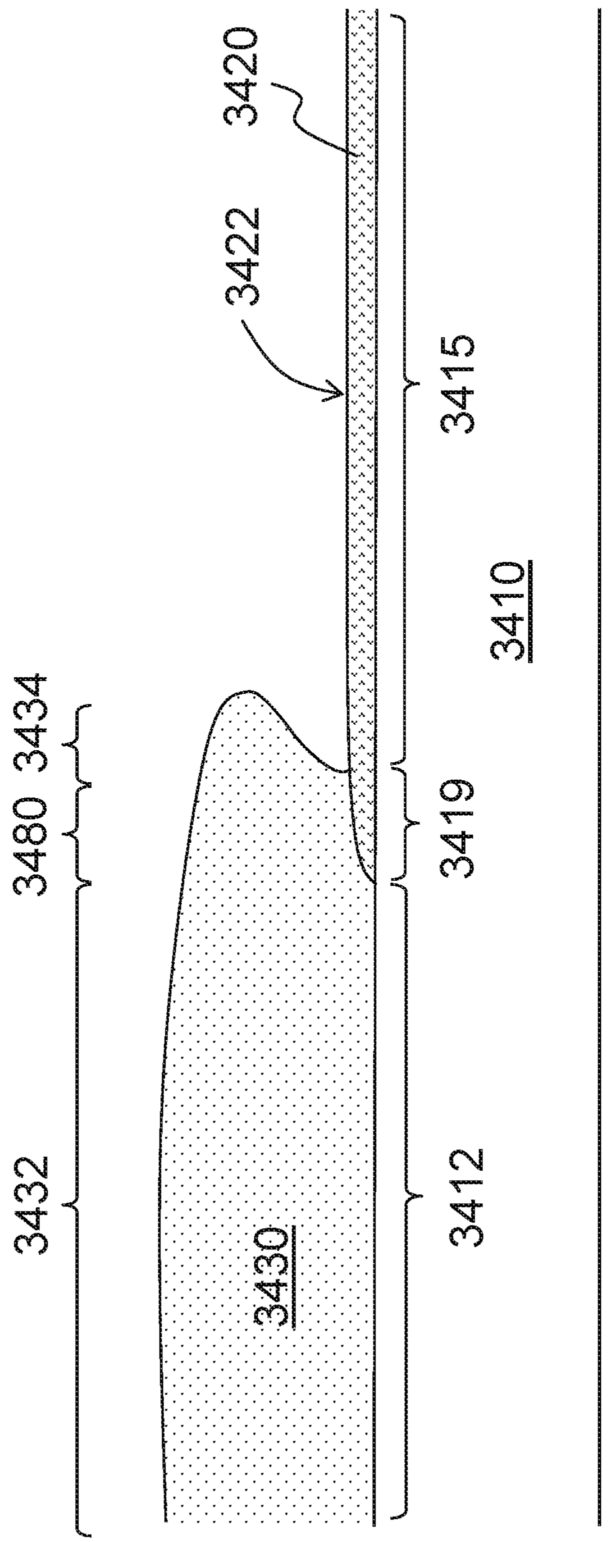
FIG. 21 is a diagram illustrating a cross-sectional profile around an interface of a conductive coating and a nucleation inhibiting coating, according to yet another embodiment.

FIG. 21 illustrates a yet another embodiment in which the conductive coating 3430 partially overlaps a portion of the nucleation inhibiting coating 3420 in a third region 3419 of the substrate 3410. Specifically, in addition to the first portion 3432 and the second portion 3434, the conductive coating 3430 further includes a third portion 3480. As illustrated in the figure, the third portion 3480 of the conductive coating 3430 is disposed between the first portion 3432 and the second portion 3434 of the conductive coating 3430, and the third portion 3480 may be in direct physical contact with the surface 3422 of the nucleation inhibiting coating 3420. In this regard, the overlap in the third region 3419 may be formed as a result of lateral growth of the conductive coating 3430 during an open mask or mask-free deposition process. More specifically, while the surface 3422 of the nucleation inhibiting coating 3420 may exhibit a relatively low initial sticking probability for the material of the conductive coating 3430 and thus the probability of the material nucleating on the surface 3422 is low, as the conductive coating 3430 grows in thickness, the coating 3430 may also grow laterally and may cover a portion of the nucleation inhibiting coating 3420 as illustrated in FIG. 21.

While details regarding certain features of the device and the conductive coating 3430 have been omitted in the above description for the embodiments of FIGS. 20-21, it will be appreciated that descriptions of various features including the gap 3441, the second portion 3434, and the third portion 3436 of the conductive coating 3430 described in relation to FIG. 18 and FIG. 19 would similarly apply to such embodiments.

Figure 22A:
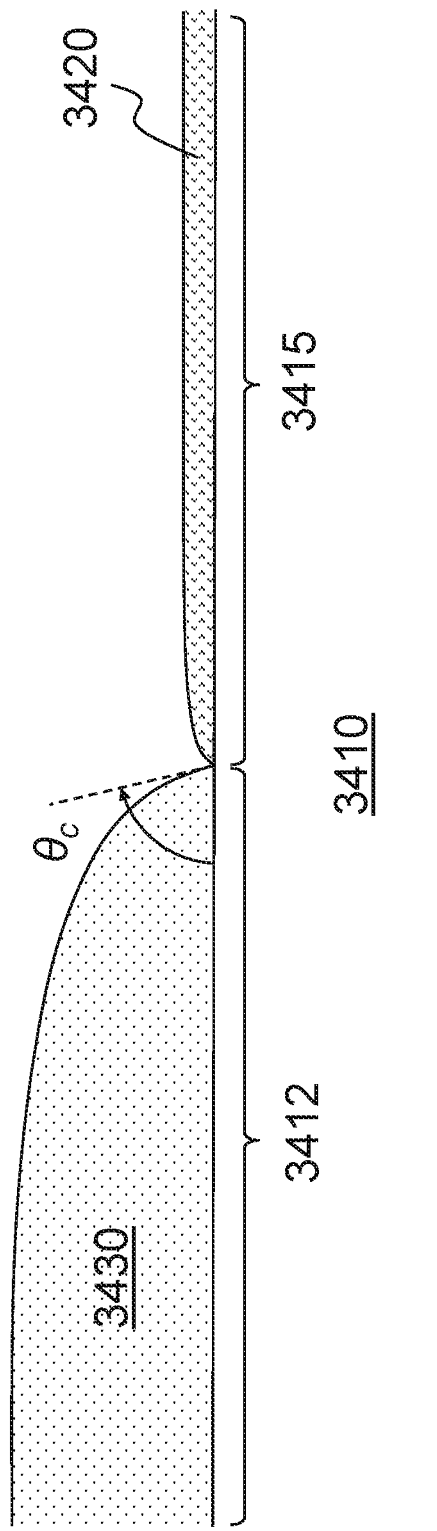
FIG. 22A is a diagram illustrating a cross-sectional profile near an interface of a conductive coating and a nucleation inhibiting coating, according to yet another embodiment.

FIG. 22A illustrates a yet another embodiment wherein the first region 3415 of the substrate 3410 is coated with the nucleation inhibiting coating 3420, and the second region 3412 adjacent to the first region 3415 is coated with the conductive coating 3430.

It has been observed that, at least in some cases, conducting the open mask or mask-free deposition of the conductive coating 3430 over a substrate surface which has been partially coated with the nucleation inhibiting coating 3420 can result in the formation of the conductive coating 3430 exhibiting a tapered cross-sectional profile at or near the interface between the conductive coating 3430 and the nucleation inhibiting coating 3420.

FIG. 22A illustrates one embodiment in which the thickness of the conductive coating 3430 is reduced at or near the interface between the conductive coating 3430 and the nucleation inhibiting coating 3420 due to the tapered profile of the conductive coating 3430. Specifically, the thickness of the conductive coating 3430 at or near the interface is less than the average thickness of the conductive coating 3430. While the tapered profile of the conductive coating 3430 is illustrated as being curved or arched in the embodiment of FIG. 22A, the profile may be substantially linear or non-linear in other embodiments. For example, the thickness of the conductive coating 3430 may decrease in substantially linear, exponential, quadratic, or other manner in the region proximal to the interface.

During the nucleation stage of the thin film formation process, molecules in the vapor phase condense onto the surface of the substrate to form nuclei. Without wishing to be bound by a particular theory, it is postulated that the shapes and sizes of these nuclei and the subsequent growth of these nuclei into islands and then into a thin film, depend on a number of factors, such as the interfacial tensions between the vapor, substrate, and the condensed film nuclei. It is further postulated that, during thin film nucleation and growth at or near the interface between the exposed surface of the substrate and the nucleation inhibiting coating, a relatively high contact angle between the edge of the film and the substrate would be observed due to "dewetting" of the solid surface of the of the thin film by the nucleation inhibiting coating. This dewetting property is driven by the minimization of surface energy between the substrate, thin film, vapor and nucleation inhibiting layer. Accordingly, it is postulated that the presence of the nucleation inhibiting coating and the properties of the nucleation inhibiting coating have a significant effect on the nuclei formation and the growth mode of the edge of the conductive coating.

It has been observed that the "contact angle" of the conductive coating 3430 at or near the interface between the conductive coating 3430 and the nucleation inhibiting coating 3420 vary depending on properties of the nucleation inhibiting coating 3420, such as the relative affinity or the initial sticking probability. It is further postulated that the contact angle of the nuclei may dictate the thin film contact angle of the conductive coating formed by deposition. Referring to FIG. 22A for example, the contact angle, $\theta_c$, may be determined by measuring the slope of the tangent of the conductive coating 3430 at or near the interface between the conductive coating 3430 and the nucleation inhibiting coating 3420. In other examples where the cross-sectional taper profile of the conductive coating 3430 is substantially linear, the contact angle may be determined by measuring the slope of the conductive coating 3430 at or near the interface. As would be appreciated, the contact angle is generally measured relative to the angle of the underlying surface. For sake of simplicity, the embodiments provided herein have been illustrated to show the coatings deposited on a planar surface, however it will be appreciated that the coatings may be deposited on non-planar surfaces.

Figure 22B:
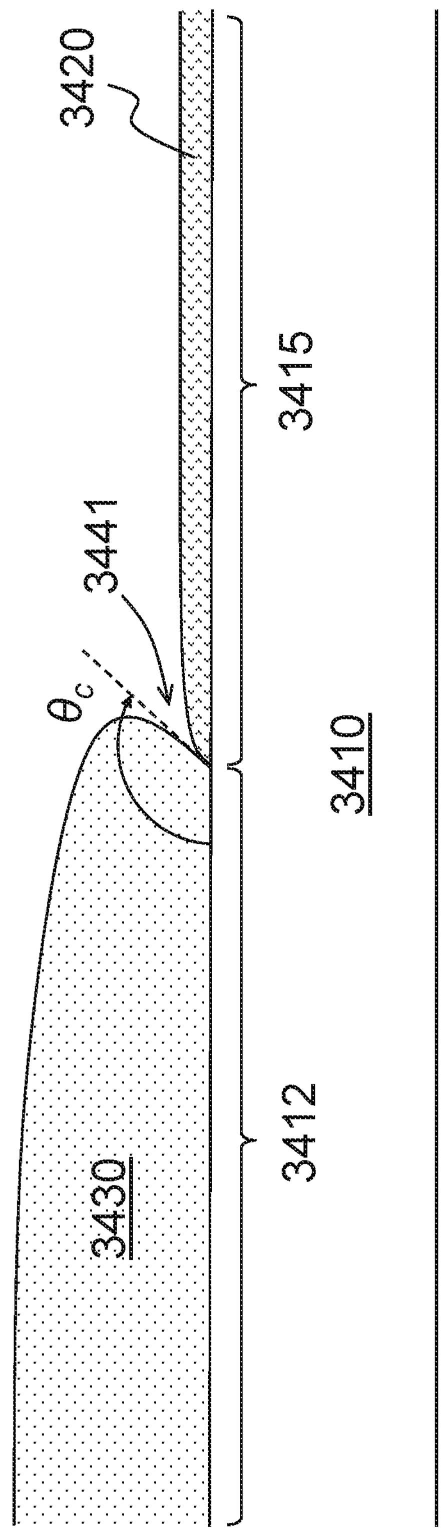
FIG. 22B is a diagram illustrating a cross-sectional profile near an interface of a conductive coating and a nucleation inhibiting coating, according to yet another embodiment.

In some embodiments, the contact angle of the conductive coating 3430 may be greater than about 90 degrees. Referring now to FIG. 22B, an embodiment is illustrated wherein the conductive coating 3430 includes a portion extending past the interface between the nucleation inhibiting coating 3420 and the conductive coating 3430, and is spaced apart from the nucleation inhibiting coating 3420 by a gap 3441. In such embodiment, for example, the contact angle, $\theta_c$, may be greater than about 90 degrees.

In at least some applications, it may be particularly advantageous to form a conductive coating 3430 exhibiting a relatively high contact angle. For example, the contact angle of greater than about 10 degrees, greater than about 15 degrees, greater than about 20 degrees, greater than about 25 degrees, greater than about 30 degrees, greater than about 35 degrees, greater than about 40 degrees, greater than about 50 degrees, greater than about 60 degrees, greater than about 70 degrees, greater than about 75 degrees, or greater than about 80 degrees. For example, conductive coating 3430 having a relatively high contact angle may be particularly advantageous for creating finely patterned features while maintaining a relatively high aspect ratio. In some applications, it may be preferable to form a conductive coating 3430 exhibiting a contact angle greater than about 90 degrees. For example, the contact angle of greater than about 90 degrees, greater than about 95 degrees, greater than about 100 degrees, greater than about 105 degrees, greater than about 110 degrees, greater than about 120 degrees, greater than about 130 degrees, greater than about 135 degrees, greater than about 140 degrees, greater than about 145 degrees, greater than about 150 degrees, or greater than about 160 degrees.

As described above, it is postulated that the contact angle of the conductive coating is determined based at least partially on the properties (e.g. initial sticking probability) of the nucleation inhibiting coating disposed adjacent to the area onto which the conductive coating is formed. Accordingly, nucleation inhibiting coating materials which allow selective deposition of conductive coating exhibiting relatively high contact angle may be particularly useful in certain applications.

Figure 37:
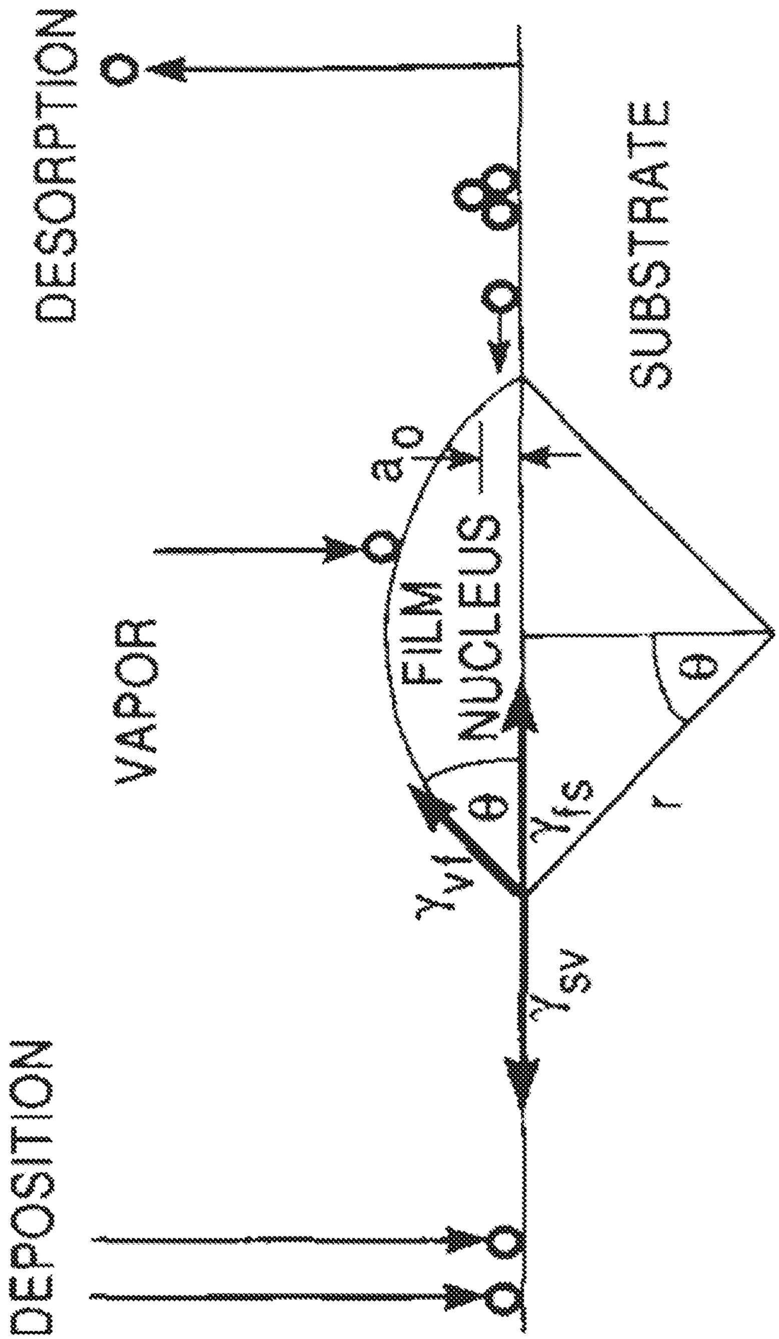
FIG. 37 is a schematic diagram illustrating the formation of a film nucleus.

Without wishing to be bound by a particular theory, it is postulated that the relationship among the various interfacial tensions present during nucleation and growth is dictated according to the following equation, which is also referred to as the Young's equation in capillarity theory:

$$\gamma_{sv}=\gamma_{fs}+\gamma_{vf}\cos\theta$$

wherein $\gamma_{sv}$ corresponds to the interfacial tension between substrate and vapor, $\gamma_{fs}$ corresponds to the interfacial tension between the film and the substrate, $\gamma_{vf}$ corresponds to the interfacial tension between the vapor and film, and θ is the film nucleus contact angle. FIG. 37 illustrates the relationship among the various parameters represented in Young's equation above.

On the basis of Young's equation, it can be derived that, for island growth, the film nucleus contact angle θ is greater than zero and therefore $\gamma_{sv}<\gamma_{fs}+\gamma_{vf}$.

For layer growth wherein the deposited film "wets" the substrate, the nucleus contact angle θ=0 and therefore $\gamma_{sv}=\gamma_{fs}+\gamma_{vf}$.

For Stranski-Krastanov (S-K) growth, wherein the strain energy per unit area of the film overgrowth is large with respect to the interfacial tension between the vapor and the film, $\gamma_{sv}>\gamma_{fs}+\gamma_{vf}$.

It is postulated that the nucleation and growth mode of the conductive coating at an interface between the nucleation inhibiting coating and the exposed substrate surface follows the island growth model, wherein θ>0. Particularly in cases where the nucleation inhibiting coating exhibits a relatively low affinity or low initial sticking probability (i.e. dewetting) towards the material used to form the conductive coating, resulting in a relatively high thin film contact angle of the conductive coating. On the contrary, when a conductive coating is selectively deposited on a surface without the use of a nucleation inhibiting coating, for example by employing a shadow mask, the nucleation and growth mode of the conductive coating may differ. In particular, it has been observed that the conductive coating formed using a shadow mask patterning process may, at least in some cases, exhibit relatively low thin film contact angle of less than about 10 degrees.

It will be appreciated that, while not explicitly illustrated, a material used to form the nucleation inhibiting coating 3420 may also be present to some extent at an interface between the conductive coating 3430 and an underlying surface (e.g., a surface of the nucleation promoting layer 3451 or the substrate 3410). Such material may be deposited as a result of a shadowing effect, in which a deposited pattern is not identical to a pattern of a mask and may result in some evaporated material being deposited on a masked portion of a target surface. For example, such material may form as islands or disconnected clusters, or as a thin film having a thickness that is substantially less than an average thickness of the nucleation inhibiting coating 3420.

Figure 22C:
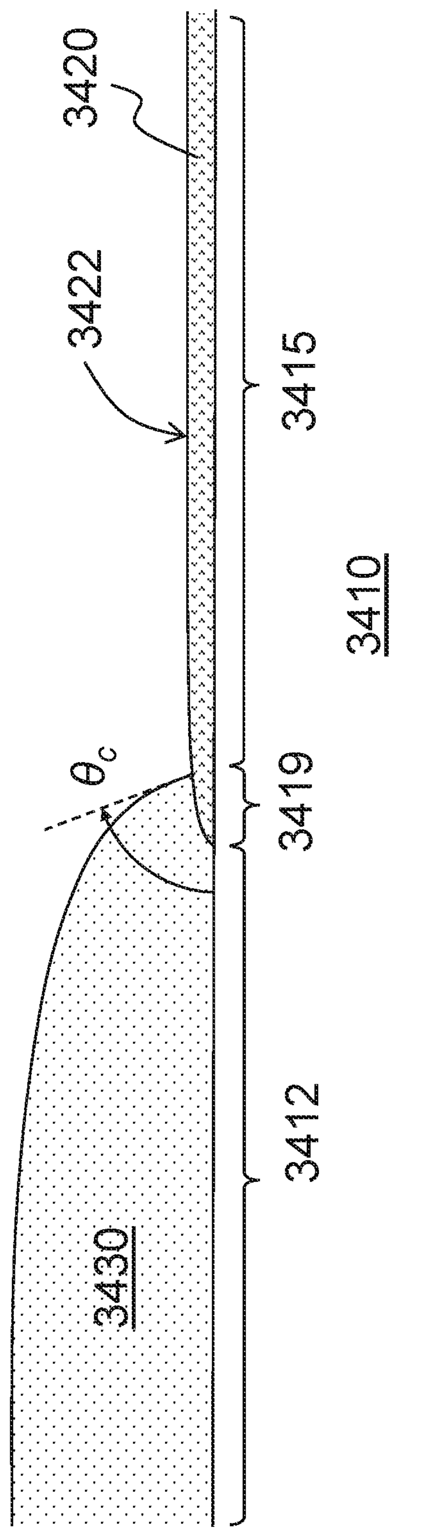
FIG. 22C is a diagram illustrating a cross-sectional profile near an interface of a conductive coating and a nucleation inhibiting coating, according to yet another embodiment.
Figure 22D:
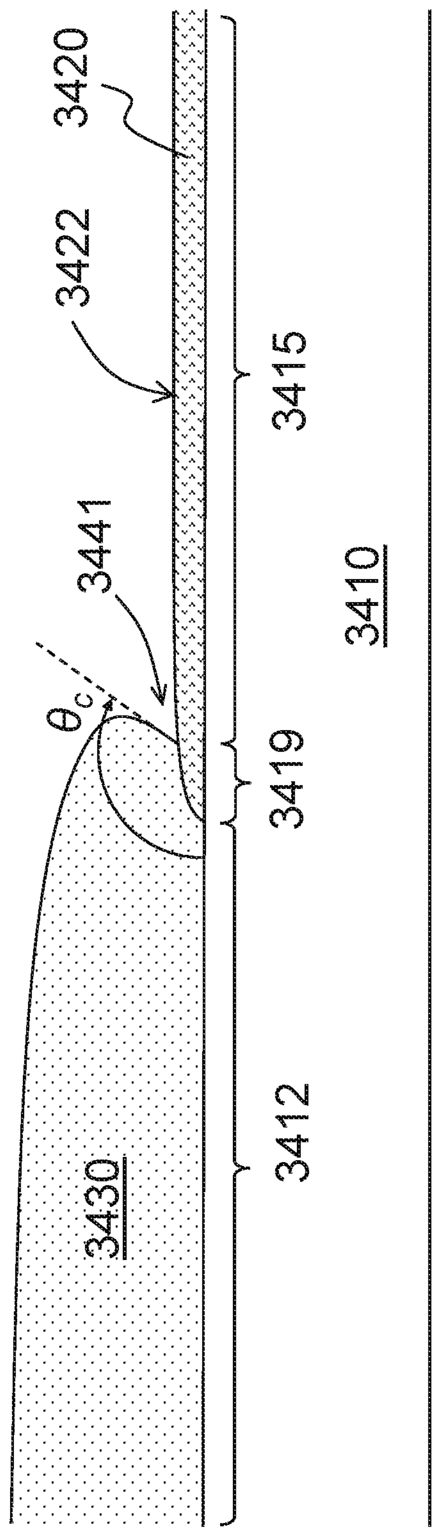
FIG. 22D is a diagram illustrating a cross-sectional profile near an interface of a conductive coating and a nucleation inhibiting coating, according to yet another embodiment.

FIGS. 22C and 22D illustrates yet another embodiment in which the conductive coating 3430 partially overlaps a portion of the nucleation inhibiting coating 3420 in the third region 3419, which is disposed between the first region 3415 and the second region 3412. As illustrated in the figures, the portion of the conductive coating partially overlapping with a portion of the nucleation inhibiting coating 3420 may be in direct physical contact with the surface 3422 of the nucleation inhibiting coating 3420. In this regard, the overlap in the third region 3419 may be formed as a result of lateral growth of the conductive coating 3430 during an open mask or mask-free deposition process. More specifically, while the surface 3422 of the nucleation inhibiting coating 3420 may exhibit a relatively low affinity or initial sticking probability for the material of the conductive coating 3430 and thus the probability of the material nucleating on the surface 3422 is low, as the conductive coating 3430 grows in thickness, the coating 3430 may also grow laterally and may cover a portion of the nucleation inhibiting coating 3420.

In the case of FIGS. 22C and 22D, the contact angle $\theta_c$ of the conductive coating 3430 may be measured at an edge of the conductive coating near the interface between the conductive coating 3430 and the nucleation inhibiting coating 3420, as illustrated in the figures. Particularly in reference to FIG. 22D, the contact angle θc may be greater than about 90 degrees, which results in a portion of the conductive coating 3430 being spaced apart from the nucleation inhibiting coating 3420 by a gap 3441.

In some embodiments, the nucleation inhibiting coating 3420 may be removed subsequent to deposition of the conductive coating 3430, such that at least a portion of an underlying surface covered by the nucleation inhibiting coating 3420 in the embodiments of FIGS. 18-22D becomes exposed. For example, the nucleation inhibiting coating 3420 may be selectively removed by etching or dissolving the nucleation inhibiting coating 3420, or using plasma or solvent processing techniques without substantially affecting or eroding the conductive coating 3430.

Figure 23B:
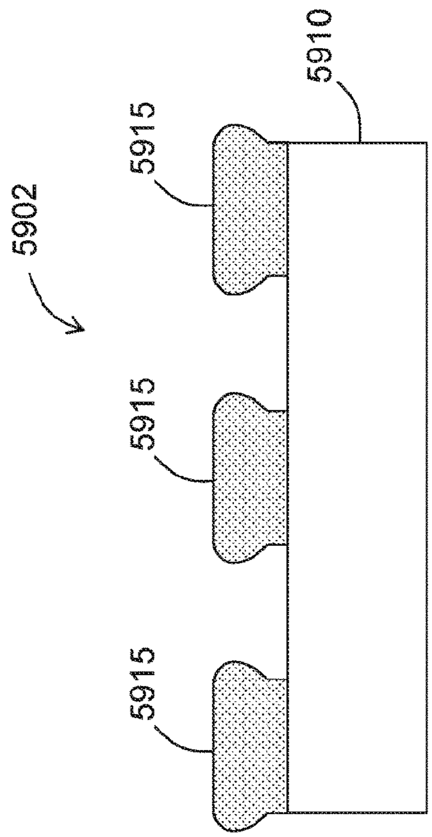
FIGS. 23A and 23B illustrate a process for removing a nucleation inhibiting coating following deposition of a conductive coating, according to one embodiment.
Figure 23A:
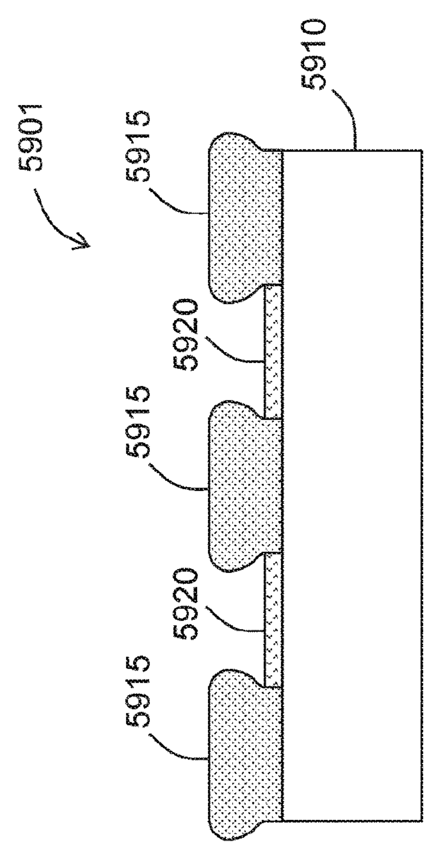

FIG. 23A illustrates a device 5901 according to one embodiment, which includes a substrate 5910 and a nucleation inhibiting coating 5920 and a conductive coating 5915 (e.g., a magnesium coating) deposited over respective regions of a surface of the substrate 5910.

FIG. 23B illustrates a device 5902 after the nucleation inhibiting coating 5920 present in the device 5901 has been removed from the surface of the substrate 5910, such that the conductive coating 5915 remains on the substrate 5910 and regions of the substrate 5910 which were covered by the nucleation inhibiting coating 5920 are now exposed or uncovered. For example, the nucleation inhibiting coating 5920 of the device 5901 may be removed by exposing the substrate 5910 to solvent or plasma which preferentially reacts and/or etches away the nucleation inhibiting coating 5920 without substantially affecting the conductive coating 5915.

A device of some embodiments may be an electronic device, and, more specifically, an opto-electronic device. An opto-electronic device generally encompasses any device that converts electrical signals into photons or vice versa. As such, an organic opto-electronic device can encompass any opto-electronic device where one or more active layers of the device are formed primarily of an organic material, and, more specifically, an organic semiconductor material. Examples of organic opto-electronic devices include, but are not limited to, OLED devices and OPV devices.

It will also be appreciated that organic opto-electronic devices may be formed on various types of base substrates. For example, a base substrate may be a flexible or rigid substrate. The base substrate may include, for example, silicon, glass, metal, polymer (e.g., polyimide), sapphire, or other materials suitable for use as the base substrate.

It will also be appreciated that various components of a device may be deposited using a wide variety of techniques, including vapor deposition, spin-coating, line coating, printing, and various other deposition techniques.

In some embodiments, an organic opto-electronic device is an OLED device, wherein an organic semiconductor layer includes an electroluminescent layer. In some embodiments, the organic semiconductor layer may include additional layers, such as an electron injection layer, an electron transport layer, a hole transport layer, and/or a hole injection layer. For example, the OLED device may be an AMOLED device, PMOLED device, or an OLED lighting panel or module. Furthermore, the opto-electronic device may be a part of an electronic device. For example, the opto-electronic device may be an OLED display module of a computing device, such as a smartphone, a tablet, a laptop, or other electronic device such as a monitor or a television set.

In some embodiments, an opto-electronic device is an OLED device, wherein the device generally includes an anode, an organic semiconductor layer and a cathode.

FIGS. 24-27 illustrate various embodiments of an active matrix OLED (AMOLED) display device. For the sake of simplicity, various details and characteristics of a conductive coating at or near an interface between the conductive coating and a nucleation inhibiting coating described above in reference to FIGS. 18-22D have been omitted. However, it will be appreciated that the features described in reference to FIGS. 18-22D may also be applicable to the embodiments of FIGS. 24-27.

Figure 24:
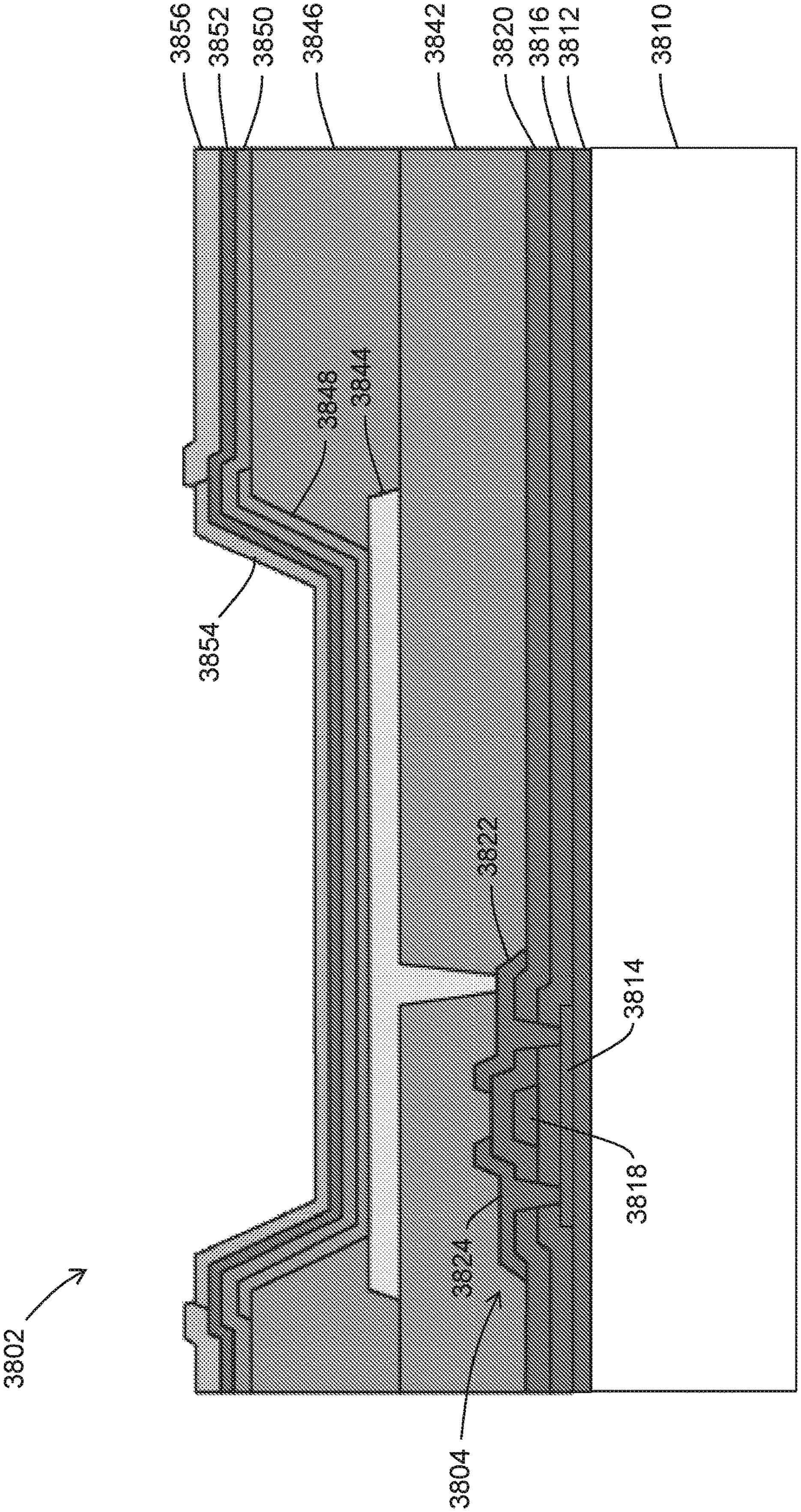
FIG. 24 is a diagram illustrating a cross-sectional profile of an active matrix OLED device, according to one embodiment.

FIG. 24 is a schematic diagram illustrating a structure of an AMOLED device 3802 according to one embodiment.

The device 3802 includes a base substrate 3810, and a buffer layer 3812 deposited over a surface of the base substrate 3810. A thin-film transistor (TFT) 3804 is then formed over the buffer layer 3812. Specifically, a semiconductor active area 3814 is formed over a portion of the buffer layer 3812, and a gate insulating layer 3816 is deposited to substantially cover the semiconductor active area 3814. Next, a gate electrode 3818 is formed on top of the gate insulating layer 3816, and an interlayer insulating layer 3820 is deposited. A source electrode 3824 and a drain electrode 3822 are formed such that they extend through openings formed through the interlayer insulating layer 3820 and the gate insulating layer 3816 to be in contact with the semiconductor active layer 3814. An insulating layer 3842 is then formed over the TFT 3804. A first electrode 3844 is then formed over a portion of the insulating layer 3842. As illustrated in FIG. 24, the first electrode 3844 extends through an opening of the insulating layer 3842 such that it is in electrical communication with the drain electrode 3822. Pixel definition layers (PDLs) 3846 are then formed to cover at least a portion of the first electrode 3844, including its outer edges. For example, the PDLs 3846 may include an insulating organic or inorganic material. An organic layer 3848 is then deposited over the first electrode 3844, particularly in regions between neighboring PDLs 3846. A second electrode 3850 is deposited to substantially cover both the organic layer 3848 and the PDLs 3846. A surface of the second electrode 3850 is then substantially covered with a nucleation promoting coating 3852. For example, the nucleation promoting coating 3852 may be deposited using an open mask or a mask-free deposition technique. A nucleation inhibiting coating 3854 is selectively deposited over a portion of the nucleation promoting coating 3852. For example, the nucleation inhibiting coating 3854 may be selectively deposited using a shadow mask. Accordingly, an auxiliary electrode 3856 is selectively deposited over an exposed surface of the nucleation promoting coating 3852 using an open mask or a mask-free deposition process. For further specificity, by conducting thermal deposition of the auxiliary electrode 3856 (e.g., including magnesium) using an open mask or with a mask, the auxiliary electrode 3856 is selectively deposited over the exposed surface of the nucleation promoting coating 3852, while leaving a surface of the nucleation inhibiting coating 3854 substantially free of a material of the auxiliary electrode 3856.

Figure 25:
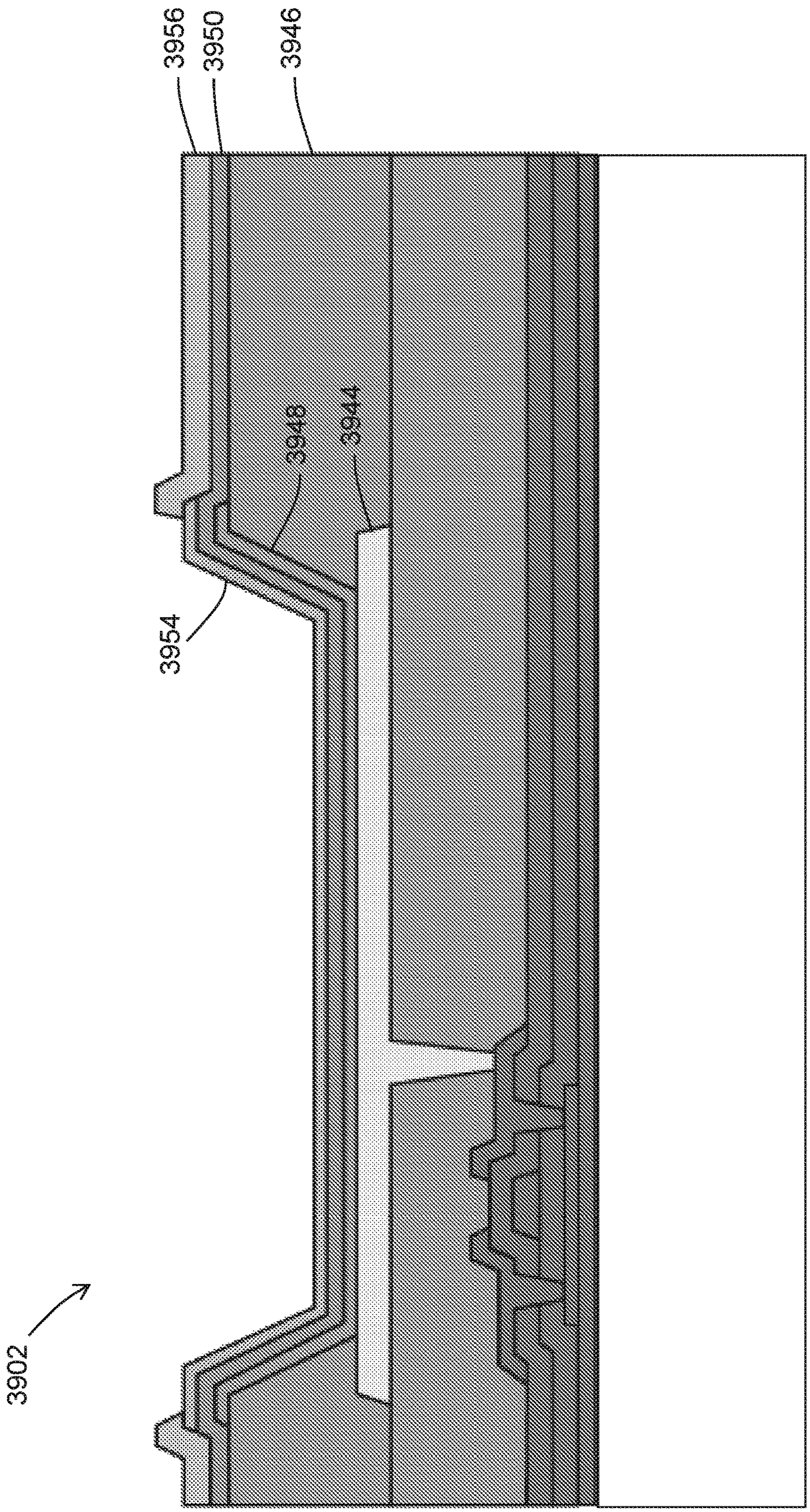
FIG. 25 is a diagram illustrating a cross-sectional profile of an active matrix OLED device, according to another embodiment.

FIG. 25 illustrates a structure of an AMOLED device 3902 according to another embodiment in which a nucleation promoting coating has been omitted. For example, the nucleation promoting coating may be omitted in cases where a surface on which an auxiliary electrode is deposited has a relatively high initial sticking probability for a material of the auxiliary electrode. In other words, for surfaces with a relatively high initial sticking probability, the nucleation promoting coating may be omitted, and a conductive coating may still be deposited thereon. For sake of simplicity, certain details of a backplane including those regarding the TFT are omitted in describing the following embodiments.

In FIG. 25, an organic layer 3948 is deposited between a first electrode 3944 and a second electrode 3950. The organic layer 3948 may partially overlap with portions of PDLs 3946. A nucleation inhibiting coating 3954 is deposited over a portion (e.g., corresponding to an emissive region) of the second electrode 3950, thereby providing a surface with a relatively low initial sticking probability (e.g., a relatively low desorption energy) for a material used to form an auxiliary electrode 3956. Accordingly, the auxiliary electrode 3956 is selectively deposited over a portion of the second electrode 3950 that is exposed from the nucleation inhibiting coating 3954. As would be understood, the auxiliary electrode 3956 is in electrical communication with the underlying second electrode 3950 so as to reduce a sheet resistance of the second electrode 3950. For example, the second electrode 3950 and the auxiliary electrode 3956 may include substantially the same material to ensure a high initial sticking probability for the material of the auxiliary electrode 3956. Specifically, the second electrode 3950 may include substantially pure magnesium (Mg) or an alloy of magnesium and another metal, such as silver (Ag). For Mg:Ag alloy, an alloy composition may range from about 1:9 to about 9:1 by volume. In other examples, the second electrode 3950 may include metal oxides such as ITO and IZO, or combination of metals and metal oxides. The auxiliary electrode 3956 may include substantially pure magnesium.

Figure 26:
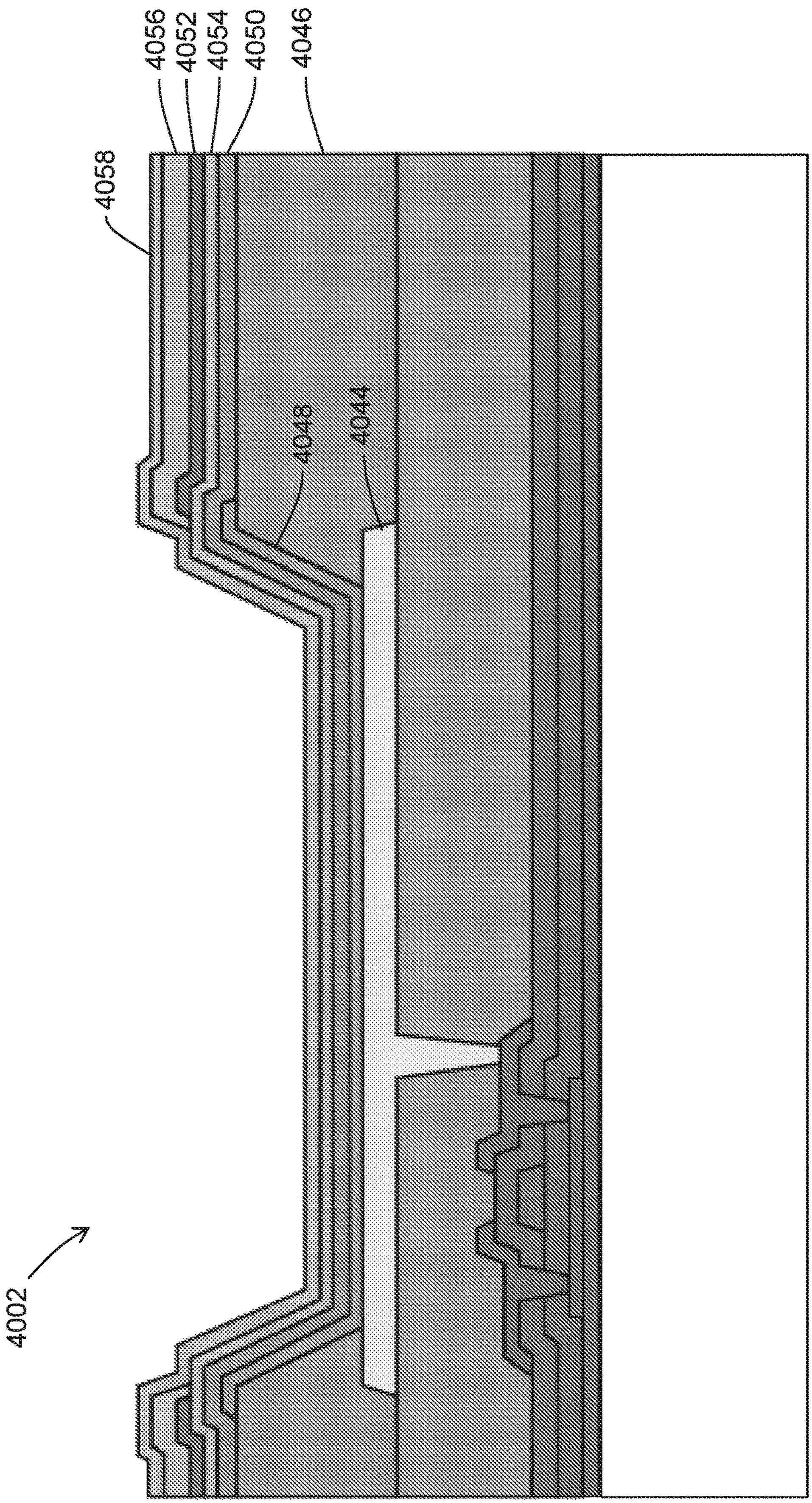
FIG. 26 is a diagram illustrating a cross-sectional profile of an active matrix OLED device, according to yet another embodiment.

FIG. 26 illustrates a structure of an AMOLED device 4002 according to yet another embodiment. In the illustrated embodiment, an organic layer 4048 is deposited between a first electrode 4044 and a second electrode 4050 such that it partially overlaps with portions of PDLs 4046. A nucleation inhibiting coating 4054 is deposited so as to substantially cover a surface of the second electrode 4050, and a nucleation promoting coating 4052 is selectively deposited on a portion of the nucleation inhibiting coating 4054. An auxiliary electrode 4056 is then formed over the nucleation promoting coating 4052. Optionally, a capping layer 4058 may be deposited to cover exposed surfaces of the nucleation inhibiting coating 4054 and the auxiliary electrode 4056.

While the auxiliary electrode 3856 or 4056 is illustrated as not being in direct physical contact with the second electrode 3850 or 4050 in the embodiments of FIGS. 24 and 26, it will be understood that the auxiliary electrode 3856 or 4056 and the second electrode 3850 or 4050 may nevertheless be in electrical communication. For example, the presence of a relatively thin film (e.g., up to about 100 nm) of a nucleation promoting material or a nucleation inhibiting material between the auxiliary electrode 3856 or 4056 and the second electrode 3850 or 4050 may still sufficiently allow a current to pass there through, thus allowing a sheet resistance of the second electrode 3850 or 4050 to be reduced.

Figure 27:
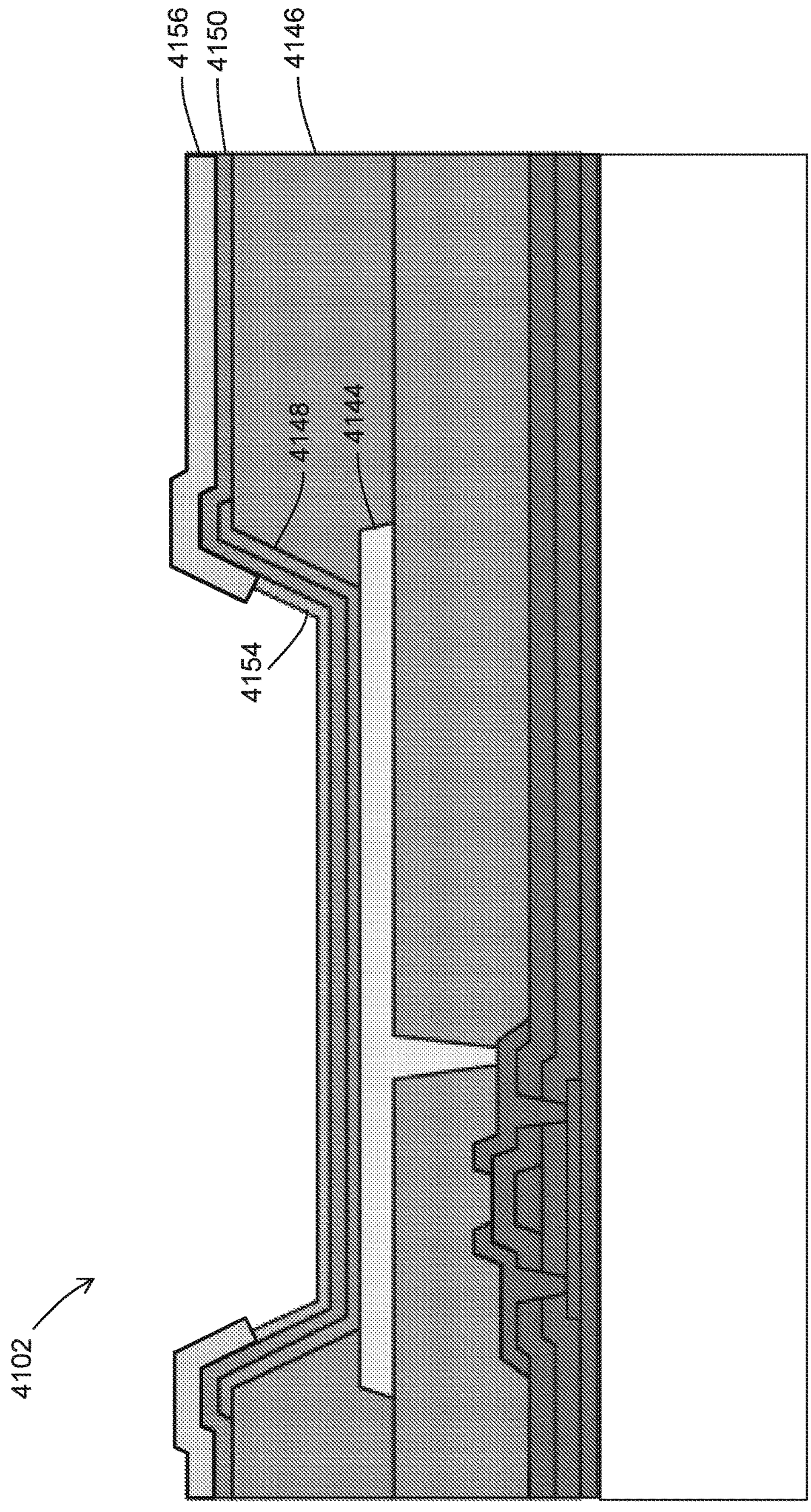
FIG. 27 is a diagram illustrating a cross-sectional profile of an active matrix OLED device, according to yet another embodiment.

FIG. 27 illustrates a structure of an AMOLED device 4102 according to yet another embodiment in which an interface between a nucleation inhibiting coating 4154 and an auxiliary electrode 4156 is formed on a slanted surface created by PDLs 4146. The device 4102 includes an organic layer 4148 deposited between a first electrode 4144 and a second electrode 4150, and the nucleation inhibiting coating 4154 is deposited over a portion of the second electrode 4150 which corresponds to an emissive region of the device 4102. The auxiliary electrode 4156 is deposited over portions of the second electrode 4150 that are exposed from the nucleation inhibiting coating 4154.

While not shown, the AMOLED device 4102 of FIG. 27 may further include a nucleation promoting coating disposed between the auxiliary electrode 4156 and the second electrode 4150. The nucleation promoting coating may also be disposed between the nucleation inhibiting coating 4154 and the second electrode 4150, particularly in cases where the nucleation promoting coating is deposited using an open mask or a mask-free deposition process.

Figure 28A:
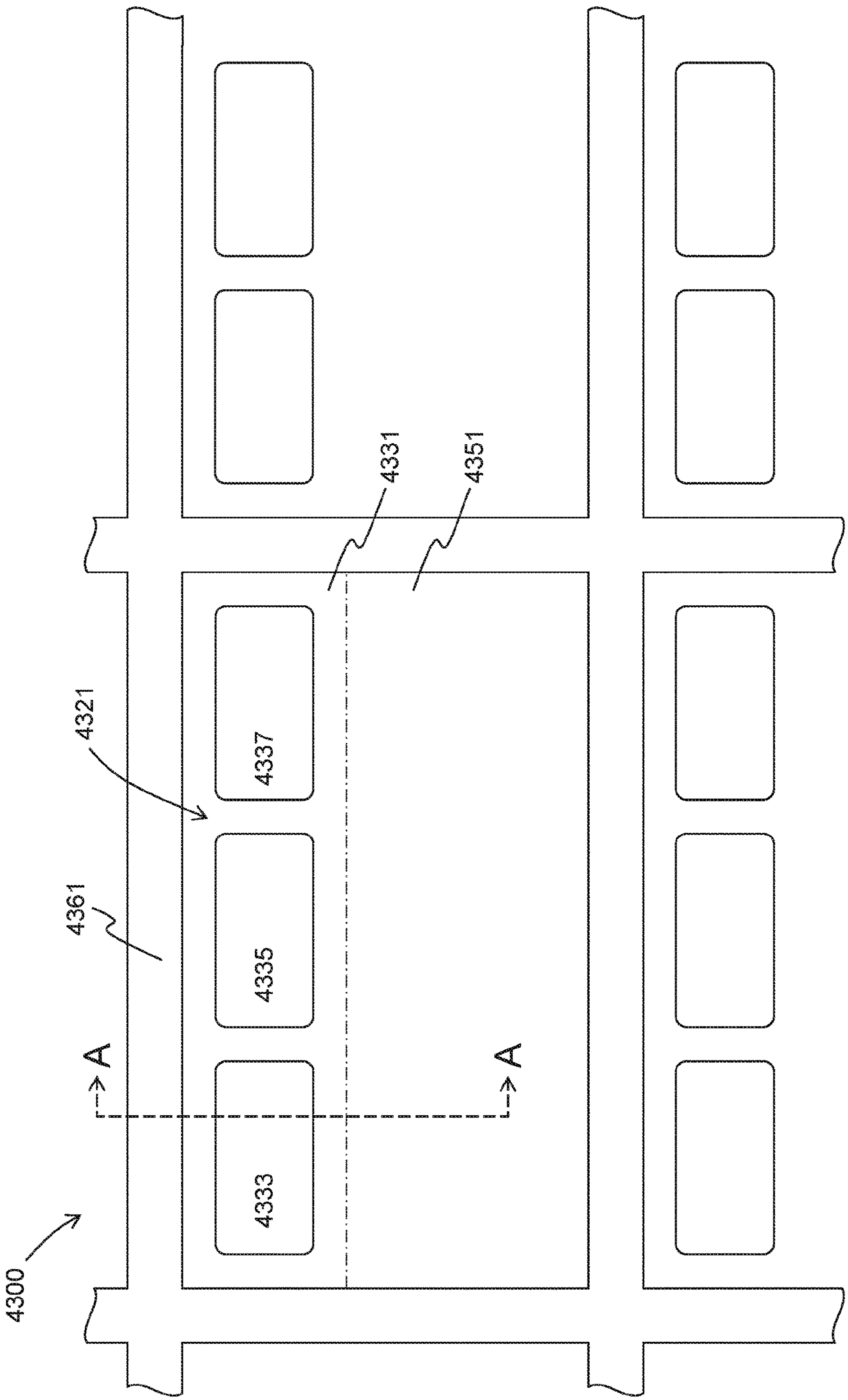
FIG. 28A is a diagram illustrating a transparent active matrix OLED device, according to one embodiment.

FIG. 28A illustrates a portion of an AMOLED device 4300 according to yet another embodiment wherein the AMOLED device 4300 includes a plurality of light transmissive regions. As illustrated, the AMOLED device 4300 includes a plurality of pixels 4321 and an auxiliary electrode 4361 disposed between neighboring pixels 4321. Each pixel 4321 includes a subpixel region 4331, which further includes a plurality of subpixels 4333, 4335, 4337, and a light transmissive region 4351. For example, the subpixel 4333 may correspond to a red subpixel, the subpixel 4335 may correspond to a green subpixel, and the subpixel 4337 may correspond to a blue subpixel. As will be explained, the light transmissive region 4351 is substantially transparent to allow light to pass through the device 4300.

Figure 28B:
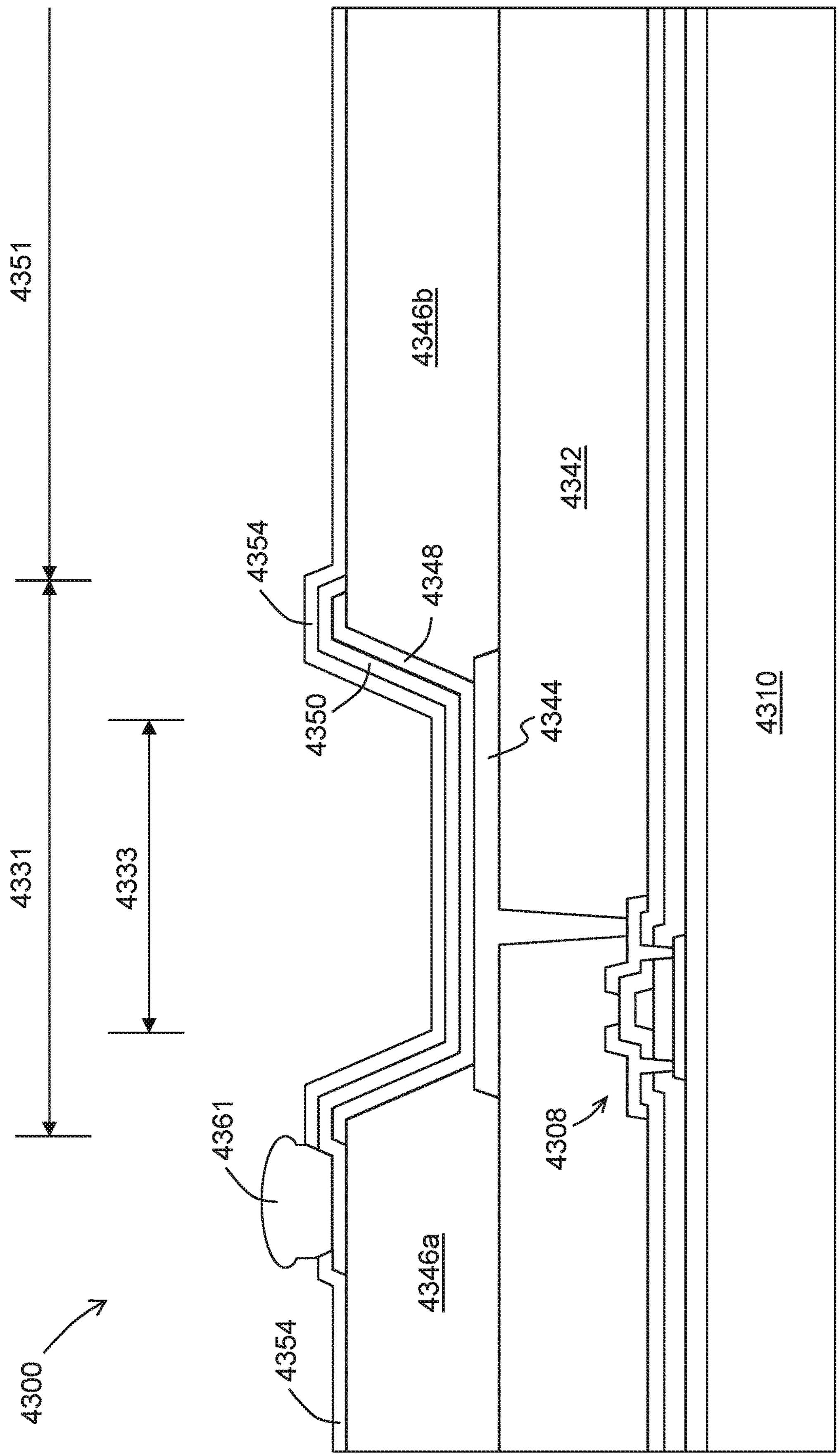
FIG. 28B is a diagram illustrating a cross-sectional profile of the device, according to FIG. 28A.

FIG. 28B illustrates a cross-sectional view of the device 4300 taken along line A-A as indicated in FIG. 28A. Briefly, the device 4300 includes a base substrate 4310, a TFT 4308, an insulating layer 4342, and an anode 4344 formed on the insulating layer 4342 and in electrical communication with the TFT 4308. A first PDL 4346*a* and a second PDL 4346*b* are formed over the insulating layer 4342 and cover edges of the anode 4344. One or more organic layers 4348 are deposited to cover an exposed region of the anode 4344 and portions of the PDLs 4346*a*, 4346*b*. A cathode 4350 is then deposited over the one or more organic layers 4348. Next, a nucleation inhibiting coating 4354 is deposited to cover portions of the device 4300 corresponding to the light transmissive region 4351 and the subpixel region 4331. The entire device surface is then exposed to magnesium vapor flux, thus causing selective deposition of magnesium over an uncoated region of the cathode 4350. In this way, the auxiliary electrode 4361, which is in electrical contact with the underlying cathode 4350, is formed.

In the device 4300, the light transmissive region 4351 is substantially free of any materials which may substantially affect the transmission of light there through. In particular, the TFT 4308, the anode 4344, and the auxiliary electrode 4361 are all positioned within the subpixel region 4331 such that these components do not attenuate or impede light from being transmitted through the light transmissive region 4351. Such arrangement allows a viewer viewing the device 4300 from a typical viewing distance to see through the device 4300 when the pixels are off or are non-emitting, thus creating a transparent AMOLED display.

While not shown, the AMOLED device 4300 of FIG. 28B may further include a nucleation promoting coating disposed between the auxiliary electrode 4361 and the cathode 4350. The nucleation promoting coating may also be disposed between the nucleation inhibiting coating 4354 and the cathode 4350.

In other embodiments, various layers or coatings, including the organic layers 4348 and the cathode 4350, may cover a portion of the light transmissive region 4351 if such layers or coatings are substantially transparent. Alternatively, the PDLs 4346*a*, 4346*b* may not be provided in the light transmissive region 4351, if desired.

It will be appreciated that pixel and subpixel arrangements other than the arrangement illustrated in FIGS. 28A and 28B may also be used, and the auxiliary electrode 4361 may be provided in other regions of a pixel. For example, the auxiliary electrode 4361 may be provided in the region between the subpixel region 4331 and the light transmissive region 4351, and/or be provided between neighbouring subpixels, if desired.

Figure 29A:
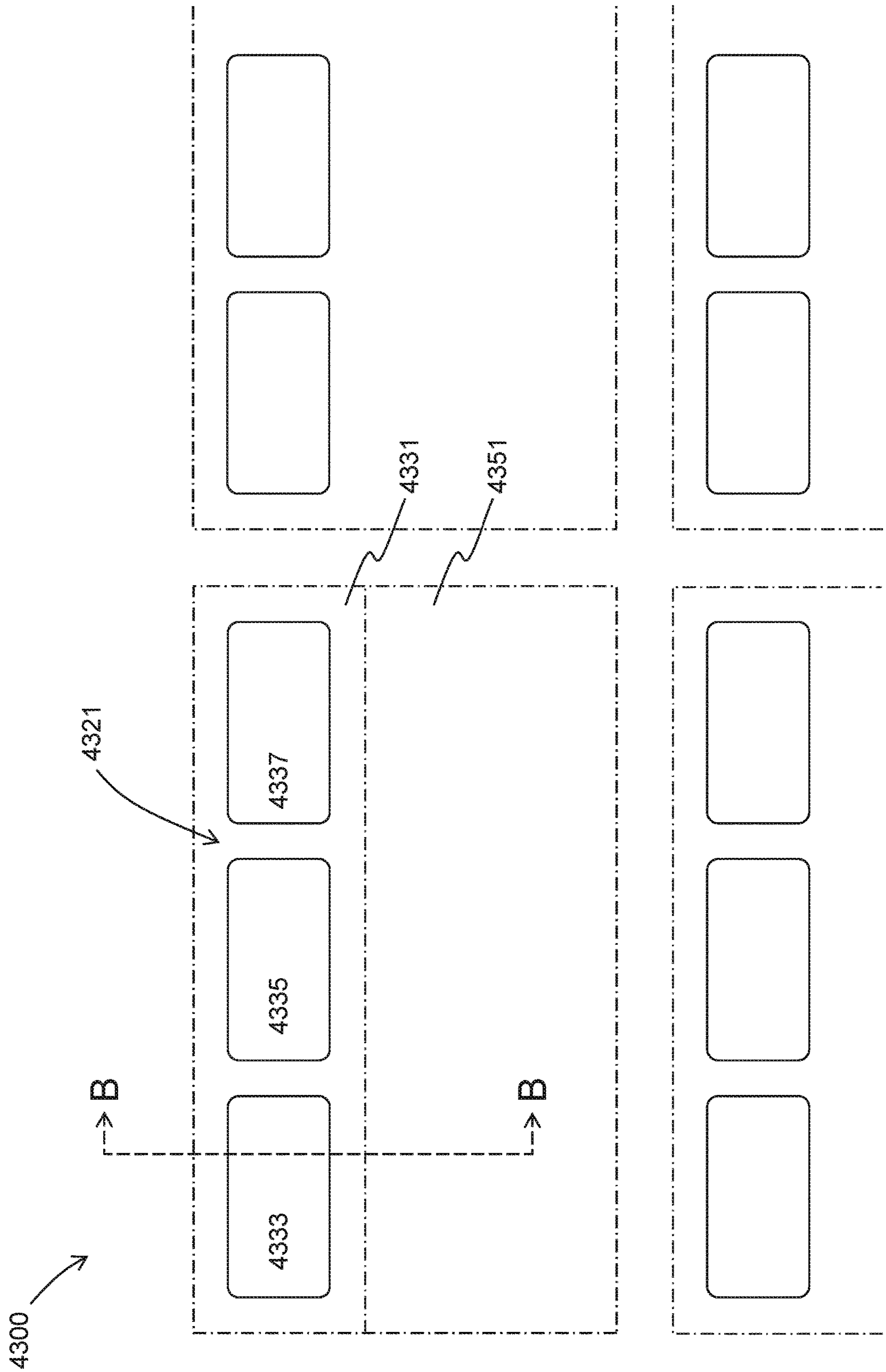
FIG. 29A is a diagram illustrating a transparent active matrix OLED device, according to one embodiment.

FIG. 29A illustrates a portion of an AMOLED device 4300 according to embodiment wherein the AMOLED device 4300 includes a plurality of light transmissive regions. As illustrated, the AMOLED device 4300 includes a plurality of pixels 4321. Each pixel 4321 includes a subpixel region 4331, which further includes a plurality of subpixels 4333, 4335, 4337, and a light transmissive region 4351. For example, the subpixel 4333 may correspond to a red subpixel, the subpixel 4335 may correspond to a green subpixel, and the subpixel 4337 may correspond to a blue subpixel. As will be explained, the light transmissive region 4351 is substantially transparent to allow light to pass through the device 4300.

Figure 29B:
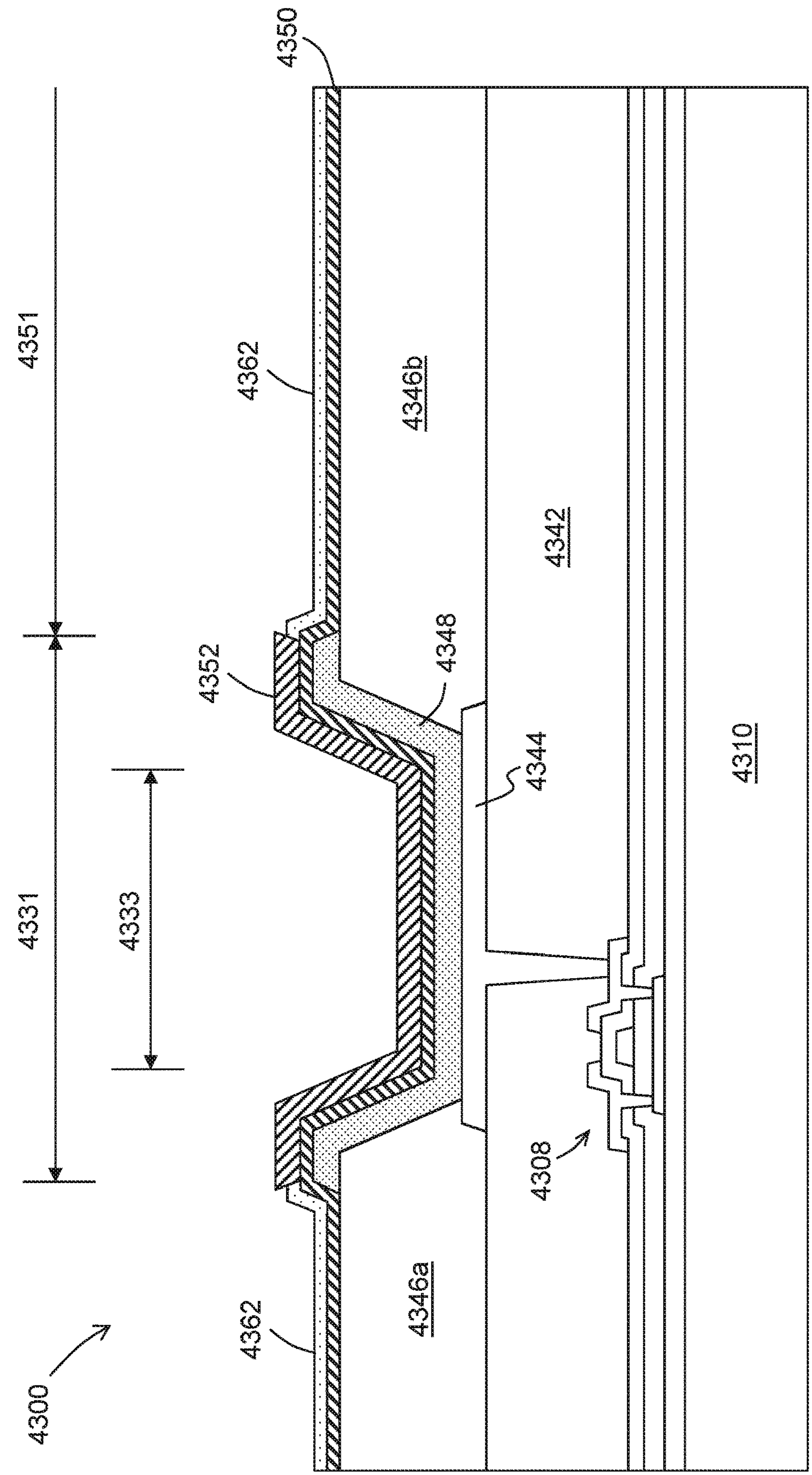
FIG. 29B is a diagram illustrating a cross-sectional profile of the device, according to one embodiment of FIG. 29A.

FIG. 29B illustrates a cross-sectional view of the device 4300 taken along line B-B according to one embodiment. The device 4300 includes a base substrate 4310, a TFT 4308, an insulating layer 4342, and an anode 4344 formed on the insulating layer 4342 and in electrical communication with the TFT 4308. A first PDL 4346*a* and a second PDL 4346*b* are formed over the insulating layer 4342 and cover the edges of the anode 4344. One or more organic layers 4348 are deposited to cover an exposed region of the anode 4344 and portions of the PDLs 4346*a*, 4346*b*. A first conductive coating 4350 is then deposited over the one or more organic layers 4348. In the illustrated embodiment, the first conductive coating 4350 is disposed over both the subpixel region 4331 and the light transmissive region 4351. In such embodiment, the first conductive coating 4350 may be substantially transparent or light-transmissive. For example, the thickness of the first conductive coating 4350 may be relatively thin such that the presence of the first conductive coating 4350 does not substantially attenuate transmission of light through the light transmissive region 4351. The first conductive coating 4350 may, for example, be deposited using an open mask or mask-free deposition process. Next, a nucleation inhibiting coating 4362 is deposited to cover portions of the device 4300 corresponding to the light transmissive region 4351. The entire device surface is then exposed to a vapor flux of material for forming the second conductive coating 4352, thus causing selective deposition of the second conductive coating 4352 over an uncoated region of the first conductive coating 4350. Specifically, the second conductive coating 4352 is disposed over a portion of the device 4300 corresponding to the subpixel region 4331. In this way, a cathode for the device 4300 is formed by the combination of the first conductive coating 4350 and the second conductive coating 4352.

In some embodiments, the thickness of the first conductive coating 4350 is less than the thickness of the second conductive coating 4352. In this way, relatively high light transmittance may be maintained in the light transmissive region 4351. For example, the thickness of the first conductive coating 4350 may be, for example, less than about 30 nm, less than about 25 nm, less than about 20 nm, less than about 15 nm, less than about 10 nm, less than about 8 nm, or less than about 5 nm, and the thickness of the second conductive coating 4352 may be, for example, less than about 30 nm, less than about 25 nm, less than about 20 nm, less than about 15 nm, less than about 10 nm, or less than about 8 nm. In other embodiments, the thickness of the first conductive coating 4350 is greater than the thickness of the second conductive coating 4352. In yet another embodiment, the thickness of the first conductive coating 4350 and the thickness of the second conductive coating 4352 may substantially be about the same.

The material(s) which may be used to form the first conductive coating 4350 and the second conductive coating 4352 may be substantially the same as those used to form the first conductive coating 1371 and the second conductive coating 1372, respectively. Since such materials have been described above in relation to other embodiments, descriptions of these materials are omitted for sake of brevity.

In the device 4300, the light transmissive region 4351 is substantially free of any materials which may substantially affect the transmission of light there through. In particular, the TFT 4308, the anode 4344, and an auxiliary electrode are all positioned within the subpixel region 4331 such that these components do not attenuate or impede light from being transmitted through the light transmissive region 4351. Such arrangement allows a viewer viewing the device 4300 from a typical viewing distance to see through the device 4300 when the pixels are off or are non-emitting, thus creating a transparent AMOLED display.

In some embodiments, an electrode of an AMOLED device may be patterned. For example, a conductive coating which has been selectively deposited using the processes described above in various embodiments may act as an electrode (e.g. cathode) of an AMOLED device.

Accordingly, in one embodiment, a light-emitting opto-electronic device is provided, the device including: an emissive region and a non-emissive region; a nucleation inhibition coating disposed in at least a portion of the non-emissive region; and a conductive coating disposed in the emissive region. In a further embodiment, the emissive region includes a first electrode, a semiconducting layer disposed over the first electrode, and the conductive coating disposed over the semiconducting layer. In this way, for example, the first electrode may act as an anode and the conductive coating may act as a cathode of the opto-electronic device. In such embodiments, the surface of the nucleation inhibiting coating in the non-emissive region may be substantially free of, or exposed from the conductive coating. In a yet further embodiment, a nucleation promoting coating may be disposed between the semiconducting layer and the conductive coating. It will be appreciated that the light-emitting opto-electronic device may be an AMOLED device, which may further include other layers, coatings, and components described herein in relation to such devices (including but not limited to TFTs, encapsulation, etc.) For example, the conductive coating disposed in the emissive region may have a thickness of less than about 40 nm, for example between about 5 nm and about 30 nm, between about 10 nm and about 25 nm, or between about 15 nm and about 25 nm. In some examples, the non-emissive region may include a light transmissive region.

Figure 29C:
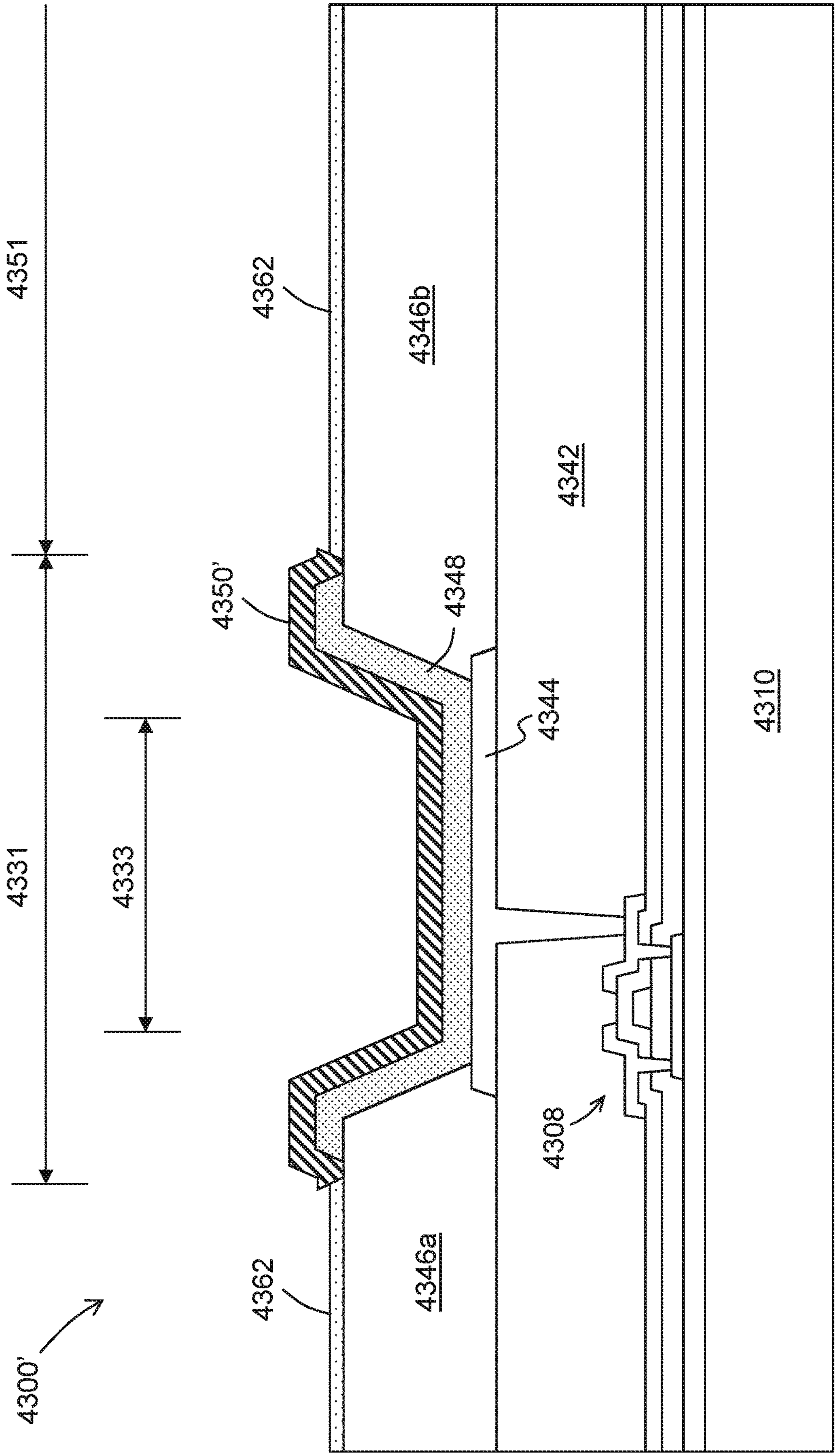

FIG. 29C illustrates the cross-section of the device 4300' according to an embodiment, wherein the first conductive coating 4350' is selectively disposed in the subpixel region 4331 and the light transmissive region 4351 is substantially free of, or exposed from, the material used to form the first conductive coating 4350'. For example, during fabrication of the device 4300', the nucleation inhibiting coating 4362 may be deposited in the light transmissive region 4351 prior to depositing the first conductive coating 4350'. In this way, the first conductive coating 4350' may be selectively deposited in the subpixel region 4331 using an open mask or mask-free deposition process. As explained above, the material used to form the first conductive coating 4350' generally exhibits a relatively poor affinity (e.g., low initial sticking probability) towards being deposited onto the surface of the nucleation inhibiting coating 4362. For example, the first conductive coating 4350' may comprise high vapor pressure materials, such as ytterbium (Yb), zinc (Zn), cadmium (Cd) and magnesium (Mg). In some embodiments, the first conductive coating 4350' may comprise pure or substantially pure magnesium. By providing a light transmissive region 4351 that is free or substantially free of the first conductive coating 4350', the light transmittance in such region may be favorably enhanced in some cases, for example in comparison to the device 4300 of FIG. 29B. In some embodiments, a nucleation promoting coating may be arranged at the interface between the first conductive coating 4350' and the semiconducting layer 4348.

While not shown, the AMOLED device 4300 of FIG. 29B and the AMOLED device 4300' of FIG. 29C may each further include a nucleation promoting coating disposed between the first conductive coating 4350 or 4350' and the underlying surfaces (e.g., the organic layer 4348). Such nucleation promoting coating may also be disposed between the nucleation inhibiting coating 4362 and the underlying surfaces (e.g., the PDLs 4346*a-b*).

In some embodiments, the nucleation inhibiting coating 4362 may be formed concurrently with at least one of the organic layers 4348. For example, the material for forming the nucleation inhibiting coating 4362 may also be used to form at least one of the organic layers 4348. In this way, the number of stages for fabricating the device 4300 or 4300' may be reduced.

In some embodiments, additional conductive coatings, including the second conductive coating and the third conductive coating, which have been described in relation to other embodiments above, may also be provided over subpixels 4333, 4335, and 4337. Additionally, in some embodiments, an auxiliary electrode may also be provided in non-emissive regions of the device 4300, 4300'. For example, such auxiliary electrode may be provided in the regions between neighboring pixels 4321 such that it does not substantially affect the light transmittance in the subpixel regions 4331 or the light transmissive regions 4351. The auxiliary electrode may also be provided in the region between the subpixel region 4331 and the light transmissive region 4351, and/or be provided between neighboring subpixels, if desired. For example, referring to the embodiment of FIG. 29B, an additional nucleation inhibiting coating may be deposited over a portion of the second conductive coating 4352 corresponding to the subpixel 4333 region, while leaving the portion corresponding to the non-emissive region uncovered or exposed. In this way, an open mask or mask-free deposition of a conductive material may be conducted to result in an auxiliary electrode being formed over the non-emissive regions of the device 4300.

In some embodiments, various layers or coatings, including the organic layers 4348, may cover a portion of the light transmissive region 4351 if such layers or coatings are substantially transparent. Alternatively, the PDLs 4346*a*, 4346*b* may be omitted from the light transmissive region 4351, if desired.

It will be appreciated that pixel and subpixel arrangements other than the arrangement illustrated in FIGS. 29A, 29B and 29C may also be used.

In the foregoing embodiments, a nucleation inhibiting coating may, in addition to inhibiting nucleation and deposition of a conductive material (e.g., magnesium) thereon, act to enhance an out-coupling of light from a device. Specifically, the nucleation inhibiting coating may act as an index-matching coating, capping layer (CPL), and/or an anti-reflective coating.

A barrier coating (not shown) may be provided to encapsulate the devices illustrated in the foregoing embodiments depicting AMOLED display devices. As will be appreciated, such a barrier coating may inhibit various device layers, including organic layers and a cathode which may be prone to oxidation, from being exposed to moisture and ambient air. For example, the barrier coating may be a thin film encapsulation formed by printing, CVD, sputtering, ALD, any combinations of the foregoing, or by any other suitable methods. The barrier coating may also be provided by laminating a pre-formed barrier film onto the devices using an adhesive. For example, the barrier coating may be a multi-layer coating comprising organic materials, inorganic materials, or combination of both. The barrier coating may further comprise a getter material and/or a desiccant in some embodiments.

A sheet resistance specification for a common electrode of an AMOLED display device may vary according to a size of the display device (e.g., a panel size) and a tolerance for voltage variation. In general, the sheet resistance specification increases (e.g., a lower sheet resistance is specified) with larger panel sizes and lower tolerances for voltage variation across a panel.

The sheet resistance specification and an associated thickness of an auxiliary electrode to comply with the specification according to an embodiment were calculated for various panel sizes. The sheet resistances and the auxiliary electrode thicknesses were calculated for voltage tolerances of 0.1 V and 0.2 V. For the purpose of the calculation, an aperture ratio of 0.64 was assumed for all display panel sizes.

The specified thickness of the auxiliary electrode at example panel sizes are summarized in Table 2 below.

TABLE 2

Specified thickness of auxiliary electrode for various panel sizes

| Panel Size (inch) | | 9.7 | 12.9 | 15.4 | 27 | 65 |
|---|---|---|---|---|---|---|
| Specified Thickness | @0.1 V | 132 | 239 | 335 | 1100 | 6500 |
| (nm) | @0.2 V | 67 | 117 | 174 | 516 | 2800 |

As will be understood, various layers and portions of a backplane, including a thin-film transistor (TFT) (e.g., TFT 3804 shown in FIG. 24) may be fabricated using a variety of suitable materials and processes. For example, the TFT may be fabricated using organic or inorganic materials, which may be deposited and/or processed using techniques such as CVD, PECVD, laser annealing, and PVD (including sputtering). As would be understood, such layers may be patterned using photolithography, which uses a photomask to expose selective portions of a photoresist covering an underlying device layer to UV light. Depending on the type of photoresist used, exposed or unexposed portions of the photomask may then be washed off to reveal desired portion(s) of the underlying device layer. A patterned surface may then be etched, chemically or physically, to effectively remove an exposed portion of the device layer.

Furthermore, while a top-gate TFT has been illustrated and described in certain embodiments above, it will be appreciated that other TFT structures may also be used. For example, the TFT may be a bottom-gate TFT. The TFT may be an n-type TFT or a p-type TFT. Examples of TFT structures include those utilizing amorphous silicon (a-Si), indium gallium zinc oxide (IGZO), and low-temperature polycrystalline silicon (LTPS).

Various layers and portions of a frontplane, including electrodes, one or more organic layers, a pixel definition layer, and a capping layer may be deposited using any suitable deposition processes, including thermal evaporation and/or printing. It will be appreciated that, for example, a shadow mask may be used as appropriate to produce desired patterns when depositing such materials, and that various etching and selective deposition processes may also be used to pattern various layers. Examples of such methods include, but are not limited to, photolithography, printing (including ink or vapor jet printing and reel-to-reel printing), OVPD, and LITI patterning.

Selective Deposition of a Conductive Coating Over Emissive Regions

In one aspect, a method for selectively depositing a conductive coating over one or more emissive regions is provided. In some embodiments, the method includes depositing a first conductive coating on a substrate. The substrate may include a first emissive region and a second emissive region. The first conductive coating deposited on the substrate may include a first portion coating the first emissive region and a second portion coating the second emissive region of the substrate. The method may further include depositing a first nucleation inhibiting coating on the first portion of the first conductive coating, and then depositing a second conductive coating on the second portion of the first conductive coating.

Figure 30:
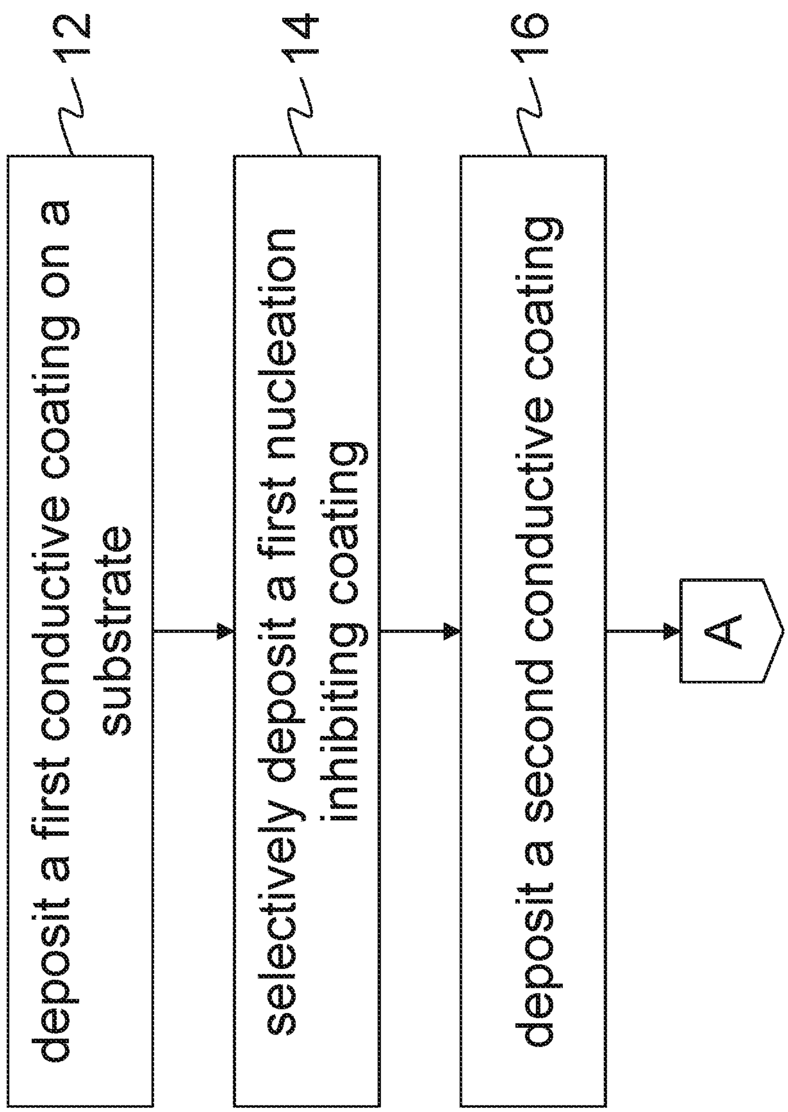
FIG. 30 is a flow diagram illustrating the stages for fabricating a device, according to one embodiment.

FIG. 30 is a flow diagram outlining stages of manufacturing a device according to one embodiment. FIGS. 31A-31D are schematic diagrams illustrating the device at each stage of the process.

Figure 31A:
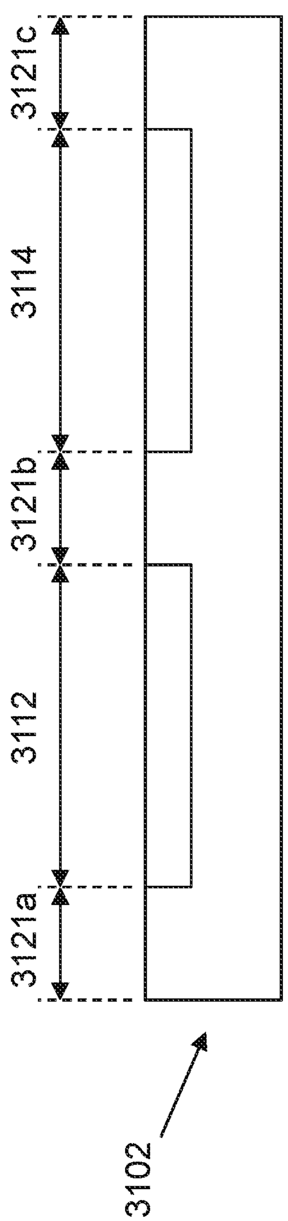
FIGS. 31A-31D are schematic diagrams illustrating the various stages of device fabrication, according to the embodiment of FIG. 30.

As illustrated in FIG. 31A, a substrate 3102 is provided. The substrate 3102 comprises a first emissive region 3112 and a second emissive region 3114. The substrate 3102 may further comprise one or more non-emissive regions 3121*a*-3121*c*. For example, the first emissive region 3112 and the second emissive region 3114 may correspond to pixel regions or subpixel regions of an electroluminescent device.

Figure 31B:
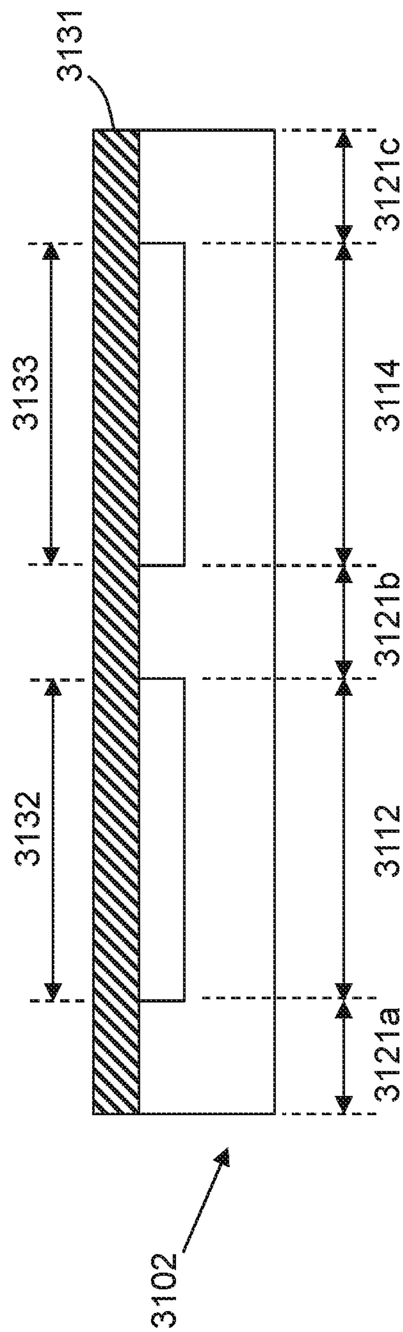
Figure 31C:
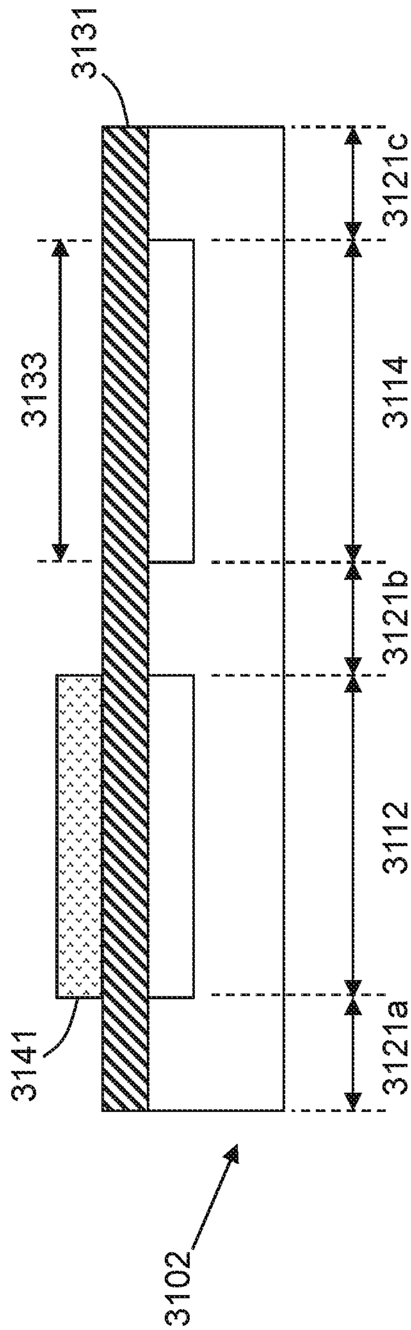

In stage 12, a first conductive coating 3131 is deposited over the substrate. As illustrated in FIG. 31B, the first conductive coating 3131 is deposited to coat the first emissive region 3112, the second emissive region 3114, and the non-emissive regions 3121*a*-3121*c*. The first conductive coating 3131 includes a first portion 3132 corresponding to the portion coating the first emissive region 3112, and a second portion 3133 corresponding to the portion coating the second emissive region 3114. For example, the first conductive coating 3131 may be deposited by evaporation, including thermal evaporation and electron beam evaporation. In some embodiments, the first conductive coating 3131 may be deposited using an open mask or without a mask (i.e. mask-free). The first conductive coating 3131 may be deposited using other methods including, but not limited to, sputtering, chemical vapor deposition, printing (including ink or vapor jet printing, reel-to-reel printing, and micro-contact transfer printing), OVPD, LITI, and combinations thereof.

In stage 14, a first nucleation inhibiting coating 3141 is selectively deposited over a portion of the first conductive coating 3131. In the embodiment illustrated in FIG. 31C, the first nucleation inhibiting coating 3141 is deposited to coat the first portion 3132 of the first conductive coating 3131, which corresponds to the first emissive region 3112. In such embodiment, the second portion 3133 of the first conductive coating 3131 disposed over the second emissive region 3114 is substantially free of, or exposed from, the first nucleation inhibiting coating 3141. In some embodiments, the first nucleation inhibiting coating 3141 may optionally also coat portion(s) of the first conductive coating 3131 deposited over one or more non-emissive regions. For example, the first nucleation inhibiting coating 3141 may optionally also coat the portion(s) of the first conductive coating 3131 deposited over one or more non-emissive regions adjacent to the first emissive region 3112, such as the non-emissive region 3121*a* and/or 3121*b*. Various processes for selectively depositing a material on a surface may be used to deposit the first nucleation inhibiting coating 3141 including, but not limited to, evaporation (including thermal evaporation and electron beam evaporation), photolithography, printing (including ink or vapor jet printing, reel-to-reel printing, and micro-contact transfer printing), OVPD, LITI patterning, and combinations thereof.

Figure 31D:
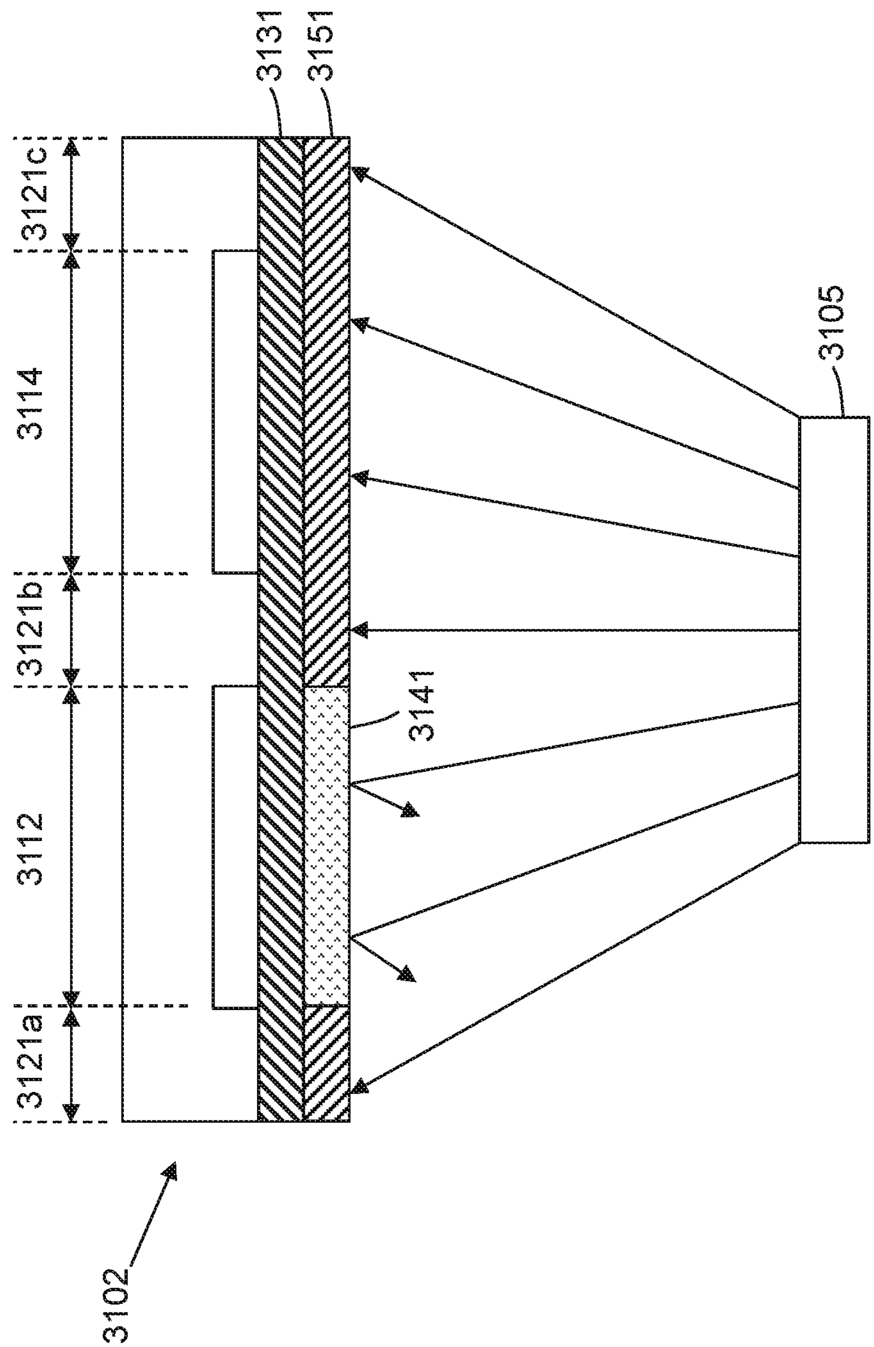

Once the first nucleation inhibiting coating 3141 has been deposited on a region of the surface of the first conductive coating 3131, a second conductive coating 3151 may be deposited on remaining uncovered region(s) of the surface where the nucleation inhibiting coating is not present. Turning to FIG. 31D, in stage 16, a conductive coating source 3105 is illustrated as directing an evaporated conductive material towards the surfaces of the first conductive coating 3131 and the first nucleation inhibiting coating 3141. As illustrated in FIG. 31D, the conducting coating source 3105 may direct the evaporated conductive material such that it is incident on both covered or treated areas (namely, region(s) of the first conductive coating 3131 with the nucleation inhibiting coating 3141 deposited thereon) and uncovered or untreated areas of the first conductive coating 3131. However, since a surface of the first nucleation inhibiting coating 3141 exhibits a relatively low initial sticking coefficient compared to that of the uncovered surface of the first conductive coating 3131, a second conductive coating 3151 selectively deposits onto the areas of the first conductive coating surface where the first nucleation inhibiting coating 3141 is not present. Accordingly, the second conductive coating 3151 may coat the second portion 3133 of the first conductive coating 3131, which corresponds to the portion of the first conductive coating 3131 coating the second emissive region 3114. As illustrated in FIG. 31D, the second conductive coating 3151 may also coat other portions or regions of the first conductive coating 3131, including the portions coating the non-emissive regions 3121*a*, 3121*b*, and 3121*c*. The second conductive coating 3151 may include, for example, pure or substantially pure magnesium. For example, the second conductive coating 3151 may be formed using materials which are identical to those used to form the first conductive coating 3131. The second conductive coating 3151 may be deposited using an open mask or without a mask (i.e. mask-free deposition process).

In some embodiments, the method may further include additional stages following stage 16. Such additional stages may include, for example, depositing one or more additional nucleation inhibiting coatings, depositing one or more additional conductive coatings, depositing an auxiliary electrode, depositing an outcoupling coating, and/or encapsulation of the device.

It will be appreciated that, while the method has been illustrated and described above in relation to a device having the first and second emissive regions, it can similarly be applied to devices having three or more emissive regions. For example, such method may be used to deposit a conductive coating of varying thickness according to the emission spectrum of each of the emissive regions.

The first conductive coating 3131 and the second conductive coating 3151 may be light transmissive or substantially transparent in at least a portion of the visible wavelength range of the electromagnetic spectrum. For further clarity, the first conductive coating 3131 and the second conductive coating 3151 may each be light transmissive or substantially transparent in at least a portion of the visible wavelength range of the electromagnetic spectrum. Thus when the second conductive coating (and any additional conductive coating) is disposed on top of the first conductive coating to form a multi-coating electrode, such electrode may also be light transmissive or substantially transparent in the visible wavelength portion of the electromagnetic spectrum. For example, the light transmittance of the first conductive coating 3131, the second conductive coating 3151, and/or the multi-coating electrode may be greater than about 30%, greater than about 40%, greater than about 45%, greater than about 50%, greater than about 60%, greater than 70%, greater than about 75%, or greater than about 80% in a visible portion of the electromagnetic spectrum.

In some embodiments, the thickness of the first conductive coating 3131 and the second conductive coating 3151 may be made relatively thin to maintain a relatively high light transmittance. For example, the thickness of the first conductive coating 3131 may be about 5 to 30 nm, about 8 to 25 nm, or about 10 to 20 nm. The thickness of the second conductive coating 3151 may, for example, be about 1 to 25 nm, about 1 to 20 nm, about 1 to 15 nm, about 1 to 10 nm, or about 3 to 6 nm. Accordingly, the thickness of a multi-coating electrode formed by the combination of the first conductive coating 3131, the second conductive coating 3151 and any additional conductive coating may, for example, be about 6 to 35 nm, about 10 to 30 nm, or about 10 to 25 nm, or about 12 to 18 nm.

The first emissive region 3112 and the second emissive region 3114 may correspond to subpixel regions of an OLED display device in some embodiments. Accordingly, it will be appreciated that the substrate 3102 onto which various coatings are deposited may include one or more additional organic and/or inorganic layers not specifically illustrated or described in the foregoing embodiments. For example, the OLED display device may be an active-matrix OLED (AMOLED) display device. In such embodiments, the substrate 3102 may comprise an electrode and at least one organic layer deposited over the electrode in each emissive region (e.g. subpixel), such that the first conductive coating 3131 may be deposited over the at least one organic layer. For example, the electrode may be an anode, and the first conductive coating 3131, either by itself or in combination with the second conductive coating 3151 and any additional conductive coatings, may form a cathode. The at least one organic layer may comprise an emitter layer. The at least one organic layer may further comprise a hole injection layer, a hole transport layer, an electron blocking layer, a hole blocking layer, an electron transport layer, an electron injection layer, and/or any additional layers. The substrate 3102 may further comprise a plurality of thin film transistors (TFTs). Each anode provided in the device may be electrically connected to at least one TFT. For example, the substrate 3102 may include one or more top-gate thin-film transistors (TFTs), one or more bottom-gate TFTs, and/or other TFT structures. A TFT may be a n-type TFT or a p-type TFT. Examples of TFT structures include those including amorphous silicon (a-Si), indium gallium zinc oxide (IGZO), and low-temperature polycrystalline silicon (LTPS).

The substrate 3102 may also include a base substrate for supporting the above-identified additional organic and/or inorganic layers. For example, the base substrate may be a flexible or rigid substrate. The base substrate may include, for example, silicon, glass, metal, polymer (e.g., polyimide), sapphire, or other materials suitable for use as the base substrate.

The first emissive region 3112 and the second emissive region 3114 may be subpixels configured to emit light of different wavelength or emission spectrum from one another. The first emissive region 3112 may be configured to emit light having a first wavelength or first emission spectrum, the second emissive region 3114 may be configured to emit light having a second wavelength or second emission spectrum. The first wavelength may be less than or greater than the second wavelength and/or the third wavelength, the second wavelength may be less than or greater than the first wavelength and/or the third wavelength. The device may comprise any number of additional emissive regions, pixels, or subpixels. For instance, the device may comprise additional emissive regions which are configured to emit light having a third wavelength or third emissive spectrum, which is different from the wavelength or emissive spectrum of the first emissive region or the second emissive region. The device may also comprise additional emissive regions which are configured to emit light having substantially identical wavelength or emissive spectrum as the first emissive region, the second emissive region, or other additional emissive regions.

In some embodiments, the first nucleation inhibiting coating 3141 may be selectively deposited using the same shadow mask used to deposit the at least one organic layer of the first emissive region 3112. In this way, the optical microcavity effect may be tuned for each subpixel in a cost-effective manner due to there being no additional mask requirements for depositing the nucleation inhibiting layers.

Figure 32:
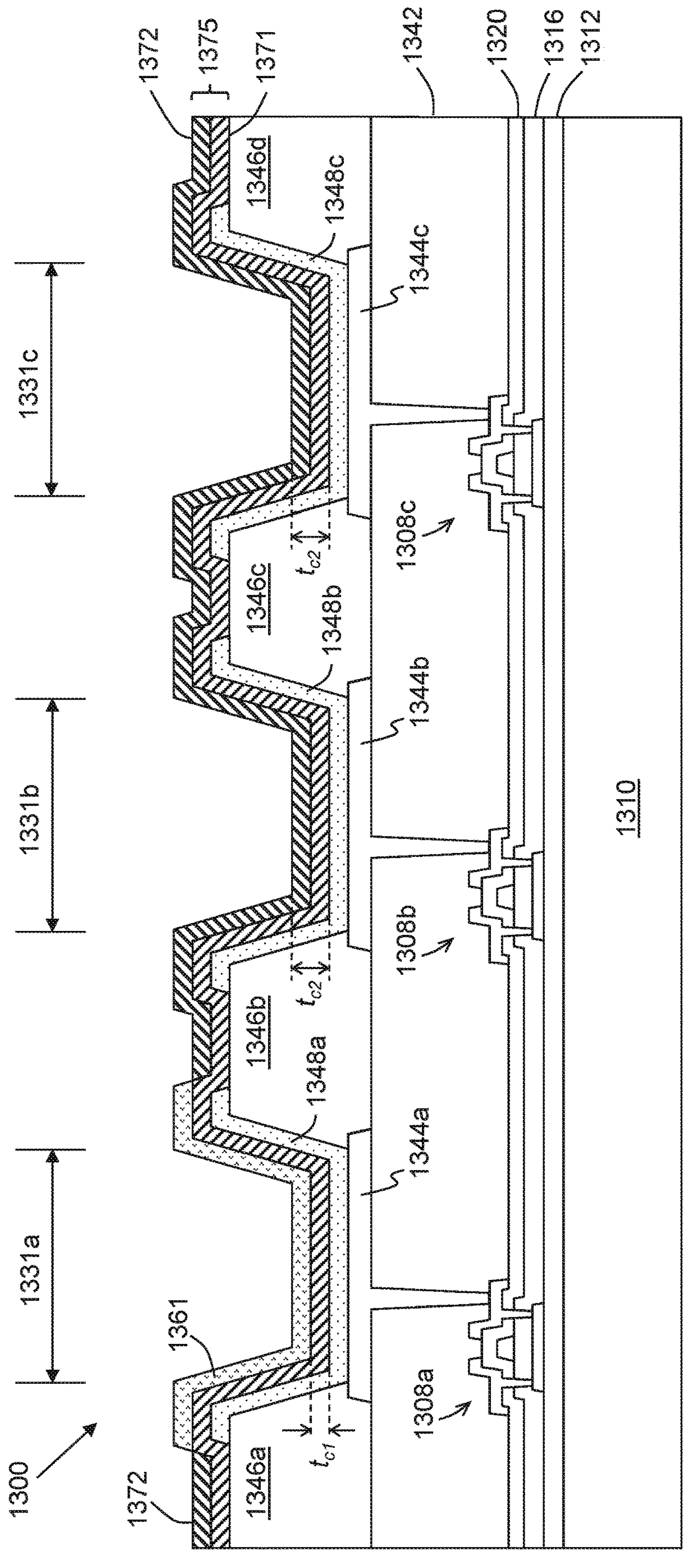
FIG. 32 is a schematic diagram illustrating the cross-section of an AMOLED device, according to yet another embodiment.

FIG. 32 is a schematic cross-sectional diagram illustrating a portion of an AMOLED device 1300. For sake of simplicity, certain details of a backplane including those regarding the TFTs 1308*a*, 1308*b*, 1308*c* are omitted in describing the following embodiments.

In the embodiment of FIG. 32, the device 1300 includes a first emissive region 1331*a*, a second emissive region 1331*b*, and a third emissive region 1331*c*. For example, the emissive regions may correspond to the subpixels of the device 1300. In the device 1300, a first electrode 1344*a*, 1344*b*, 1344*c* is formed in each of the first emissive region 1331*a*, the second emissive region 1331*b*, and the third emissive region 1331*c*, respectively. As illustrated in FIG. 32, each of the first electrode 1344*a*, 1344*b*, 1344*c* extends through an opening of an insulating layer 1342 such that it is in electrical communication with the respective TFTs 1308*a*, 1308*b*. 1308*c*. Pixel definition layers (PDLs) 1346*a-d* are then formed to cover at least a portion of the first electrodes 1344*a-c*, including the outer edges of each electrode. For example, the PDLs 1346*a-d* may include an insulating organic or inorganic material. An organic layer 1348*a*, 1348*b*, 1348*c* is then deposited over the respective first electrode 1344*a*, 1344*b*, 1344*c*, particularly in regions between neighboring PDLs 1346*a-d*. A first conductive coating 1371 is deposited to substantially cover both the organic layers 1348*a-c* and the PDLs 1346*a-d*. For example, the first conductive coating 1371 may form a common cathode, or a portion thereof. A first nucleation inhibiting coating 1361 is selectively deposited over a portion of the first conductive coating 1371 disposed over the first emissive region 1331*a*. For example, the first nucleation inhibiting coating 1361 may be selectively deposited using a fine metal mask or a shadow mask. Accordingly, a second conductive coating 1372 is selectively deposited over an exposed surface of the first conductive coating 1371 using an open mask or a mask-free deposition process. For further specificity, by conducting thermal deposition of the second conductive coating 1372 (e.g., including magnesium) using an open mask or without a mask, the second conductive coating 1372 is selectively deposited over the exposed surface of the first conductive coating 1371, while leaving a surface of the first nucleation inhibiting coating 1361 substantially free of a material of the first conductive coating 1372. The second conductive coating 1372 may be deposited to coat the portions of the first conductive coating 1371 disposed over the second emissive region 1331*b* and the third emissive region 1331*c*.

In the device 1300 illustrated in FIG. 32, the first conductive coating 1371 and the second conductive coating 1372 may collectively form a common cathode 1375. Specifically, the common cathode 1375 may be formed by the combination of the first conductive coating 1371 and the second conductive coating 1372, wherein the second conductive coating 1372 is disposed directly over at least a portion of the first conductive coating 1371. The common cathode 1375 has a first thickness $t_{c1}$ in the first emissive region 1331*a*, and a second thickness $t_{c2}$ in the second emissive region 1335*b* and the third emissive region 1335*c*. The first thickness $t_{c1}$ may correspond to the thickness of the first conductive coating 1371, and the second thickness ta may correspond to the combined thickness of the first conductive coating 1371 and the second conductive coating 1372. Accordingly, the second thickness $t_{c2}$ is greater than the first thickness $t_{c1}$.

Figure 33:
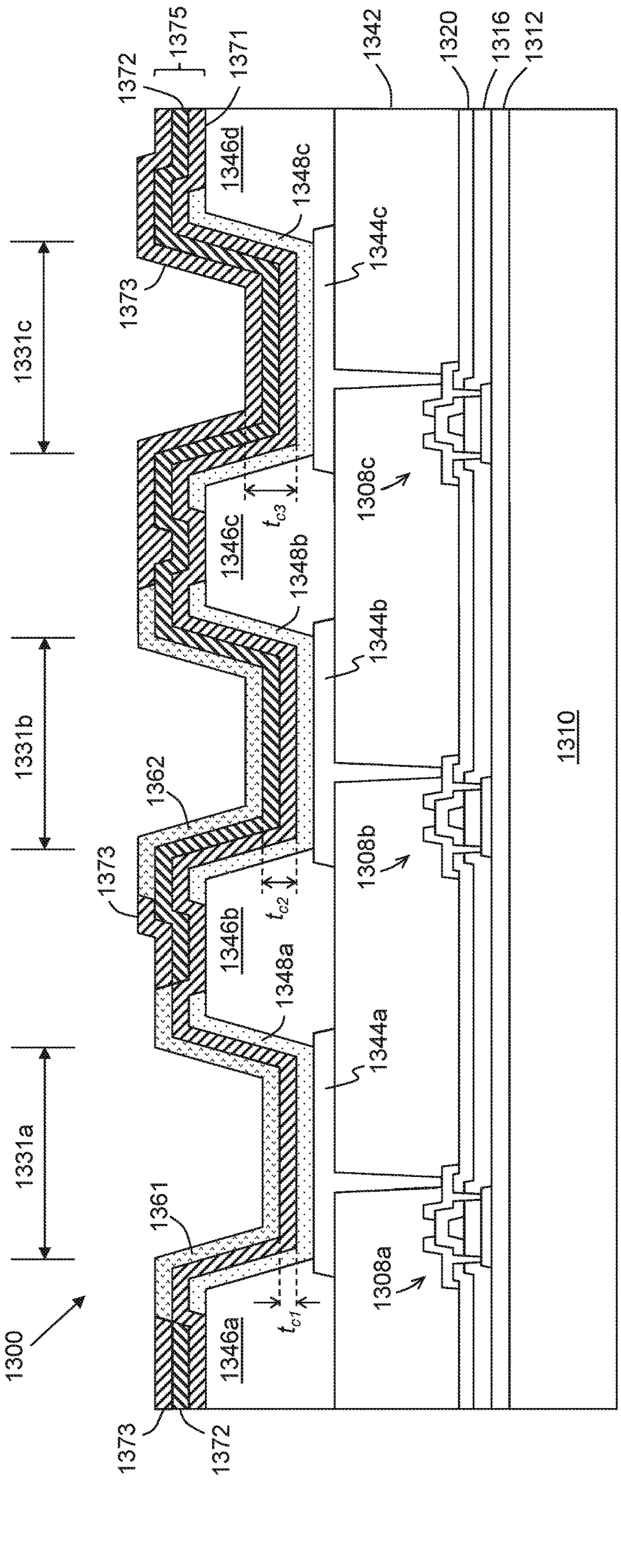
FIG. 33 is a schematic diagram illustrating the cross-section of an AMOLED device, according to yet another embodiment.

FIG. 33 illustrates a further embodiment of device 1300 wherein the common cathode 1375 further comprises a third conductive coating 1373. Specifically, in the embodiment of FIG. 33, the device 1300 comprises a second nucleation inhibiting coating 1362 disposed over a portion of the second conductive coating 1372 provided over the second emissive region 1331*b*. A third conductive coating 1373 is then deposited over the exposed or untreated surface(s) of the second conductive coating 1372, including the portion of the second conductive coating 1372 disposed over the third emissive region 1331*c*. In this way, a common cathode 1375 having a first thickness $t_{c1}$ in the first emissive region 1331*a*, a second thickness $t_{c2}$ in the second emissive region 1331*b*, and a third thickness $t_{c3}$ in the third emissive region 1331*c* may be provided. As would be appreciated, the first thickness $t_{c1}$ corresponds to the thickness of the first conductive coating 1371, the second thickness $t_{c2}$ corresponds to the thickness of the second conductive coating 1372, and the third thickness $t_{c3}$ corresponds to the thickness of the third conductive coating 1373. Accordingly, the first thickness $t_{c1}$ may be less than the second thickness $t_{c2}$, and the third thickness $t_{c3}$ may be greater than the second thickness ta.

Figure 34:
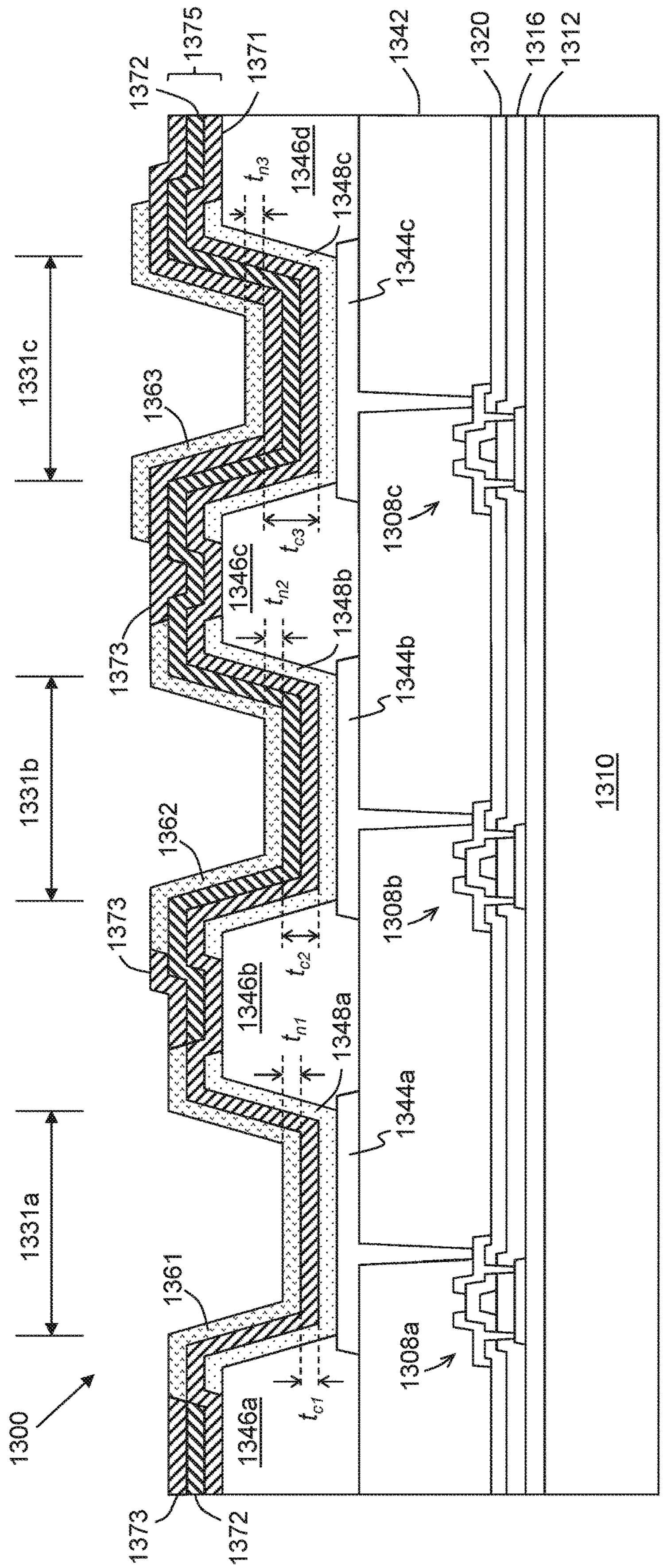
FIG. 34 is a schematic diagram illustrating the cross-section of an AMOLED device, according to yet another embodiment.

In yet another embodiment illustrated in FIG. 34, the device 1300 may further comprise a third nucleation inhibiting coating 1363 disposed over the third emissive region 1331*c*. Specifically, the third nucleation inhibiting coating 1363 is illustrated as being deposited over a portion of the third conductive coating 1373 coating a portion of the device corresponding to the third emissive region 1331*c*.

Figure 35:
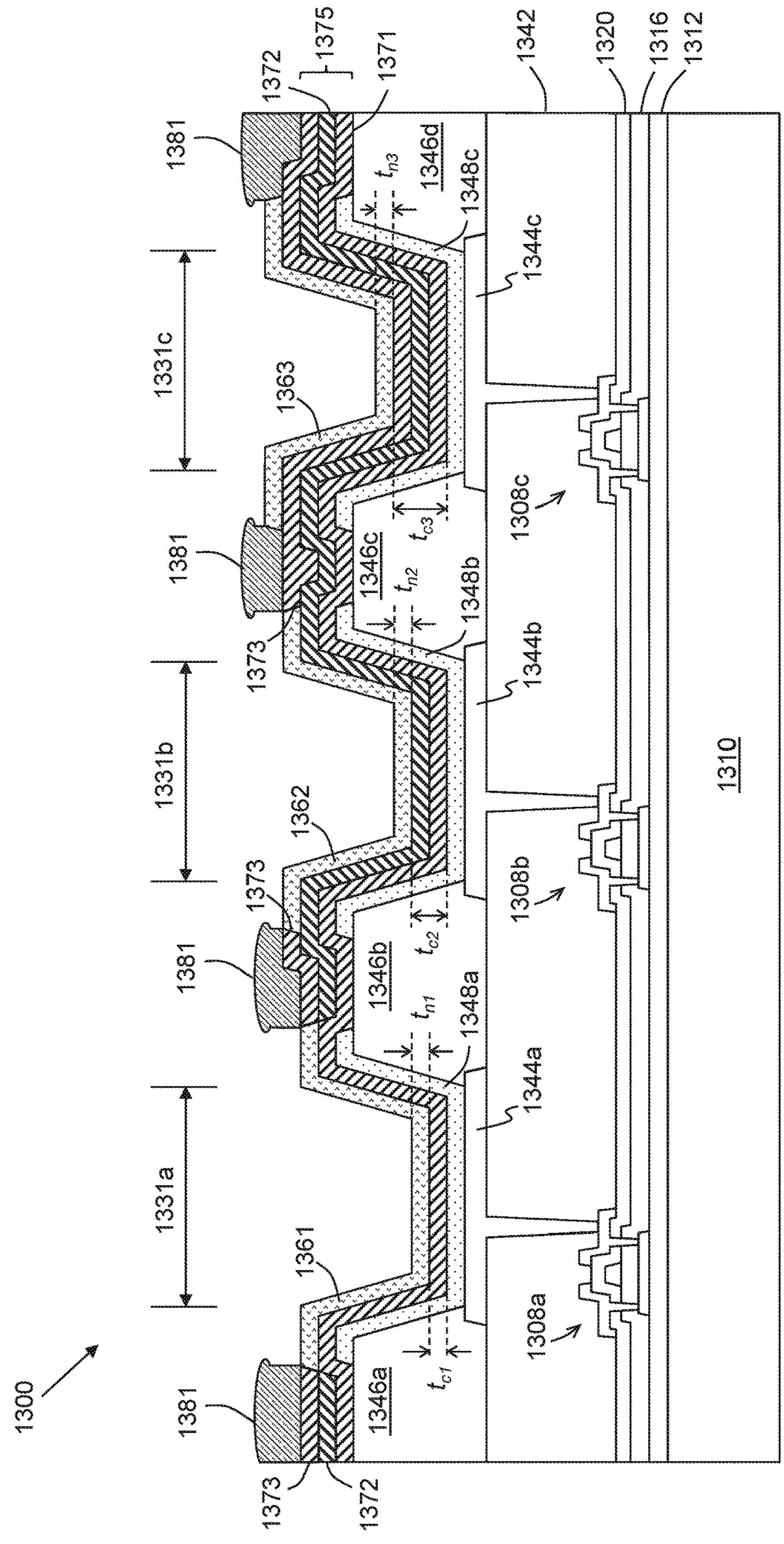
FIG. 35 is a schematic diagram illustrating the cross-section of an AMOLED device, according to yet another embodiment.

In yet another embodiment illustrated in FIG. 35, the device 1300 further comprises an auxiliary electrode 1381 disposed in the non-emissive regions of the device 1300. For example, the auxiliary electrode 1381 may be formed using substantially the same processes as those used to deposit the second conductive coating 1372 and/or the third conductive coating 1373. The auxiliary electrode 1381 is illustrated as being deposited over the pixel definition layer 1346*a*-1346*d*, which correspond to the non-emissive regions of the device 1300. The emissive regions 1331*a*, 1331*b*, 1331*c* may be substantially free of the material used to form the auxiliary electrode 1381.

The first conductive coating 1371, the second conductive coating 1372, and the third conductive coating 1373 may be light transmissive or substantially transparent in the visible wavelength portion of the electromagnetic spectrum. For further clarity, the first conductive coating 1371, the second conductive coating 1372, and the third conductive coating 1373 may each be light transmissive or substantially transparent at least in a portion of the visible wavelength range of the electromagnetic spectrum. Thus, when the second conductive coating and/or the third conductive coating are disposed on top of the first conductive coating to form the common cathode 1375, such electrode may also be light transmissive or substantially transparent in the visible wavelength portion of the electromagnetic spectrum. For example, the light transmittance of the first conductive coating 1371, the second conductive coating 1372, the third conductive coating 1373, and/or the common cathode 1375 may be greater than about 30%, greater than about 40%, greater than about 45%, greater than about 50%, greater than about 60%, greater than 70%, greater than about 75%, or greater than about 80% in a visible portion of the electromagnetic spectrum.

In some embodiments, the thickness of the first conductive coating 1371, the second conductive coating 1372, and the third conductive coating 1373 may be made relatively thin to maintain a relatively high light transmittance. For example, the thickness of the first conductive coating 1371 may be about 5 to 30 nm, about 8 to 25 nm, or about 10 to 20 nm. The thickness of the second conductive coating 1372 may, for example, be about 1 to 25 nm, about 1 to 20 nm, about 1 to 15 nm, about 1 to 10 nm, or about 3 to 6 nm. The thickness of the third conductive coating 1373 may, for example, be about 1 to 25 nm, about 1 to 20 nm, about 1 to 15 nm, about 1 to 10 nm, or about 3 to 6 nm. Accordingly, the thickness of a common cathode 1375 formed by the combination of the first conductive coating 1371 and the second conductive coating 1372 and/or the third conductive coating 1373 may, for example, be about 6 to 35 nm, about 10 to 30 nm, or about 10 to 25 nm, or about 12 to 18 nm.

The thickness of the auxiliary electrode 1381 may be greater than the thickness of the first conductive coating 1371, the second conductive coating 1372, the third conductive coating 1373, and/or the common cathode 1375. For example, the thickness of the auxiliary electrode 1381 may be greater than about 50 nm, greater than about 80 nm, greater than about 100 nm, greater than about 150 nm, greater than about 200 nm, greater than about 300 nm, greater than about 400 nm, greater than about 500 nm, greater than about 700 nm, greater than about 800 nm, greater than about 1 μm, greater than about 1.2 μm, greater than about 1.5 μm, greater than about 2 μm, greater than about 2.5 μm, or greater than about 3 μm. In some embodiments, the auxiliary electrode 1375 may be substantially non-transparent or opaque. However, since the auxiliary electrode 1375 is generally provided in the non-emissive region(s) of the device, the auxiliary electrode 1375 may not cause significant optical interference. For example, the light transmittance of the auxiliary electrode 1375 may be less than about 50%, less than about 70%, less than about 80%, less than about 85%, less than about 90%, or less than about 95% in the visible portion of the electromagnetic spectrum. In some embodiments, the auxiliary electrode 1375 may absorb light in at least a portion of the visible wavelength range of the electromagnetic spectrum.

The first conductive coating 1371 may comprise various materials commonly used to form light transmissive conductive layers or coatings. For example, the first conductive coating 1371 may include transparent conducting oxides (TCOs), metallic or non-metallic thin films, and any combination thereof. The first conductive coating 1371 may further comprise two or more layers or coatings. For example, such layers or coatings may be distinct layers or coatings disposed on top of one another. The first conductive coating 1371 may comprise various materials including, for example, indium tin oxide (ITO), fluorine tin oxide (FTO), indium zinc oxide (IZO), magnesium (Mg), aluminum (Al), ytterbium (Yb), silver (Ag), zinc (Zn), cadmium (Cd), and combinations of any two or more thereof, including alloys containing any of the foregoing materials. For example, the first conductive coating 1371 may comprise a Mg:Ag alloy, a Mg:Yb alloy, a bilayer structure including a Yb layer and an Ag layer, or a combination thereof. For a Mg:Ag alloy or a Mg:Yb alloy, the alloy composition may range from about 1:9 to about 9:1 by volume.

The second conductive coating 1372 and the third conductive coating 1373 may comprise high vapor pressure materials, such as ytterbium (Yb), zinc (Zn), cadmium (Cd) and magnesium (Mg). In some embodiments, the second conductive coating 1372 and the third conductive coating 1373 may comprise pure or substantially pure magnesium.

The auxiliary electrode 1381 may comprise substantially the same material(s) as the second conductive coating 1372 and/or the third conductive coating 1373. In some embodiments, the auxiliary electrode 1381 may include magnesium. For example, the auxiliary electrode 1381 may comprise pure or substantially pure magnesium. In other examples, the auxiliary electrode 1381 may comprise Yb, Cd, and/or Zn.

In some embodiments, the thickness of the nucleation inhibiting coating 1361, 1362, 1363 disposed in the emissive regions 1331*a*, 1331*b*, 1331*c* may be varied according to the color or emission spectrum of the light emitted by each emissive region. As illustrated in FIGS. 34 and 35, the first nucleation inhibiting coating 1361 may have a first nucleation inhibiting coating thickness to, the second nucleation inhibiting coating 1362 may have a second nucleation inhibiting coating thickness $t_{n2}$, and the third nucleation inhibiting coating 1363 may have a third nucleation inhibiting coating thickness $t_{n3}$. The first nucleation inhibiting coating thickness to, the second nucleation inhibiting coating thickness $t_{n2}$, and/or the third nucleation inhibiting coating thickness $t_{n3}$ may be substantially the same as one another. Alternatively, the first nucleation inhibiting coating thickness to, the second nucleation inhibiting coating thickness $t_{n2}$, and/or the third nucleation inhibiting coating thickness $t_{n3}$ may be different from one another.

By modulating the thickness of the nucleation inhibiting coating disposed in each emissive region or subpixel independently of one another, the optical microcavity effects in each emissive region or subpixel can be further controlled. For example, the thickness of the nucleation inhibiting coating disposed over a blue subpixel may be less than the thickness of the nucleation inhibiting coating disposed over a green subpixel, and the thickness of the nucleation inhibiting coating disposed over a green subpixel may be less than the thickness of the nucleation inhibiting coating disposed over a red subpixel. As would be appreciated, the optical microcavity effect in each emissive region or subpixel may be controlled to an even greater extent by modulating both the nucleation inhibiting coating thickness and the conductive coating thickness for each emissive region or subpixel independent of other emissive regions or subpixels.

Optical microcavity effects arise due to the presence of optical interfaces created by numerous thin-film layers and coatings with different refractive indices, which are used to construct opto-electronic devices such as OLEDs. Some factors which affect the optical microcavity effect observed in a device include the total path length (e.g. the total thickness of the device through which light emitted from the device travels before being out-coupled) and the refractive indices of various layers and coatings. It has now been found that, by modulating the thickness of the cathode in an emissive region (e.g. subpixel), the optical microcavity effect in the emissive region may be varied. Such effect may generally be attributed to the change in the total optical path length. It is further postulated that, particularly in the case of light-transmissive cathode formed by thin coating(s), the change in the cathode thickness may also change the refractive index of the cathode in addition to the total optical path length. Furthermore, the optical path length, and thus the optical microcavity effect, may also be modulated by changing the thickness of the nucleation inhibiting coating disposed in the emissive region.

The optical properties of the device which may be affected by modulating the optical microcavity effects include the emission spectrum, intensity (e.g. luminous intensity), and angular distribution of the output light, including the angular dependence of the brightness and color shift of the output light.

While various embodiments have been described with 2 or 3 emissive regions or subpixels, it will be appreciated that devices may comprise any number of emissive regions or subpixels. For example, a device may comprise a plurality of pixels, wherein each pixel comprises 2, 3, or more subpixels. Furthermore, the specific arrangement of the pixels or subpixels with respect to other pixels or subpixels may be varied depending on the device design. For example, the subpixels may be arranged according to known arrangement schemes such as RGB side-by-side, diamond, or PenTile®.

Conductive Coating for Electrically Connecting an Electrode to an Auxiliary Electrode In one aspect, an opto-electronic device is provided. The opto-electronic device includes a first electrode and a second electrode, a semiconducting layer disposed between the first electrode and the second electrode, a nucleation inhibiting coating disposed over at least a portion of the second electrode, an auxiliary electrode, a patterning structure arranged to overlap with the auxiliary electrode to provide a shadowed region, and a conductive coating disposed in the shadowed region, the conductive coating in electrical connection with the auxiliary electrode and the second electrode.

Figure 36:
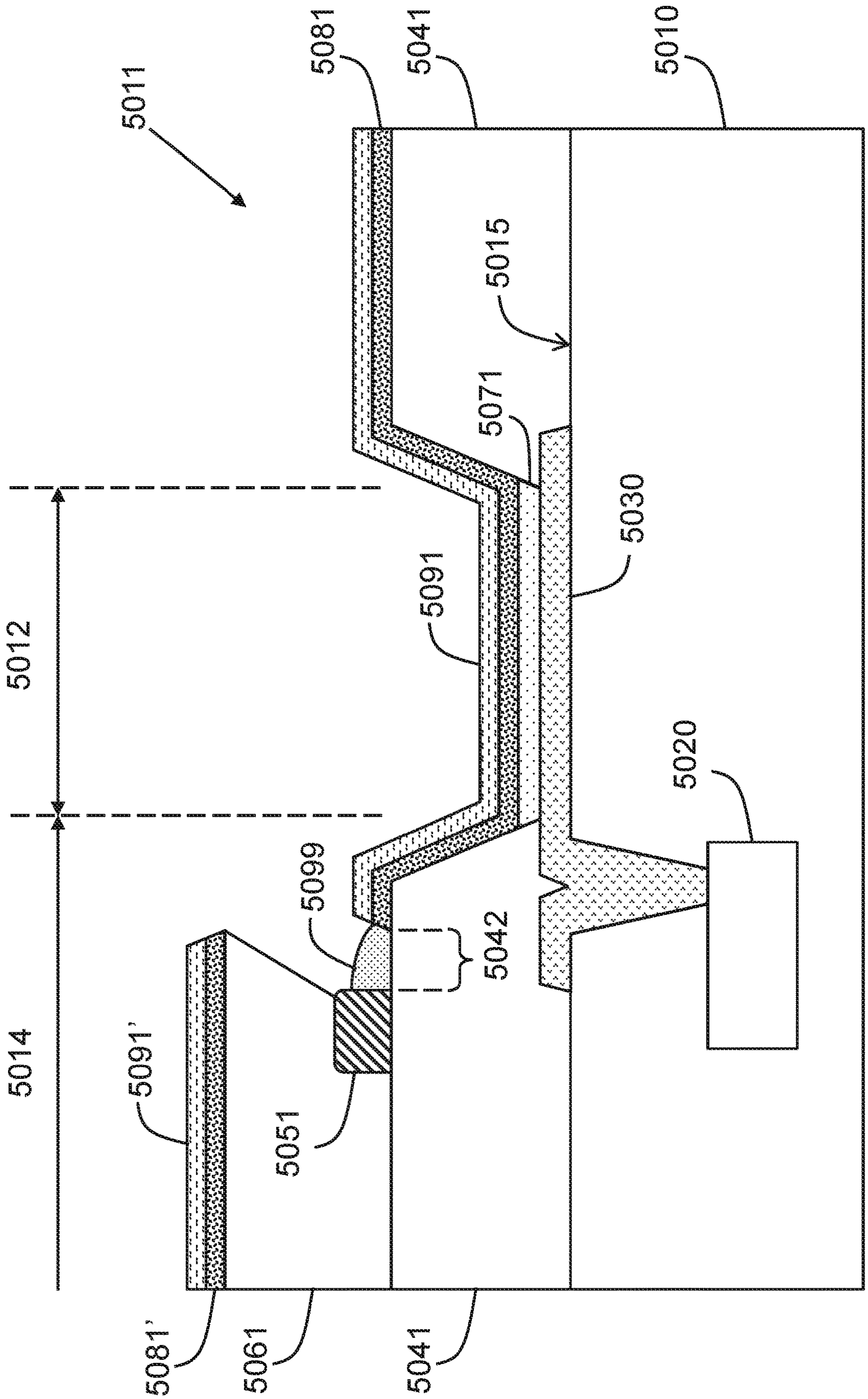
FIG. 36 is a schematic diagram illustrating a cross-sectional profile of an AMOLED device, according to one embodiment.

FIG. 36 illustrates the opto-electronic device 5011 according to an embodiment. The device 5011 includes an emissive region 5012 arranged adjacent to a non-emissive region 5014. In some embodiments, the emissive region 5012 corresponds to a subpixel region of the device 5011. The emissive region 5012 includes a first electrode 5030, a second electrode 5081, and a semiconducting layer 5071 arranged between the first electrode 5030 and the second electrode 5081. The first electrode 5030 is provided on a surface 5015 of the substrate 5010. The substrate 5010 includes a TFT 5020, which is electrically connected to the first electrode 5030. The edges or perimeter of the first electrode 5030 is generally covered by a pixel definition layer 5014. The non-emissive region 5014 includes an auxiliary electrode 5051 and a patterning structure 5061 arranged to overlap with the auxiliary electrode 5051. The patterning structure 5061 extends laterally to provide a shadowed region 5042. For example, the patterning structure 5061 may be recessed at or near the auxiliary electrode 5051 on at least one side to provide the shadowed region. In the illustrated embodiment, the shadowed region 5042 corresponds to a region on the surface of the pixel definition layer 5041 which overlaps with a laterally extending portion of the patterning structure 5061. The non-emissive region 5014 further includes a conductive coating 5099 disposed in the shadowed region 5042. The conductive coating 5099 electrically connects the auxiliary electrode 5051 and the second electrode 5081. A nucleation inhibiting coating 5091 is disposed in the emissive region 5012 and the non-emissive region 5014. The nucleation inhibiting coating 5091 is disposed on the surface of the second electrode 5081. In some embodiments, the surface of the patterning structure 5061 is coated with a residual second electrode 5081' and a residual nucleation inhibiting coating 5091'. The shadowed region 5042 is substantially free of, or uncovered by the nucleation inhibiting coating 5091 to allow the conductive coating 5099 to be deposited thereon.

While FIG. 36 illustrates one embodiment of such device, it will be appreciated that various modifications may be made. For example, in some embodiments, the patterning structure 5061 may provide a shadowed region along at least two of its sides. In other embodiments, the patterning structure 5061 may be omitted, and the auxiliary electrode 5051 may include a recessed portion to provide the shadowed region 5042. In yet other embodiments, the auxiliary electrode 5051 and the conductive coating 5099 may be disposed directly on the surface 5015 of the substrate 5010 as opposed to on the pixel definition layer 5041.

Selective Deposition of Optical Coating

In one aspect according to some embodiments, a device is provided. The device may be an opto-electronic device. In some embodiments, the device includes a substrate, a nucleation inhibiting coating, and an optical coating. The nucleation inhibiting coating covers a first region of the substrate. The optical coating covers a second region of the substrate, and at least a portion of the nucleation inhibiting coating is exposed from, or is substantially free of or is substantially uncovered by, the optical coating.

The optical coating may be used to modulate optical properties of light being transmitted, emitted, or absorbed by the device, including plasmon modes. For example, the optical coating may be used as an optical filter, index-matching coating, optical out-coupling coating, scattering layer, diffraction grating, or portions thereof. In another example, the optical coating may be used to modulate the microcavity effects in an opto-electronic device by tuning for example the total optical path length and/or the refractive index. The optical properties of the device which may be affected by modulating the optical microcavity effects include the emission spectrum, intensity (e.g. luminous intensity), and angular distribution of the output light, including the angular dependence of the brightness and color shift of the output light. In some embodiments, the optical coating may be a non-electrical component. In other words, the optical coating may not be configured to conduct or transmit electrical current during normal device operation in such embodiments.

For example, the optical coating may be formed using any of the various embodiments of methods for depositing the conductive coating described above. The optical coating may comprise high vapor pressure materials, such as ytterbium (Yb), zinc (Zn), cadmium (Cd) and magnesium (Mg). In some embodiments, the optical coating may comprise pure or substantially pure magnesium.

Thin Film Formation

The formation of thin films during vapor deposition on a surface of a substrate involves processes of nucleation and growth. During initial stages of film formation, a sufficient number of vapor monomers (e.g., atoms or molecules) typically condense from a vapor phase to form initial nuclei on the surface. As vapor monomers continue to impinge upon the surface, a size and density of these initial nuclei increase to form small clusters or islands. After reaching a saturation island density, adjacent islands typically will start to coalesce, increasing an average island size, while decreasing an island density. Coalescence of adjacent islands continues until a substantially closed film is formed.

There can be three basic growth modes for the formation of thin films: 1) island (Volmer-Weber), 2) layer-by-layer (Frank-van der Merwe), and 3) Stranski-Krastanov. Island growth typically occurs when stable clusters of monomers nucleate on a surface and grow to form discrete islands. This growth mode occurs when the interactions between the monomers is stronger than that between the monomers and the surface.

The nucleation rate describes how many nuclei of a critical size form on a surface per unit time. During initial stages of film formation, it is unlikely that nuclei will grow from direct impingement of monomers on the surface, since the density of nuclei is low, and thus the nuclei cover a relatively small fraction of the surface (e.g., there are large gaps/spaces between neighboring nuclei). Therefore, the rate at which critical nuclei grow typically depends on the rate at which adsorbed monomers (e.g., adatoms) on the surface migrate and attach to nearby nuclei.

After adsorption of an adatom on a surface, the adatom may either desorb from the surface, or may migrate some distance on the surface before either desorbing, interacting with other adatoms to form a small cluster, or attach to a growing nucleus. An average amount of time that an adatom remains on the surface after initial adsorption is given by:

$$\tau_s = \frac{1}{\nu}\exp\left(\frac{E_{des}}{kT}\right)$$

In the above equation, ν is a vibrational frequency of the adatom on the surface, k is the Boltzmann constant, T is temperature, and $E_{des}$ is an energy involved to desorb the adatom from the surface. From this equation it is noted that the lower the value of $E_{des}$ the easier it is for the adatom to desorb from the surface, and hence the shorter the time the adatom will remain on the surface. A mean distance an adatom can diffuse is given by, $$X = a_0\exp\left(\frac{E_{des} - E_S}{2kT}\right)$$

where $a_0$ is a lattice constant and $E_S$ is an activation energy for surface diffusion. For low values of $E_{des}$ and/or high values of $E_S$ the adatom will diffuse a shorter distance before desorbing, and hence is less likely to attach to a growing nuclei or interact with another adatom or cluster of adatoms.

During initial stages of film formation, adsorbed adatoms may interact to form clusters, with a critical concentration of clusters per unit area being given by, $$\frac{N_i}{n_0} = \left|\frac{N_1}{n_0}\right|^i \exp\left(\frac{E_i}{kT}\right)$$

where $E_i$ is an energy involved to dissociate a critical cluster containing i adatoms into separate adatoms, $n_0$ is a total density of adsorption sites, and $N_1$ is a monomer density given by:

$$N_1 = \dot{R}\tau_s$$

where $\dot{R}$ is a vapor impingement rate. Typically i will depend on a crystal structure of a material being deposited and will determine the critical cluster size to form a stable nucleus.

A critical monomer supply rate for growing clusters is given by the rate of vapor impingement and an average area over which an adatom can diffuse before desorbing:

$$\dot{R}X^2 = a_0^2\exp\left(\frac{E_{des} - E_S}{kT}\right)$$

The critical nucleation rate is thus given by the combination of the above equations:

$$\dot{N}_i = \dot{R}a_0^2 n_0\left(\frac{\dot{R}}{\nu n_0}\right)^i \exp\left(\frac{(i+1)E_{des} - E_S + E_i}{kT}\right)$$

From the above equation it is noted that the critical nucleation rate will be suppressed for surfaces that have a low desorption energy for adsorbed adatoms, a high activation energy for diffusion of an adatom, are at high temperatures, or are subjected to low vapor impingement rates.

Sites of substrate heterogeneities, such as defects, ledges or step edges, may increase $E_{des}$, leading to a higher density of nuclei observed at such sites. Also, impurities or contamination on a surface may also increase $E_{des}$, leading to a higher density of nuclei. For vapor deposition processes conducted under high vacuum conditions, the type and density of contaminates on a surface is affected by a vacuum pressure and a composition of residual gases that make up that pressure.

Under high vacuum conditions, a flux of molecules that impinge on a surface (per $cm^2$-sec) is given by:

$$\Phi = 3.513\times10^{22}\frac{P}{MT}$$

where P is pressure, and M is molecular weight. Therefore, a higher partial pressure of a reactive gas, such as $H_2O$, can lead to a higher density of contamination on a surface during vapor deposition, leading to an increase in $E_{des}$ and hence a higher density of nuclei.

A useful parameter for characterizing nucleation and growth of thin films is the sticking probability given by:

$$S = \frac{N_{ads}}{N_{total}}$$

where $N_{ads}$ is a number of adsorbed monomers that remain on a surface (e.g., are incorporated into a film) and $N_{total}$ is a total number of impinging monomers on the surface. A sticking probability equal to 1 indicates that all monomers that impinge the surface are adsorbed and subsequently incorporated into a growing film. A sticking probability equal to 0 indicates that all monomers that impinge the surface are desorbed and subsequently no film is formed on the surface. A sticking probability of metals on various surfaces can be evaluated using various techniques of measuring the sticking probability, such as a dual quartz crystal microbalance (QCM) technique as described by Walker et al., *J. Phys. Chem. C* 2007, 111, 765 (2006).

As the density of islands increases (e.g., increasing average film thickness), a sticking probability may change. For example, a low initial sticking probability may increase with increasing average film thickness. This can be understood based on a difference in sticking probability between an area of a surface with no islands (bare substrate) and an area with a high density of islands. For example, a monomer that impinges a surface of an island may have a sticking probability close to 1.

An initial sticking probability $S_0$ can therefore be specified as a sticking probability of a surface prior to the formation of any significant number of critical nuclei. One measure of an initial sticking probability can involve a sticking probability of a surface for a material during an initial stage of deposition of the material, where an average thickness of the deposited material across the surface is at or below threshold value. In the description of some embodiments, a threshold value for an initial sticking probability can be specified as 1 nm. An average sticking probability is then given by:

$$\overline{S}=S_0(1-A_{nuc})+S_{nuc}(A_{nuc})$$

where $S_{nuc}$ is a sticking probability of an area covered by islands, and $A_{nuc}$ is a percentage of an area of a substrate surface covered by islands.

Figure 38:
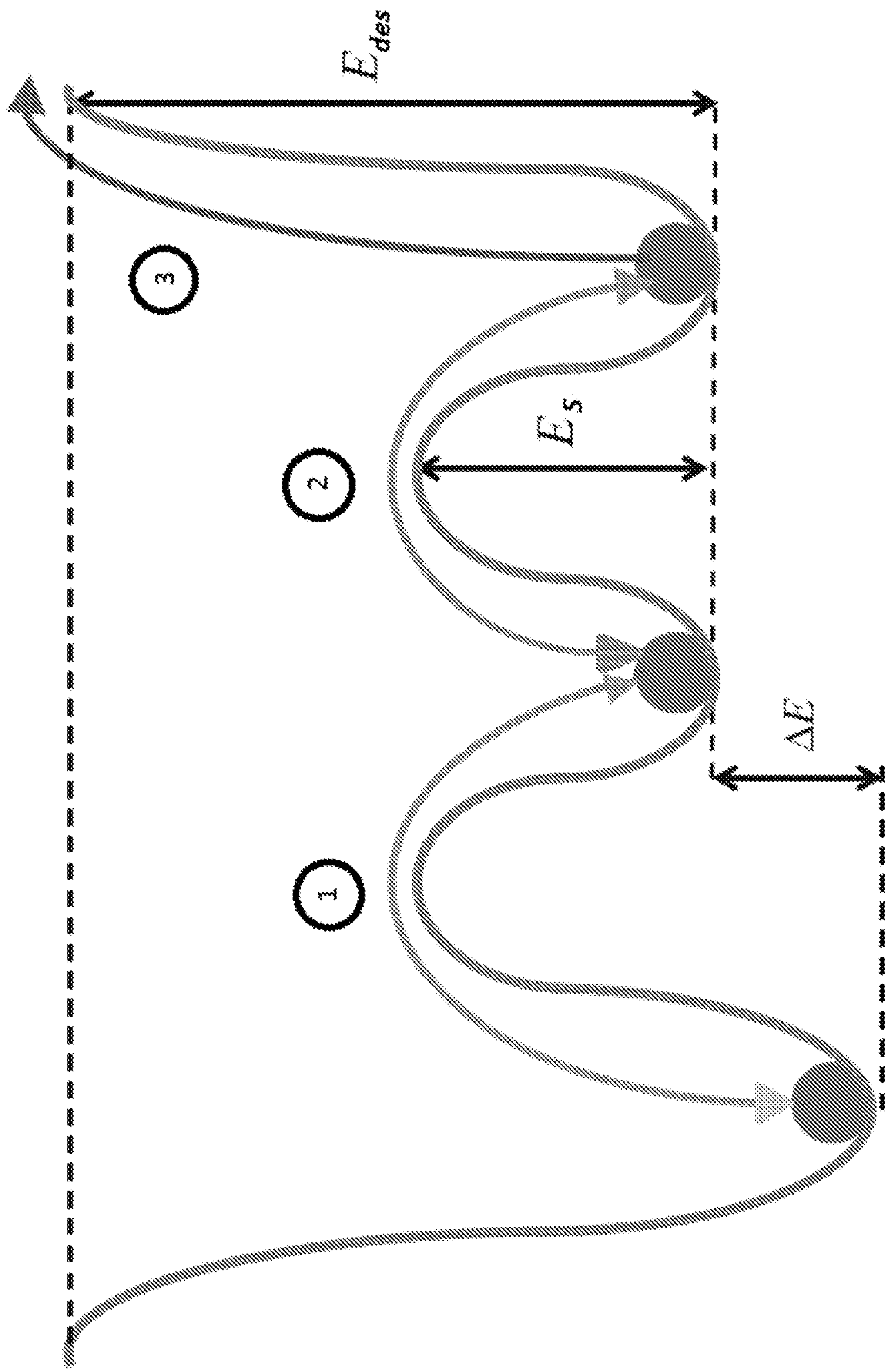
FIG. 38 is a schematic diagram illustrating the relative energy states of an adatom.

An example of an energy profile of an adatom adsorbed onto a substrate surface is illustrated in FIG. 38. Specifically, FIG. 38 illustrates the energy profiles corresponding to: (1) adatom escaping from a local low energy site; (2) diffusion of adatom on the surface; and (3) desorption of adatom.

In (1), the local low energy site may be any site on the substrate surface onto which an adatom will be at a lower energy. Typically, the nucleation site may be a defect or anomaly on the surface substrate, such as for example, step edges, chemical impurities, bonding sites, or kinks. Once the adatom is trapped at the local low energy site, there is typically an energy barrier before surface diffusion can take place. This energy barrier is represented as $\Delta E$ in the diagram of FIG. 38. If the energy barrier to escape the local low energy site is large enough, the site may act as a nucleation site.

In (2), the adatom may diffuse on the substrate surface. For example, in the case of localized absorbates, adatoms tend to oscillate near the minima of the surface potential and migrate to various neighboring sites until the adatom is either desorbed, or is incorporated into a growing film or growing islands formed by a cluster of adatoms. In the diagram of FIG. 38, the activation energy associated with surface diffusion of adatoms is represented as $E_S$.

In (3), the activation energy associated with desorption of the adatom from the surface is represented as $E_{des}$. It will be appreciated that any adatoms that are not desorbed would remain on the substrate surface. For example, such adatoms may diffuse on the surface, be incorporated as part of a growing film or coating, or become part of a cluster of adatoms that form islands on the surface.

Based on energy profile shown in FIG. 38, it can be postulated that nucleation inhibiting coating materials exhibiting relatively low activation energy for desorption ($E_{des}$) and/or relatively high activation energy for surface diffusion ($E_S$) may be particularly advantageous for use in various applications. For example, it may be particularly advantageous in some embodiments for the activation energy for desorption ($E_{des}$) to be less than about 2 times the thermal energy ($k_BT$), less than about 1.5 times the thermal energy, less than about 1.3 times the thermal energy, less than about 1.2 times the thermal energy, less than the thermal energy, less than about 0.8 times the thermal energy, or less than about 0.5 times the thermal energy. In some embodiments, it may be particularly advantageous for the activation energy for surface diffusion ($E_S$) to be greater than the thermal energy, greater than about 1.5 times the thermal energy, greater than about 1.8 times the thermal energy, greater than about 2 times the thermal energy, greater than about 3 times the thermal energy, greater than about 5 times the thermal energy, greater than about 7 times the thermal energy, or greater than about 10 times the thermal energy.

While certain embodiments have been described above with reference to selectively depositing a conductive coating to form a cathode or an auxiliary electrode for a common cathode, it will be understood that similar materials and processes may be used to form an anode or an auxiliary electrode for an anode in other embodiments.

Nucleation Inhibiting Coating

Suitable materials for use to form a nucleation inhibiting coating include those exhibiting or characterized as having an initial sticking probability for a material of a conductive coating of no greater than or less than about 0.1 (or 10%) or no greater than or less than about 0.05, and, more particularly, no greater than or less than about 0.03, no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001. Suitable materials for use to form a nucleation promoting coating include those exhibiting or characterized as having an initial sticking probability for a material of a conductive coating of at least about 0.6 (or 60%), at least about 0.7, at least about 0.75, at least about 0.8, at least about 0.9, at least about 0.93, at least about 0.95, at least about 0.98, or at least about 0.99.

Suitable nucleation inhibiting materials include organic materials, such as small molecule organic materials and organic polymers. Examples of suitable organic materials include polycyclic aromatic compounds including organic molecules which may optionally include one or more heteroatoms, such as nitrogen (N), sulfur (S), oxygen (O), phosphorus (P), and aluminum (Al). In some embodiments, a polycyclic aromatic compound includes organic molecules each including a core moiety and at least one terminal moiety bonded to the core moiety. A number of terminal moieties may be 1 or more, 2 or more, 3 or more, or 4 or more. In the case of 2 or more terminal moieties, the terminal moieties may be the same or different, or a subset of the terminal moieties may be the same but different from at least one remaining terminal moiety.

In some embodiments, at least one terminal moiety is, or includes, a phenyl moiety represented by the structure (I-A) as follows:

(I-A)

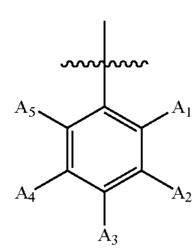

In general, the phenyl moiety represented by (I-A) may be unsubstituted or substituted. In some embodiments, the phenyl moiety represented by (I-A) may be substituted by one or more substituent groups present as at least one of $A_1$, $A_2$, $A_3$, $A_4$, and $A_5$, the one or more substituent groups independently selected from H, D (deutero), F, Cl, alkyl including $C_1$-$C_6$ alkyl, cycloalkyl, silyl, fluoroalkyl, arylalkyl, aryl, heteroaryl, alkoxy, fluoroalkoxy, and a combination of any two or more thereof. In some embodiments, the one or more substituent groups is independently selected from: methyl, methoxy, ethyl, t-butyl, fluoromethyl, difluoromethyl, trifluoromethyl, trifluoromethoxy, fluoroethyl, and polyfluoroethyl.

In some embodiments, at least one terminal moiety is, or includes, a naphthyl moiety represented by the structure (I-B) as follows:

(I-B)

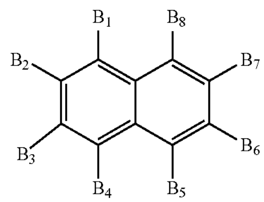

wherein at least one of $B_1$, $B_2$, $B_3$, $B_4$, $B_5$, $B_6$, $B_7$, and $B_8$ represents a bond formed between the naphthyl moiety and the core moiety. In general, the naphthyl moiety represented by (I-B) may be unsubstituted or substituted. In some embodiments, the naphthyl moiety represented by (I-B) may be substituted by one or more substituent groups present as at least one of $B_1$, $B_2$, $B_3$, $B_4$, $B_5$, $B_6$, $B_7$, and $B_8$, the one or more substituent groups independently selected from: H, D (deutero), F, Cl, alkyl including $C_1$-$C_6$ alkyl, cycloalkyl, silyl, fluoroalkyl, arylalkyl, aryl, heteroaryl, alkoxy, fluoroalkoxy, and a combination of any two or more thereof. In some embodiments, the one or more substituent groups is independently selected from: methyl, methoxy, ethyl, t-butyl, fluoromethyl, difluoromethyl, trifluoromethyl, trifluoromethoxy, fluoroethyl, and polyfluoroethyl. In some embodiments, the "B" substituent is a corresponding B' (B-prime) substituent and any B' substituent may have the value of the indicated B substituent herein.

In some embodiments, at least one terminal moiety is, or includes, a phenanthrenyl moiety represented by the structure (I-C) as follows:

(I-C)

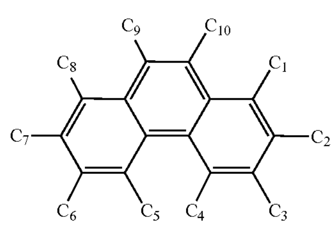

wherein at least one of $C_1$, $C_2$, $C_3$, $C_4$, $C_5$, $C_6$, $C_7$, $C_8$, $C_9$, and $C_{10}$ represents a bond formed between the phenanthryl moiety and the core moiety. In general, the phenanthryl moiety represented by (I-C) may be unsubstituted or substituted. In some embodiments, the phenanthryl moiety represented by (I-C) may be substituted by one or more substituent groups present as at least one of $C_1$, $C_2$, $C_3$, $C_4$, $C_5$, $C_6$, $C_7$, $C_8$, $C_9$, and $C_{10}$, the one or more substituent groups independently selected from: H, D (deutero), F, Cl, alkyl including $C_1$-$C_6$ alkyl, cycloalkyl, silyl, fluoroalkyl, arylalkyl, aryl, heteroaryl, alkoxy, fluoroalkoxy, and a combination of any two or more thereof. In some embodiments, the one or more substituent groups is independently selected from: methyl, methoxy, ethyl, t-butyl, fluoromethyl, difluoromethyl, trifluoromethyl, trifluoromethoxy, fluoroethyl, and polyfluoroethyl. In some embodiments, the "C" substituent is a corresponding C' (C-prime) substituent and any C' substituent may have the value of the indicated C substituent herein.

In some embodiments, at least one terminal moiety is, or includes, an anthracenyl moiety represented by the structure (I-D) as follows:

(I-D)

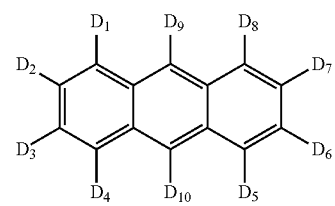

wherein at least one of the $D_1$, $D_2$, $D_3$, $D_4$, $D_5$, $D_6$, $D_7$, $D_8$, $D_9$, and $D_{10}$ represents a bond formed between the phenanthryl moiety and the core moiety. In general, the anthracenyl moiety represented by (I-D) may be unsubstituted or substituted. In some embodiments, the anthracenyl moiety represented by (I-D) may be substituted by one or more substituent groups present as at least one of $D_1$, $D_2$, $D_3$, $D_4$, $D_5$, $D_6$, $D_7$, $D_8$, $D_9$, and $D_{10}$, the one or more substituent groups independently selected from: H, D (deutero), F, Cl, alkyl including $C_1$-$C_6$ alkyl, cycloalkyl, silyl, fluoroalkyl, arylalkyl, aryl, heteroaryl, alkoxy, fluoroalkoxy, and a combination of any two or more thereof. In some embodiments, the one or more substituent groups is independently selected from: methyl, methoxy, ethyl, t-butyl, fluoromethyl, difluoromethyl, trifluoromethyl, trifluoromethoxy, fluoroethyl, and polyfluoroethyl.

In some embodiments, at least one terminal moiety is, or includes, a benzanthracenyl moiety represented by the structure (I-E) as follows:

(I-E)

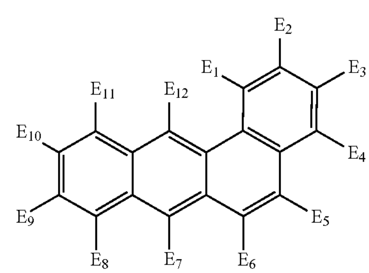

wherein at least one of the $E_1$, $E_2$, $E_3$, $E_4$, $E_5$, $E_6$, $E_7$, $E_8$, $E_9$, $E_{10}$, $E_{11}$, and $E_{12}$ represents a bond formed between the benzanthracenyl moiety and the core moiety. In general, the benzanthracenyl moiety represented by (I-E) may be unsubstituted or substituted. In some embodiments, the benzanthracenyl moiety represented by (I-E) may be substituted by one or more substituent groups present as at least one of $E_1$, $E_2$, $E_3$, $E_4$, $E_5$, $E_6$, $E_7$, $E_8$, $E_9$, $E_{10}$, $E_{11}$, and $E_{12}$, the one or more substituent groups independently selected from: H, D (deutero), F, $C_1$, alkyl including $C_1$-$C_6$ alkyl, cycloalkyl, silyl, fluoroalkyl, arylalkyl, aryl, heteroaryl, alkoxy, fluoroalkoxy, and a combination of any two or more thereof. In some embodiments, the one or more substituent groups is independently selected from: methyl, methoxy, ethyl, t-butyl, fluoromethyl, difluoromethyl, trifluoromethyl, trifluoromethoxy, fluoroethyl, and polyfluoroethyl.

In some embodiments, at least one terminal moiety is, or includes, a pyrenyl moiety represented by the structure (I-F) as follows:

(I-F)

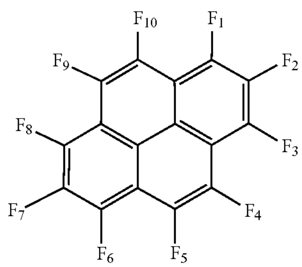

wherein at least one of the $F_1$, $F_2$, $F_3$, $F_4$, $F_5$, $F_6$, $F_7$, $F_8$, $F_9$, and $F_{10}$ represents a bond formed between the pyrenyl moiety and the core moiety. In general, the pyrenyl moiety represented by (I-F) may be unsubstituted or substituted. In some embodiments, the pyrenyl moiety represented by (I-F) may be substituted by one or more substituent groups present as at least one of $F_1$, $F_2$, $F_3$, $F_4$, $F_5$, $F_6$, $F_7$, $F_8$, $F_9$, and $F_{10}$, the one or more substituent groups independently selected from: H, D (deutero), F, Cl, alkyl including $C_1$-$C_6$ alkyl, cycloalkyl, silyl, fluoroalkyl, arylalkyl, aryl, heteroaryl, alkoxy, fluoroalkoxy, and a combination of any two or more thereof. In some embodiments, the one or more substituent groups is independently selected from: methyl, methoxy, ethyl, t-butyl, fluoromethyl, difluoromethyl, trifluoromethyl, trifluoromethoxy, fluoroethyl, and polyfluoroethyl.

In some embodiments, at least one terminal moiety is, or includes, a chrysenyl moiety represented by the structure (I-G) as follows:

(I-G)

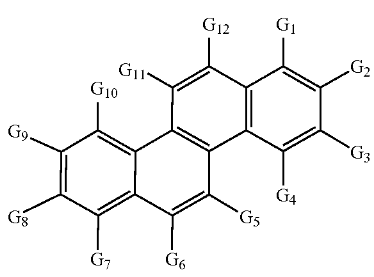

wherein at least one of $G_1$, $G_2$, $G_3$, $G_4$, $G_5$, $G_6$, $G_7$, $G_8$, $G_9$, $G_{10}$, $G_{11}$, and $G_{12}$ represents a bond formed between the chrysenyl moiety and the core moiety. In general, the chrysenyl moiety represented by (I-G) may be unsubstituted or substituted. In some embodiments, the chrysenyl moiety represented by (I-G) may be substituted by one or more substituent groups present as at least one of $G_1$, $G_2$, $G_3$, $G_4$, $G_5$, $G_6$, $G_7$, $G_8$, $G_9$, $G_{10}$, $G_{11}$, and $G_{12}$, the one or more substituent groups independently selected from: H, D (deutero), F, Cl, alkyl including $C_1$-$C_6$ alkyl, cycloalkyl, silyl, fluoroalkyl, arylalkyl, aryl, heteroaryl, alkoxy, fluoroalkoxy, a combination of any two or more thereof. In some embodiments, the one or more substituent groups is independently selected from: methyl, methoxy, ethyl, t-butyl, fluoromethyl, difluoromethyl, trifluoromethyl, trifluoromethoxy, fluoroethyl, and polyfluoroethyl.

In yet another embodiment, at least one terminal moiety is, or includes, a polycyclic aromatic moiety including fused ring structures, such as fluorene moieties or phenylene moieties (including those containing multiple (e.g., 3, 4, or more) fused benzene rings). Examples of such moieties include spirobifluorene moiety, triphenylene moiety, diphenylfluorene moiety, dimethylfluorene moiety, difluorofluorene moiety, and combinations of any two or more thereof.

In some embodiments, a polycyclic aromatic compound includes organic molecules each including a core moiety and at least one terminal moiety bonded to the core moiety, wherein the core moiety is, or includes, an anthracenyl moiety represented by structure (II) as follows:

(II)

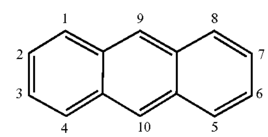

In (II), one or more terminal moieties are bonded to the anthracenyl core moiety. For example, 1, 2, 3, 4, or more terminal moieties may be bonded directly or indirectly (e.g. via a linker moiety) to the anthracenyl core moiety. In some embodiments, 2 independently selected terminal moieties are bonded to the anthracenyl core moiety. For example, one or more terminal moieties may be independently bonded to one or more of 1-, 2-, 3-, 4-, 5-, 6-, 7-, 8-, 9-, and 10-positions indicated in (II) above. In some embodiments, 2 independently selected terminal moieties are bonded to the anthracenyl core moiety in the 9- and 10-positions. In some further embodiments, a third independently selected terminal moiety is bonded to the anthracenyl core moiety. For example, the third independently selected terminal moiety may be bonded to the anthracenyl core moiety in the 2-, 3-, 6-, or 7-positions. In a yet further embodiment, a fourth independently selected terminal moiety is bonded to the anthracenyl core moiety in an unoccupied position selected from the 2-, 3-, 6-, and 7-positions.

The one or more terminal moieties bonded to the anthracenyl core moiety in (II) is, or includes, a moiety represented by (I-A), (I-B), or (I-C), (I-D), (I-E), (I-F), (I-G) or a polycyclic aromatic moiety including fused ring structures as described above. The one or more terminal moiety may be directly bonded to the core moiety, or may be bonded to the core moiety via a linker moiety. Examples of a linker moiety include —O— (where θ denotes an oxygen atom), —S— (where S denotes a sulfur atom), and cyclic or acyclic hydrocarbon moieties including 1, 2, 3, 4, or more carbon atoms, and which may be unsubstituted or substituted, and which may optionally include one or more heteroatoms. The bond between the core moiety and one or more terminal moieties may be a covalent bond, for example. In embodiments wherein two or more terminal moieties are bonded to the core moiety, each of the two or more terminal moieties may be selected independent of one another. For example, the two or more terminal moieties may be the same or different as one another. In one embodiment, a polycyclic aromatic compound includes organic molecules each including an anthracenyl core moiety represented by (II). The organic molecules each includes a first terminal moiety in the form of a phenyl moiety represented by (I-A), and a second terminal moiety in the form of a naphthyl moiety represented by (I-B), a phenanthryl moiety represented by (I-C), an anthracenyl moiety represented by (I-D), a benzanthracenyl moiety represented by (I-E), a pyrenyl moiety represented by (I-F) or a chrysenyl moiety represented by (I-G). For example, the first terminal moiety may be bonded to the 1-, 9-, or 8-position, and the second terminal moiety may be bonded to the 4-, 10-, or 5-position. The first terminal moiety and the second terminal moiety may be symmetrically or asymmetrically arranged with respect to one another about the anthracenyl core moiety. For example, the first terminal moiety and the second terminal moiety may be symmetrically arranged by bonding the first terminal moiety and the second terminal moiety to the 1-position and the 4-position, the 9-position and the 10-position, or the 8-position and the 5-position, respectively. In another example, the first terminal moiety and the second terminal moiety may be asymmetrically arranged by bonding the first terminal moiety and the second terminal moiety to the 1-position and the 5-position, or the 8-position and the 4-position, respectively. In some embodiments, one or more additional terminal moieties may be bonded to the anthracenyl core moiety. The one or more additional terminal moieties may each be bonded to one or more unoccupied positions of the anthracenyl core moiety. For example, the one or more additional terminal moieties may be each be bonded to the 2-, 3-, 6-, or 7-position.

In some embodiments, one or more carbon atoms of the polycylic aromatic compound may be substituted by a heteroatom. For example, one or more carbon atoms in a terminal moiety and/or the core moiety may be substituted by a heteroatom. Examples of such heteroatom substitutions include, but are not limited to, sulfur and nitrogen.

In some embodiments, the polycyclic aromatic compound contains at least one fluorine (F) atom.

Examples of polycyclic aromatic compounds containing an anthracenyl core are provided below.

A1

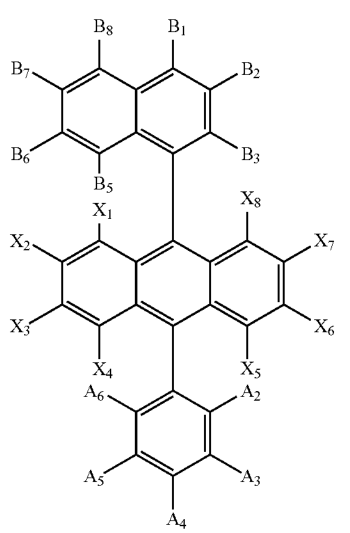

-continued

A2

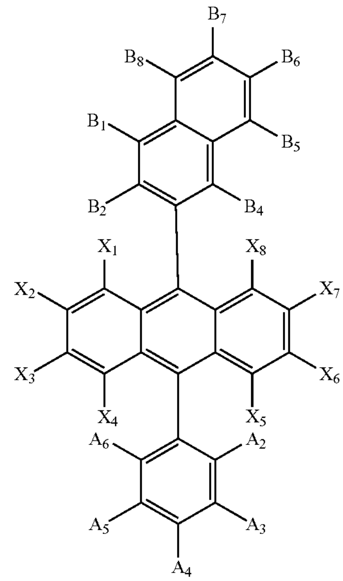

A3

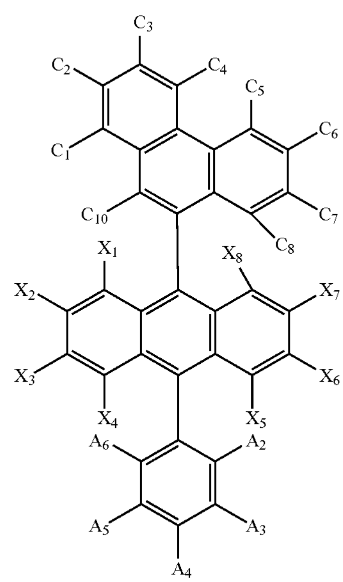

-continued
A4
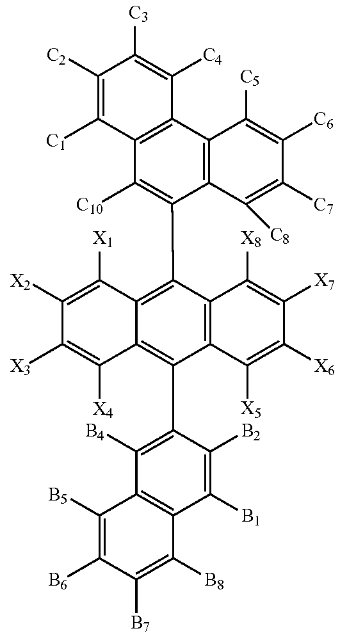
A6
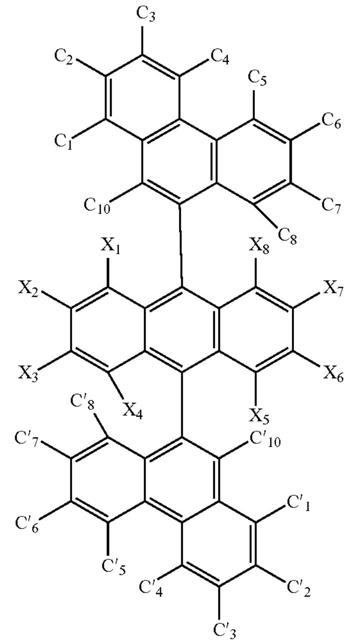
A5
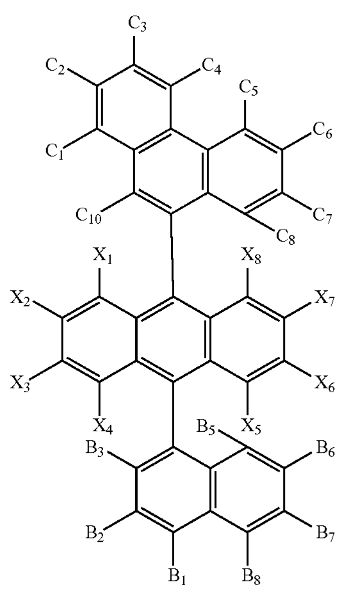
A7
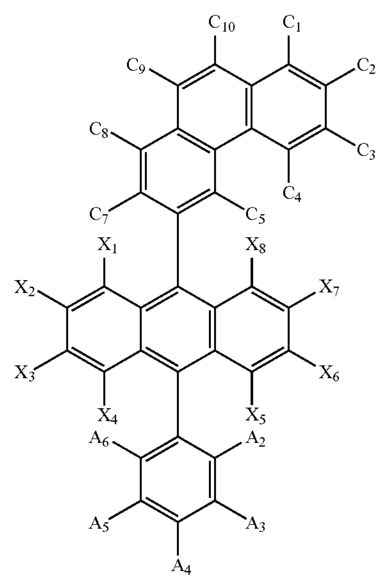

A8
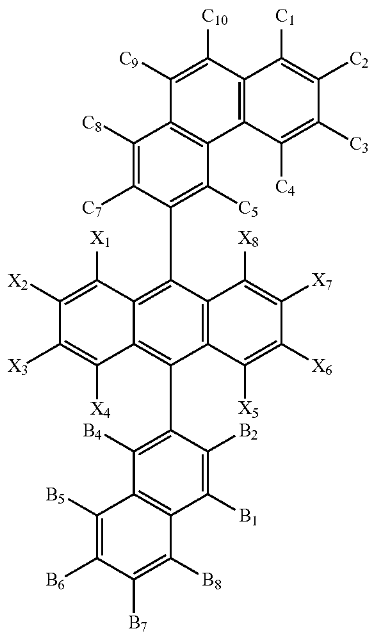
A9
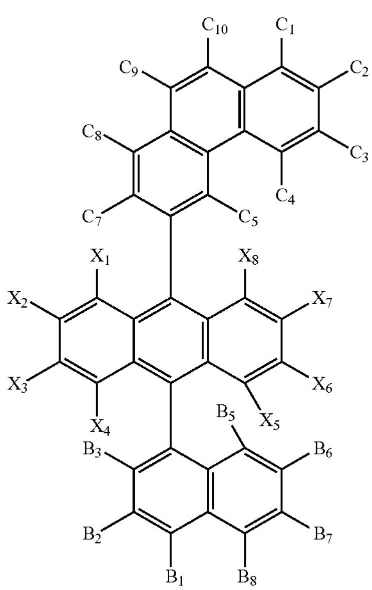
A10
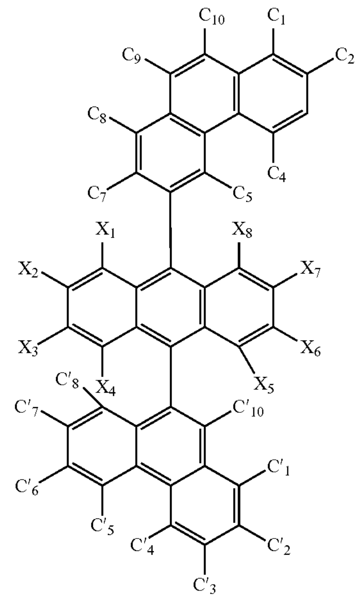
A11
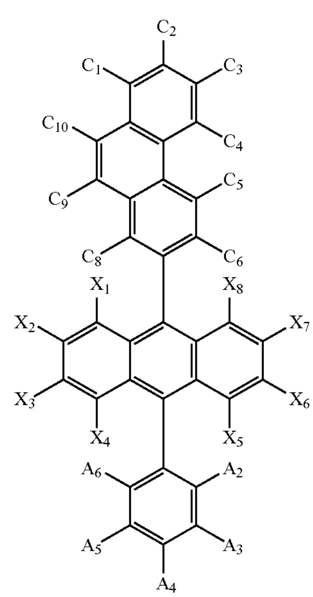

-continued
A12
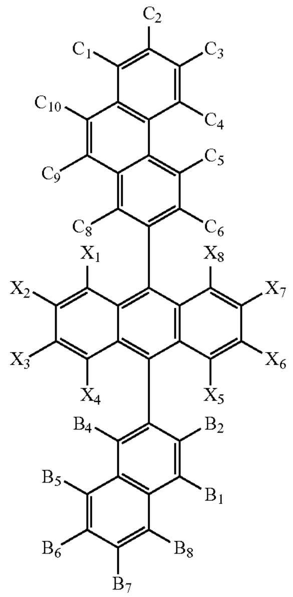
A13
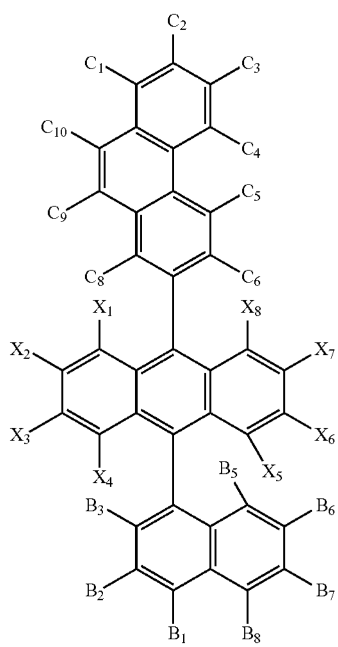
-continued
A14
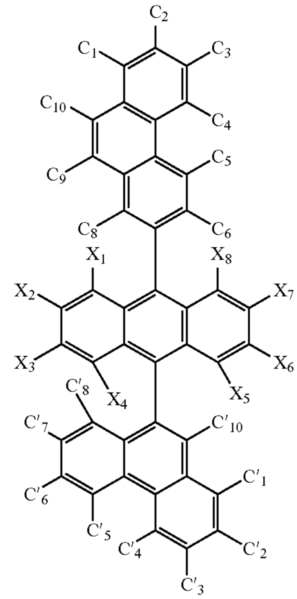
A15
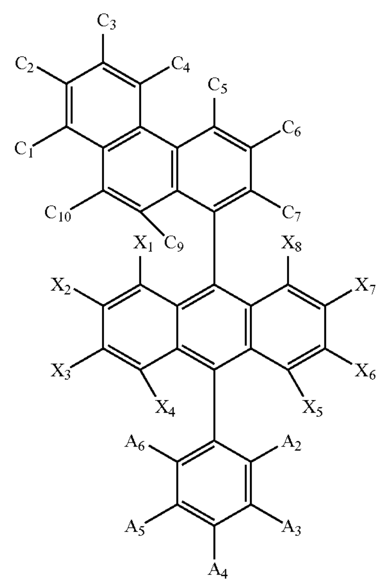

A16
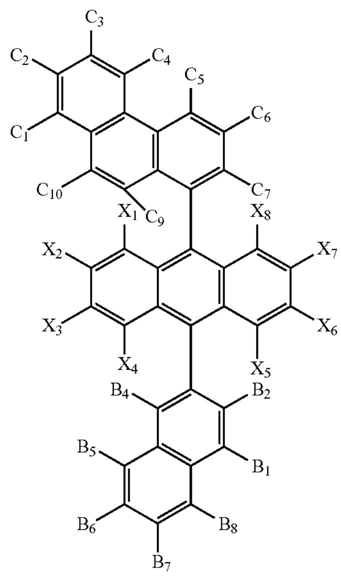
A17
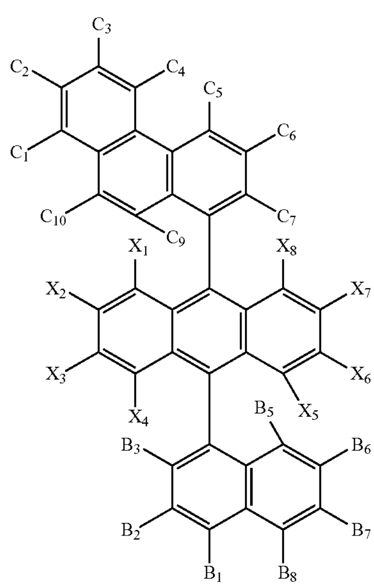
A18
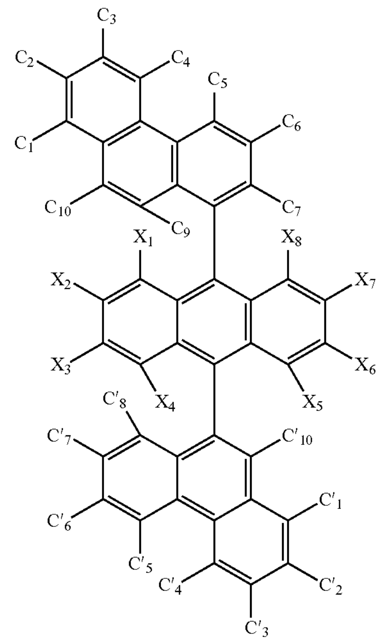
A19
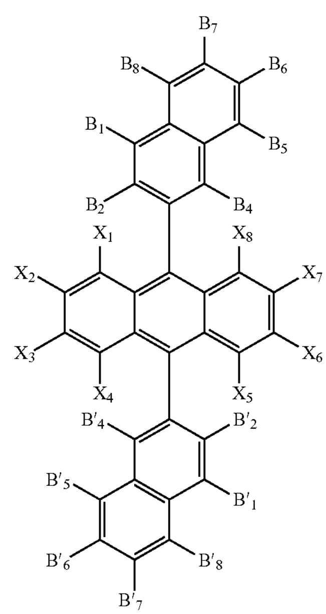

-continued
A20
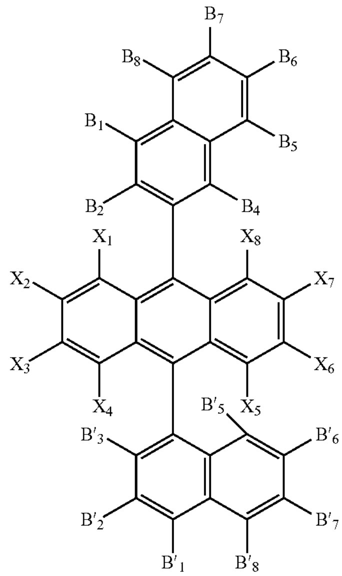
A21
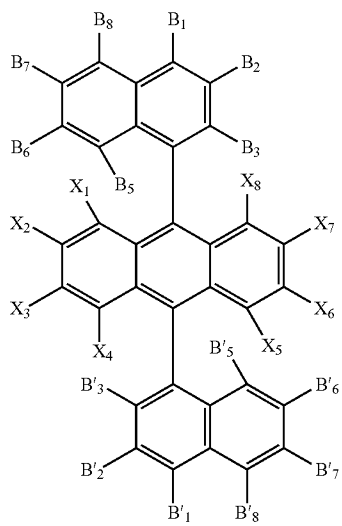
A22
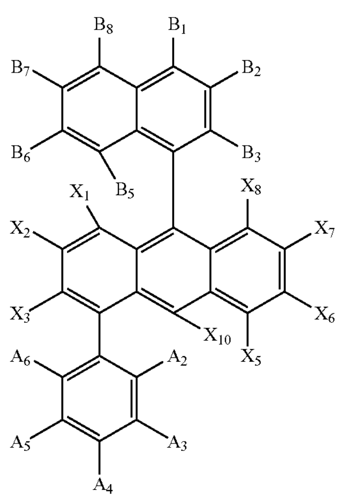
-continued
A23
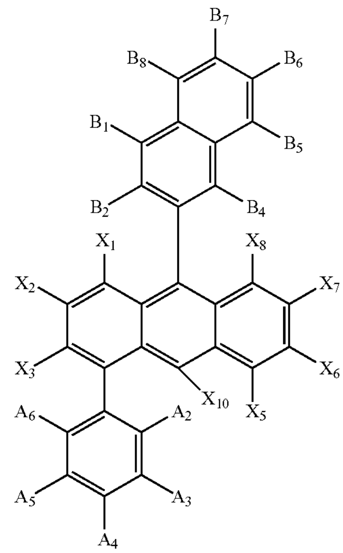
A24
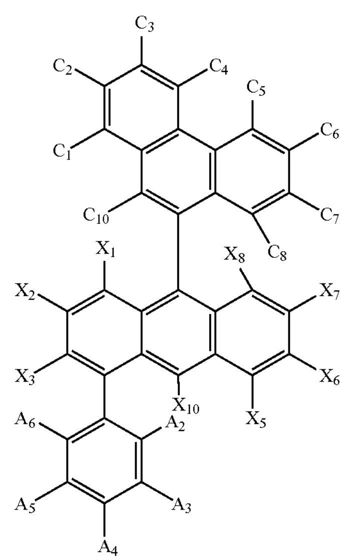

-continued
A25
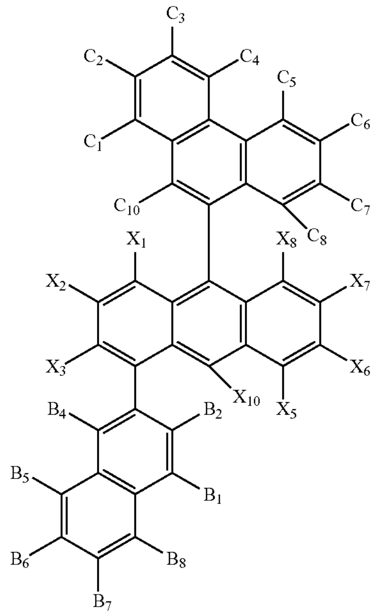
A26
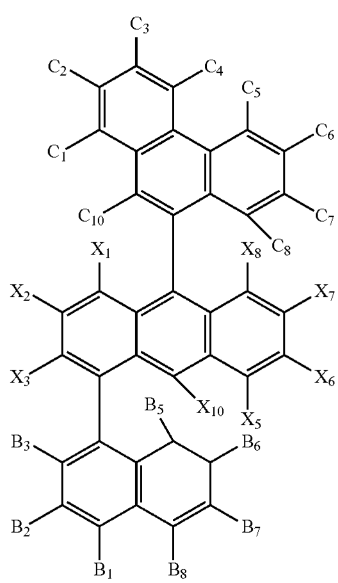
-continued
A27
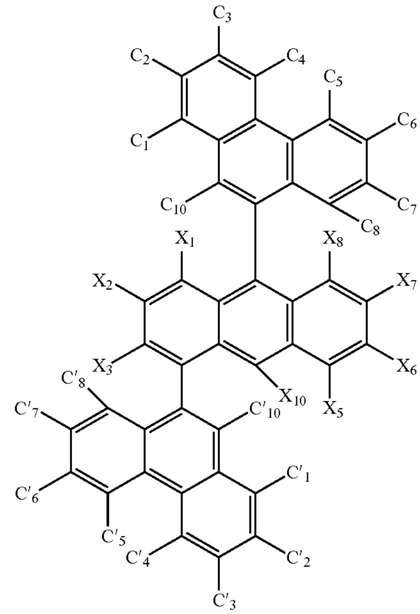
A28
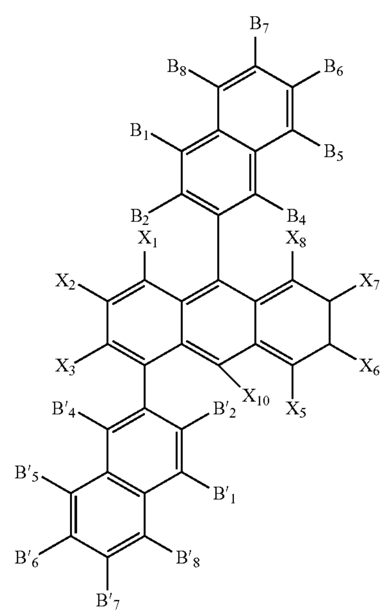

-continued
A29
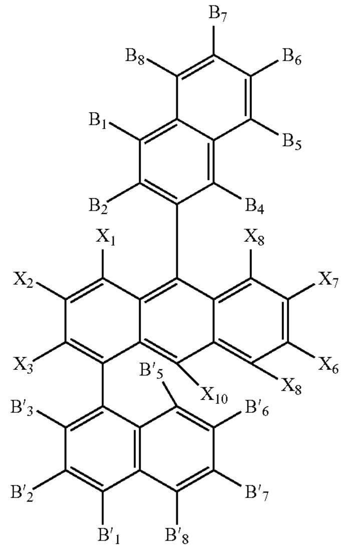
A30
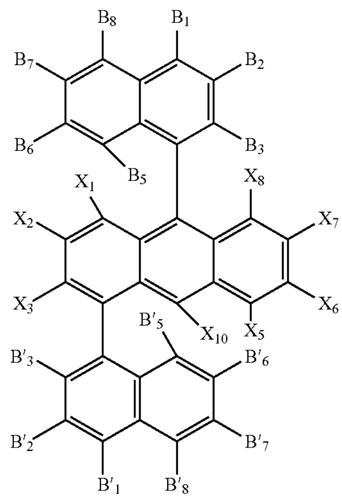
A31
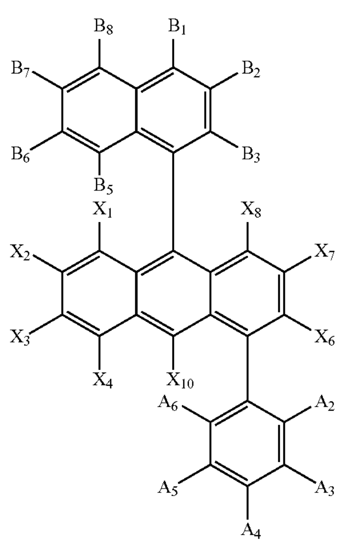
-continued
A32
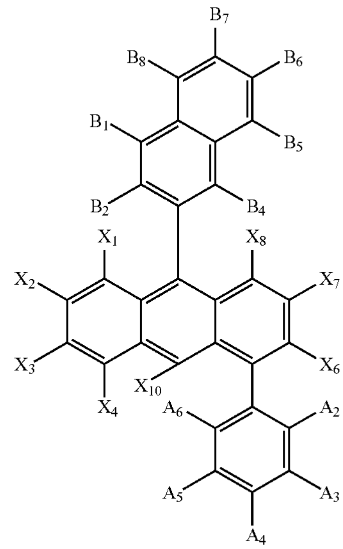
A33
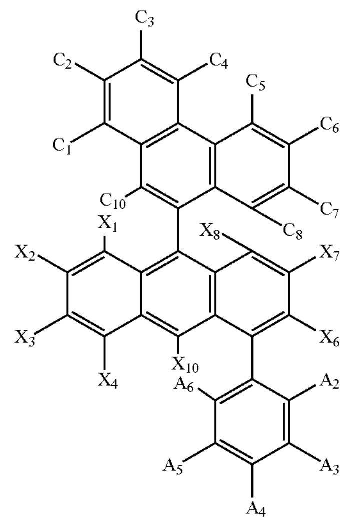
A34
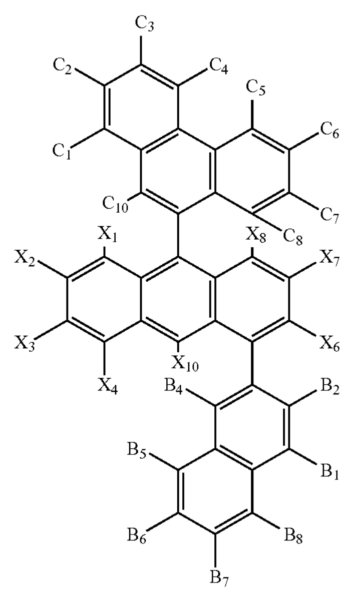

A35
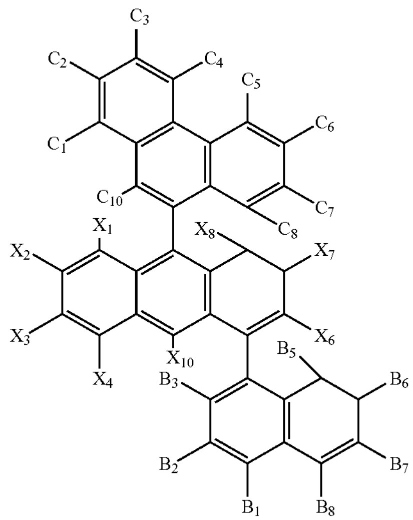
A36
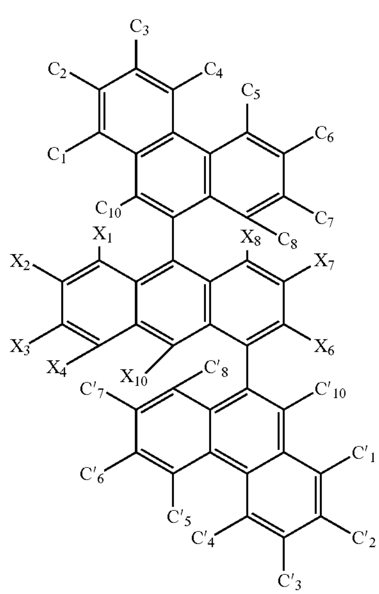
A37
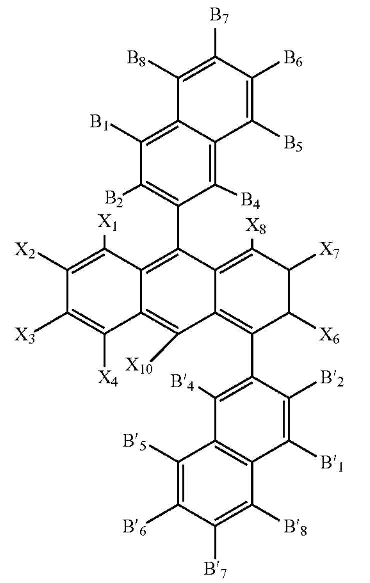
A38
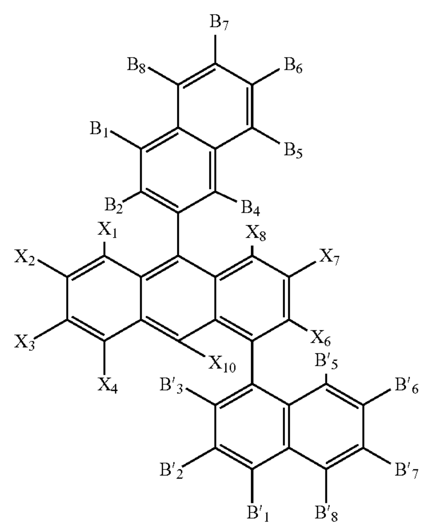
A39
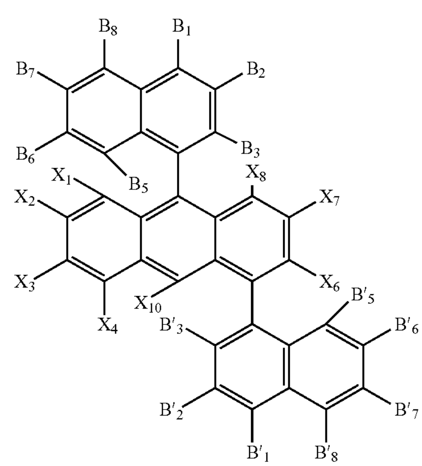

-continued
A40
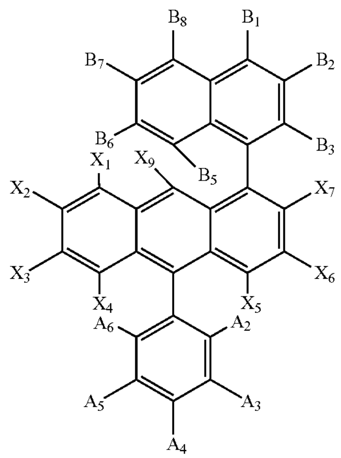
A41
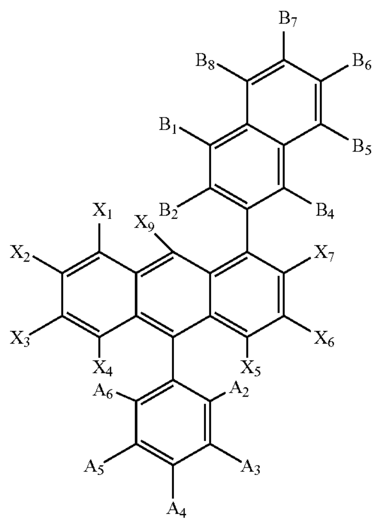
A42
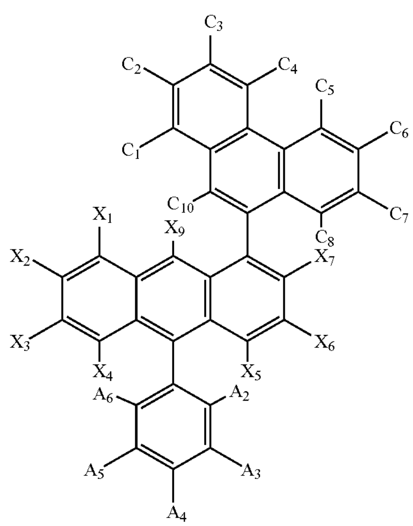
-continued
A43
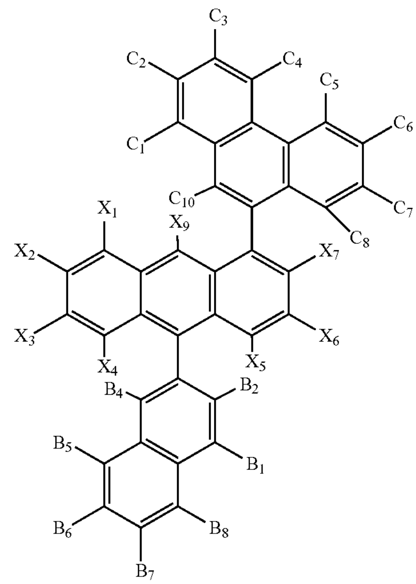
A44
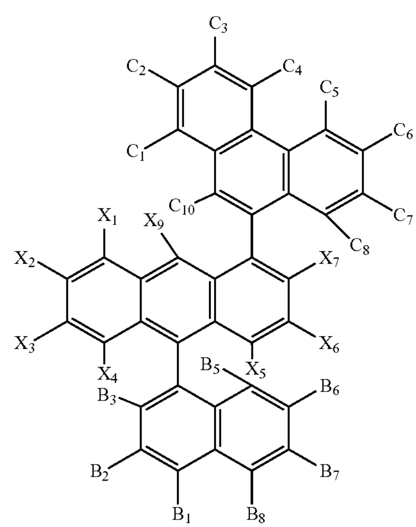

A45
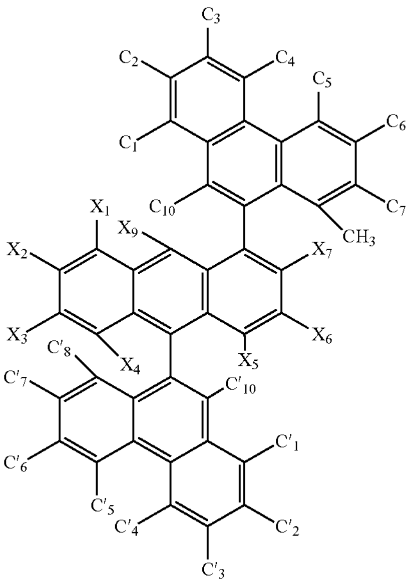
A46
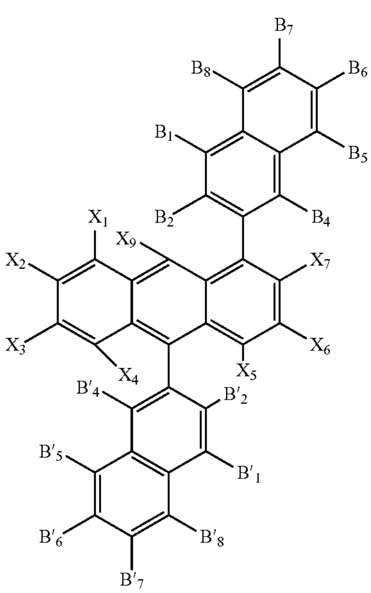
A47
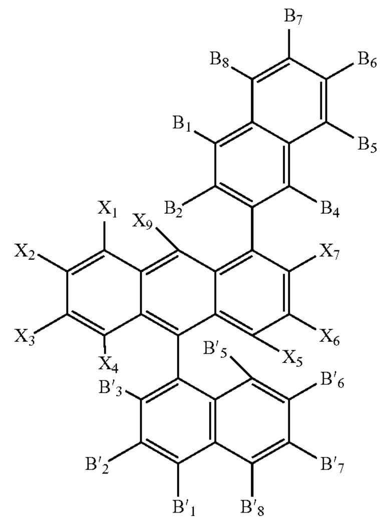
A48
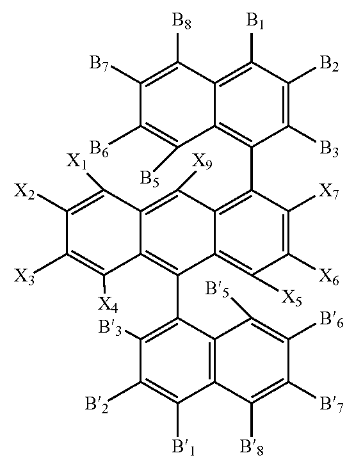
A49
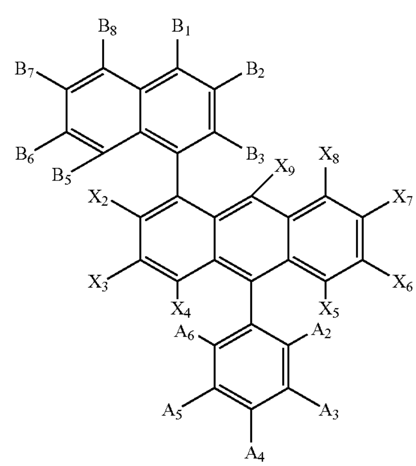

A50
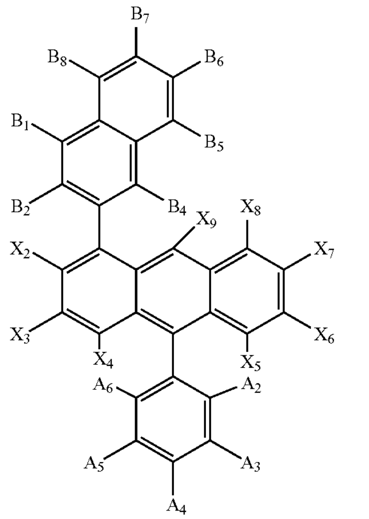
A51
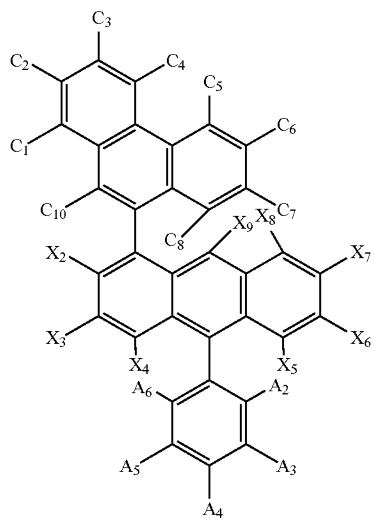
A52
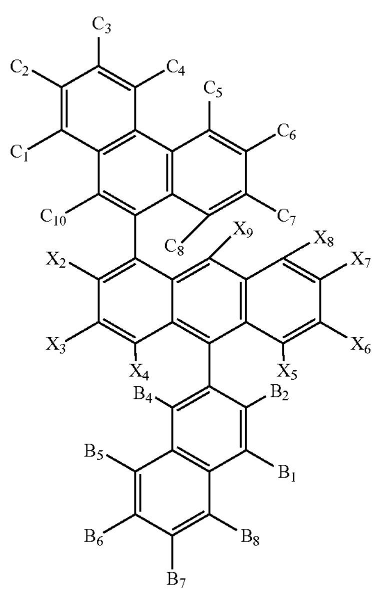
A53
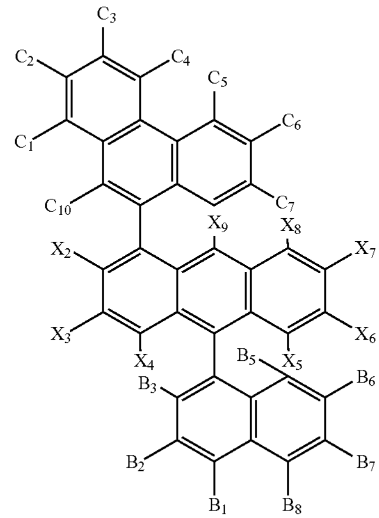
A54
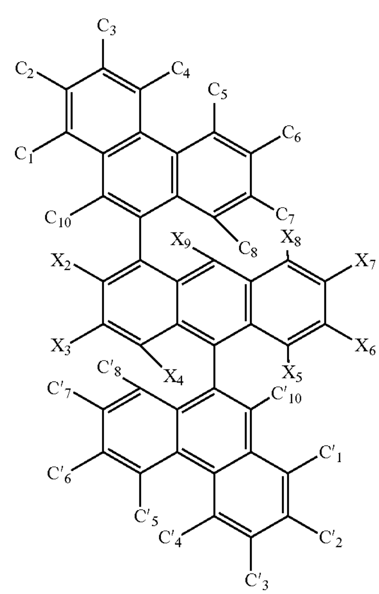

-continued
A55
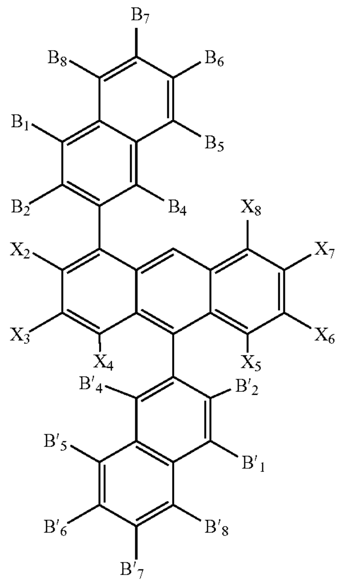
A56
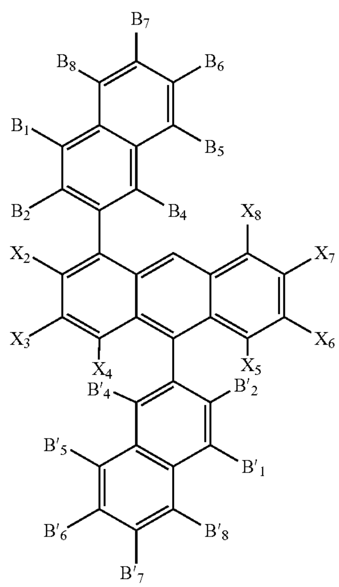
A57
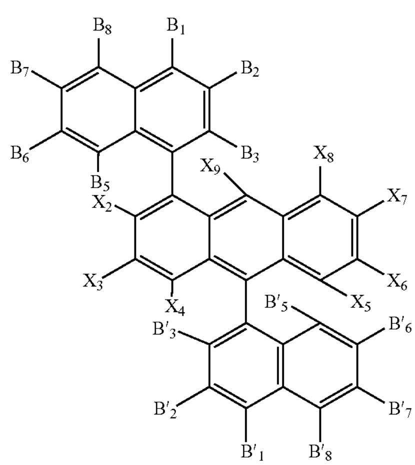
-continued
A58
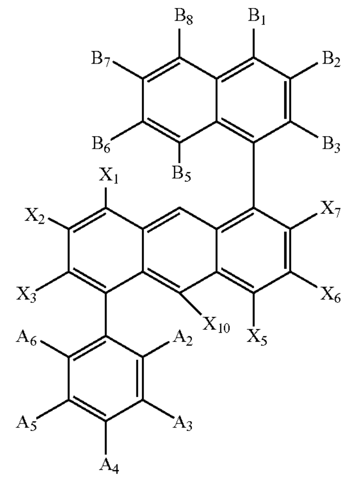
A59
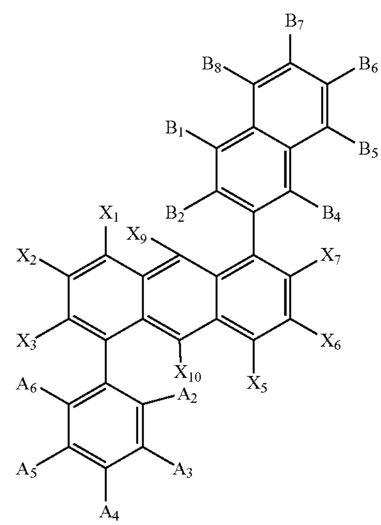
A60
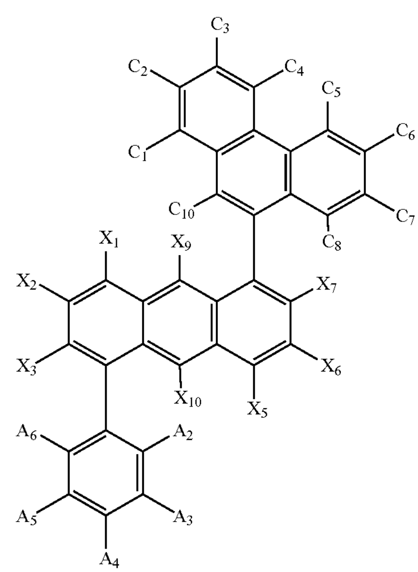

-continued
A61
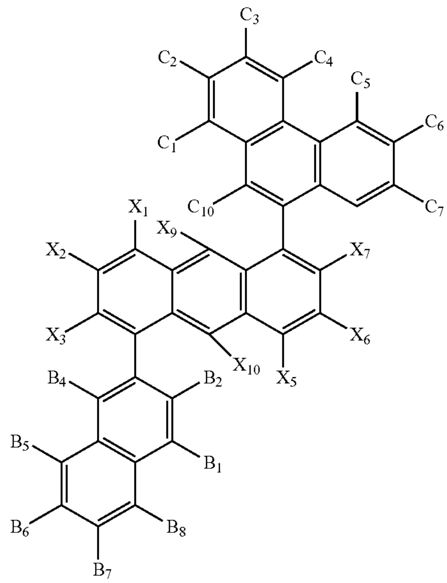
A62
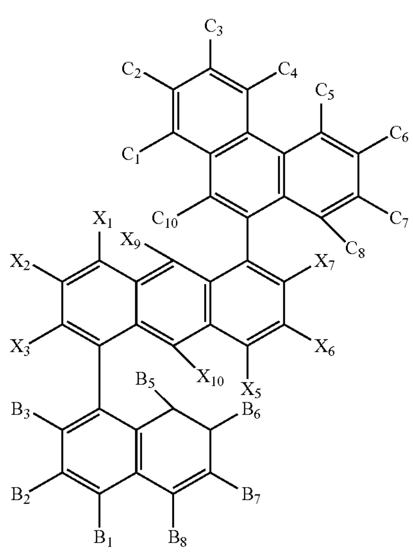
-continued
A63
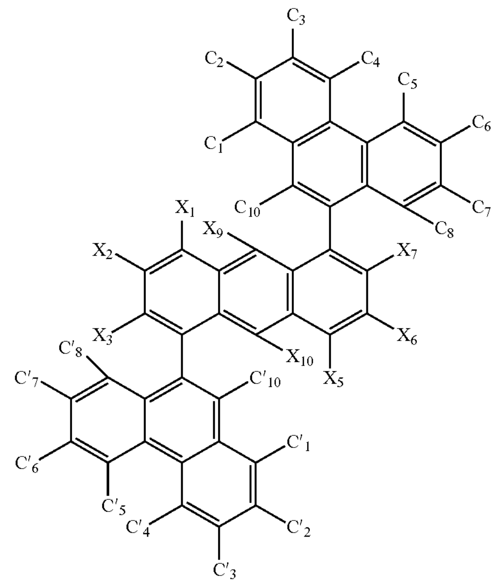
A64
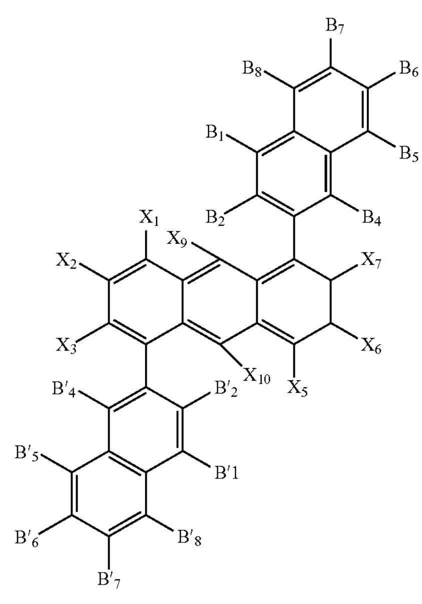

-continued

A65

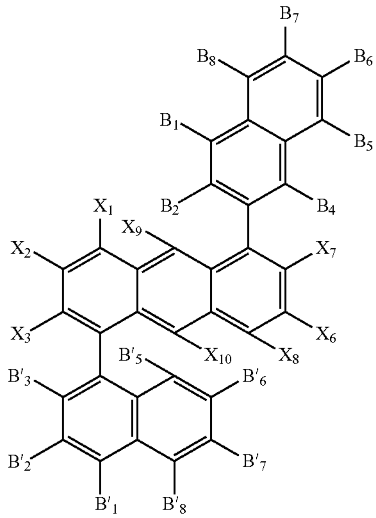

A66

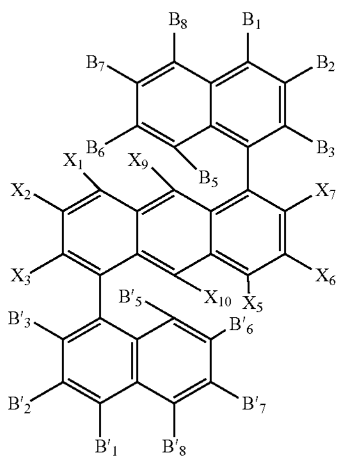

In the moiety represented by structures A1 to A66, $X_1$ to $X_{10}$ represents the presence of one or more substituent groups. For example, one or more substituent groups, $X_1$ to $X_{10}$, may independently be selected from: H, D (deutero), F, Cl, alkyl including $C_1$-$C_4$ alkyl, cycloalkyl, silyl, fluoroalkyl, arylalkyl, aryl, heteroaryl, alkoxy, fluoroalkoxy, and combinations of any two or more thereof. Furthermore, one or more substituent groups, may be independently selected from: methyl, methoxy, ethyl, t-butyl, fluoromethyl, difluoromethyl, trifluoromethyl, trifluoromethoxy, fluoroethyl, and polyfluoroethyl. Descriptions of other substituent groups, $A_1$, $A_2$, $A_3$, $A_4$, $A_5$, $B_1$, $B_2$, $B_3$, $B_4$, $B_5$, $B_6$, $B_7$ (as well as the B' counterparts to $B_1$-$B_7$), $C_1$, $C_2$, $C_3$, $C_4$, $C_5$, $C_6$, $C_7$, $C_8$, $C_9$ (as well as the C' counterparts to $C_1$-$C_9$), $D_1$, $D_2$, $D_3$, $D_4$, $D_5$, $D_6$, $D_7$, $D_8$, $D_9$, $E_1$, $E_2$, $E_3$, $E_4$, $E_5$, $E_6$, $E_7$, $E_8$, $E_9$, $E_{10}$, $E_{11}$, $F_1$, $F_2$, $F_3$, $F_4$, $F_5$, $F_6$, $F_7$, $F_8$, $F_9$, $F_{10}$, $G_1$, $G_2$, $G_3$, $G_4$, $G_5$, $G_6$, $G_7$, $G_8$, $G_9$, $G_{10}$, $G_{11}$, and $G_{12}$, provided above in relation to (I-A), (I-B), or (I-C), (I-D), (I-E), (I-F), (I-G) are applicable to the corresponding substituent groups represented by A1 to A66.

Examples of alkyl substituent includes C1-C6 alkyl, which may be straight or branched. For example, in the case of C4-C6 alkyl, branched alkyl may be preferred in some cases.

In one example wherein the moiety is represented by structure A1, at least one of $B_1$, $B_2$, $B_3$, $B_5$, $B_6$, $B_7$, $B_8$, $X_1$, $X_2$, $X_3$, $X_4$, $X_5$, $X_6$, $X_7$, $X_8$, $A_2$, $A_3$, $A_4$, $A_5$, and $A_6$ is F. In a further example, at least one of $B_1$, $B_2$, $B_3$, $B_5$, $B_6$, $B_7$, $B_8$, $X_2$, $X_3$, $X_6$ $X_7$, $A_2$, $A_3$, $A_4$, $A_5$ and $A_6$ is F. In a yet further example, at least one of $B_1$, $B_2$, $B_6$, $B_7$, $B_8$, $X_2$, $X_3$, $X_6$, $X_7$, $A_2$, $A_3$, $A_4$, $A_5$, and $A_6$ is F. In a yet further example, at least one of $B_1$, $B_2$, $B_6$, $B_7$, $B_8$, $X_2$, $X_3$, $X_6$, $X_7$, $A_3$, $A_4$, and $A_5$ is F. In a yet further example, at least one of $B_1$, $B_2$, $B_6$, $B_7$, $B_8$, $X_2$, $X_3$, $X_6$, $X_7$, $A_2$, and $A_6$ is F. For example, up to 10, 6, 5, 3, or 1 F atoms may be present in such structure.

In another example wherein the moiety is represented by structure A1, at least one of $B_1$, $B_2$, $B_3$, $B_5$, $B_6$, $B_7$, $B_8$, $X_1$, $X_2$, $X_3$, $X_4$, $X_5$, $X_6$, $X_7$, $X_8$, $A_2$, $A_3$, $A_4$, $A_5$, and $A_6$ is alkyl. In a further example, at least one of $B_1$, $B_2$, $B_3$, $B_5$, $B_6$, $B_7$, $B_8$, $X_1$, $X_2$, $X_3$, $X_6$, $X_7$, $X_8$, $A_2$, $A_3$, $A_4$, $A_5$, and $A_6$ is alkyl. In a yet further example, at least one of $B_1$, $B_2$, $B_6$, $B_7$, $B_8$, $X_1$, $X_2$, $X_3$, $X_6$ $X_7$, $X_8$, $A_3$, $A_4$, and $A_5$ is alkyl. In a yet further example, at least one of $A_3$, $A_4$, and $A_5$ is alkyl. For example, up to 6, 5, 3, or 1 alkyl substituent may be present in such structure.

In another example wherein the moiety is represented by structure A1, at least one of $B_1$, $B_2$, $B_3$, $B_5$, $B_6$, $B_7$, $B_8$, $X_1$, $X_2$, $X_3$, $X_4$, $X_5$, $X_6$, $X_7$, $X_8$, $A_2$, $A_3$, $A_4$, $A_5$ and $A_6$ is fluoroalkyl or fluoroalkoxy. In a further example, at least one of $B_1$, $B_2$, $B_3$, $B_5$, $B_6$, $B_7$, $B_8$, $X_2$, $X_3$, $X_6$, $X_7$, $A_2$, $A_3$, $A_4$, $A_5$ and $A_6$ is fluoroalkyl or fluoroalkoxy. In further example, at least one of $B_1$, $B_2$, $B_6$, $B_7$, $B_8$, $X_2$, $X_3$, $X_6$, $X_7$, $A_2$, $A_3$, $A_4$, $A_5$ and $A_6$ is fluoroalkyl or fluoroalkoxy. In a further example, at least one of $A_3$, $A_4$ and $A_5$ is fluoroalkyl or fluoroalkoxy. For example, up to 5, 3, or 1 such substituent may be present in such structure.

In another example wherein the moiety is represented by structure A1, at least one of $B_1$, $B_2$, $B_3$, $B_5$, $B_6$, $B_7$, $B_8$, $X_2$, $X_3$, $X_6$ $X_7$, $A_2$, $A_3$, $A_4$, $A_5$ and $A_6$ is aryl, arylalkyl, or heteroaryl. In further example, at least one of $B_2$, $B_3$, $B_6$, $B_7$, $B_8$, $X_2$, $X_3$, $X_6$ $X_7$, $A_2$, $A_3$, $A_4$, $A_5$ and $A_6$ is aryl, arylalkyl, or heteroaryl. In a further example, at least one of $B_2$, $B_3$, $B_5$, $X_2$, $X_3$, $X_6$ $X_7$, $A_2$, $A_3$, $A_4$, $A_5$ and $A_6$ is aryl, arylalkyl, or heteroaryl. In a further example, at least one of $B_2$, $B_3$, $B_5$, $X_2$, $X_3$, $X_6$, $X_7$, $A_2$, $A_3$, $A_5$ and $A_6$ is aryl, arylalkyl, or heteroaryl. In a further example, at least one of $B_2$, $B_3$, $B_5$, $X_2$, $X_3$, $X_6$, $X_7$, $A_5$ and $A_6$ is aryl, arylalkyl, or heteroaryl. For example, up to 8, 6, 4, 3, or 1 such substituent may be present in such structure.

In one example wherein the moiety is represented by structure A2, at least one of $B_1$, $B_2$, $B_4$, $B_5$, $B_6$, $B_7$, $B_8$, $X_1$, $X_2$, $X_3$, $X_4$, $X_5$, $X_6$, $X_7$, $X_8$, $A_2$, $A_3$, $A_4$, $A_5$ and $A_6$ is F. In a further example, at least one of $B_1$, $B_2$, $B_4$, $B_5$, $B_6$, $B_7$, $B_8$, $X_2$, $X_3$, $X_6$, $X_7$, $A_2$, $A_3$, $A_4$, $A_5$ and $A_6$ is F. In a further example, at least one of $B_1$, $B_5$, $B_6$, $B_7$, $B_8$, $X_2$, $X_3$, $X_6$, $X_7$, $A_2$, $A_3$, $A_4$, $A_5$ and $A_6$ is F. In a further example, at least one of $B_1$, $B_5$, $B_6$, $B_7$, $B_8$, $X_2$, $X_3$, $X_6$, $X_7$, $A_3$, $A_4$ and $A_5$ is F. For example, up to 10, 6, 5, 3, or 1 F atom may be present in such structure.

In another example wherein the moiety is represented by structure A2, at least one of $B_1$, $B_2$, $B_4$, $B_5$, $B_6$, $B_7$, $B_8$, $X_1$, $X_2$, $X_3$, $X_4$, $X_5$, $X_6$, $X_7$, $X_8$, $A_2$, $A_3$, $A_4$, $A_5$ and $A_6$ is alkyl. In a further example, at least one of $B_1$, $B_2$, $B_4$, $B_5$, $B_6$, $B_7$, $B_8$, $X_1$, $X_2$, $X_3$, $X_6$, $X_7$, $X_8$, $A_2$, $A_3$, $A_4$, $A_5$ and $A_6$ is alkyl. In a further example, at least one of $B_1$, $B_5$, $B_6$, $B_7$, $B_8$, $X_1$, $X_2$, $X_3$, $X_6$, $X_7$, $X_8$, $A_2$, $A_3$, $A_4$, $A_5$ and $A_6$ is alkyl. In a further example, at least one of $A_3$, $A_4$ and $A_5$ is alkyl. For example, up to 6, 5, 3, or 1 such substituent may be present in such structure.

In another example wherein the moiety is represented by structure A2, at least one of $B_1$, $B_2$, $B_4$, $B_5$, $B_6$, $B_7$, $B_8$, $X_1$, $X_2$, $X_3$, $X_4$, $X_5$, $X_6$, $X_7$, $X_8$, $A_2$, $A_3$, $A_4$, $A_5$ and $A_6$ is fluoroalkyl or fluoroalkoxy. In a further example, at least one of $B_1$, $B_2$, $B_4$, $B_5$, $B_6$, $B_7$, $B_8$, $X_2$, $X_3$ $X_6$, $X_7$, $A_2$, $A_3$, $A_4$, $A_5$ and $A_6$ is fluoroalkyl or fluoroalkoxy. In a further example, at least one of $B_1$, $B_5$, $B_6$, $B_7$, $B_8$, $X_2$, $X_3$ $X_6$, $X_7$, $A_2$, $A_3$, $A_4$, $A_5$ and $A_6$ is fluoroalkyl or fluoroalkoxy. In a further example, at least one of $B_1$, $B_5$, $B_6$, $B_7$, $B_8$, $X_2$, $X_3$ $X_6$, $X_7$, $A_3$, $A_4$ and $A_5$ is fluoroalkyl or fluoroalkoxy. For example, up to 5, 3, or 1 such substituent may be present in such structure.

In another example wherein the moiety is represented by structure A2, at least one of $B_1$, $B_2$, $B_4$, $B_5$, $B_6$, $B_7$, $B_8$, $X_2$, $X_3$, $X_6$, $X_7$, $A_2$, $A_3$, $A_4$, $A_5$ and $A_6$ is aryl, arylalkyl or heteroaryl. In a further example, at least one of $B_1$, $B_5$, $B_6$, $B_7$, $B_8$, $X_2$, $X_3$, $X_6$, $X_7$, $A_2$, $A_3$, $A_4$, $A_5$ and $A_6$ is aryl, arylalkyl or heteroaryl. In a further example, at least one of $B_5$, $B_6$, $B_8$, $X_2$, $X_3$, $X_6$, $X_7$, $A_2$, $A_3$, $A_4$, $A_5$ and $A_6$ is aryl, arylalkyl or heteroaryl. In a further example, at least one of $B_5$, $B_6$, $B_8$, $X_2$, $X_3$, $X_6$, $X_7$, $A_2$, $A_3$, $A_4$, $A_5$ and $A_6$ is aryl, arylalkyl or heteroaryl. For example, up to 8, 6, 4, 3, or 1 such substituent may be present in such structure.

In one example wherein the moiety is represented by structure A3, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $A_2$, $A_3$, $A_4$, $A_5$ and $A_6$ is F. In a further example, at least one of $C_1$, $C_2$, $C_3$, $C_4$, $C_5$, $C_6$, $C_7$, $C_8$, $C_{10}$, $X_2$, $X_3$, $X_6$, $X_7$, $A_2$, $A_3$, $A_4$, $A_5$ and $A_6$ is F. In a further example, at least one of $C_1$, $C_2$, $C_3$, $C_4$, $C_5$, $C_6$, $C_7$, $X_2$, $X_3$, $X_6$, $X_7$, $A_2$, $A_3$, $A_4$, $A_5$ and $A_6$ is F. In a further example, at least one of $A_3$, $A_4$ and $A_5$ is F. For example, up to 12, 10, 6, 5, 3, or 1 such substituent may be present in such structure.

In another example wherein the moiety is represented by structure A3, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $A_2$, $A_3$, $A_4$, $A_5$ and $A_6$ is alkyl or alkoxy. In a further example, at least one of $C_1$, $C_2$, $C_3$, $C_4$, $C_5$, $C_6$, $C_7$, $C_8$, $C_{10}$, $X_1$, $X_2$, $X_3$, $X_6$, $X_7$, $X_8$, $A_2$, $A_3$, $A_4$, $A_5$ and $A_6$ is alkyl. In a further example, at least one of $C_1$, $C_2$, $C_3$, $C_4$, $C_5$, $C_6$, $C_7$, $X_2$, $X_3$, $X_6$, $X_7$, $A_2$, $A_3$, $A_4$, $A_5$ and $A_6$ is alkyl. In a further example, at least one of $C_1$, $C_2$, $C_3$, $C_4$, $C_5$, $C_6$, $C_7$, $X_2$, $X_3$, $X_6$, $X_7$, $A_3$, $A_4$ and $A_5$ is alkyl. For example, up to 6, 5, 3, or 1 such substituent may be present in such structure.

In another example wherein the moiety is represented by structure A3, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $A_2$, $A_3$, $A_4$, $A_5$ and $A_6$ is fluoroalkyl or fluoroalkoxy. In a further example, at least one of $C_1$, $C_2$, $C_3$, $C_4$, $C_5$, $C_6$, $C_7$, $C_8$, $C_{10}$, $X_2$, $X_3$, $X_6$, $X_7$, $A_2$, $A_3$, $A_4$, $A_5$ and $A_6$ is fluoroalkyl or fluoroalkoxy. In a further example, at least one of $C_1$, $C_2$, $C_3$, $C_4$, $C_5$, $C_6$, $C_7$, $X_2$, $X_3$, $X_6$, $X_7$, $A_2$, $A_3$, $A_4$, $A_5$ and $A_6$ is fluoroalkyl or fluoroalkoxy. In a further example, at least one of $A_3$, $A_4$ and $A_5$ is fluoroalkyl or fluoroalkoxy. For example, up to 5, 3, or 1 such substituent may be present in such structure.

In another example wherein the moiety is represented by structure A3, at least one of $C_1$, $C_2$, $C_3$, $C_4$, $C_5$, $C_6$, $C_7$, $C_8$, $C_{10}$, $X_2$, $X_3$, $X_6$, $X_7$, $A_2$, $A_3$, $A_4$, $A_5$ and $A_6$ is aryl, arylalkyl or heteroaryl. In a further example, at least one of $C_1$, $C_2$, $C_3$, $C_4$, $C_5$, $C_6$, $C_7$, $X_2$, $X_3$, $X_6$, $X_7$, $A_2$, $A_3$, $A_4$, $A_5$ and $A_6$ is aryl, arylalkyl or heteroaryl. In a further example, at least one of $C_1$, $C_2$, $C_3$, $C_4$, $C_5$, $C_6$, $C_7$, $X_2$, $X_3$, $X_6$, $X_7$, $A_2$ and $A_6$ is aryl, arylalkyl or heteroaryl. For example, up to 8, 6, 4, 3, or 1 such substituent may be present in such structure.

In one example wherein the moiety is represented by structure A4, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $B_1$, $B_2$, $B_4$, $B_5$, $B_6$, $B_7$ and $B_8$ is F. In a further example, at least one of $C_1$, $C_2$, $C_3$, $C_4$, $C_5$, $C_6$, $C_7$, $C_8$, $C_{10}$, $X_2$, $X_3$, $X_6$, $X_7$, $B_1$, $B_2$, $B_4$, $B_5$, $B_6$, $B_7$ and $B_8$ is F. In a further example, at least one of $C_1$, $C_2$, $C_3$, $C_4$, $C_5$, $C_6$, $C_7$, $X_2$, $X_3$, $X_6$ $X_7$, $B_1$, $B_2$, $B_4$, $B_5$, $B_6$, $B_7$ and $B_8$ is F. In a further example, at least one of $C_1$, $C_2$, $C_3$, $C_4$, $C_5$, $C_6$, $C_7$, $X_2$, $X_3$, $X_6$, $X_7$, $B_1$, $B_5$, $B_6$, $B_7$ and $B_8$ is F. For example, up to 14, 10, 8, 6, 4, 3, or 1 such substituent may be present in such structure.

In another example wherein the moiety is represented by structure A4, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $B_1$, $B_2$, $B_4$, $B_5$, $B_6$, $B_7$ and $B_8$ is alkyl or fluoroalkyl. In a further example, at least one of $C_1$, $C_2$, $C_3$, $C_4$, $C_5$, $C_6$, $C_7$, $C_8$, $C_{10}$, $X_1$, $X_2$, $X_3$, $X_6$, $X_7$, $X_8$, $B_1$, $B_2$, $B_4$, $B_5$, $B_6$, $B_7$ and $B_8$ is alkyl or fluoroalkyl. In a further example, at least one of $C_1$, $C_2$, $C_3$, $C_4$, $C_5$, $C_6$, $C_7$, $X_1$, $X_2$, $X_3$, $X_6$, $X_7$, $X_8$, $B_1$, $B_2$, $B_4$, $B_5$, $B_6$, $B_7$, and $B_8$ is alkyl or fluoroalkyl. In a further example, at least one of $B_1$, $B_5$, $B_6$, $B_7$ and $B_8$ is alkyl or fluoroalkyl. For example, up to 6, 5, 3, or 1 such substituent may be present in such structure.

In another example wherein the moiety is represented by structure A4, at least one of $C_1$, $C_2$, $C_3$, $C_4$, $C_5$, $C_6$, $C_7$, $C_8$, $C_{10}$, $X_2$, $X_3$, $X_6$, $X_7$, $B_1$, $B_2$, $B_4$, $B_5$, $B_6$, $B_7$ and $B_8$ is aryl, arylalkyl or heteroaryl. In a further example, at least one of $C_1$, $C_2$, $C_3$, $C_4$, $C_5$, $C_6$, $C_7$, $X_2$, $X_3$, $X_6$ $X_7$, $B_1$, $B_2$, $B_4$, $B_5$, $B_6$, $B_7$ and $B_8$ is aryl, arylalkyl or heteroaryl. In a further example, at least one of $C_1$, $C_2$, $C_4$, $C_5$, $C_6$, $C_7$, $X_2$, $X_3$, $X_6$, $X_7$, $B_1$, $B_2$, $B_4$, $B_5$, $B_6$, $B_7$, and $B_8$ is aryl, arylalkyl or heteroaryl. In a further example, at least one of $C_1$, $C_2$, $C_4$, $C_5$, $C_6$, $C_7$, $X_2$, $X_3$, $X_6$, $X_7$, $B_2$, and $B_4$ is aryl, arylalkyl or heteroaryl. For example, up to 8, 6, 4, 3, or 1 such substituent may be present in such structure.

In another example wherein the moiety is represented by structure A4, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $B_1$, $B_2$, $B_4$, $B_5$, $B_6$, $B_7$ and $B_8$ is fluoroalkoxy. In a further example, at least one of $C_1$, $C_2$, $C_3$, $C_4$, $C_5$, $C_6$, $C_7$, $C_8$, $C_{10}$, $X_2$, $X_3$, $X_6$, $X_7$, $B_1$, $B_2$, $B_4$, $B_5$, $B_6$, $B_7$ and $B_8$ is fluoroalkoxy. In a further example, at least one of $C_1$, $C_2$, $C_3$, $C_4$, $C_5$, $C_6$, $C_7$, $X_2$, $X_3$, $X_6$ $X_7$, $B_1$, $B_2$, $B_4$, $B_5$, $B_6$, $B_7$ and $B_8$ is fluoroalkoxy. In a further example, at least one of $C_1$, $C_2$, $C_3$, $C_4$, $C_5$, $C_6$, $C_7$, $X_2$, $X_3$, $X_6$, $X_7$, $B_1$, $B_5$, $B_6$, $B_7$ and $B_8$ is fluoroalkoxy. For example, up to 7, 5, 3, or 1 such substituent may be present in such structure.

In one example wherein the moiety is represented by structure A5, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $B_1$, $B_2$, $B_3$, $B_5$, $B_6$, $B_7$ and $B_8$ is F. In a further example, at least one of $C_1$, $C_2$, $C_3$, $C_4$, $C_5$, $C_6$, $C_7$, $C_8$, $C_{10}$, $X_2$, $X_3$, $X_6$, $X_7$, $B_1$, $B_2$, $B_3$, $B_5$, $B_6$, $B_7$ and $B_8$ is F. In a further example, at least one of $C_1$, $C_2$, $C_3$, $C_4$, $C_5$, $C_6$, $C_7$, $X_2$, $X_3$, $X_6$ $X_7$, $B_1$, $B_2$, $B_3$, $B_5$, $B_6$, $B_7$ and $B_8$ is F. In a further example, at least one of $C_1$, $C_2$, $C_3$, $C_4$, $C_5$, $C_6$, $C_7$, $X_2$, $X_3$, $X_6$, $X_7$, $B_1$, $B_2$, $B_6$, $B_7$ and $B_8$ is F. In a further example, at least one of $B_1$, $B_2$, $B_7$ and $B_8$ is F. For example, up to 16, 10, 6, 5, 3, or 1 such substituent may be present in such structure.

In another example wherein the moiety is represented by structure A5, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $B_1$, $B_2$, $B_3$, $B_5$, $B_6$, $B_7$ and $B_8$ is alkyl. In a further example, at least one of $C_1$, $C_2$, $C_3$, $C_4$, $C_5$, $C_6$, $C_7$, $C_8$, $C_{10}$, $X_1$, $X_2$, $X_3$, $X_6$, $X_7$, $X_8$, $B_1$, $B_2$, $B_3$, $B_5$, $B_6$, $B_7$ and $B_8$ is alkyl. In a further example, at least one of $C_1$, $C_2$, $C_3$, $C_4$, $C_5$, $C_6$, $C_7$, $X_2$, $X_3$, $X_6$, $X_7$, $B_1$, $B_2$, $B_6$, $B_7$ and $B_8$ is alkyl. In a further example, at least one of $C_1$, $C_2$, $C_3$, $C_6$, $C_7$, $B_1$, $B_2$, $B_7$ and $B_8$ is alkyl. For example, up to 10, 6, 5, 3, or 1 such substituent may be present in such structure.

In another example wherein the moiety is represented by structure A5, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $B_1$, $B_2$, $B_3$, $B_5$, $B_6$, $B_7$ and $B_8$ is fluoroalkyl or fluoroalkoxy. In a further example, at least one of $C_1$, $C_2$, $C_3$, $C_4$, $C_5$, $C_6$, $C_7$, $C_8$, $C_{10}$, $X_2$, $X_3$, $X_6$ $X_7$, $B_1$, $B_2$, $B_3$, $B_5$, $B_6$, $B_7$ and $B_8$ is fluoroalkyl or fluoroalkoxy. In a further example, at least one of $C_1$, $C_2$, $C_3$, $C_4$, $C_5$, $C_6$, $C_7$, $X_2$, $X_3$, $X_6$, $X_7$, $B_1$, $B_2$, $B_3$, $B_5$, $B_6$, $B_7$ and $B_8$ is fluoroalkyl or fluoroalkoxy. In a further example, at least one of $C_1$, $C_2$, $C_3$, $C_4$, $C_5$, $C_6$, $C_7$, $X_2$, $X_3$, $X_6$, $X_7$, $B_1$, $B_2$, $B_6$, $B_7$ and $B_8$ is fluoroalkyl or fluoroalkoxy. In a further example, at least one of $B_1$, $B_2$, $B_7$ and $B_8$ is fluoroalkyl or fluoroalkoxy. For example, up to 8, 5, 3, or 1 such substituent may be present in such structure.

In another example wherein the moiety is represented by structure A5, at least one of $C_1$, $C_2$, $C_3$, $C_4$, $C_5$, $C_6$, $C_7$, $C_8$, $C_{10}$, $X_2$, $X_3$, $X_6$, $X_7$, $B_1$, $B_2$, $B_3$, $B_5$, $B_6$, $B_7$ and $B_8$ is aryl, arylalkyl or heteroaryl. In a further example, at least one of $C_1$, $C_2$, $C_3$, $C_4$, $C_5$, $C_6$, $C_7$, $X_2$, $X_3$, $X_6$, $X_7$, $B_1$, $B_2$, $B_3$, $B_5$, $B_6$, $B_7$ and $B_8$ is aryl, arylalkyl or heteroaryl. In a further example, at least one of $C_1$, $C_2$, $C_4$, $C_5$, $C_6$, $C_7$, $X_2$, $X_3$, $X_6$, $X_7$, $B_1$, $B_2$, $B_3$, $B_6$, $B_7$ and $B_8$ is aryl, arylalkyl or heteroaryl. In a further example, at least one of $C_1$, $C_2$, $C_4$, $C_5$, $C_6$, $C_7$, $X_2$, $X_3$, $X_6$, $X_7$, $B_3$ and $B_6$ is aryl, arylalkyl or heteroaryl. For example, up to 8, 6, 4, 3, or 1 such substituent may be present in such structure.

In one example wherein the moiety is represented by structure A6, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $C'_1$, $C'_2$, $C'_3$, $C'_4$, $C'_5$, $C'_6$, $C'_7$, $C'_8$, and $C'_{10}$ is F. In a further example, at least one of $C_1$, $C_2$, $C_3$, $C_4$, $C_5$, $C_6$, $C_7$, $C_8$, $C_{10}$, $X_2$, $X_3$, $X_6$, $X_7$, $C'_1$, $C'_2$, $C'_3$, $C'_4$, $C'_6$, $C'_8$, and $C'_{10}$ is F. In a further, at least one of $C_1$, $C_2$, $C_3$, $C_4$, $C_5$, $C_6$, $C_7$, $X_2$, $X_3$, $X_6$, $X_7$, $C'_1$, $C'_2$, $C'_3$, $C'_4$, $C'_5$, $C'_6$, $C'_7$, $C'_8$, and $C'_{10}$ is F. In a further example, at least one of $C_3$, $C_4$, $C_5$, $C_6$, $X_2$, $X_3$, $X_6$, $X_7$, $C'_1$, $C'_2$, $C'_3$, $C'_4$, $C'_5$, $C'_6$, $C'_7$, $C'_8$, and $C'_{10}$ is F. In a further example, at least one of $C_3$, $C_4$, $C_5$, $C_6$, $X_2$, $X_3$, $X_6$, $X_7$, $C'_1$, $C'_2$, $C'_3$, $C'_4$, $C'_5$, $C'_6$ and $C'_7$ is F. For example, up to 18, 12, 10, 6, 5, 3, or 1 such substituent may be present in such structure.

In another example wherein the moiety is represented by structure A6, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $C'_1$, $C'_2$, $C'_3$, $C'_4$, $C'_5$, $C'_6$, $C'_7$, $C'_8$, and $C'_{10}$ is alkyl. In a further example, at least one of $C_1$, $C_2$, $C_3$, $C_4$, $C_5$, $C_6$, $C_7$, $C_8$, $C_{10}$, $X_1$, $X_2$, $X_3$, $X_6$, $X_7$, $X_8$, $C'_1$, $C'_2$, $C'_3$, $C'_4$, $C'_5$, $C'_6$, $C'_7$, $C'_8$, and $C'_{10}$ is alkyl. In a further example, at least one of $C_1$, $C_2$, $C_3$, $C_4$, $C_5$, $C_6$, $C_7$, $X_1$, $X_2$, $X_3$, $X_6$, $X_7$, $X_8$, $C'_1$, $C'_2$, $C'_3$, $C'_4$, $C'_5$, $C'_6$, $C'_7$, $C'_8$, and $C'_{10}$ is alkyl. In a further example, at least one of $C_1$, $C_2$, $C_3$, $C_4$, $C_5$, $C_6$, $C_7$, $X_1$, $X_2$, $X_3$, $X_6$, $X_7$, $X_8$, $C'_1$, $C'_2$, $C'_3$, $C'_4$, $C'_6$ and $C'_7$ is alkyl. For example, up to 8, 6, 5, 3, or 1 such substituent may be present in such structure.

In another example wherein the moiety is represented by structure A6, at least one of $C_1$, $C_2$, $C_3$, $C_4$, $C_5$, $C_6$, $C_7$, $C_8$, $C_{10}$, $X_1$, $X_2$, $X_3$, $X_4$, $X_5$, $X_6$, $X_7$, $X_8$, $C'_1$, $C'_2$, $C'_3$, $C'_4$, $C'_5$, $C'_6$, $C'_7$, $C'_8$, and $C'_{10}$ is fluoroalkyl or fluoroalkoxy. In a further example, at least one of $C_1$, $C_2$, $C_3$, $C_4$, $C_5$, $C_6$, $C_7$, $C_8$, $C_{10}$, $X_2$, $X_3$, $X_6$, $X_7$, $C'_1$, $C'_2$, $C'_3$, $C'_4$, $C'_5$, $C'_6$, $C'_7$, $C'_8$, and $C'_{10}$ is fluoroalkyl or fluoroalkoxy. In a further example, at least one of $C_1$, $C_2$, $C_3$, $C_4$, $C_5$, $C_6$, $C_7$, $X_2$, $X_3$, $X_6$, $X_7$, $C'_1$, $C'_2$, $C'_3$, $C'_4$, $C'_5$, $C'_6$, $C'_7$, $C'_8$, and $C'_{10}$ is fluoroalkyl or fluoroalkoxy. In a further example, at least one of $C_3$, $C_4$, $C_5$, $C_6$, $X_2$, $X_3$, $X_6$, $X_7$, $C'_1$, $C'_2$, $C'_3$, $C'_4$, $C'_5$, $C'_6$, $C'_7$, $C'_8$, and $C'_{10}$ is fluoroalkyl or fluoroalkoxy. In a further example, at least one of $C_3$, $C_4$, $C_5$, $C_6$, $X_2$, $X_3$, $X_6$, $X_7$, $C'_1$, $C'_3$, $C'_4$, $C'_5$, $C'_6$, and $C'_7$ is fluoroalkyl or fluoroalkoxy. For example, up to 8, 5, 3, or 1 such substituent may be present in such structure.

In another example wherein the moiety is represented by structure A6, at least one of $C_1$, $C_2$, $C_3$, $C_4$, $C_5$, $C_6$, $C_7$, $C_8$, $C_{10}$, $X_2$, $X_3$, $X_6$, $X_7$, $C'_1$, $C'_2$, $C'_3$, $C'_4$, $C'_5$, $C'_6$, $C'_7$, $C'_8$, and $C'_{10}$ is aryl, arylalkyl or heteroaryl. In a further example, at least one of $C_1$, $C_2$, $C_3$, $C_4$, $C_5$, $C_6$, $C_7$, $X_2$, $X_3$, $X_6$, $X_7$, $C'_1$, $C'_2$, $C'_3$, $C'_4$, $C'_5$, $C'_6$, $C'_7$, $C'_8$, and $C'_{10}$ is aryl, arylalkyl or heteroaryl. In a further example, at least one of $C_1$, $C_2$, $C_4$, $C_5$, $C_6$, $C_7$, $X_2$, $X_3$, $X_6$, $X_7$, $C'_1$, $C'_2$, $C'_3$, $C'_4$, $C'_5$, $C'_6$, $C'_7$, $C'_8$, and $C'_{10}$ is aryl, arylalkyl or heteroaryl. In a further example, at least one of $C_1$, $C_2$, $C_4$, $C_5$, $C_6$, $C_7$, $X_2$, $X_3$, $X_6$, $X_7$, $C'_8$, and $C'_{10}$ is aryl, arylalkyl or heteroaryl. For example, up to 8, 6, 4, 3, or 1 such substituent may be present in such structure.

Without wishing to be bound by any particular theory, it is generally postulated that molecules with one or more of the following characteristics may be particularly suitable for use in forming the nucleation inhibiting coating: (i) relatively low degree of symmetry in molecular structure; (ii) containing bonds with a relatively high rotational energy barrier; (iii) relatively large optical gap; and (iv) relatively low likelihood of reacting with the material for forming the conductive coating. For example, it is postulated that, for molecular structures containing a naphthyl terminal moiety, it may generally be preferable for such naphthyl moiety to be bonded directly or indirectly to the core moiety at the 1- or 4-position, rather than at 2- or 3-position. Such configuration may contribute to increasing the rotational energy barrier of the naphthyl terminal moiety. In another example, it is postulated that, for molecular structures containing a phenanthrenyl moiety, it may generally be preferable for such phenanthrenyl moiety to be bonded directly or indirectly to the core moiety at the 9-, or 10-position over the 1- or 3-position, which is still preferable over bonding at the 2- or 7-position for increasing the rotational energy barrier of the phenathrenyl moiety. In some embodiments, the nucleation inhibiting coating includes a molecule exhibiting an optical gap of greater than about 2.5 eV, greater than about 2.6 eV, greater than about 2.7 eV, or greater than about 2.8 eV. Generally, molecules with greater optical gap decrease the absorption of light in the visible portion of the electromagnetic spectrum and thus may be preferable in at least some applications.

In some embodiments, the polycyclic aromatic compound contains one or more fluorine atoms. For example, the polycyclic aromatic compound may contain 1, 2, 3, 4 or more fluorine atoms. In some embodiments, the polycyclic aromatic compound contains between 1 and 3 fluorine atoms. Further examples of polycyclic aromatic compounds containing an anthracenyl core are provided below.

SF0

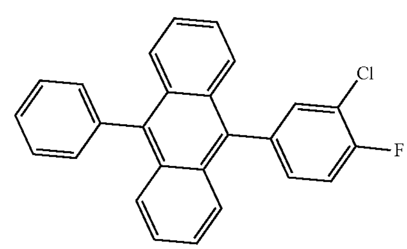

SF1

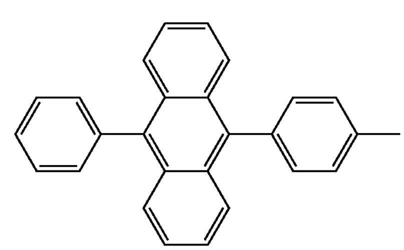

-continued
SF2
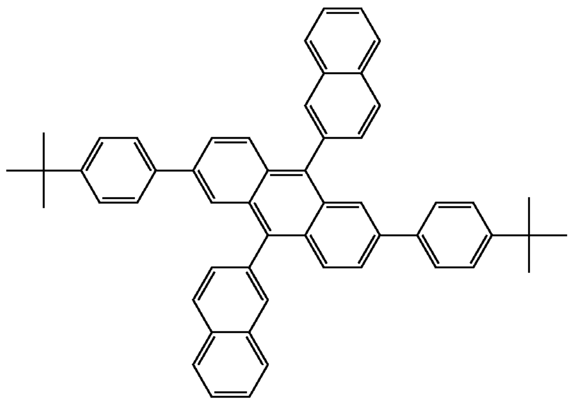
SF3
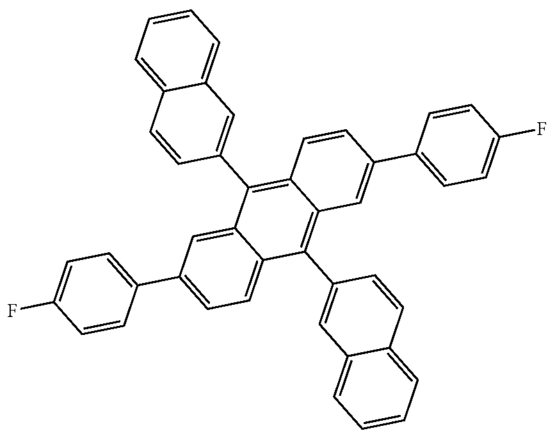
SF4
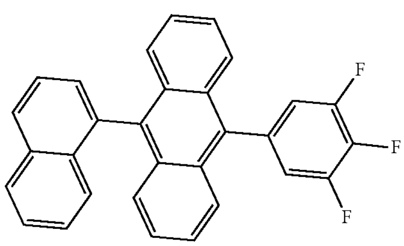
SF5
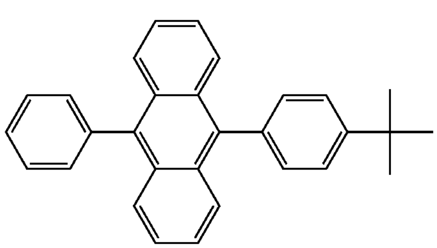
-continued
SF6
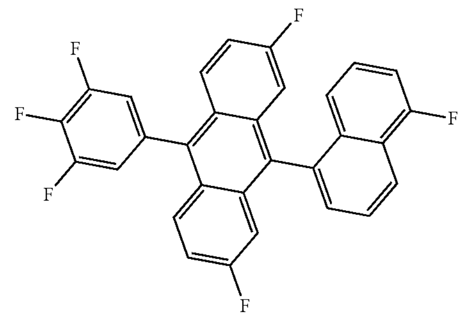
SF7
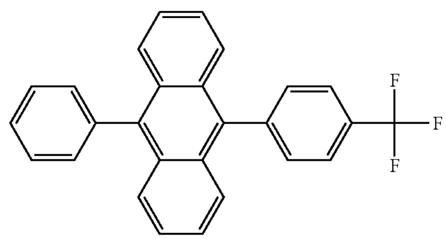
SF8
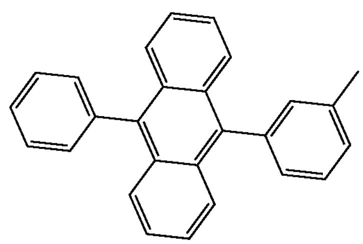
SF9
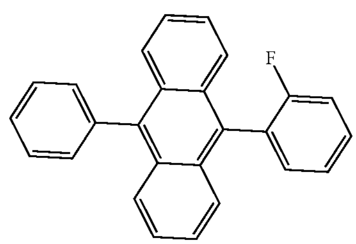
SF10
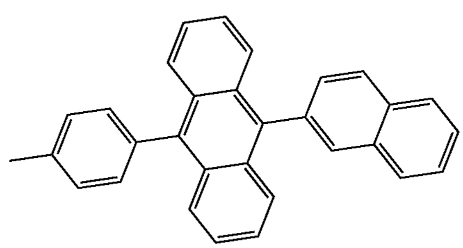
SF11
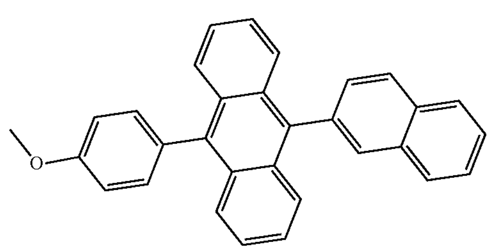

-continued
SF12
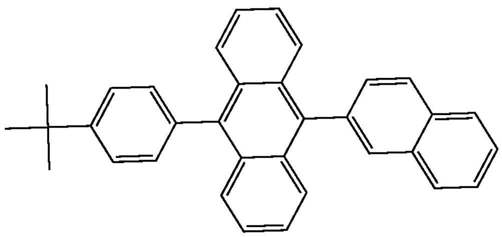
SF13
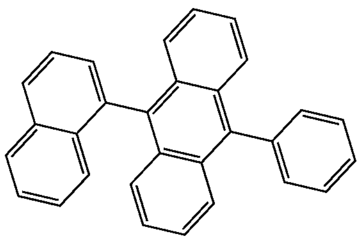
SF14
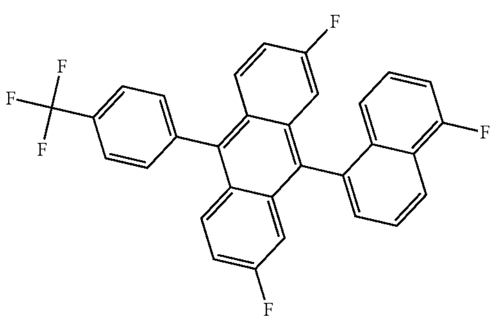
SF15
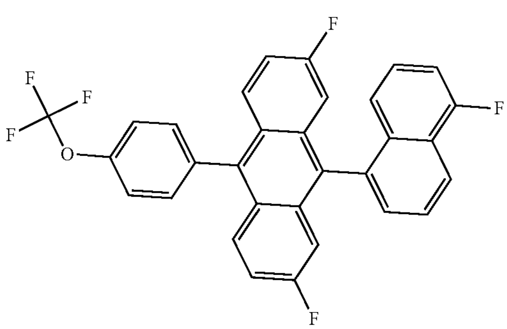
SF16
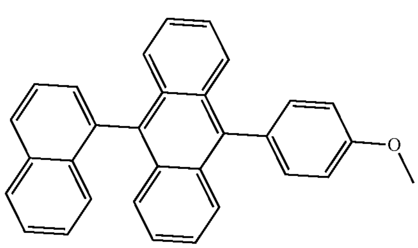
-continued
SF17
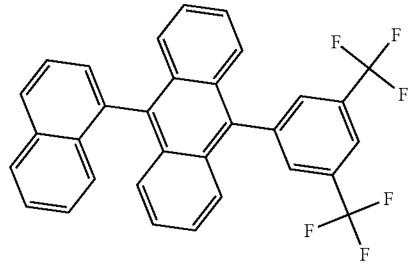
SF18
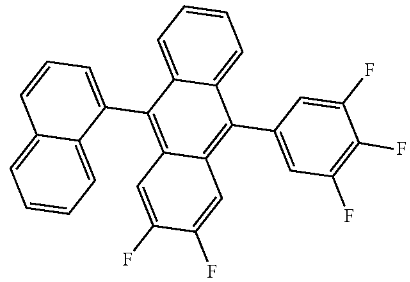
SF19
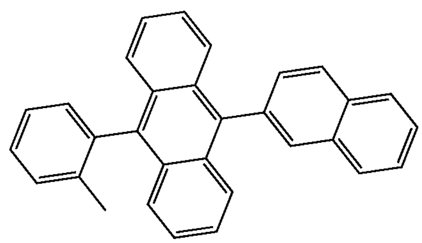
SF20
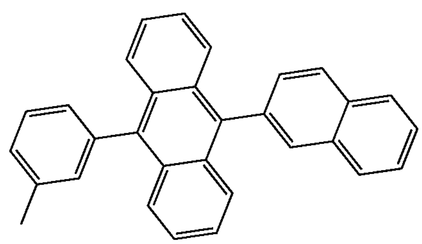
SF21
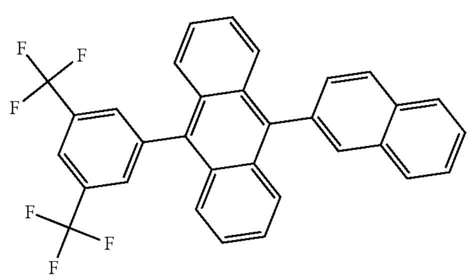
SF22
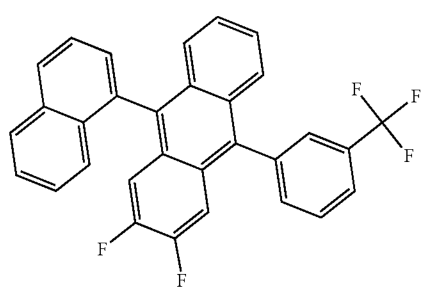

-continued
SF23
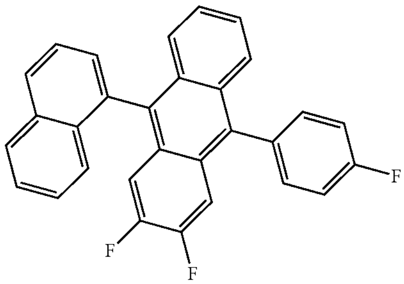
SF24
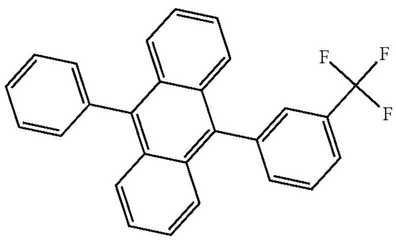
SF25
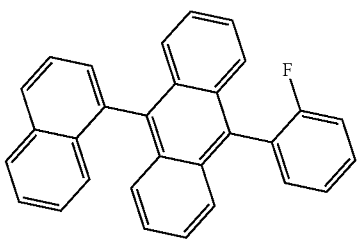
SF26
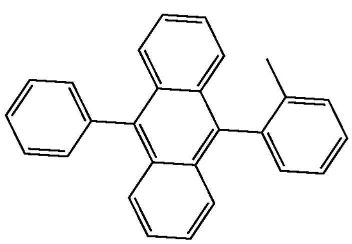
SF27
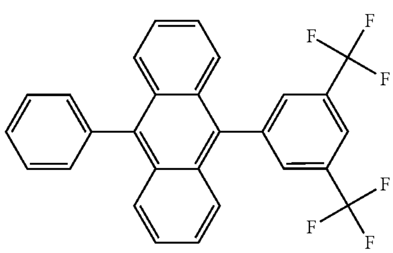
SF28
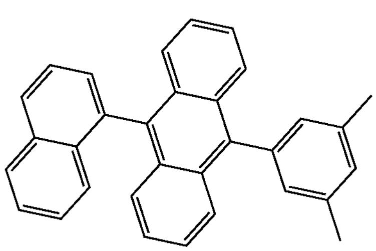
-continued
SF29
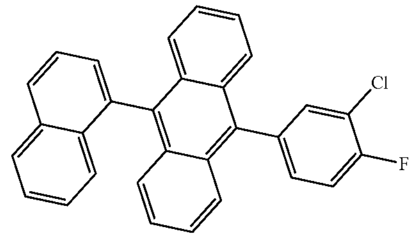
SF30
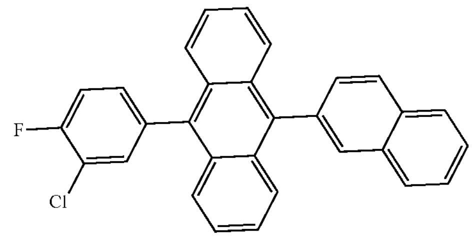
SF31
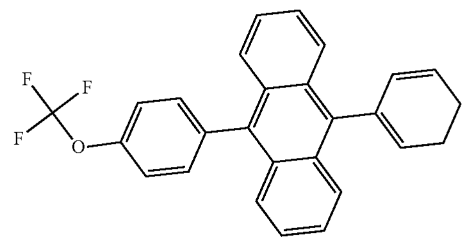
SF32
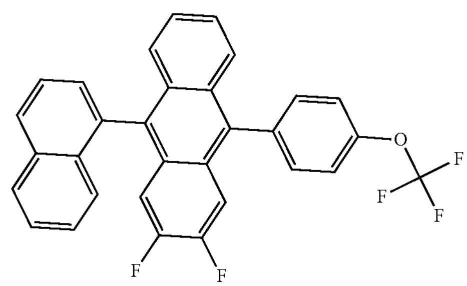
SF33
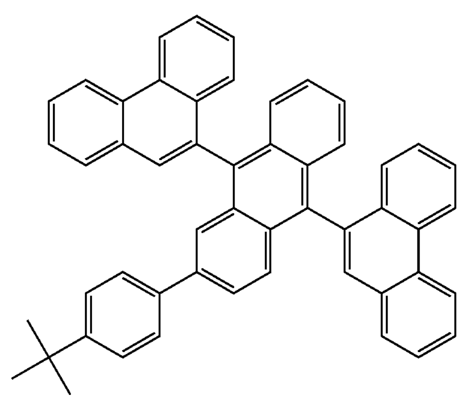

-continued
SF34
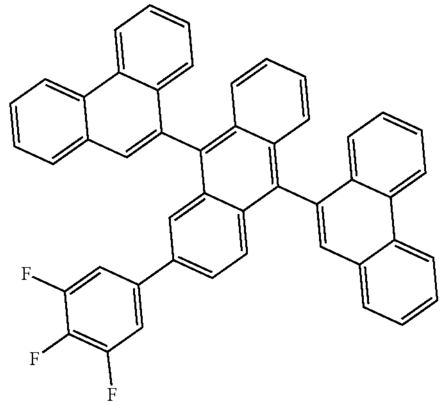
SF35
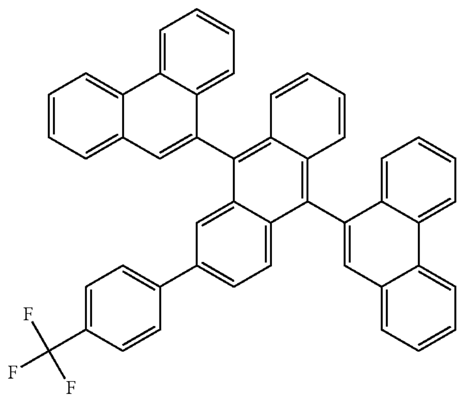
SF36
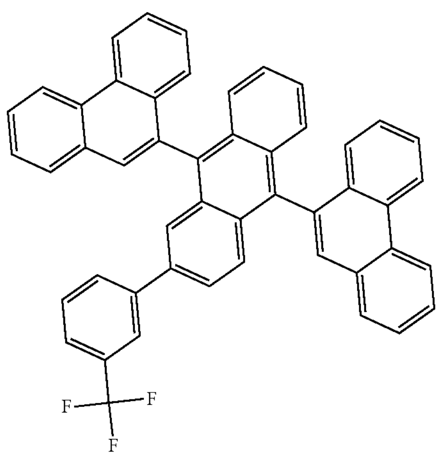
SF37
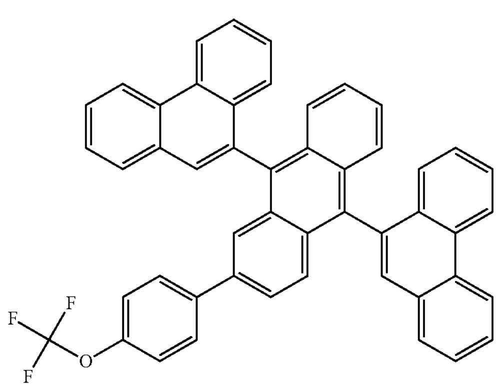
-continued
SF38
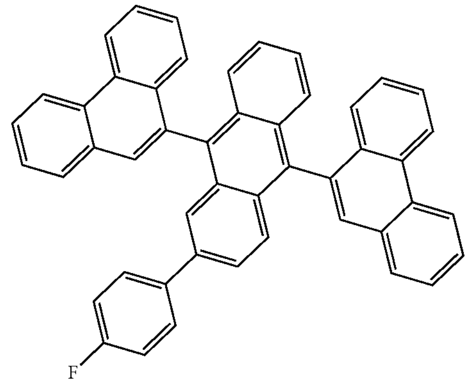
SF39
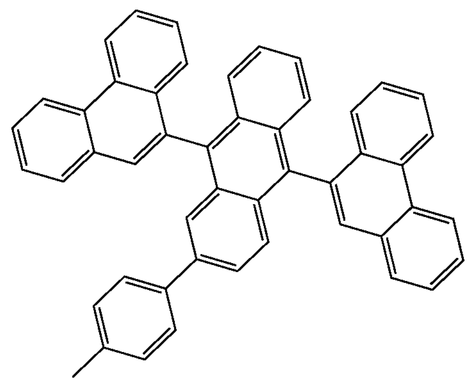
SF40
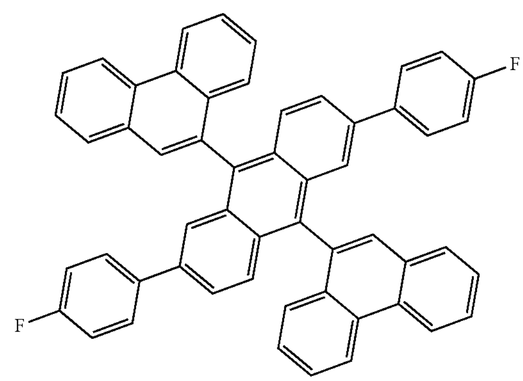
SF41
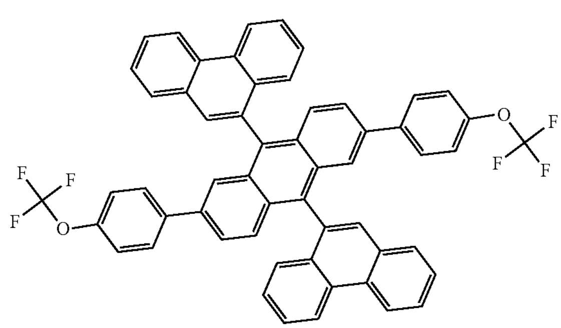

-continued
SF42
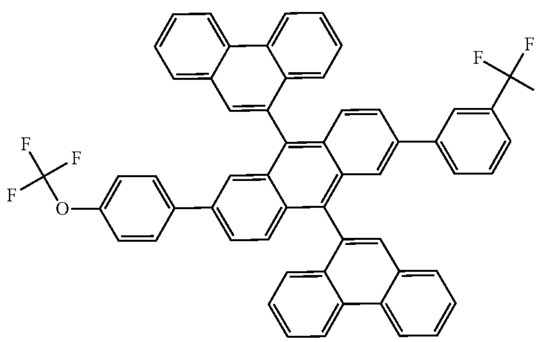
SF43
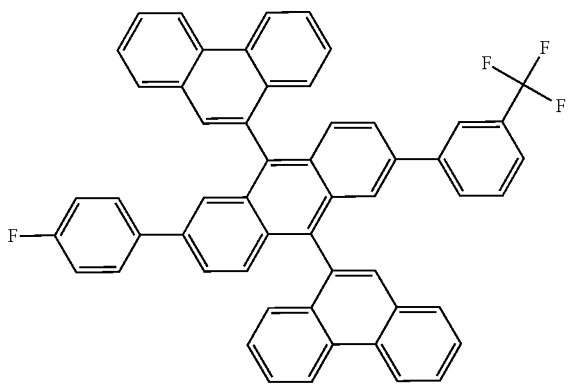
SF44
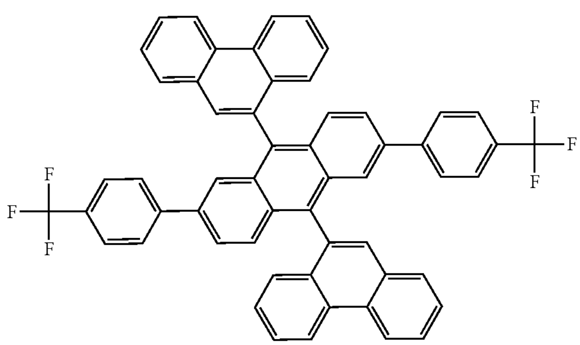
SF45
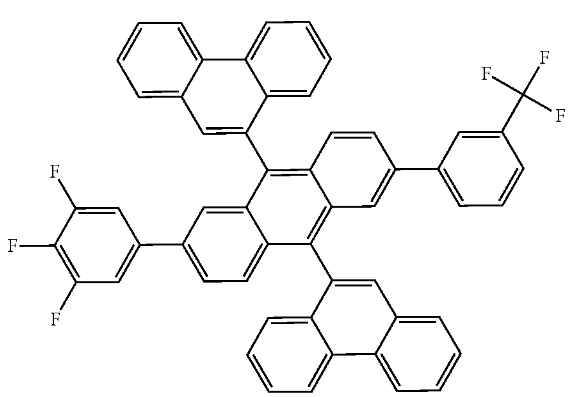
-continued
SF46
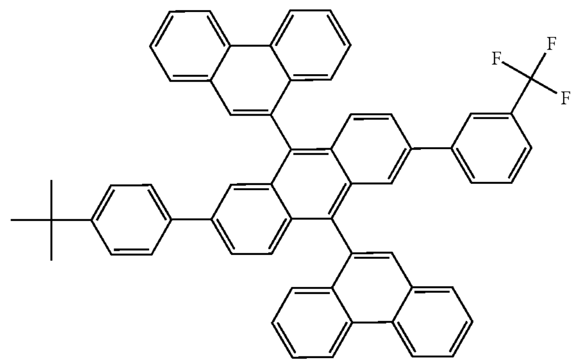
SF47
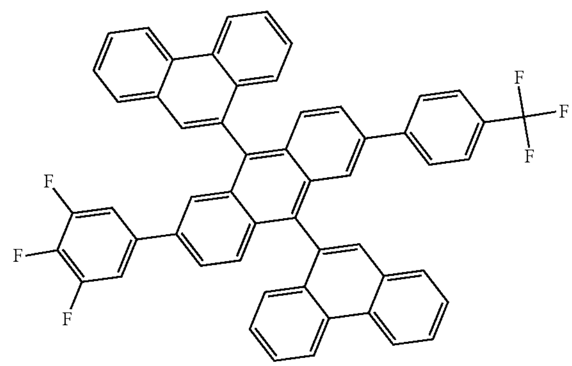
SF48
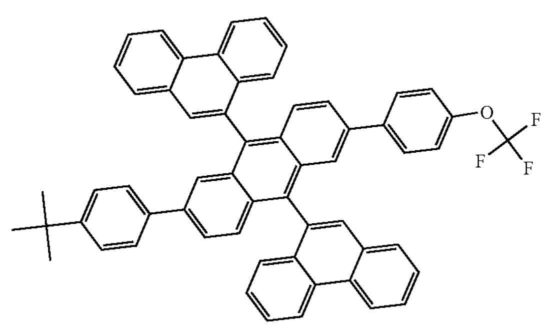
SF49
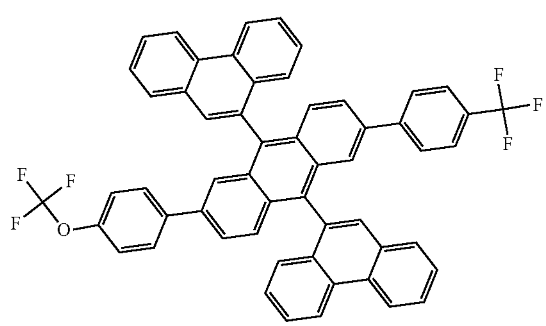

-continued
SF50
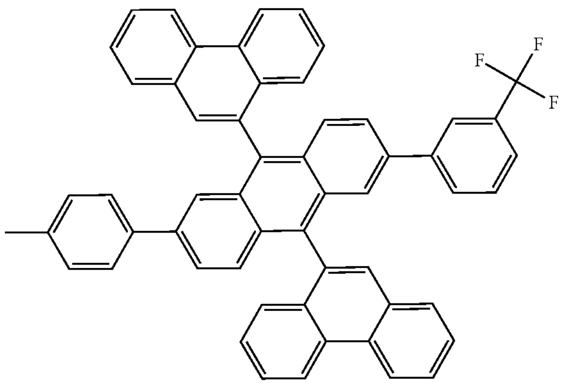
SF51
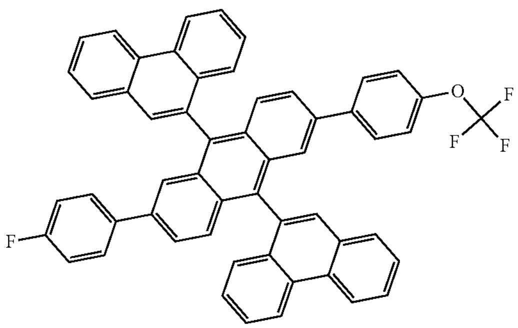
SF52
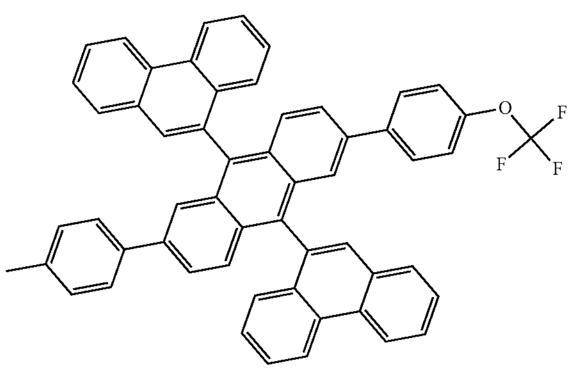
SF53
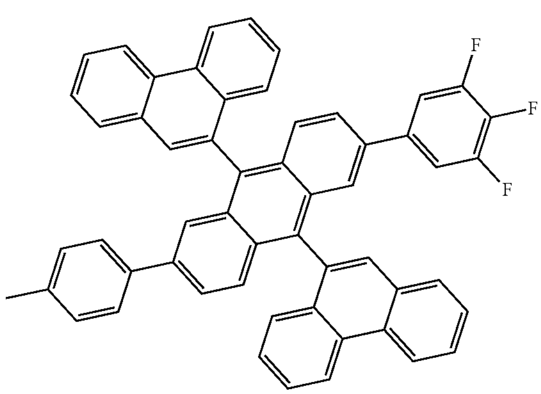
-continued
SF54
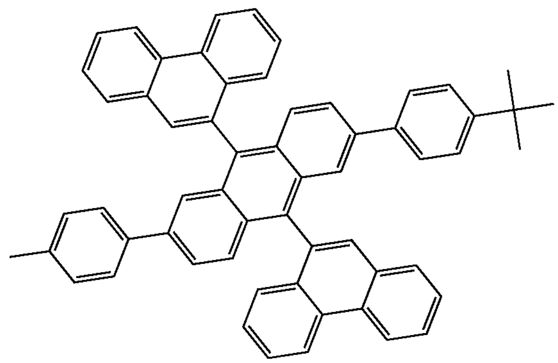
SF55
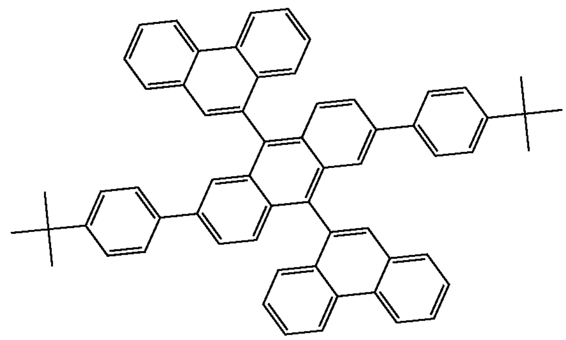
SF56
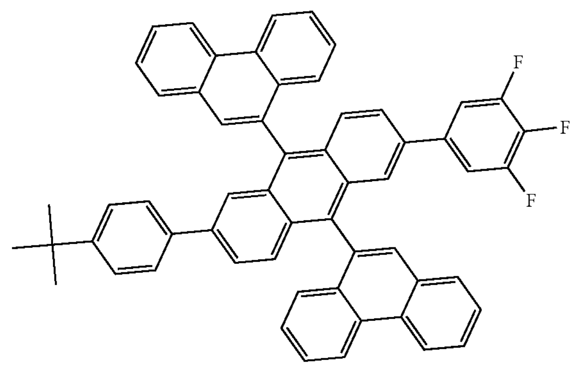
SF57
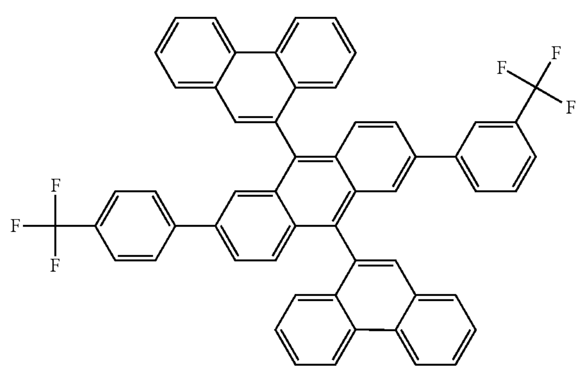

-continued
SF58
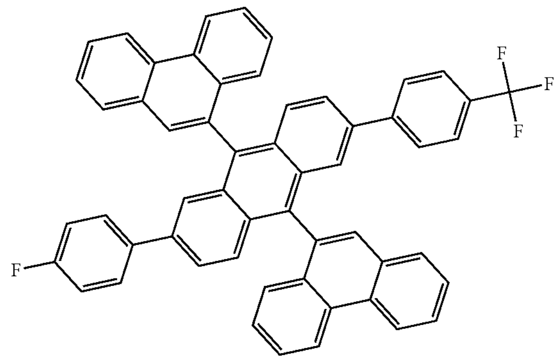
SF59
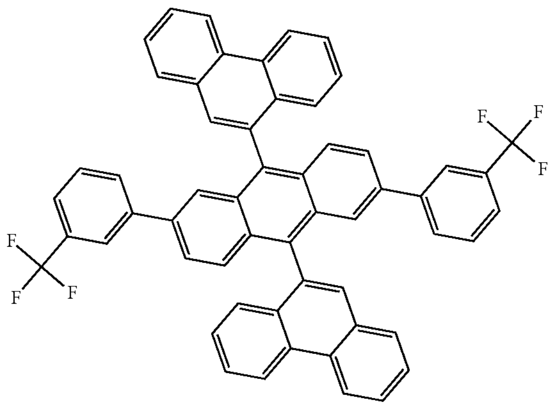
SF60
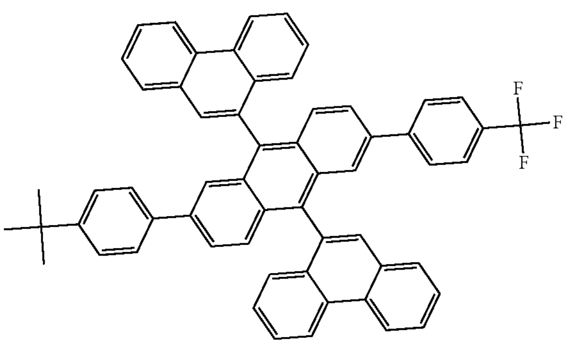
SF61
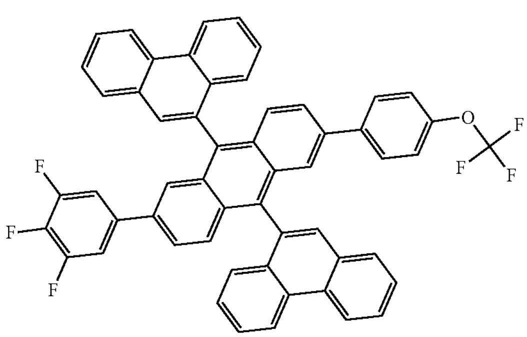
-continued
SF62
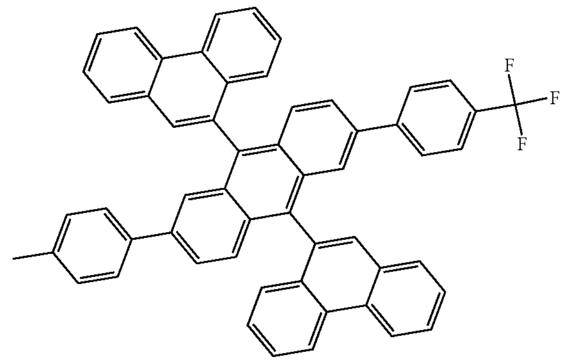
SF63
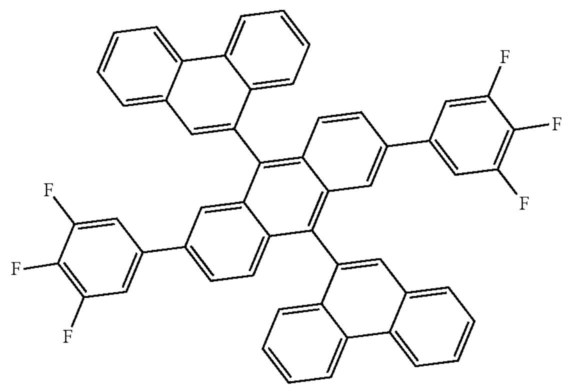
SF64
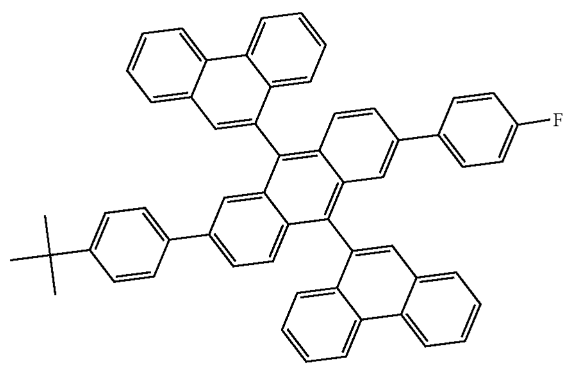
SF65
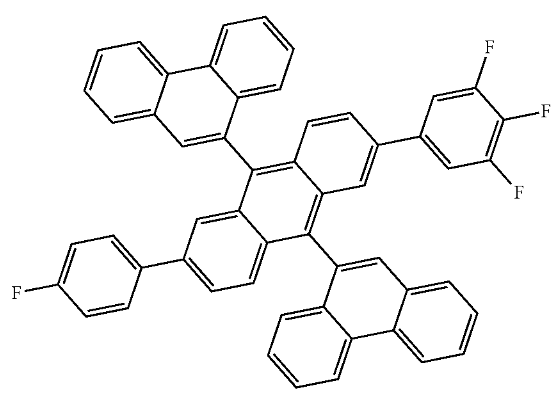

-continued
SF66
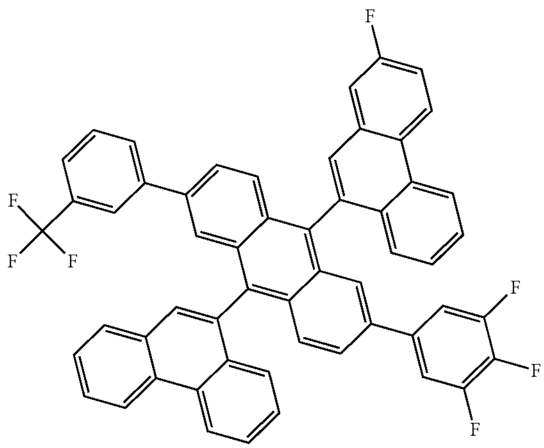
SF67
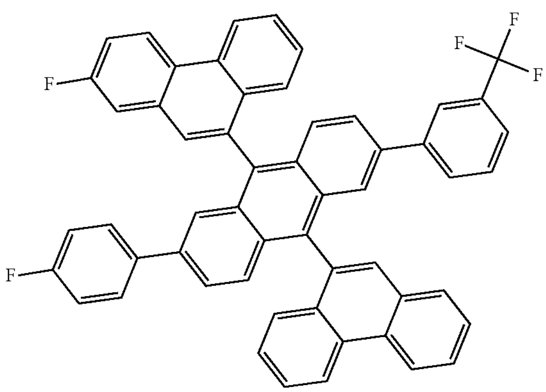
SF68
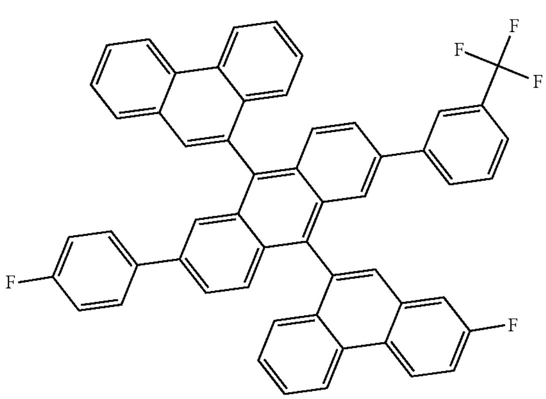
-continued
SF69
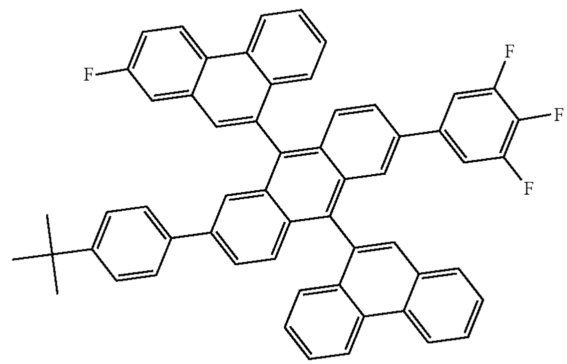
SF70
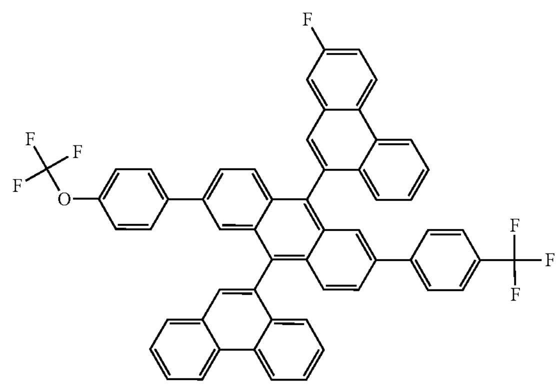
SF71
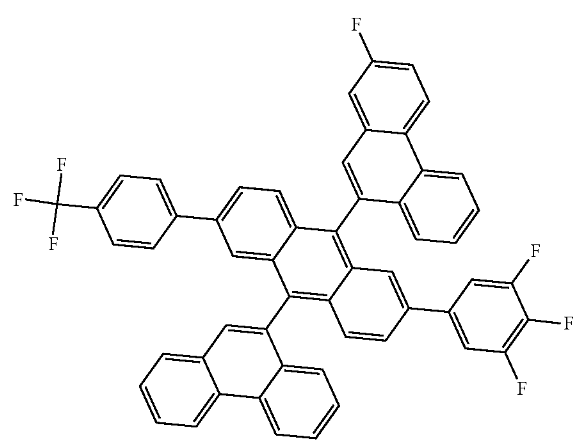
SF72
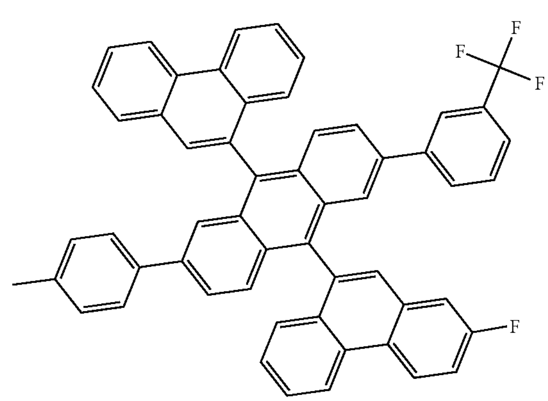

SF73
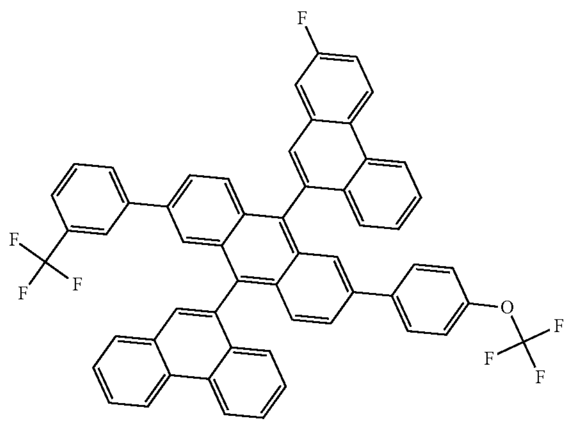
SF74
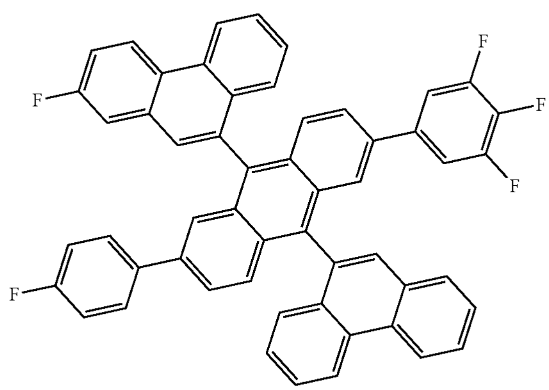
SF75
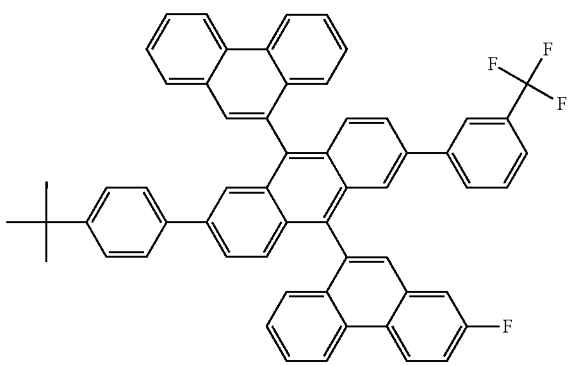
SF76
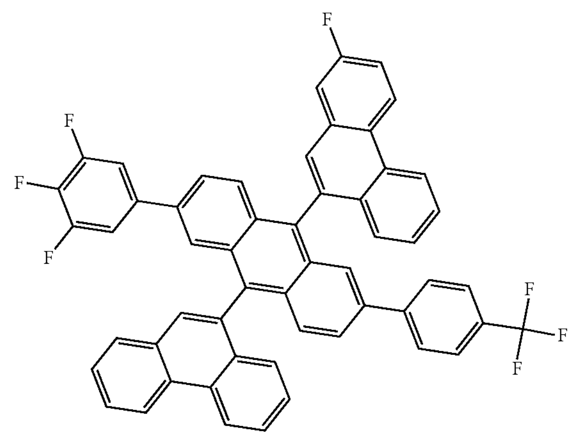
SF77
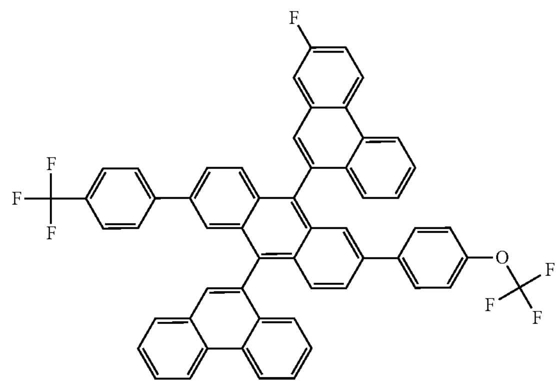
SF78
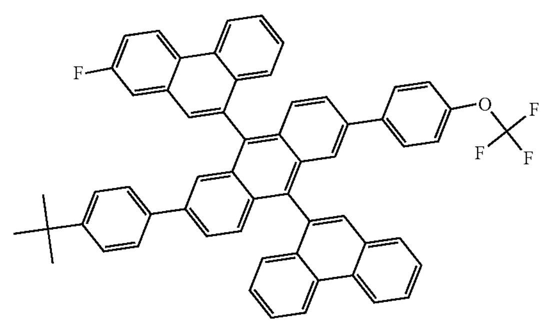
SF79
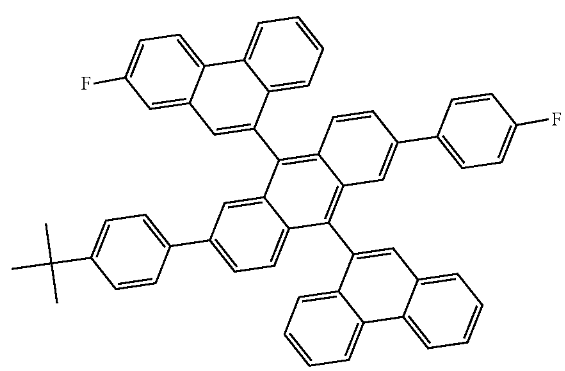

SF80
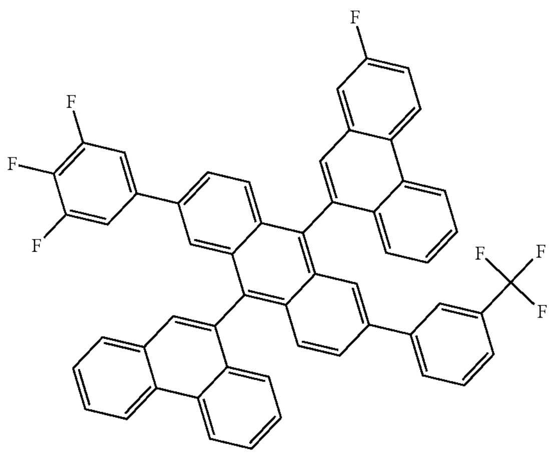
SF81
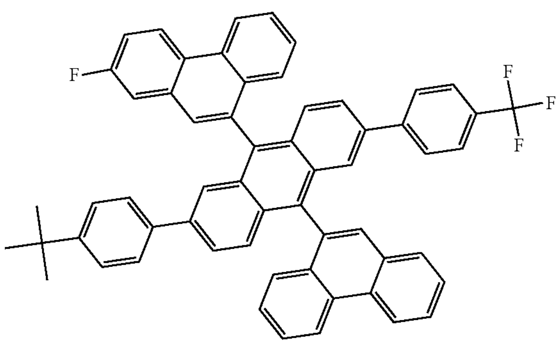
SF82
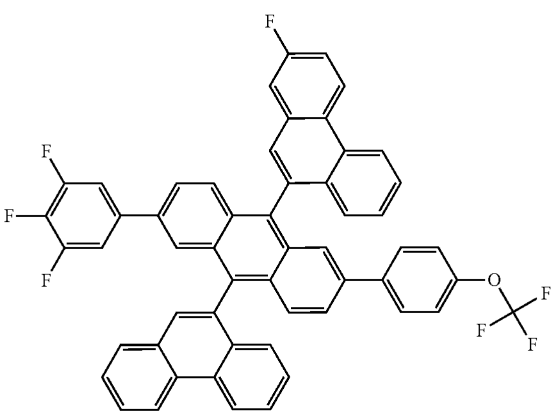
SF83
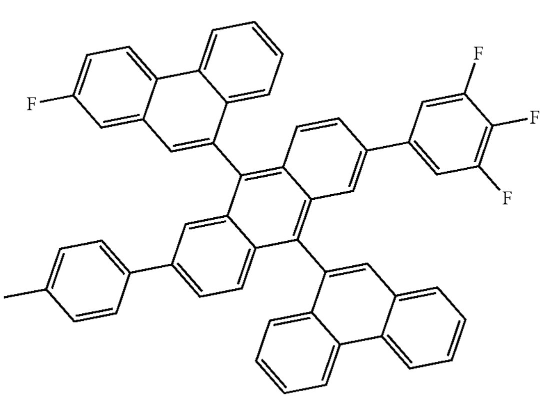
SF84
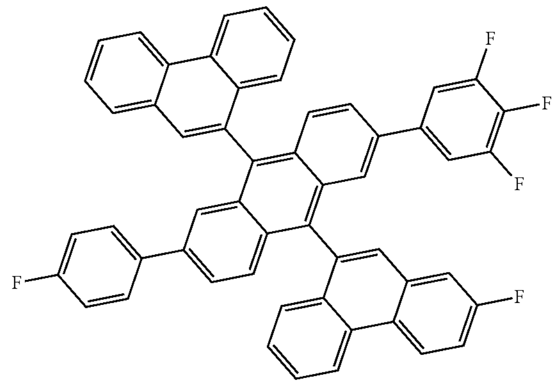
SF85
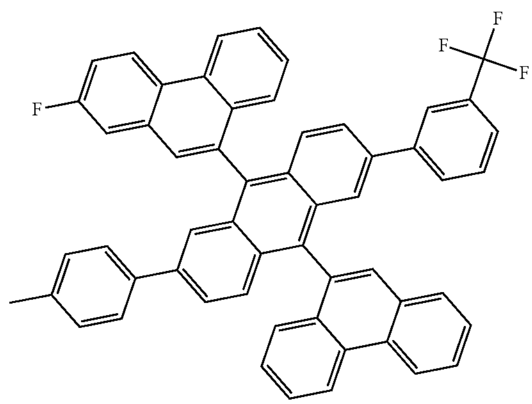
SF86
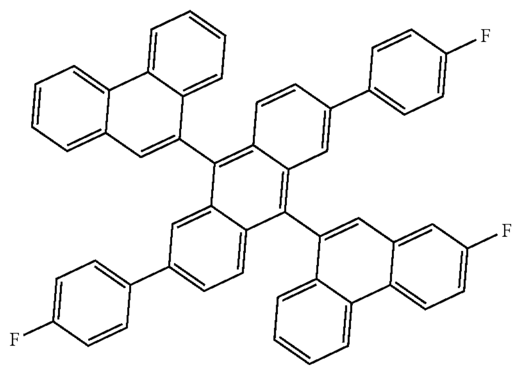
SF87
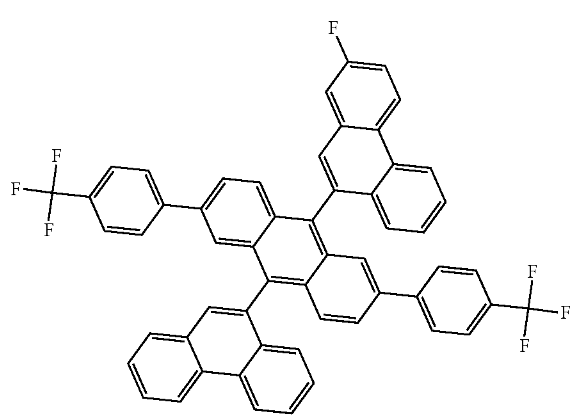

-continued
SF88
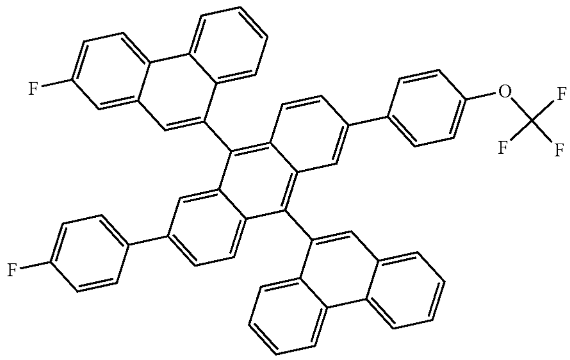
SF89
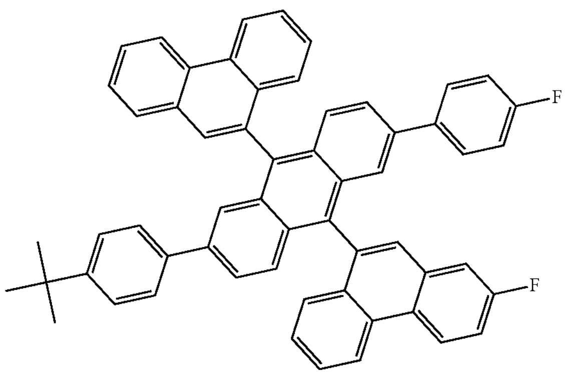
SF90
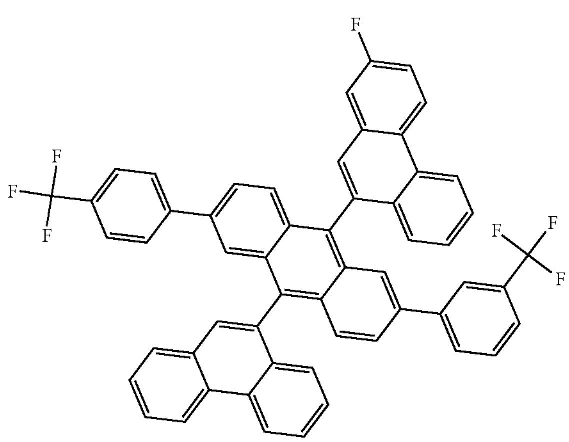
SF91
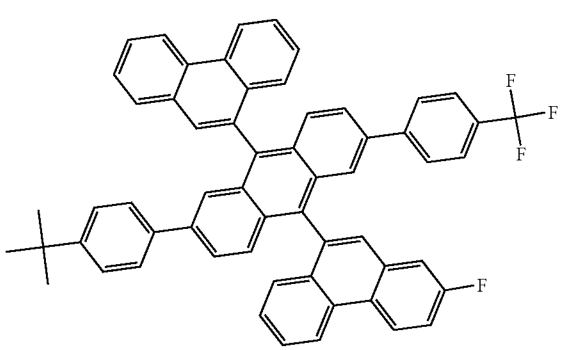
-continued
SF92
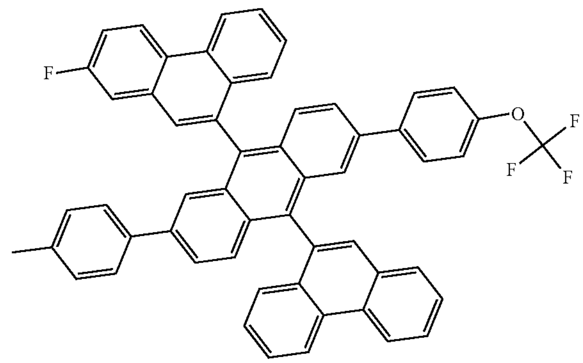
SF93
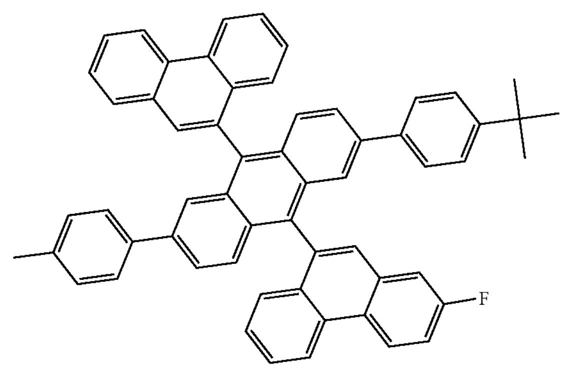
SF94
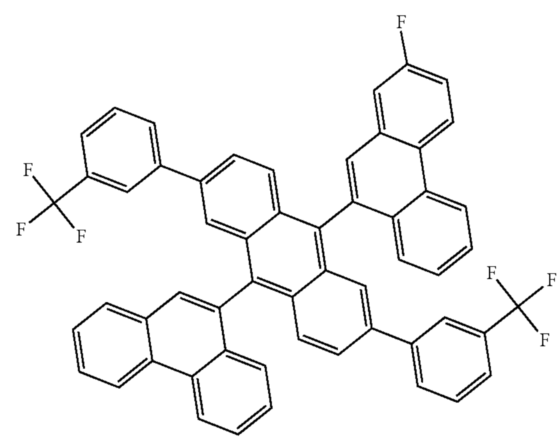
SF95
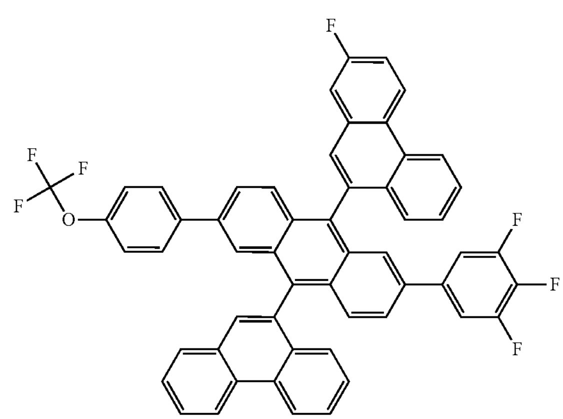

SF96
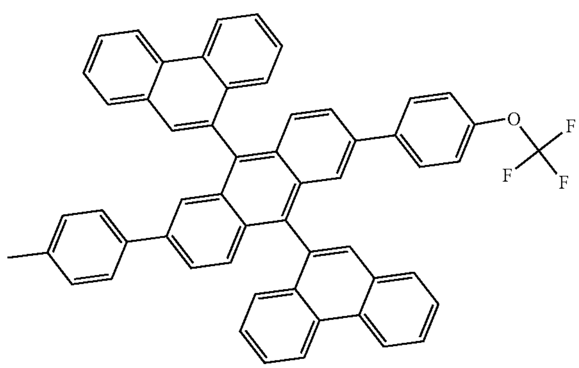
SF97
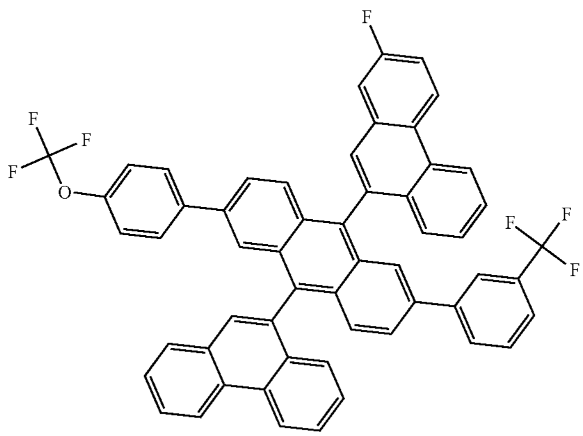
SF98
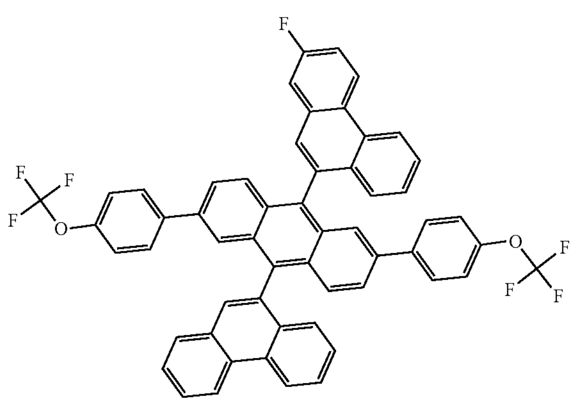
SF99
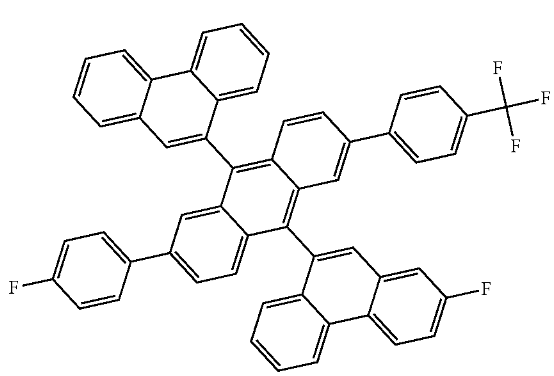
SF100
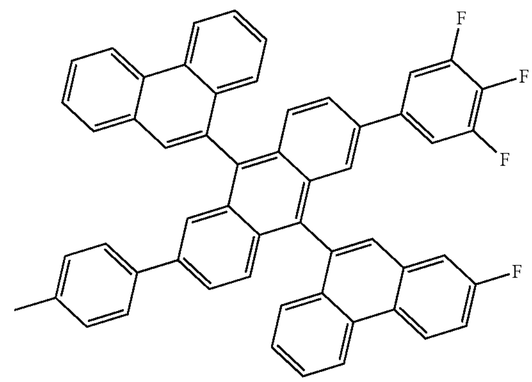
SF101
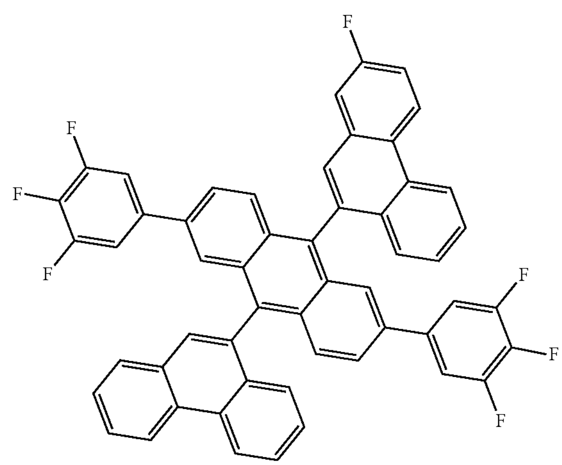
SF102
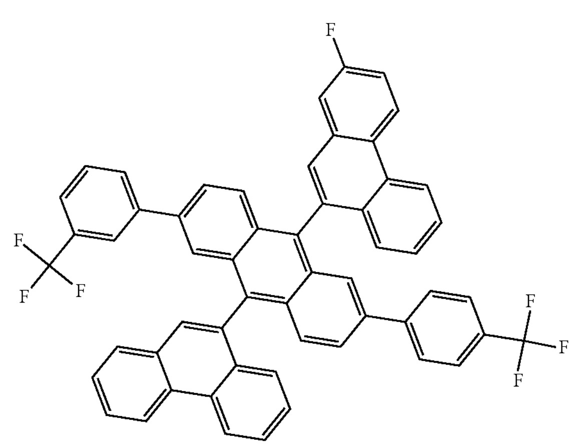

-continued
SF103
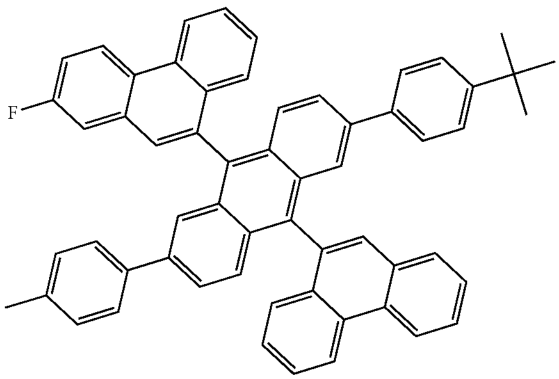
SF104
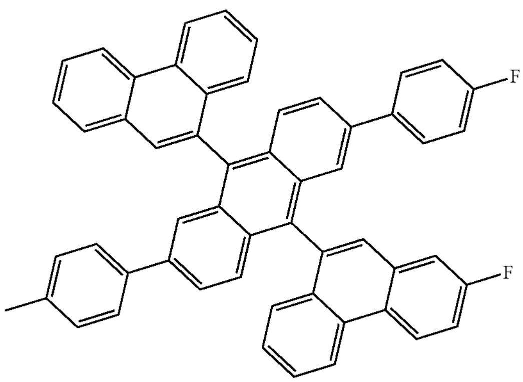
SF105
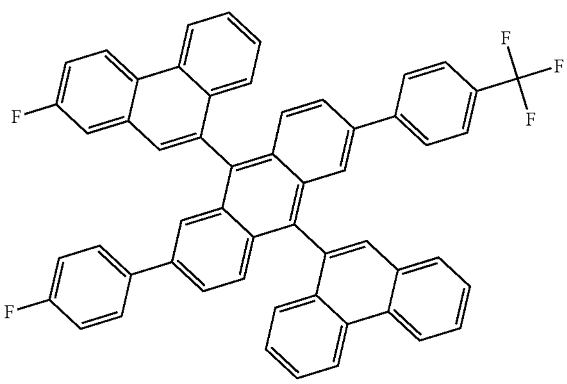
SF106
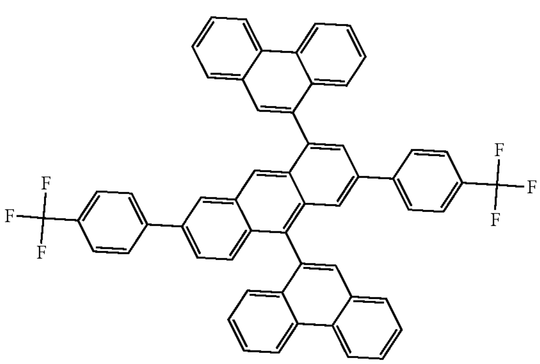
-continued
SF107
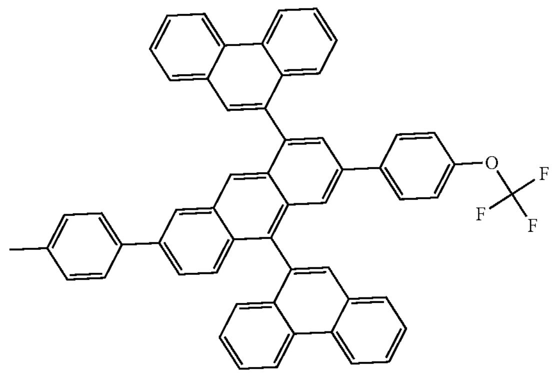
SF108
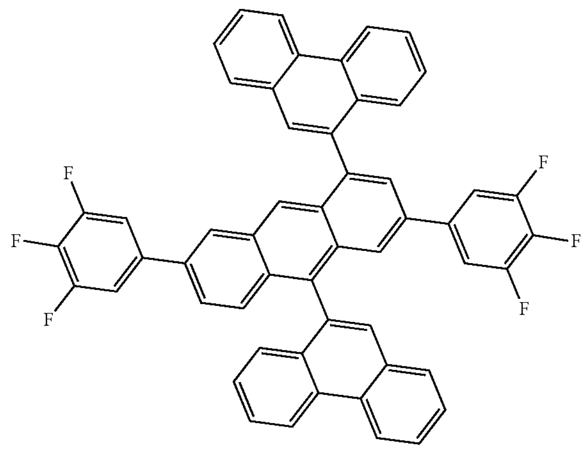
SF109
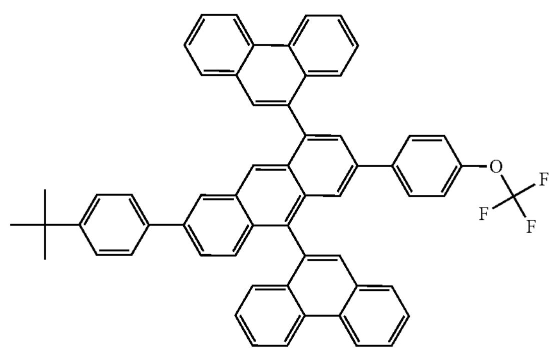
SF110
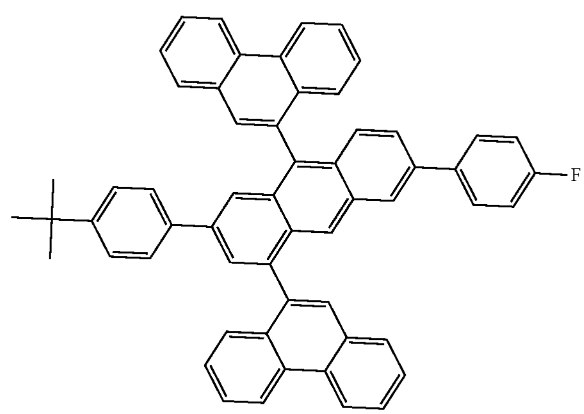

-continued
SF111
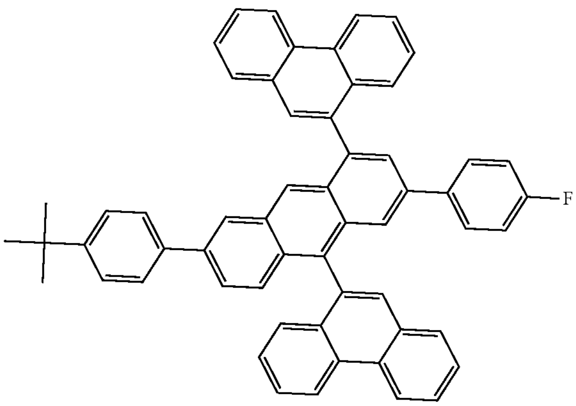
SF112
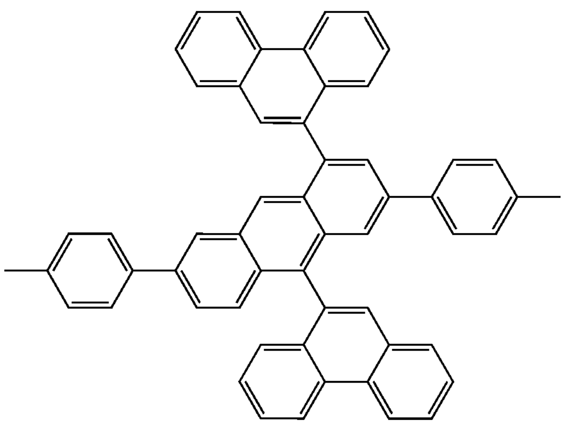
SF113
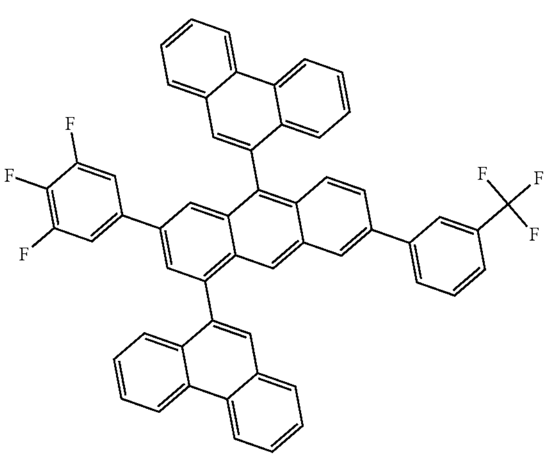
-continued
SF114
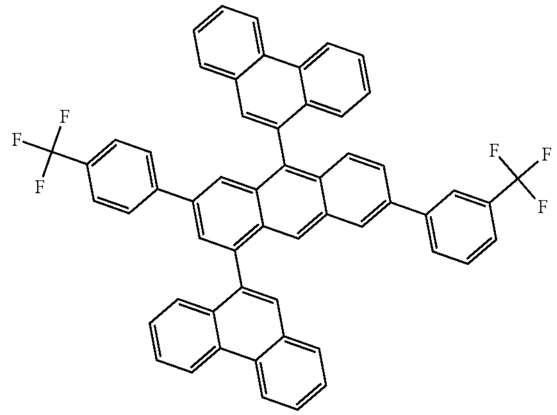
SF115
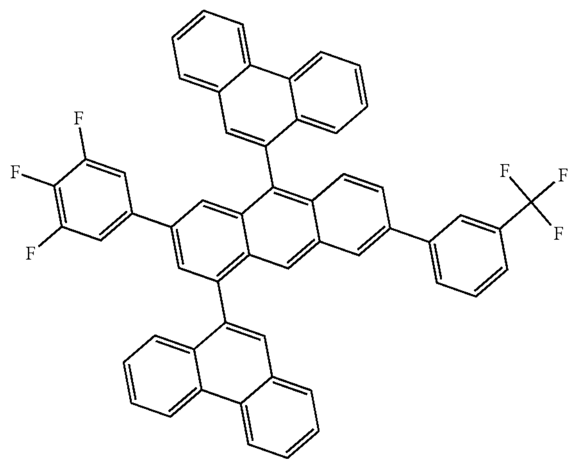
SF116
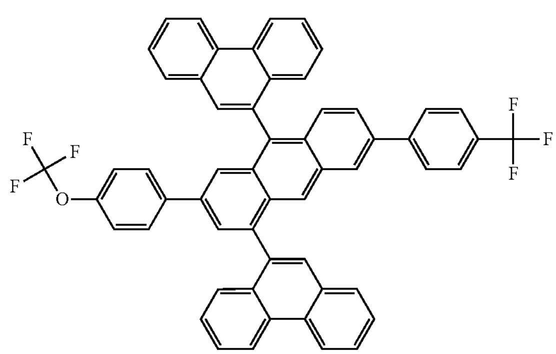

-continued
SF117
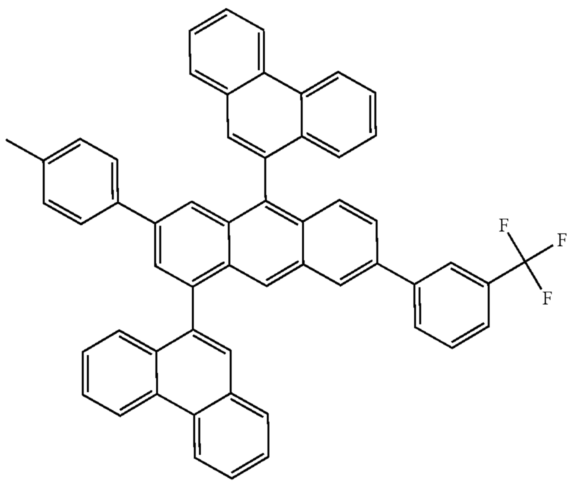
SF118
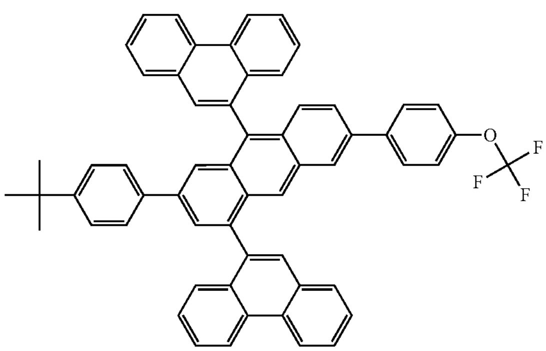
SF119
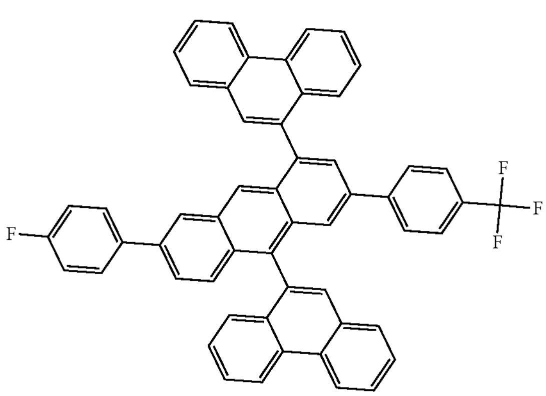
-continued
SF120
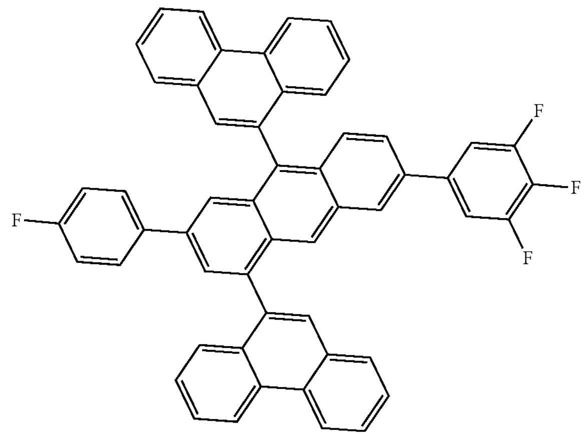
SF121
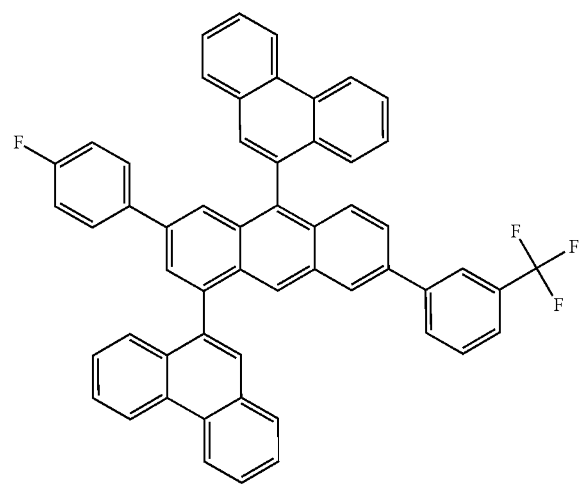
SF122
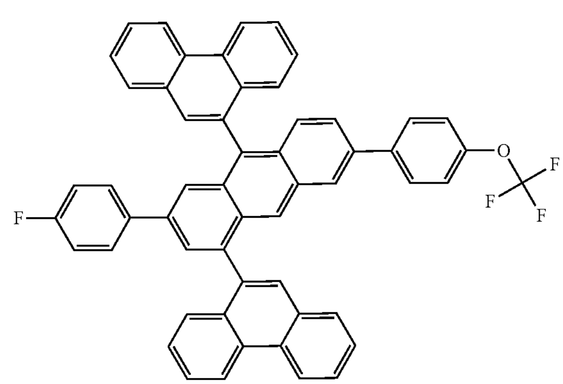

-continued
SF123
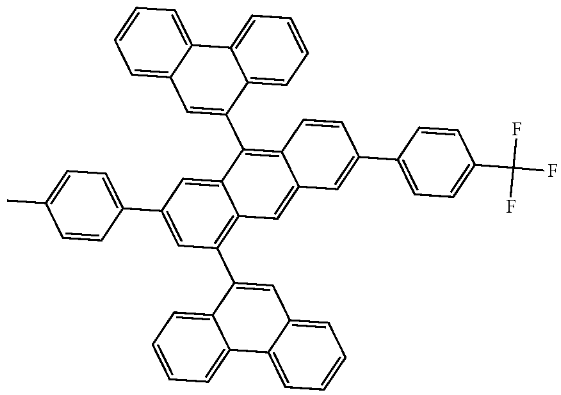
SF124
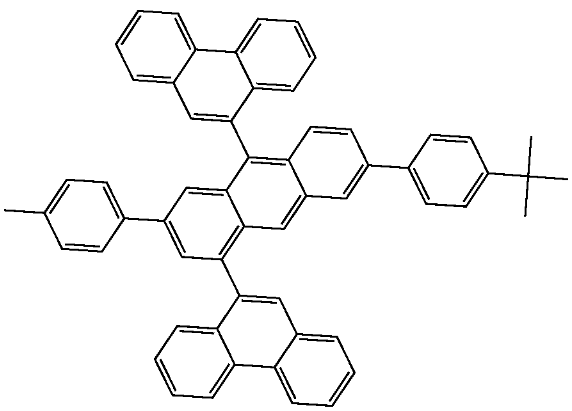
SF125
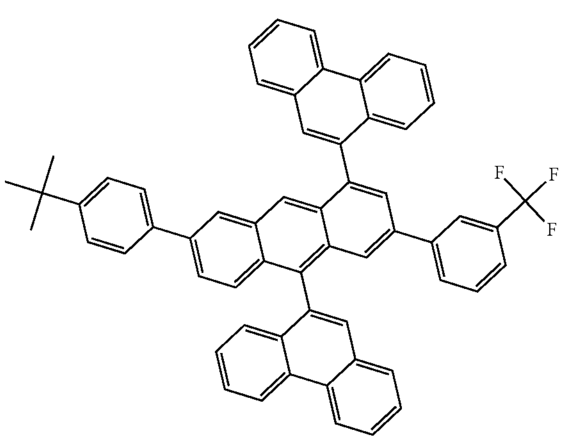
-continued
SF126
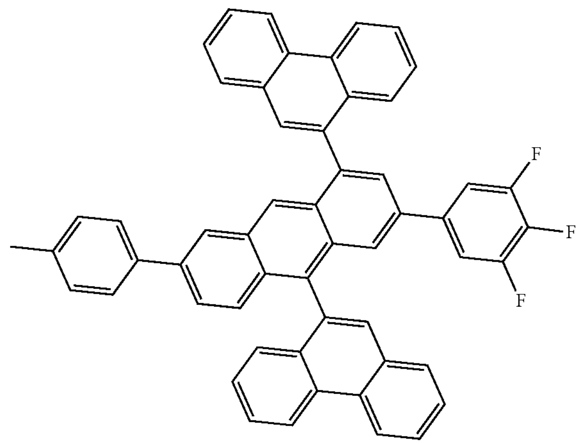
SF127
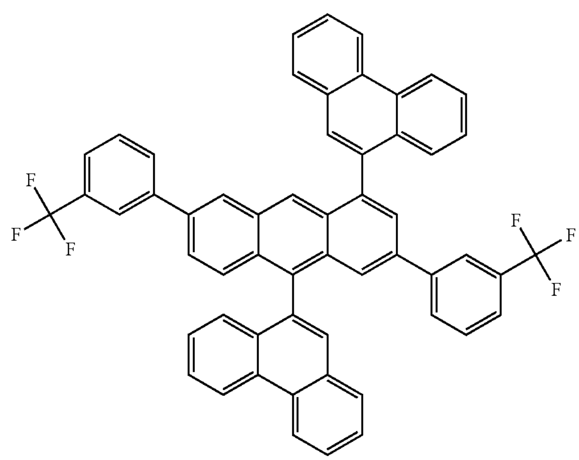
SF128
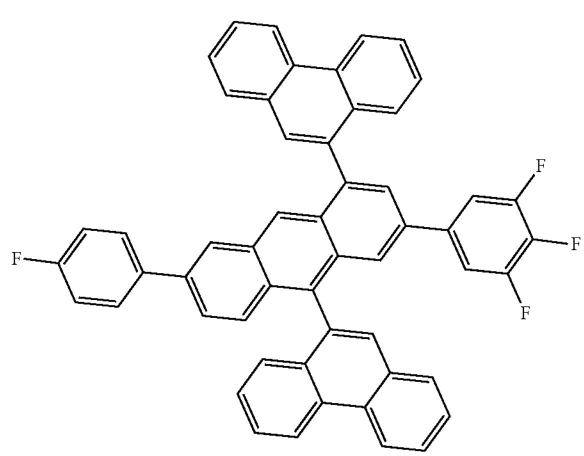

-continued
SF129
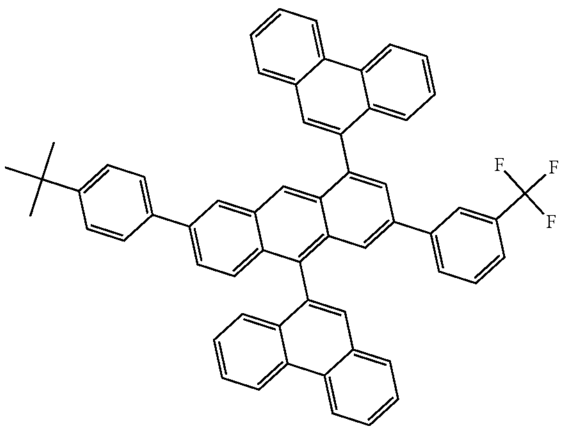
SF130
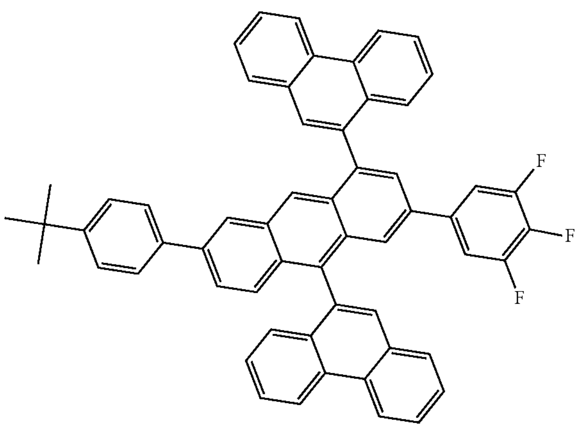
SF131
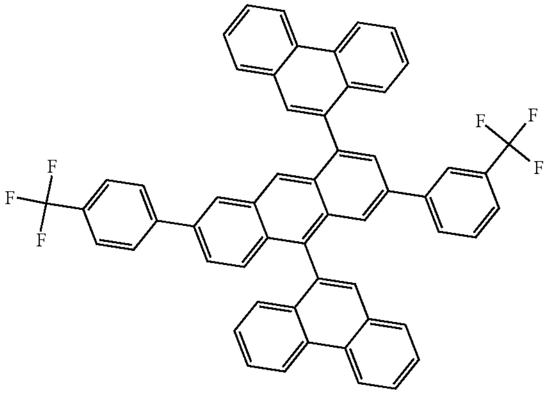
-continued
SF132
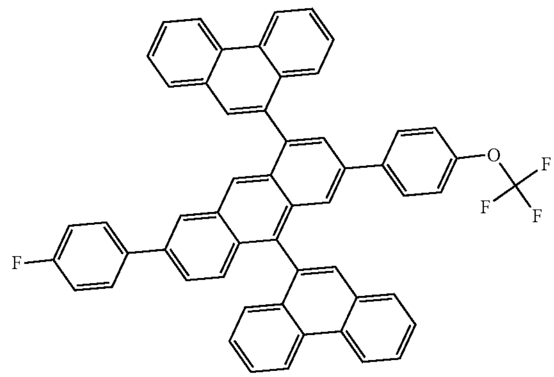
SF133
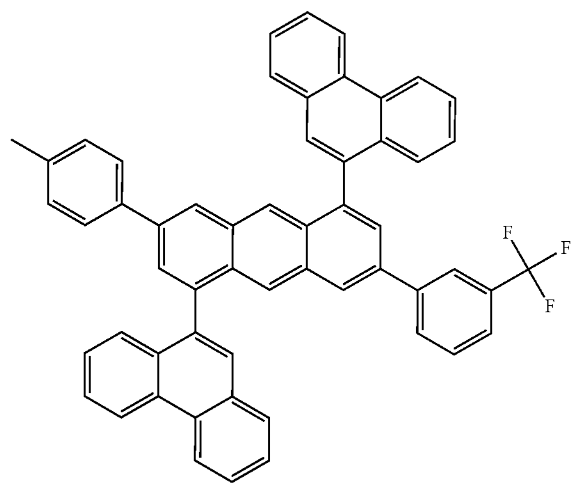
SF134
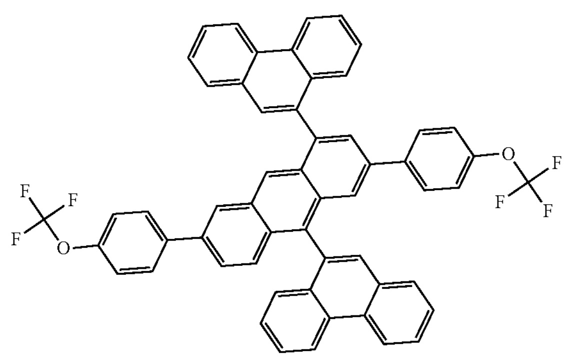

-continued
SF135
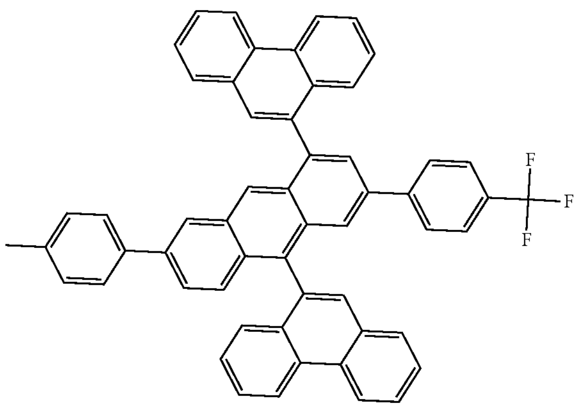
SF136
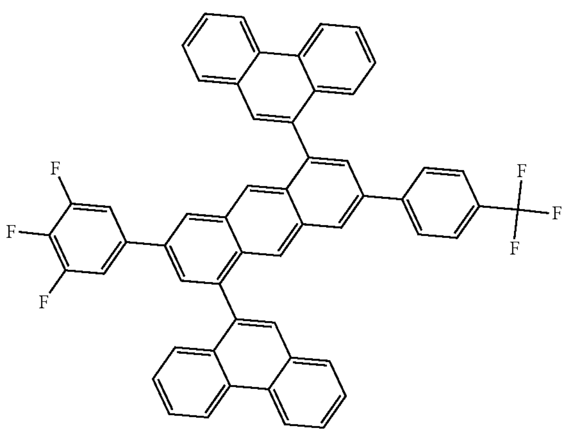
SF137
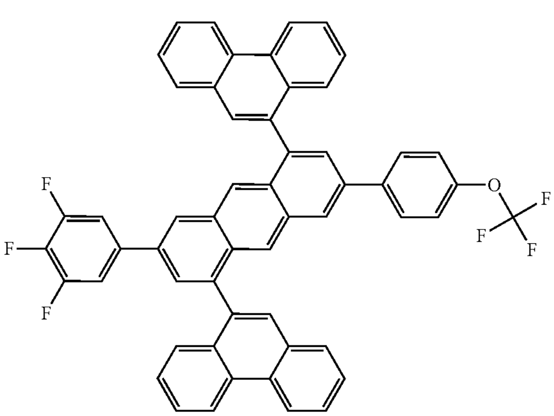
-continued
SF138
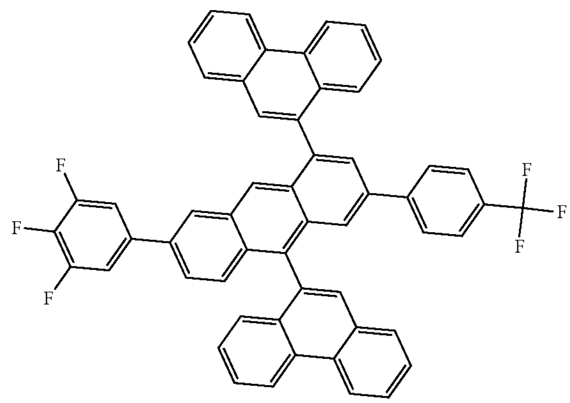
SF139
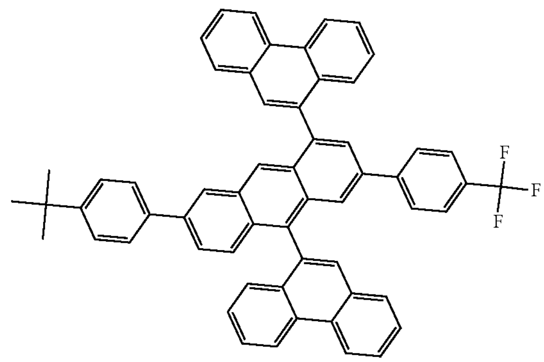
SF140
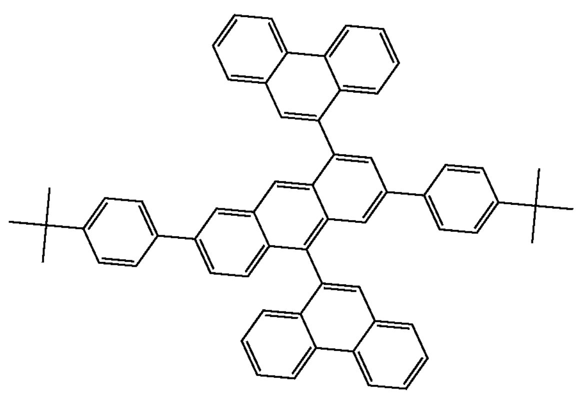
SF141
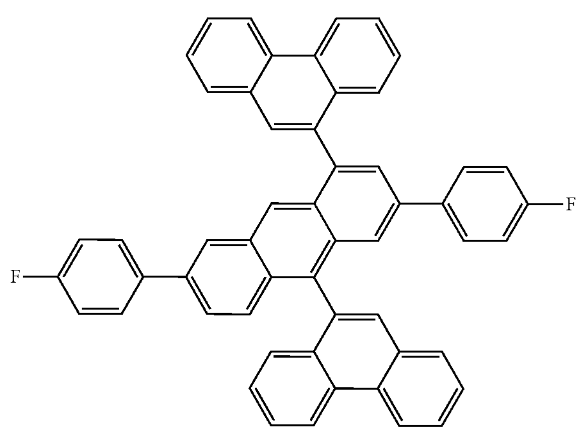

SF142
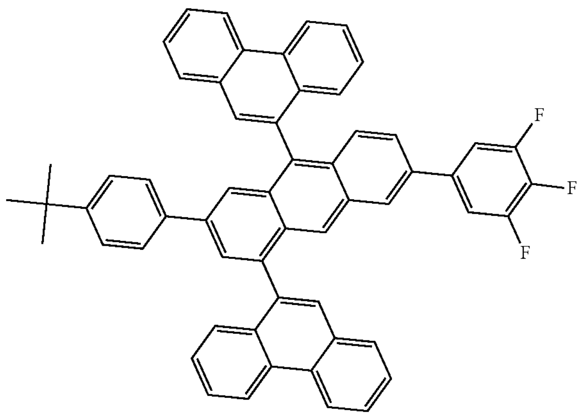
SF143
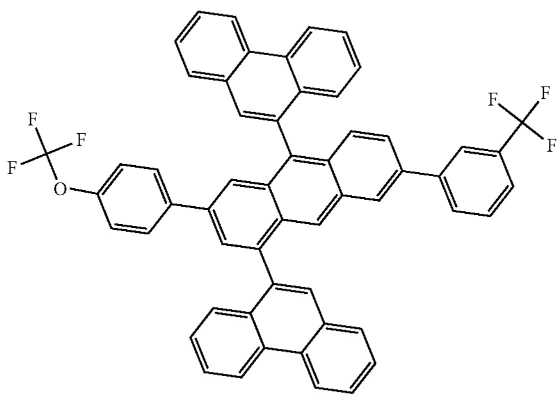
SF144
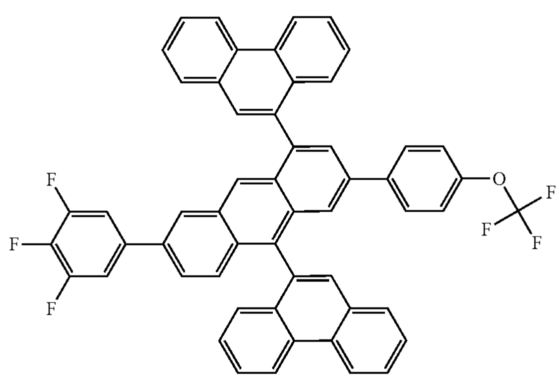
SF145
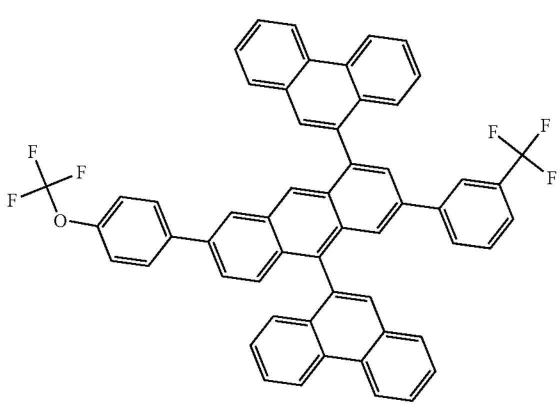
SF146
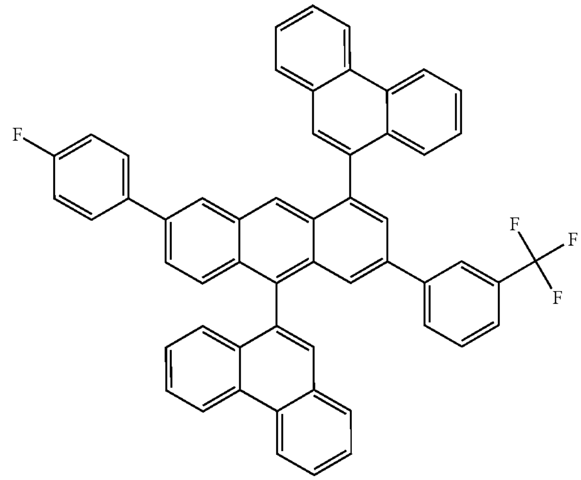
SF147
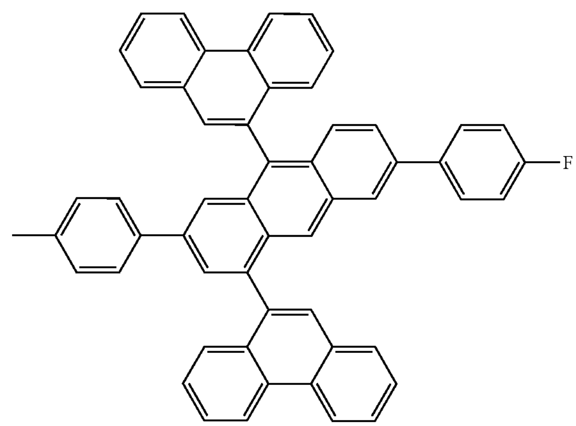
SF148
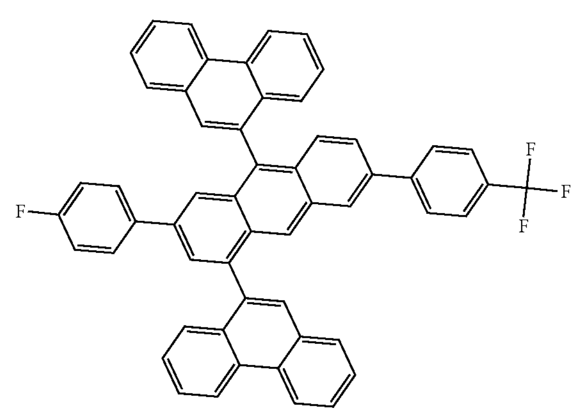

-continued
SF149
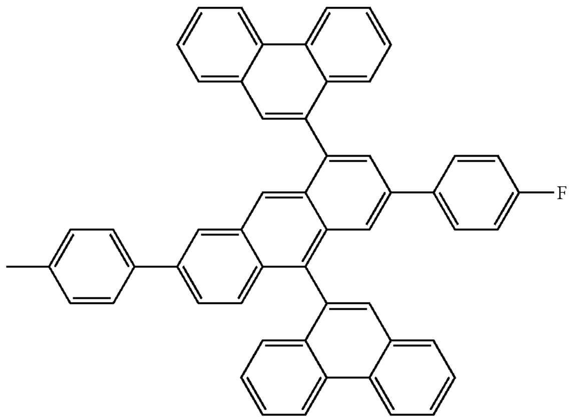
SF150
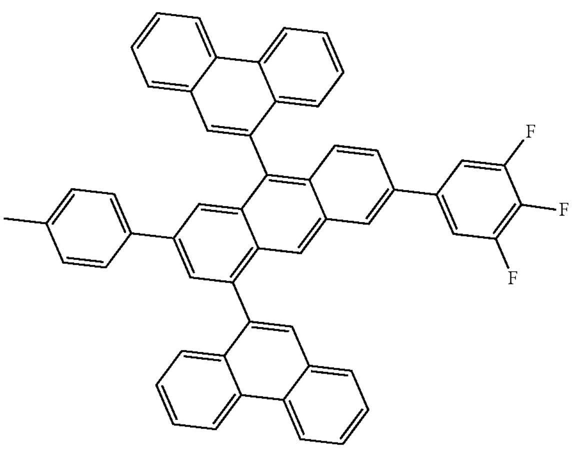
SF151
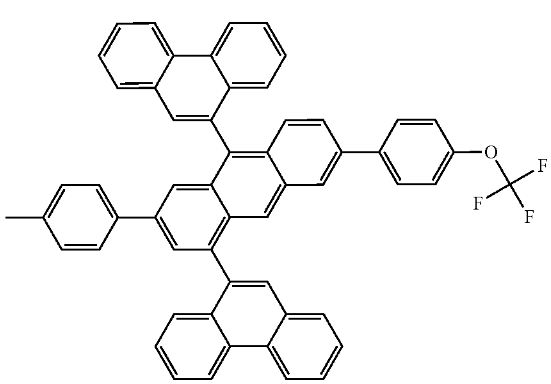
-continued
SF152
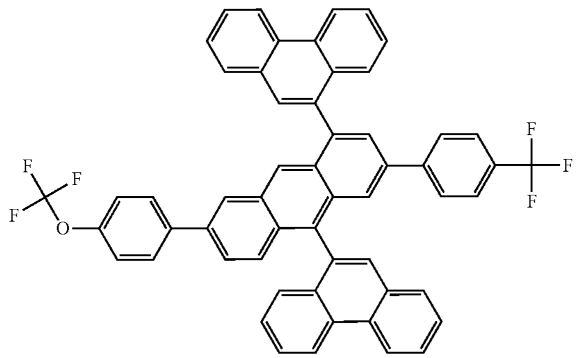
SF153
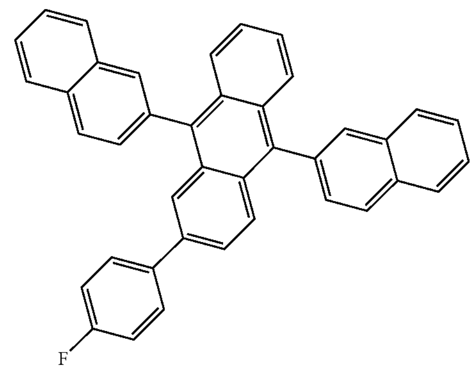
SF154
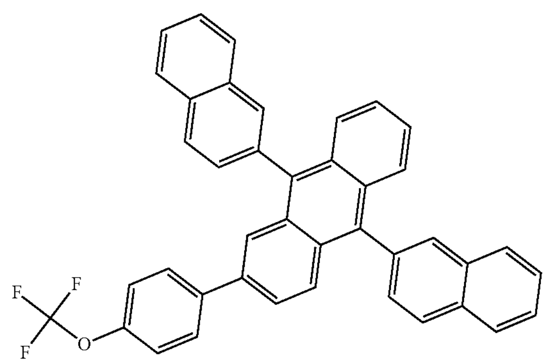
SF155
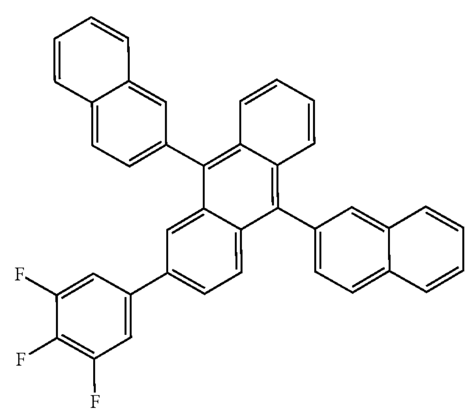

-continued
SF156
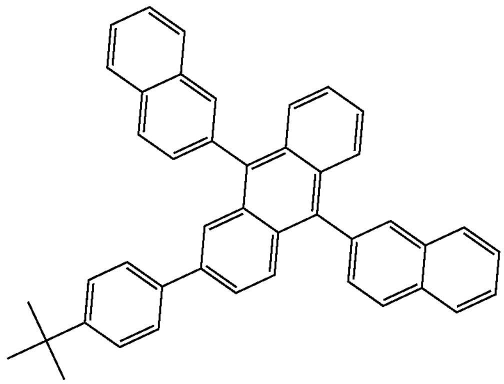
SF157
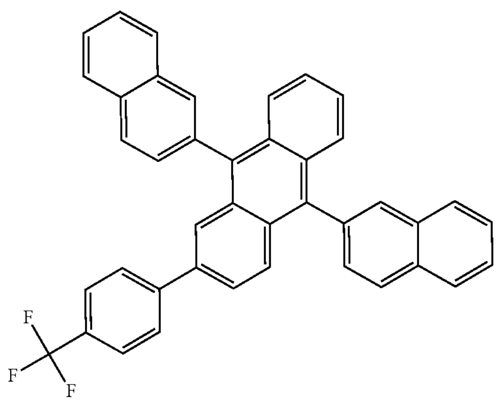
SF158
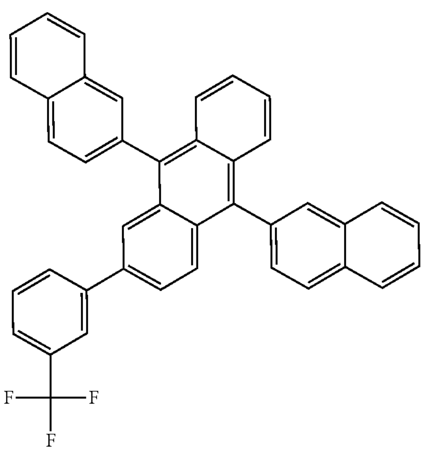
SF159
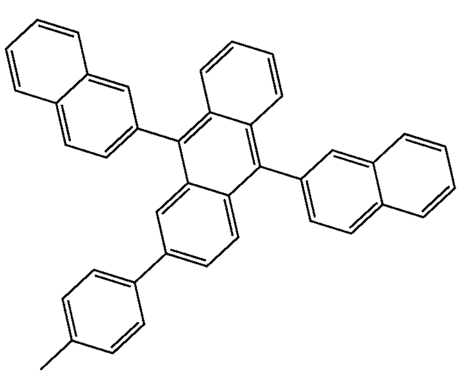
-continued
SF160
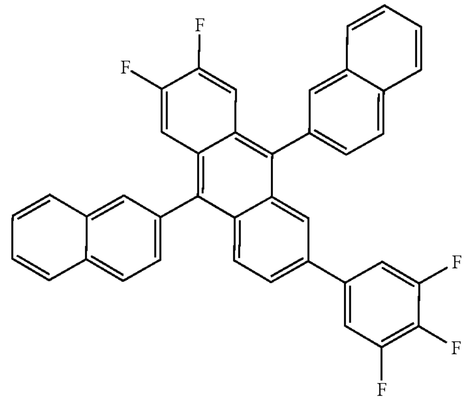
SF161
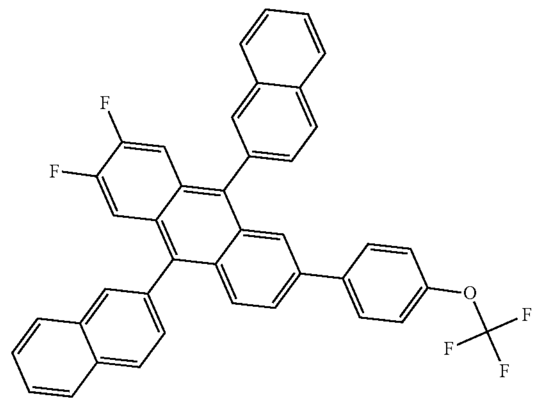
SF162
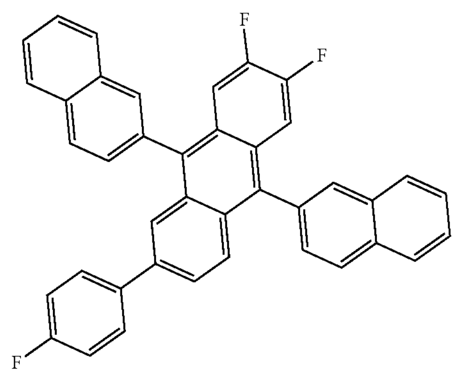
SF163
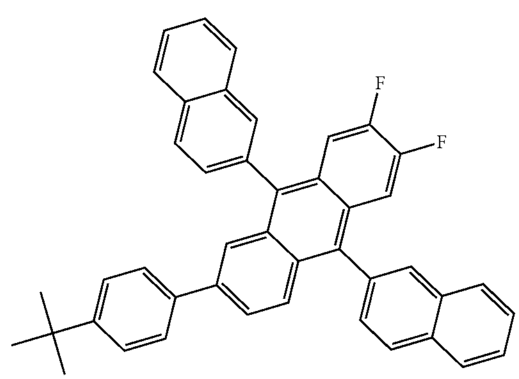

-continued
SF164
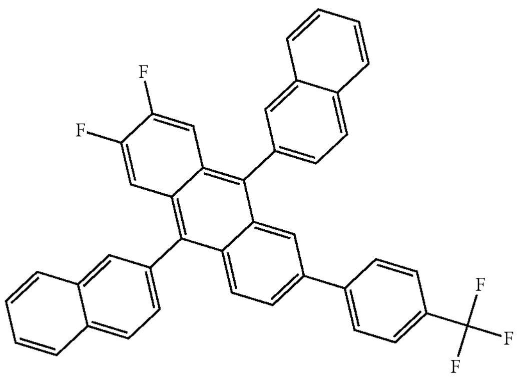
SF165
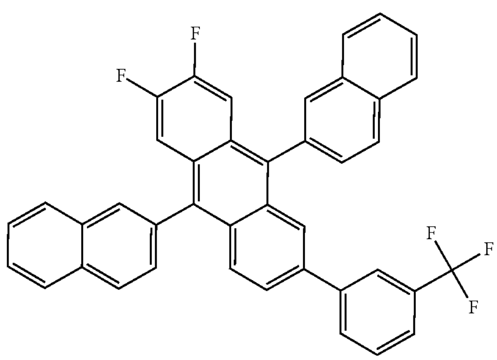
SF166
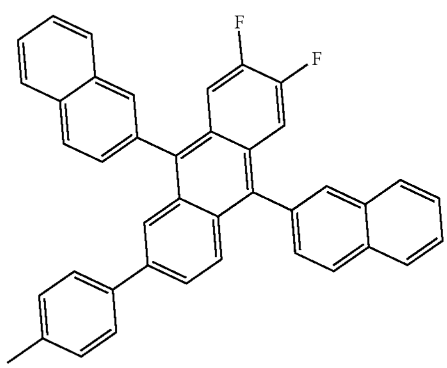
SF167
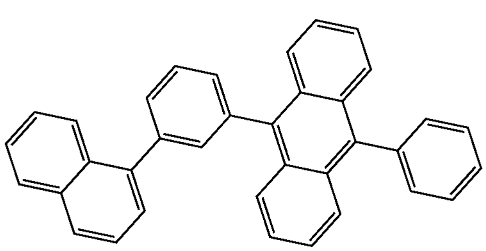
-continued
SF168
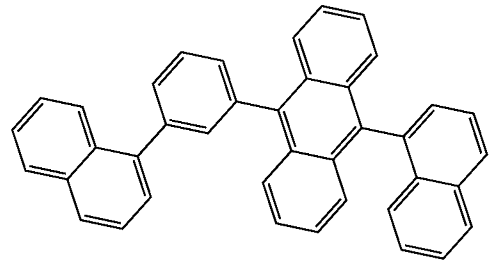
SF169
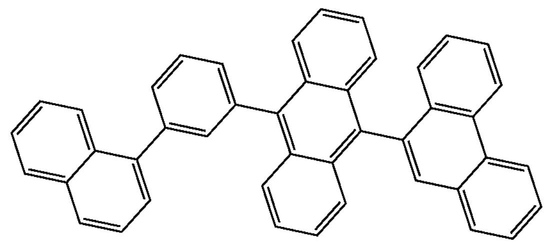
SF170
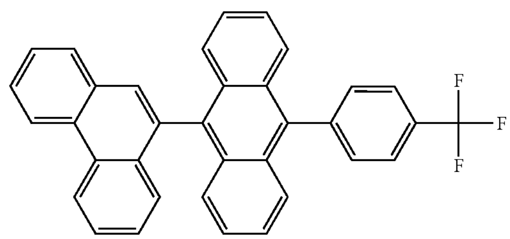
SF171
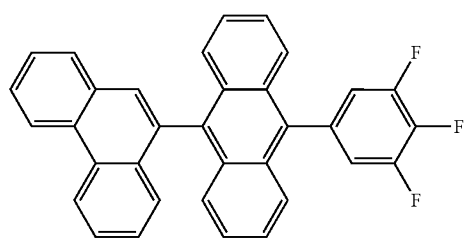
SF172
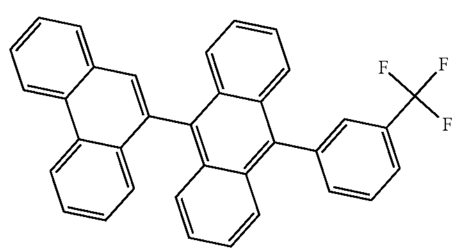
SF173
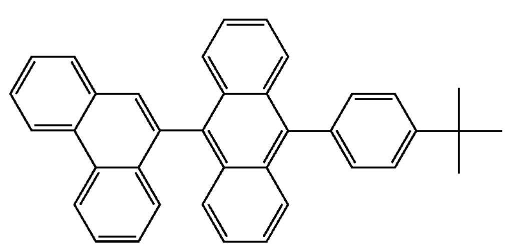

-continued
SF174
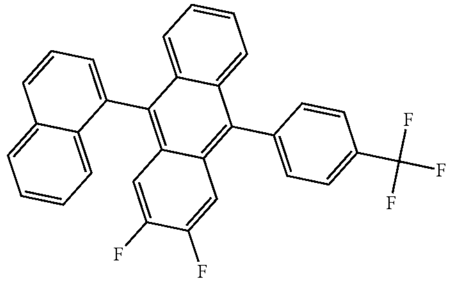
SF175
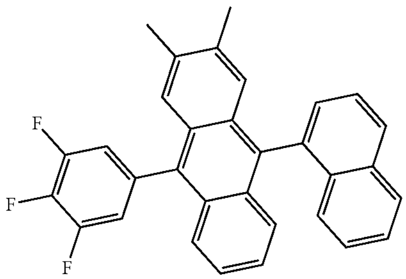
SF176
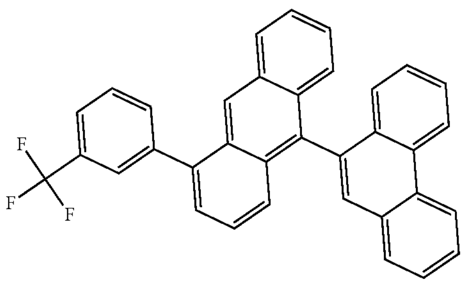
SF177
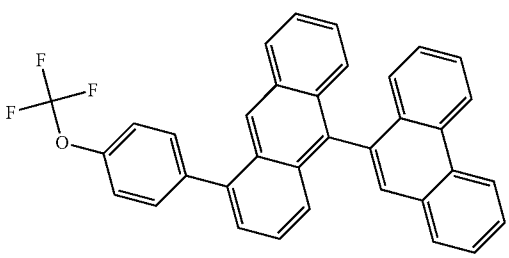
SF178
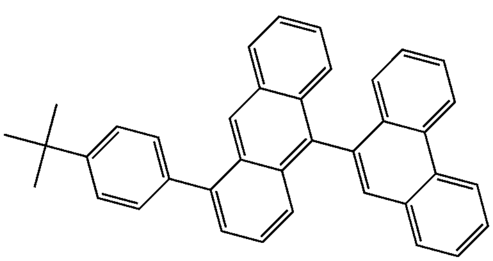
-continued
SF179
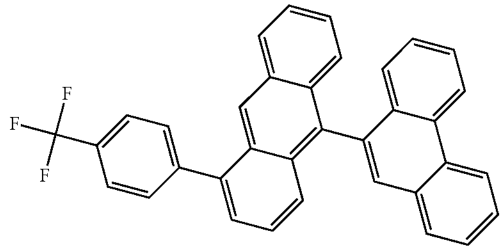
SF180
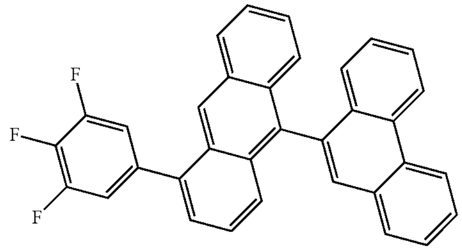
SF181
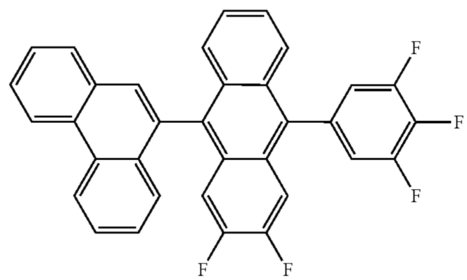
SF182
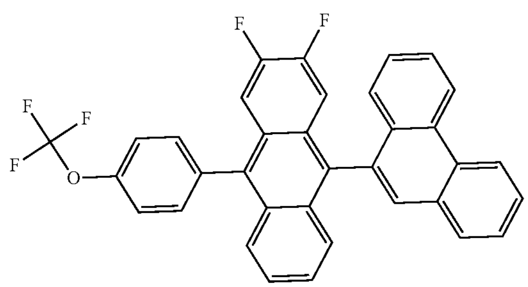
SF183
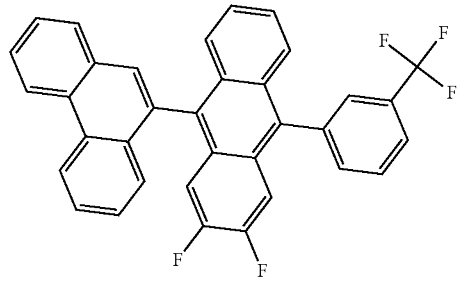

-continued
SF184
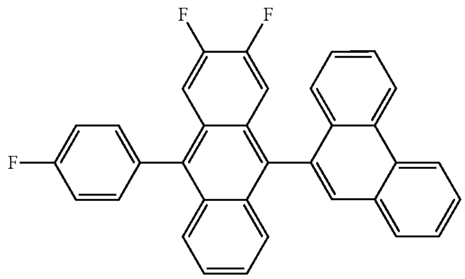
SF185
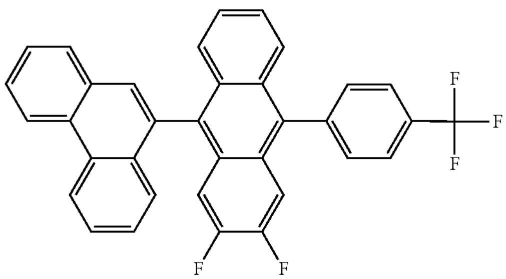
SF186
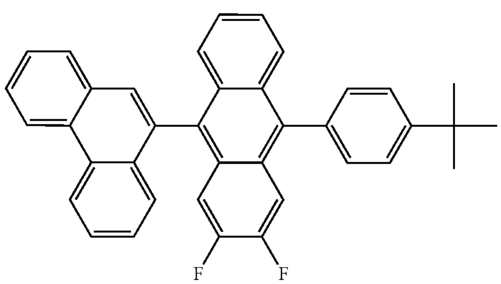
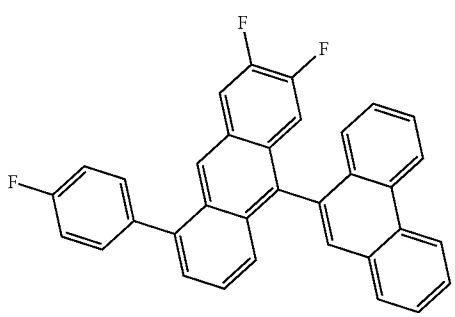
SF188
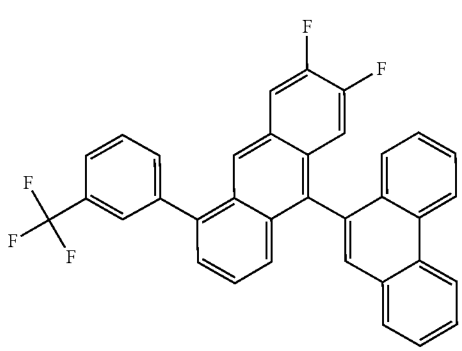
-continued
SF189
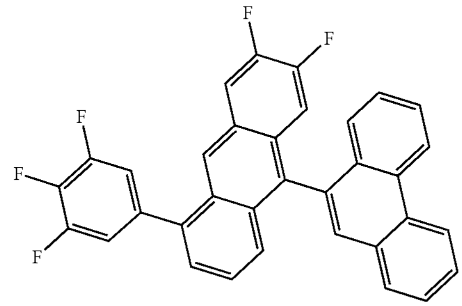
SF190
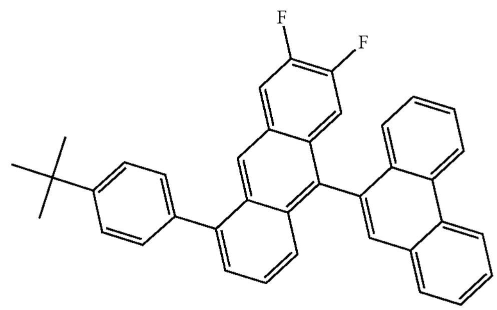
SF191
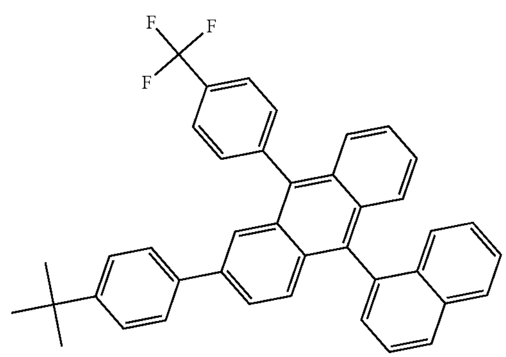
SF192
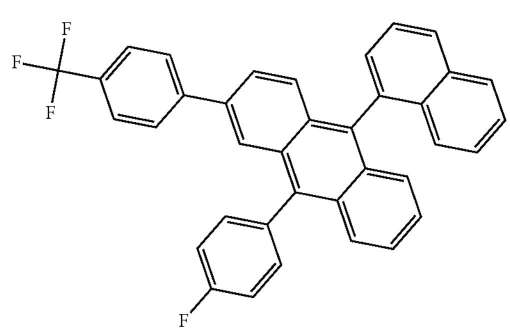

-continued
SF193
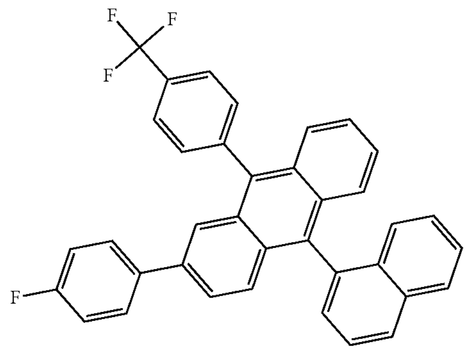
SF194
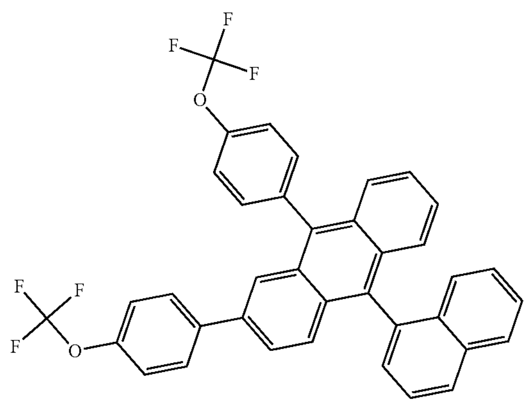
SF195
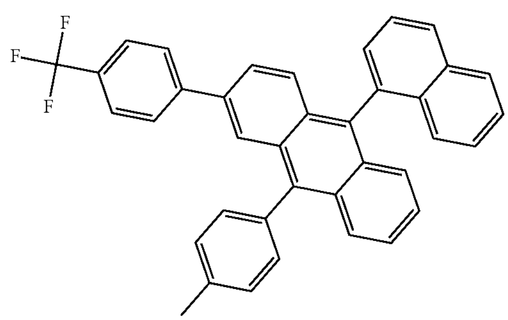
SF196
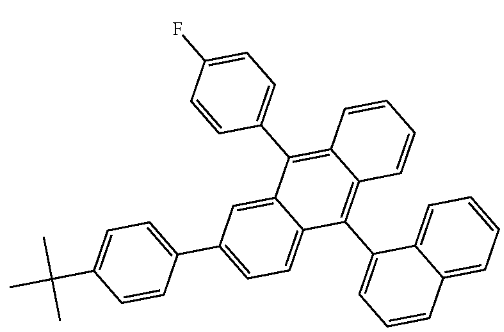
-continued
SF197
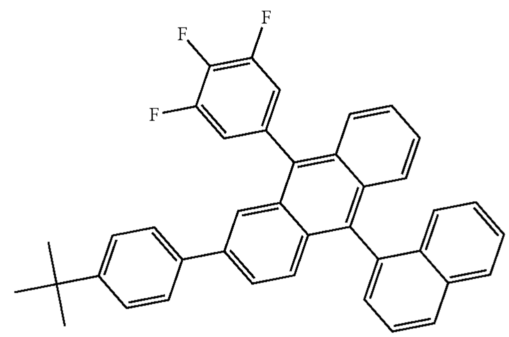
SF198
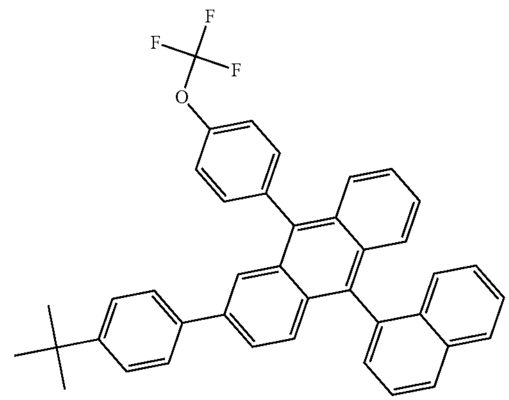
SF199
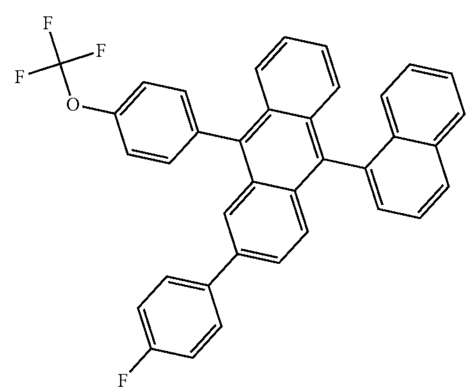
SF200
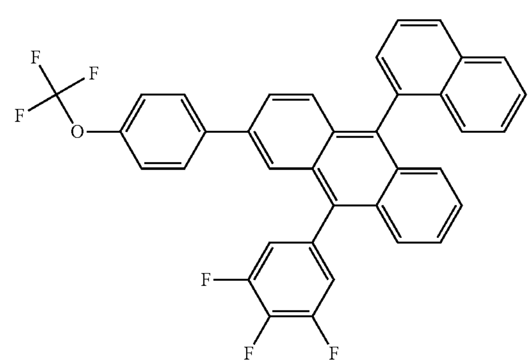

-continued
SF201
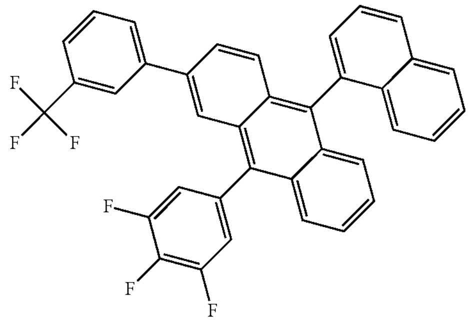
SF202
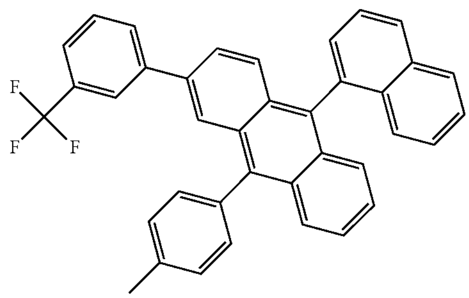
SF203
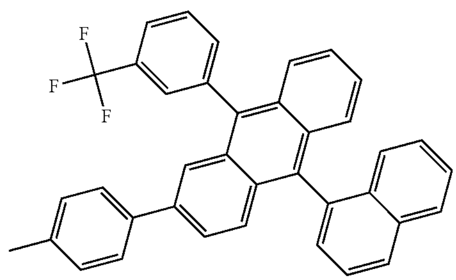
SF204
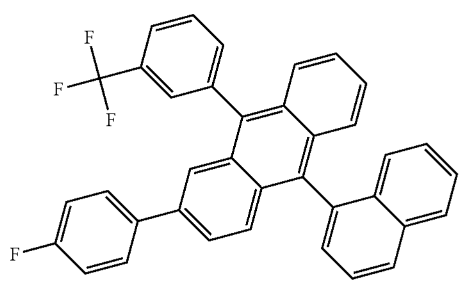
SF205
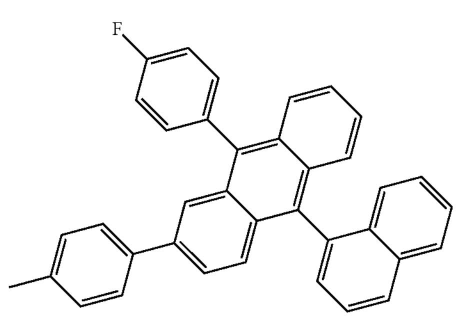
SF206
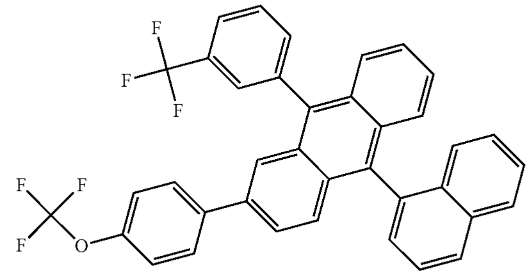
SF207
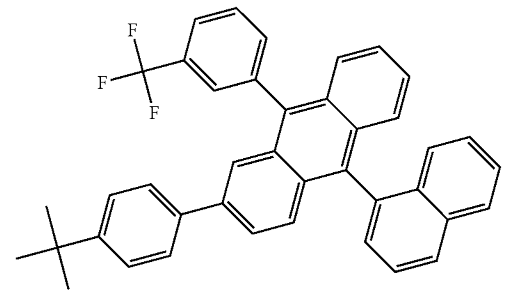
SF208
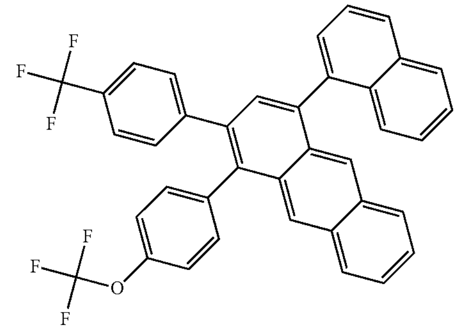
SF209
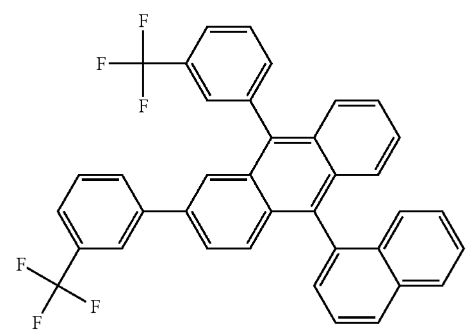
SF210
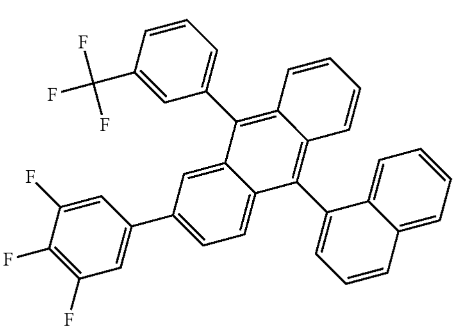

-continued
SF211
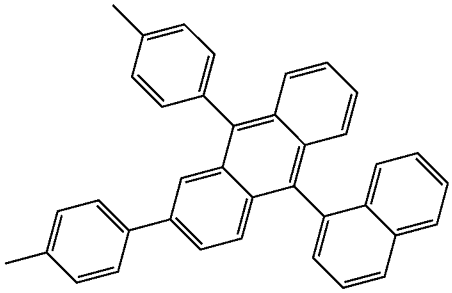
SF212
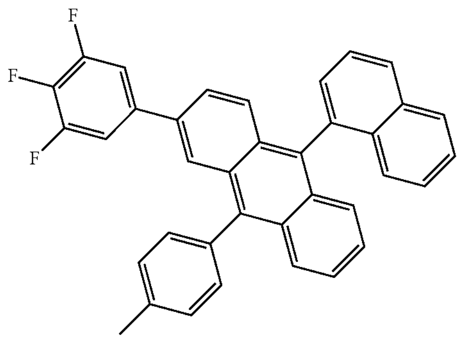
SF213
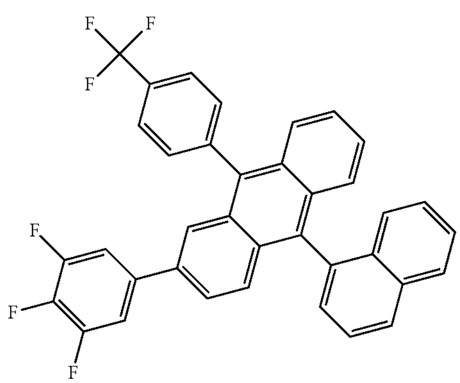
SF214
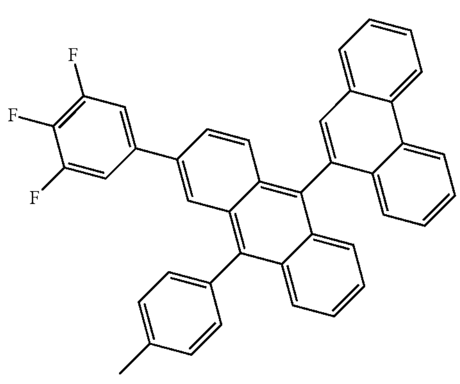
-continued
SF215
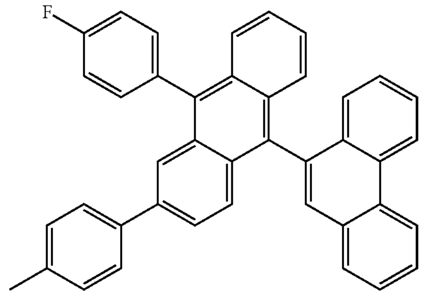
SF216
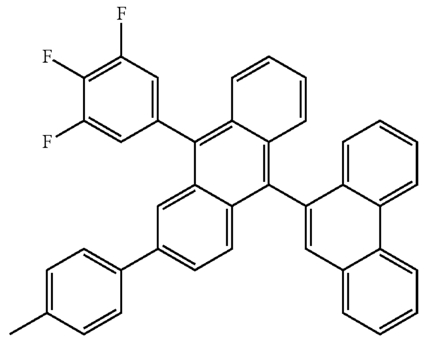
SF217
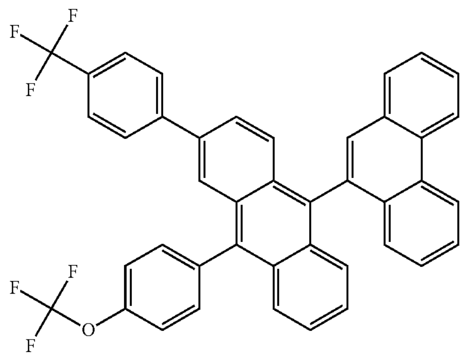
SF218
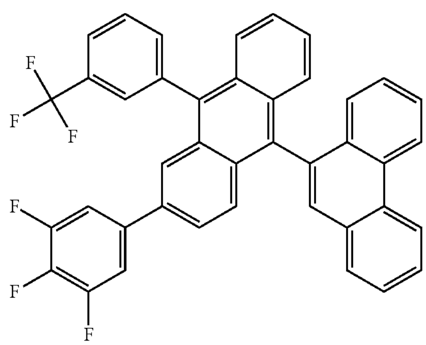
SF219
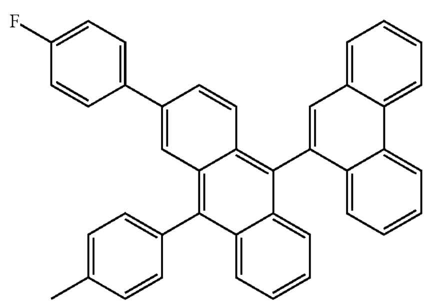

-continued
SF220
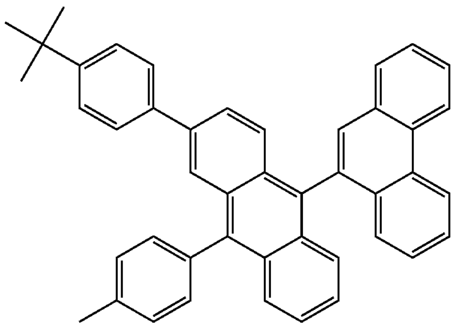
SF221
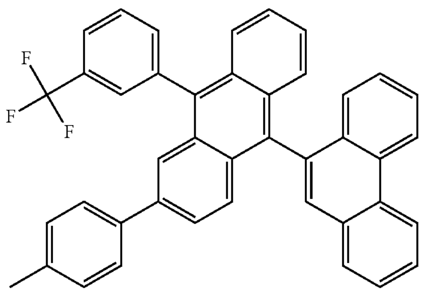
SF222
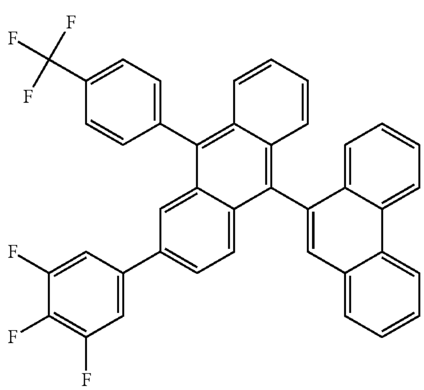
SF223
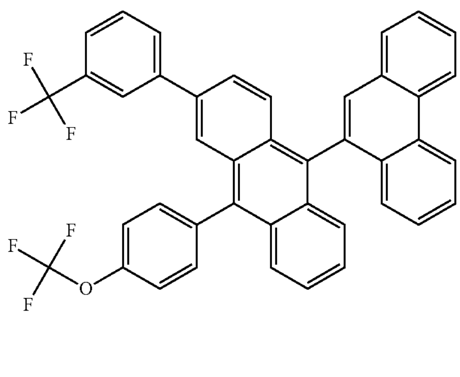
-continued
SF224
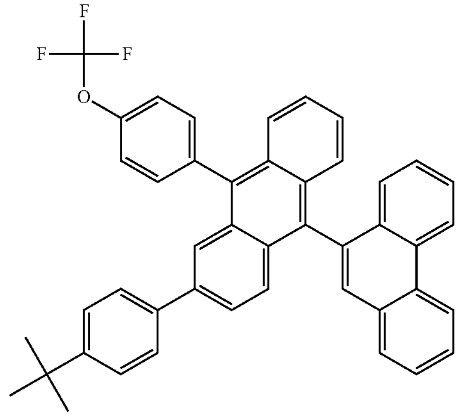
SF225
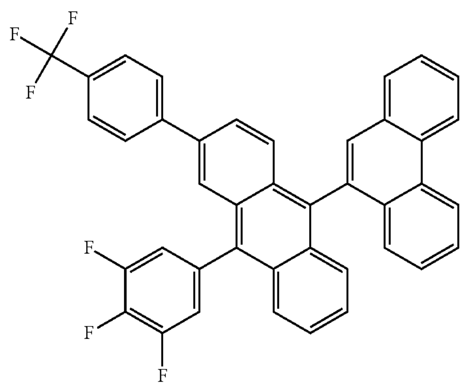
SF226
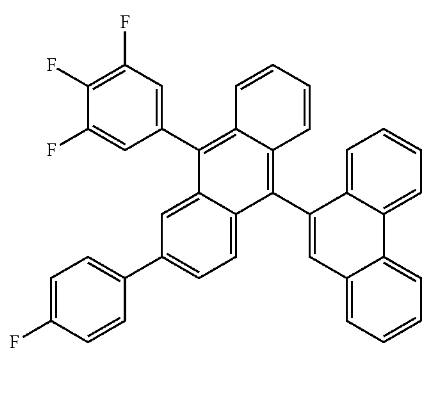
SF227
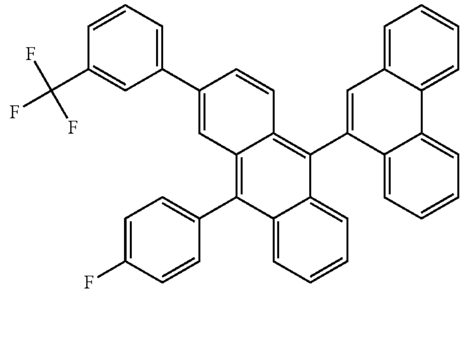

-continued
SF228
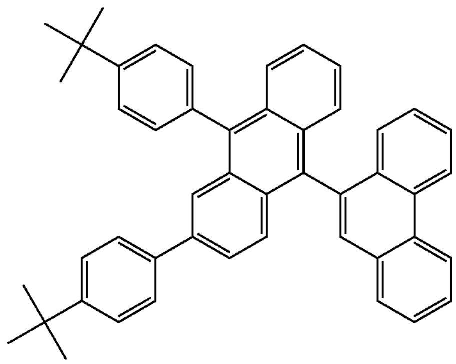
SF229
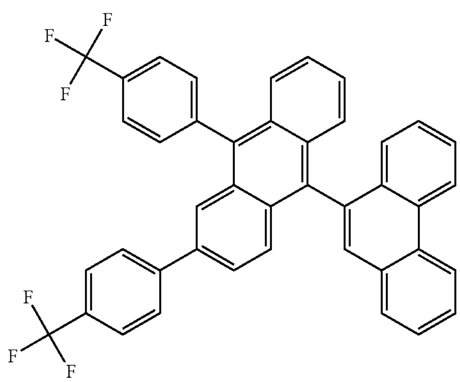
SF230
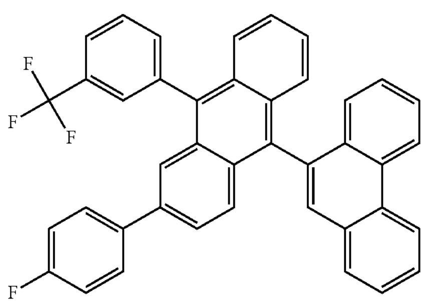
SF231
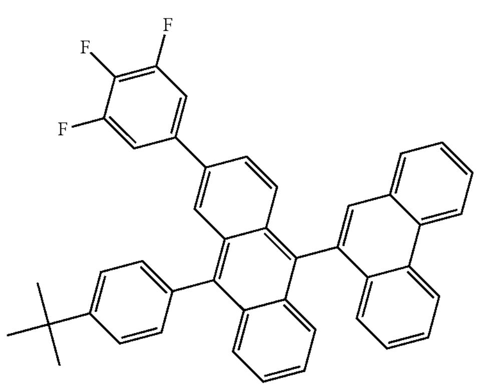
-continued
SF232
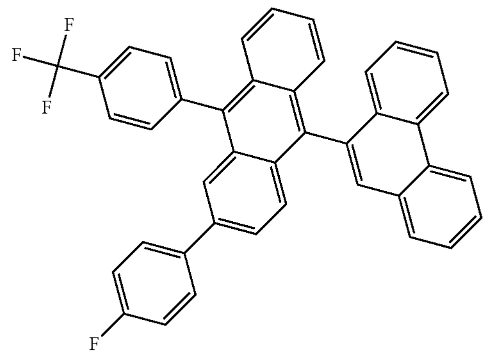
SF233
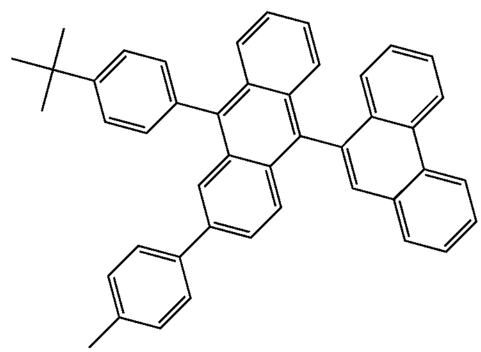
SF234
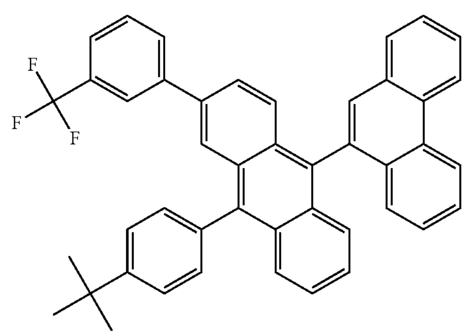
SF235
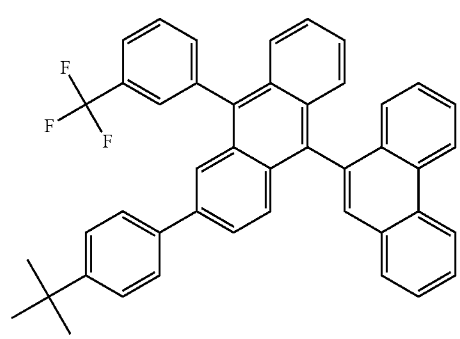

-continued
SF236
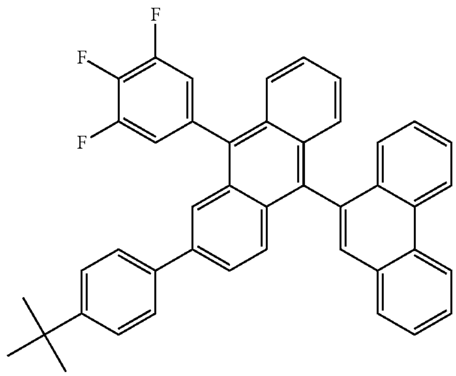
SF237
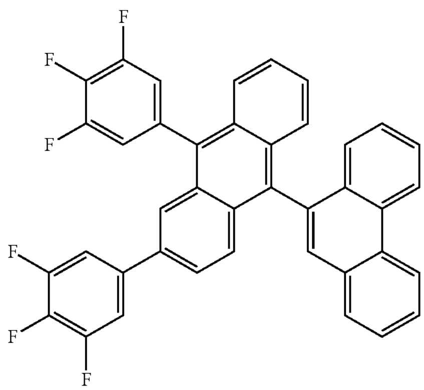
SF238
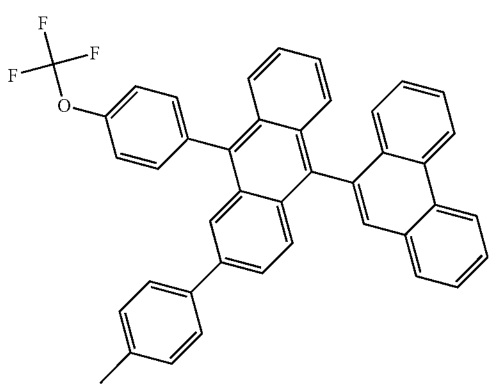
SF239
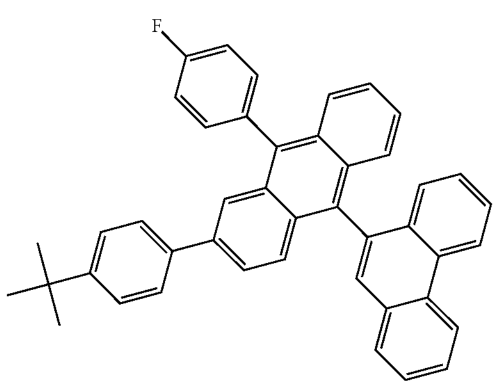
-continued
SF240
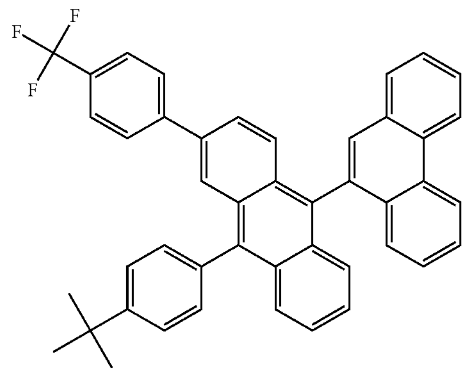
SF241
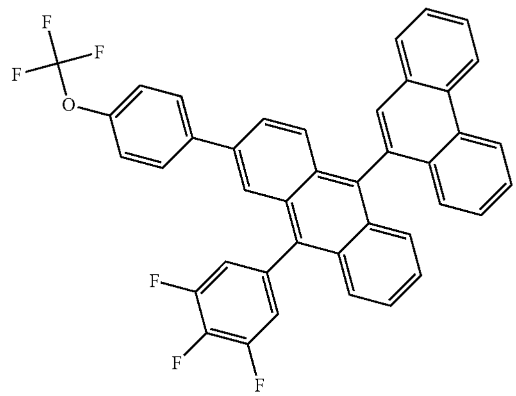
SF242
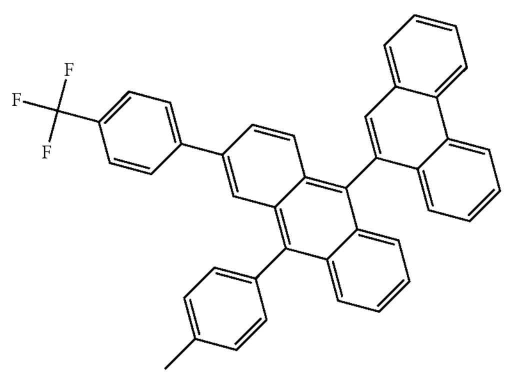
SF243
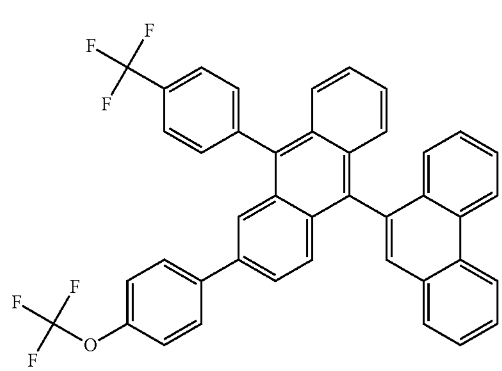

-continued
SF244
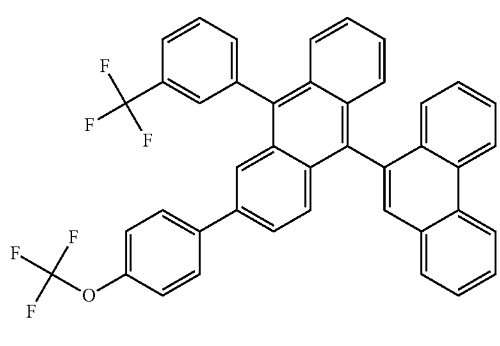
SF245
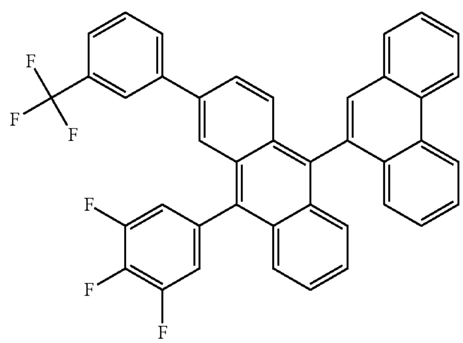
SF246
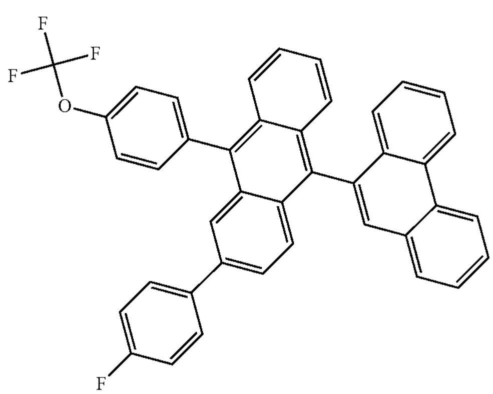
SF247
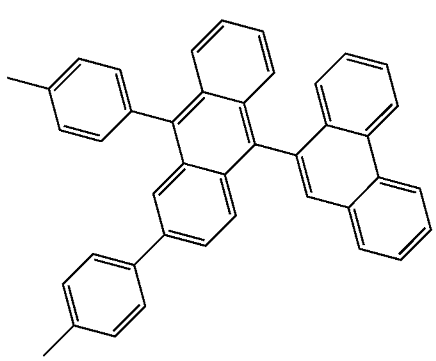
-continued
SF248
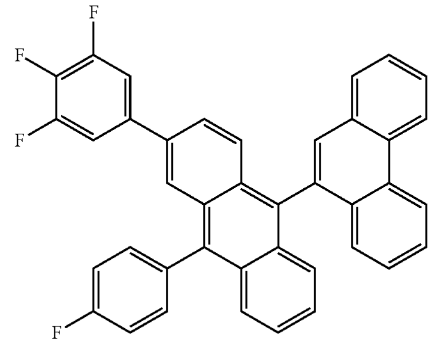
SF249
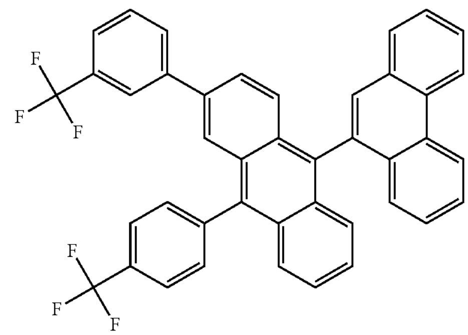
SF250
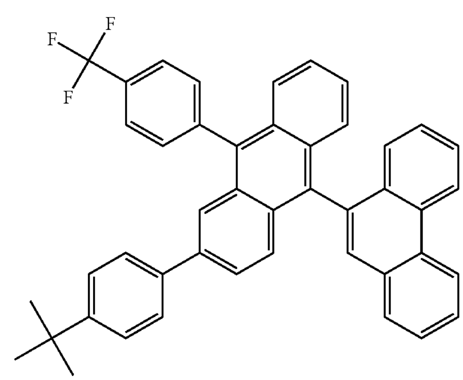
SF251
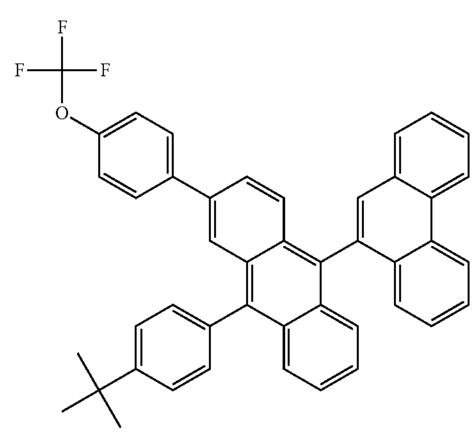

SF252
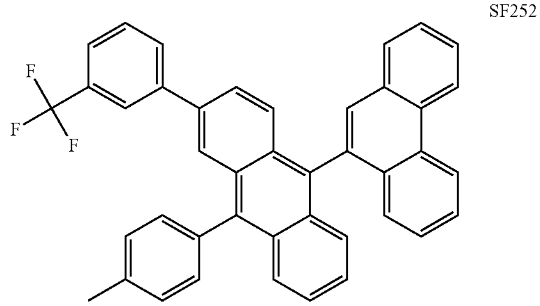
SF253
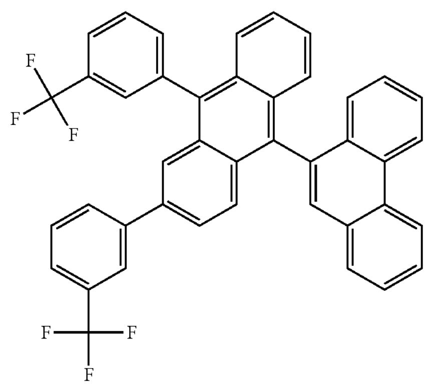
SF254
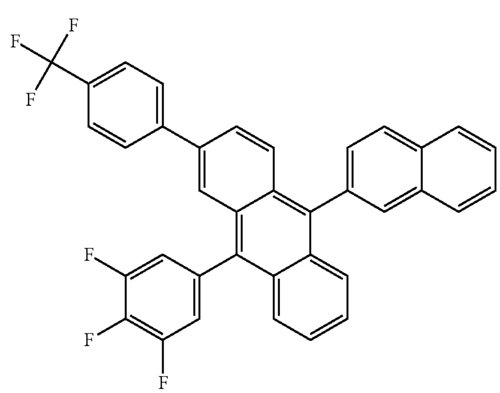
SF255
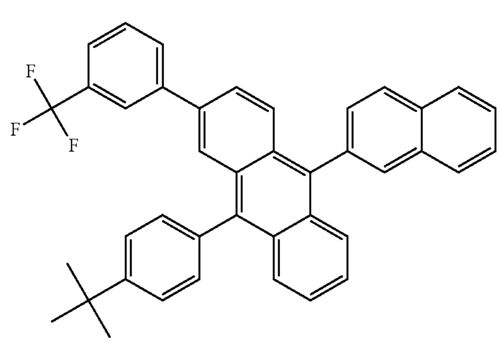
SF256
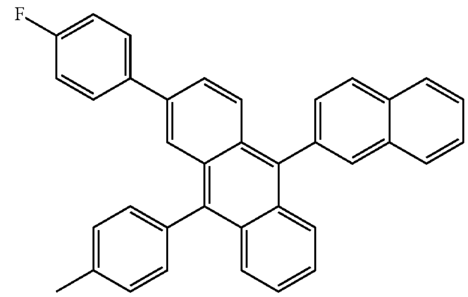
SF257
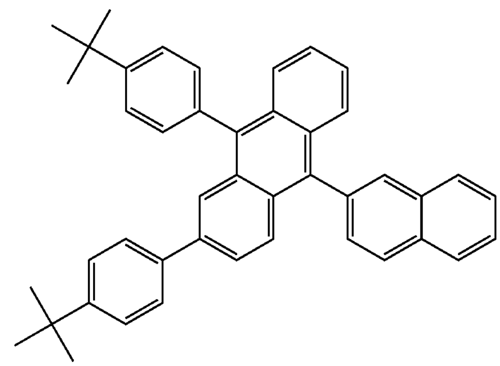
SF258
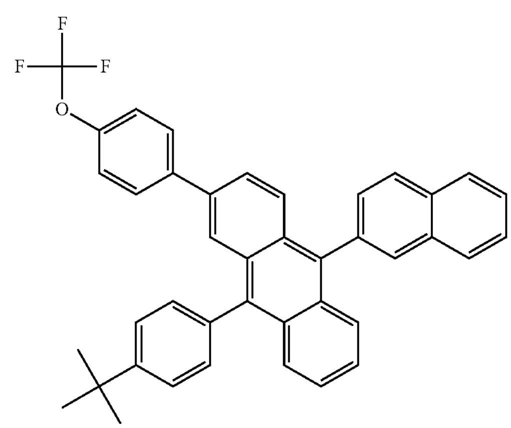
SF259
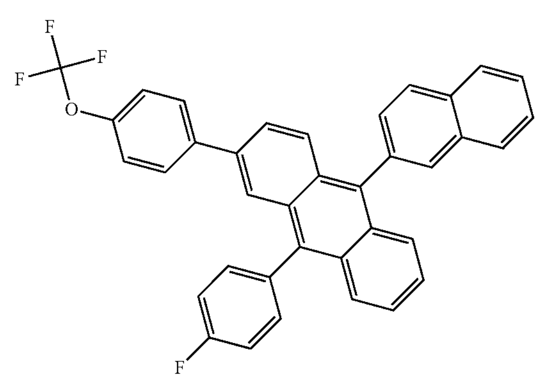

-continued
SF260
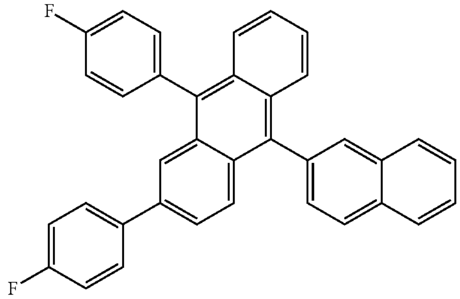
SF261
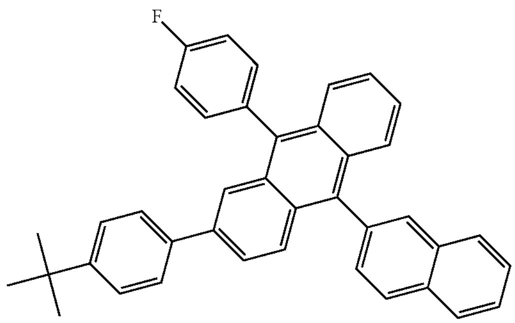
SF262
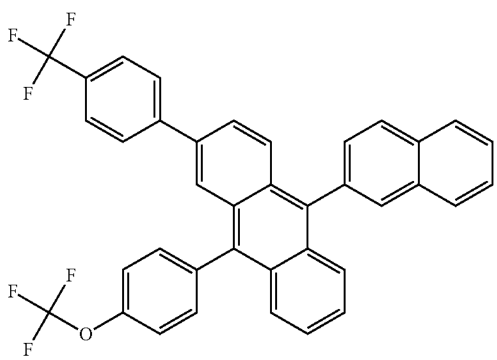
SF263
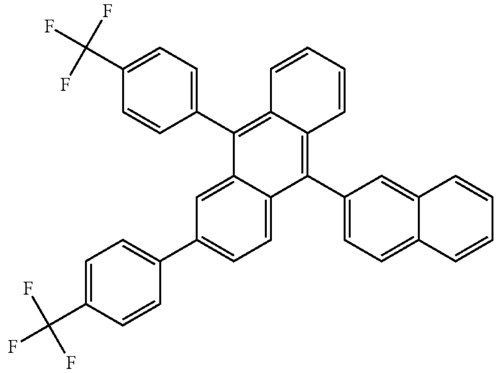
-continued
SF264
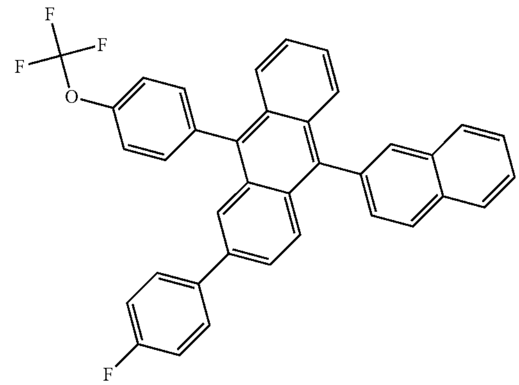
SF265
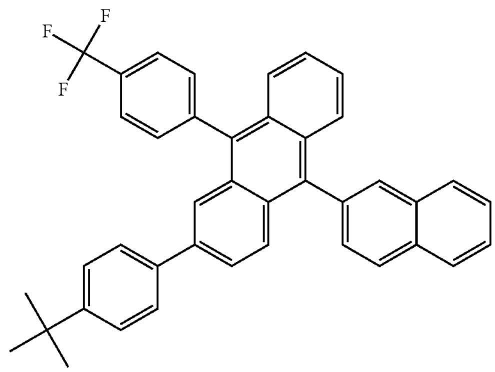
SF266
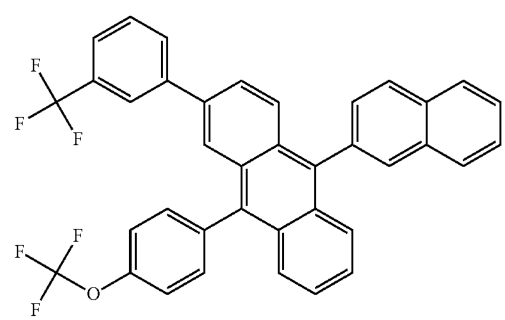
SF267
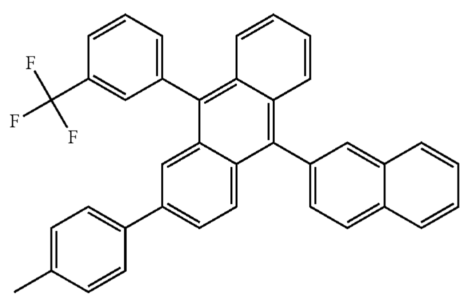

-continued
SF268
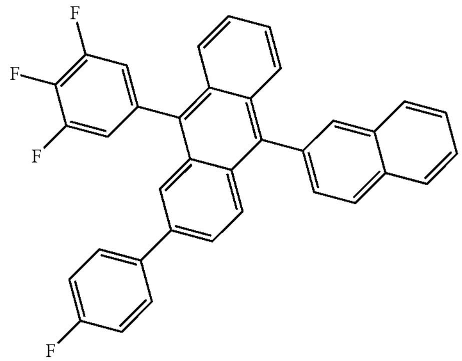
SF269
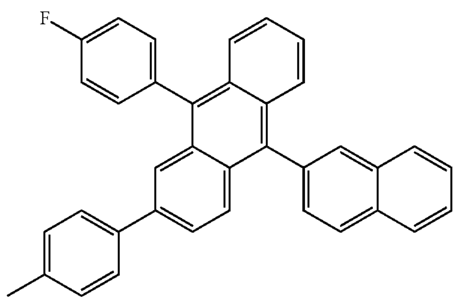
SF270
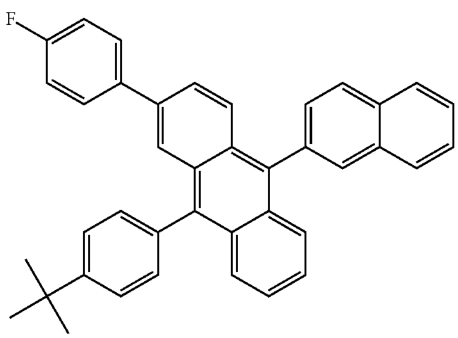
SF271
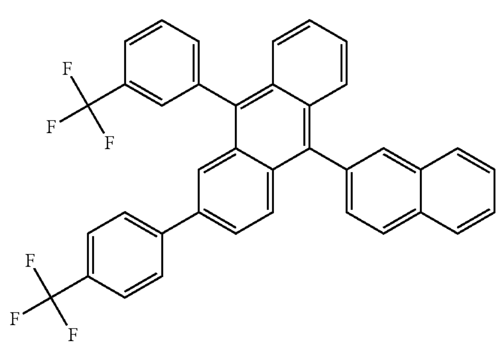
-continued
SF272
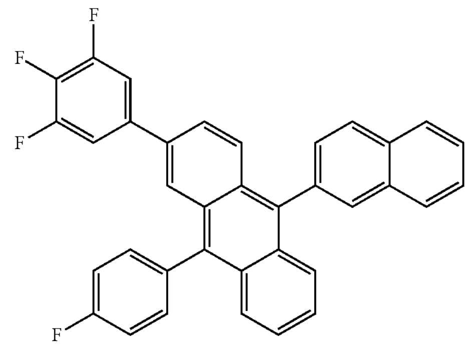
SF273
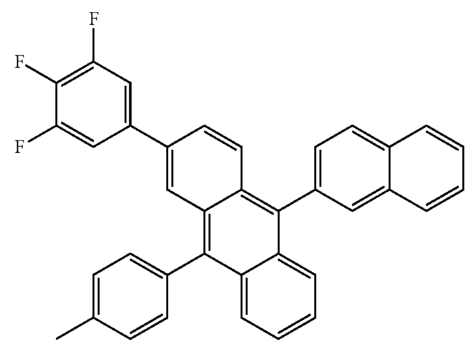
SF274
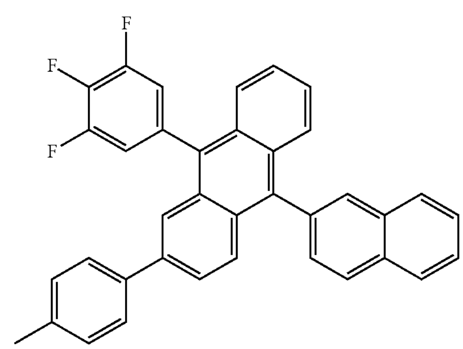
SF275
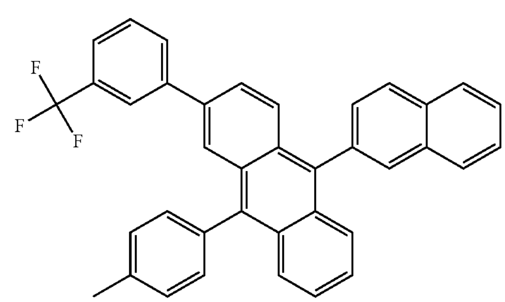

SF276
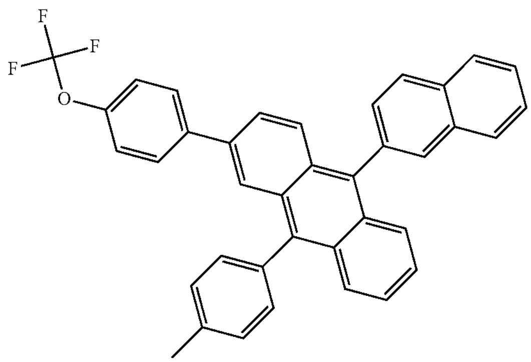
SF277
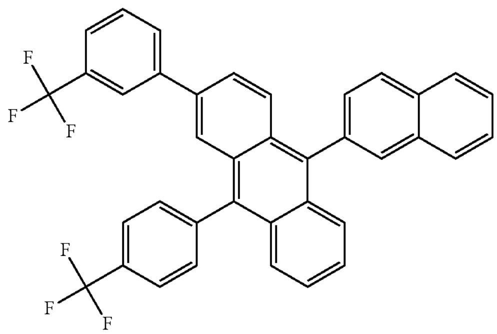
SF278
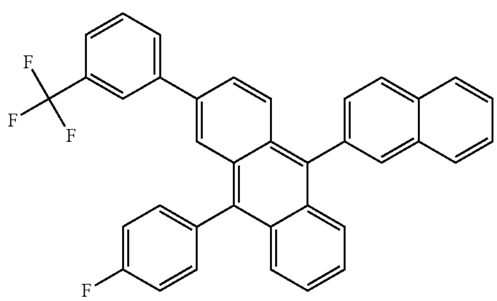
SF279
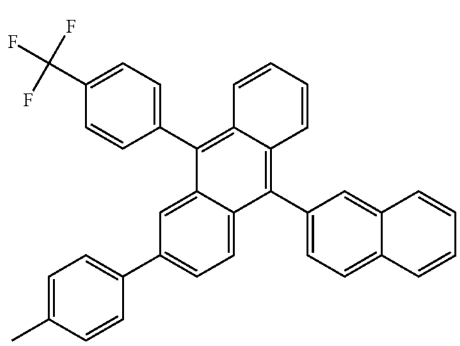
SF280
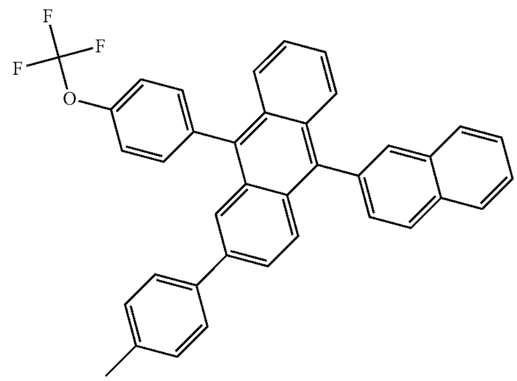
SF281
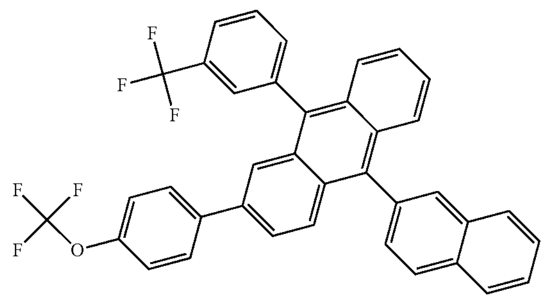
SF282
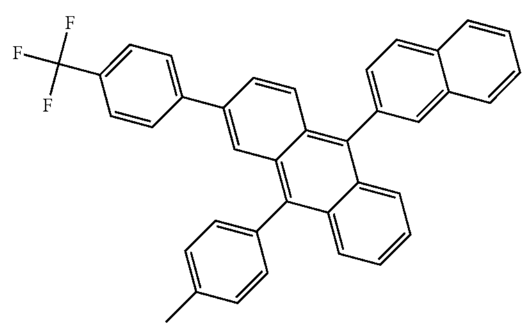
SF283
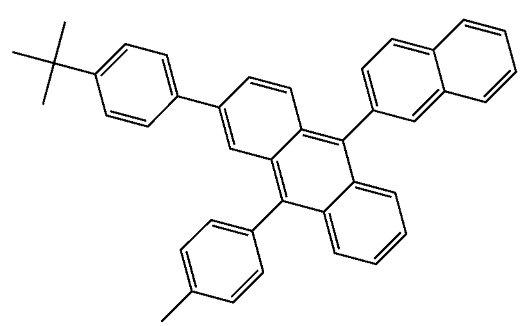

-continued
SF284
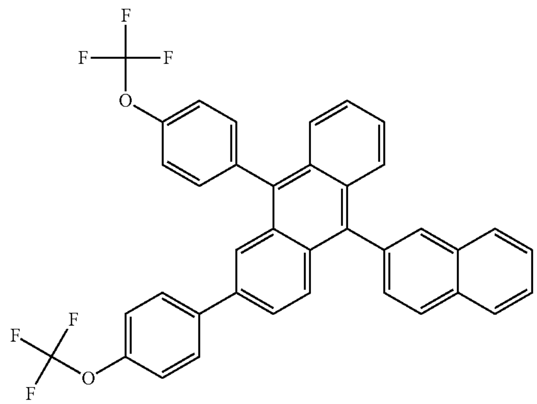
SF285
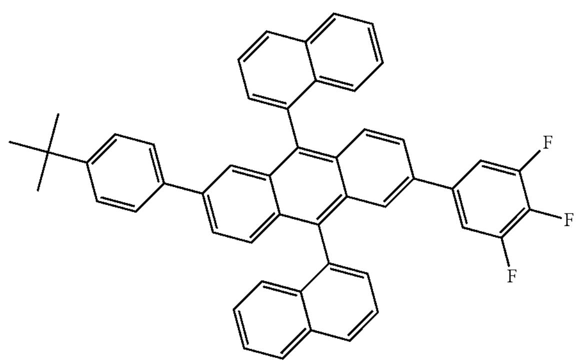
SF286
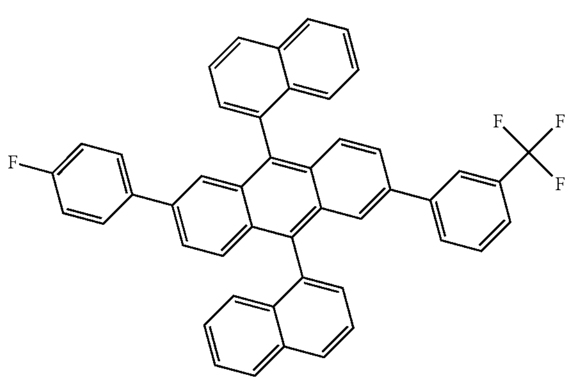
SF287
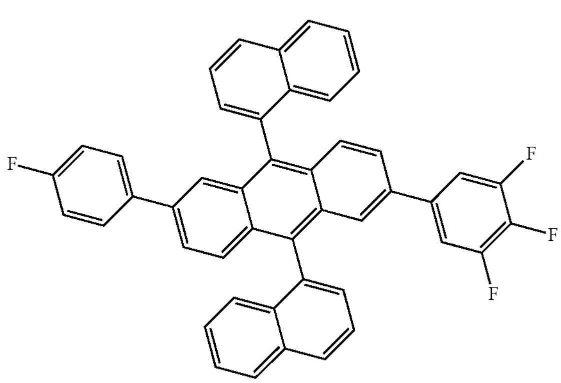
-continued
SF288
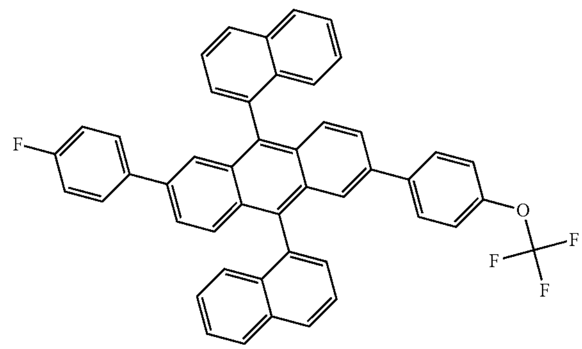
SF289
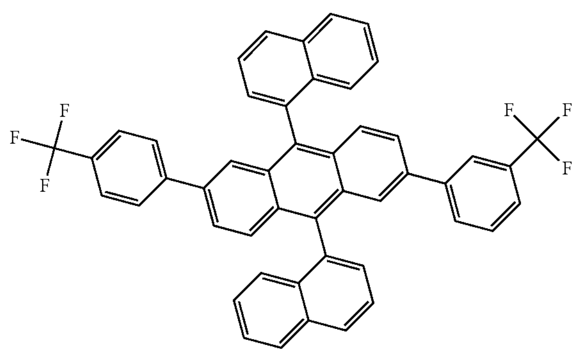
SF290
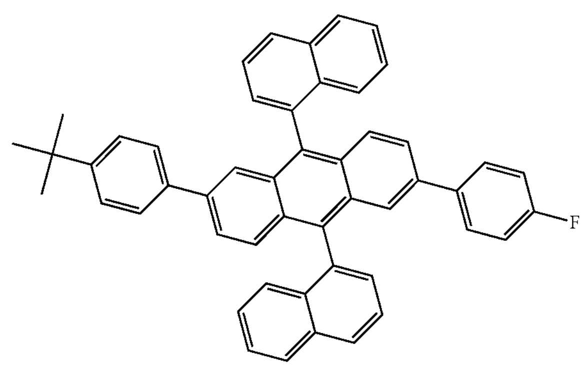
SF291
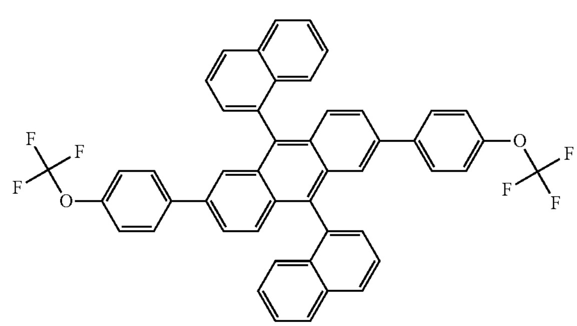

-continued
SF292
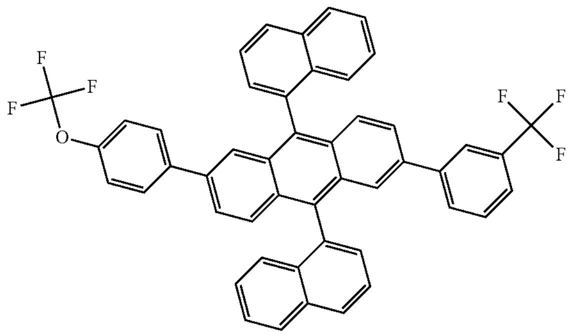
SF293
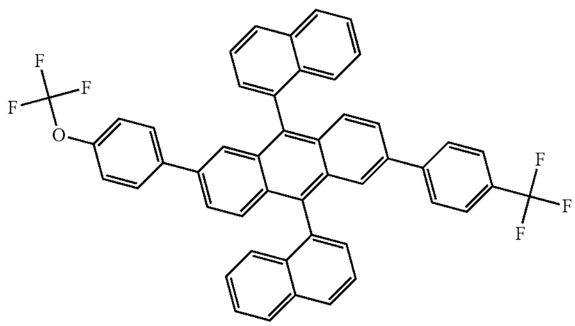
SF294
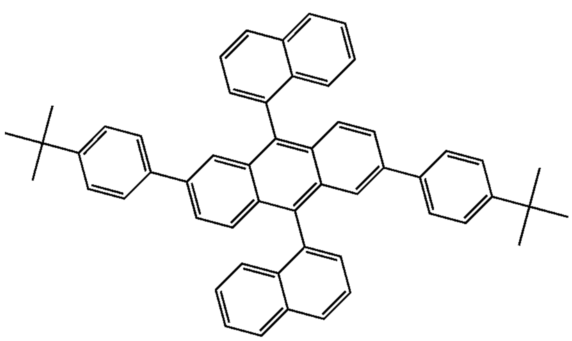
SF295
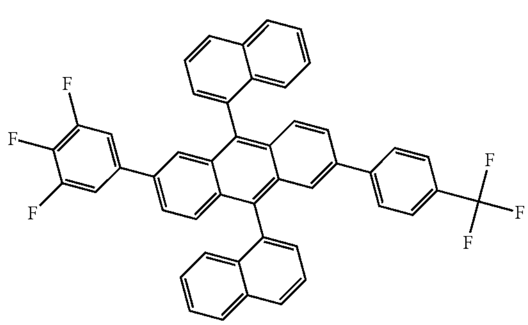
-continued
SF296
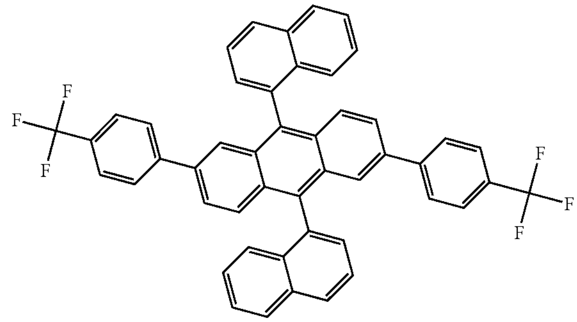
SF297
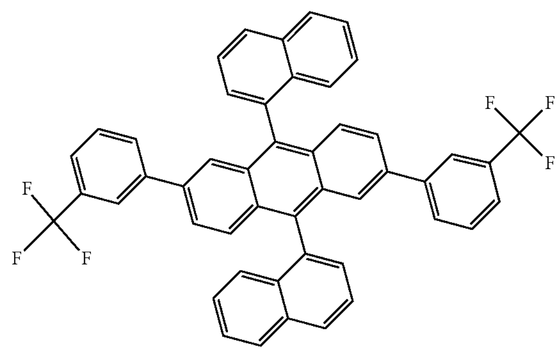
SF298
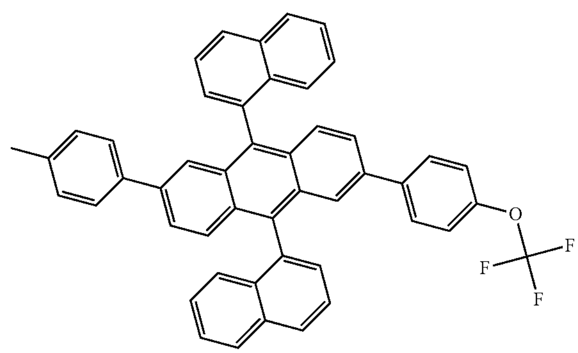
SF299
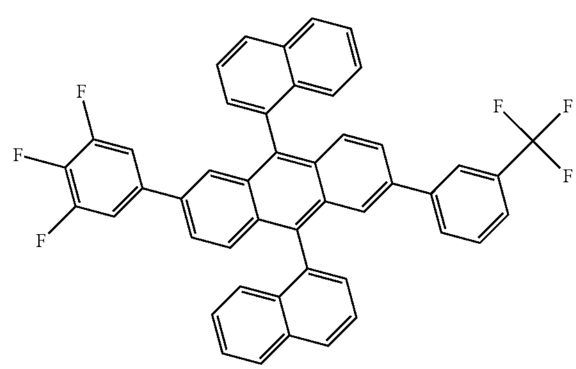

-continued
SF300
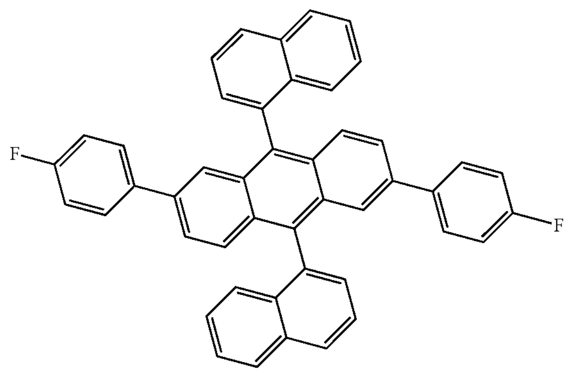
SF301
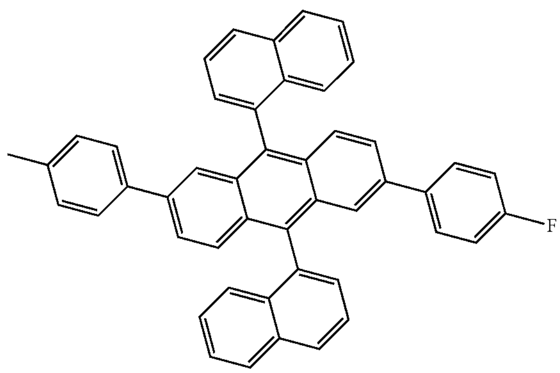
SF302
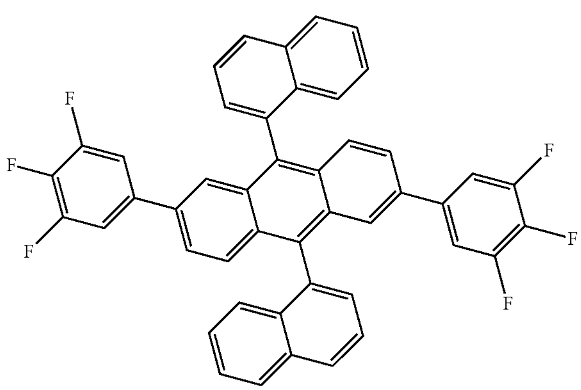
SF303
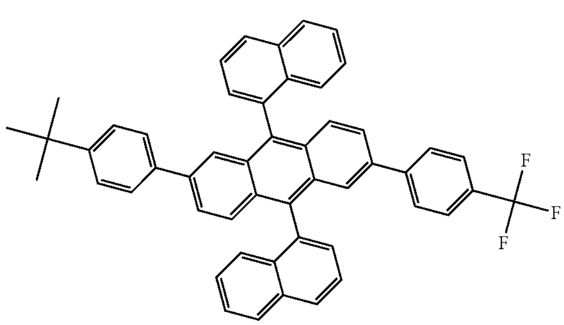
-continued
SF304
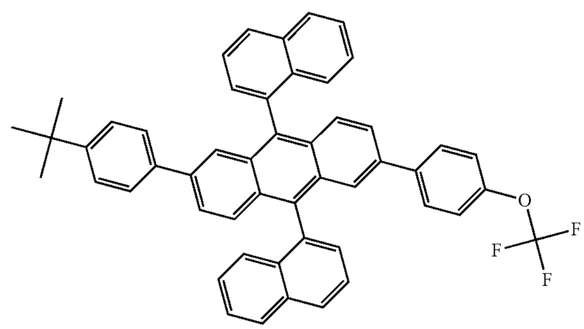
SF305
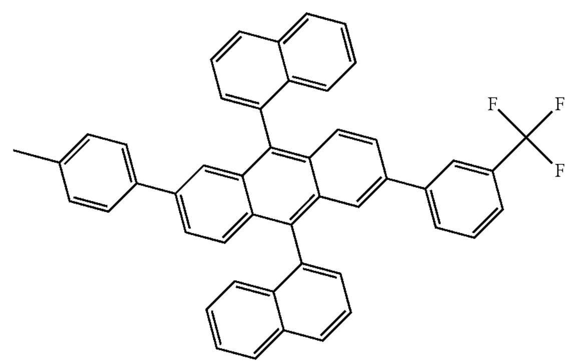
SF306
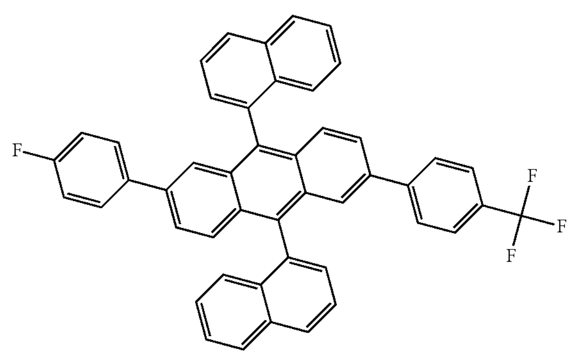
SF307
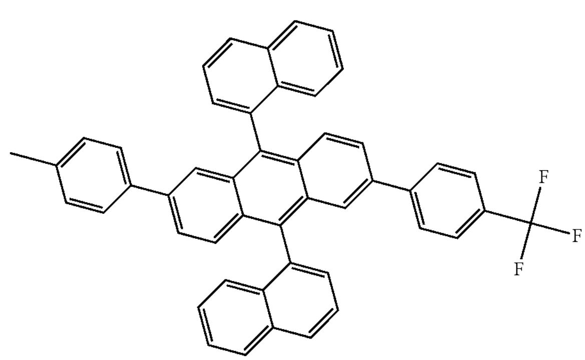

-continued
SF308
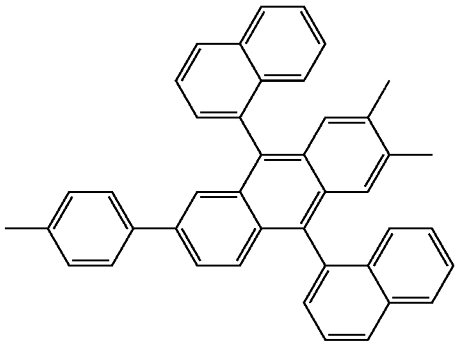
SF309
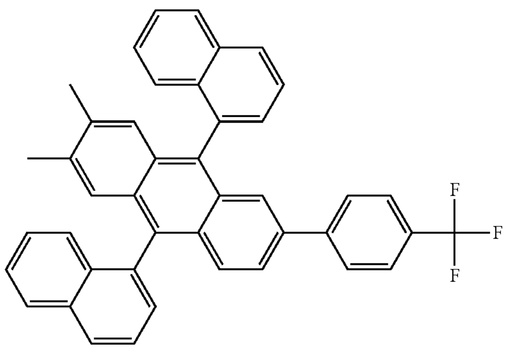
SF310
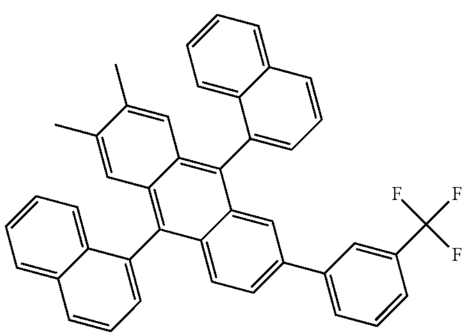
SF311
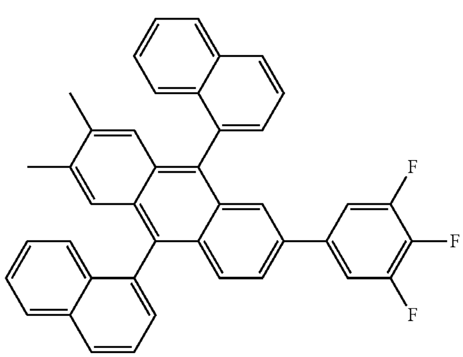
-continued
SF312
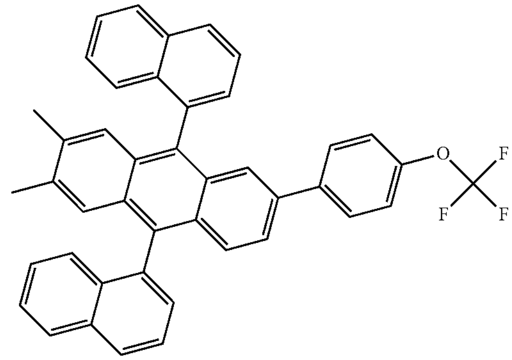
SF313
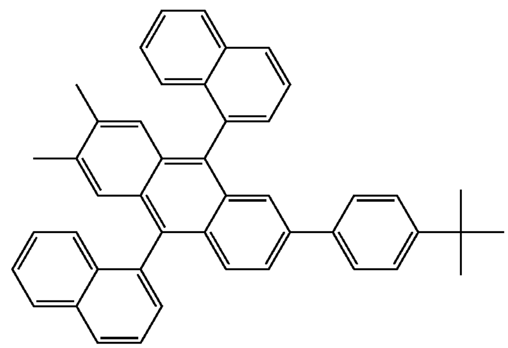
SF314
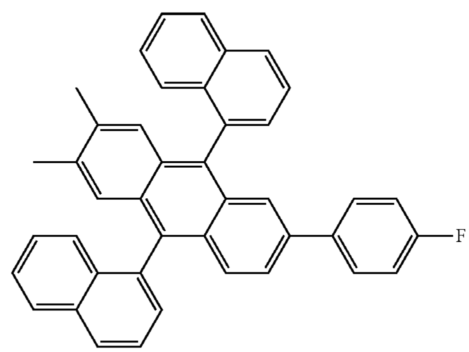
SF315
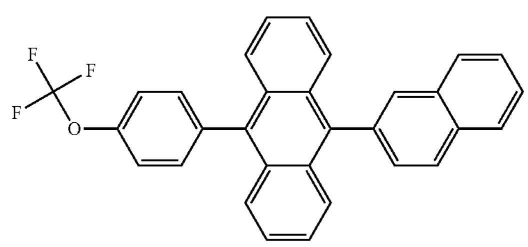
SF316
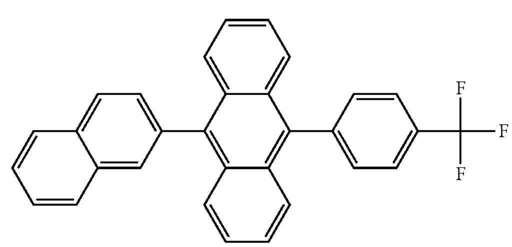

-continued
SF317
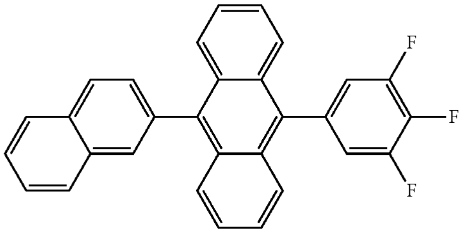
SF318
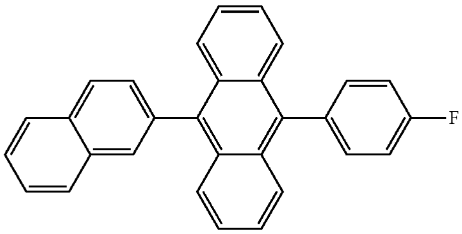
SF319
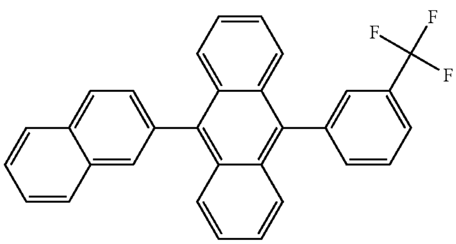
SF320
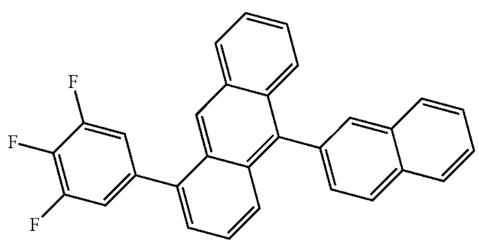
SF321
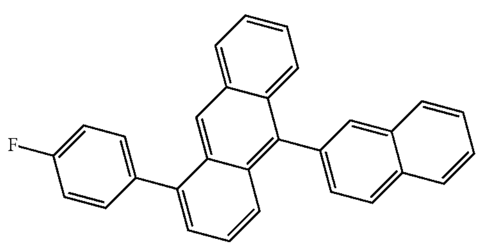
SF322
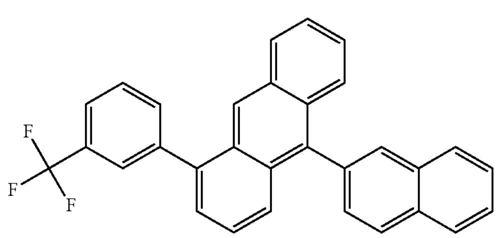
-continued
SF323
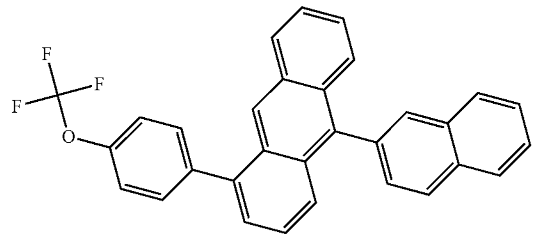
SF324
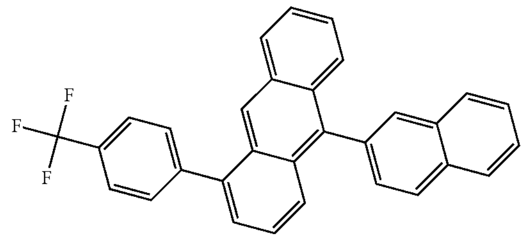
SF325
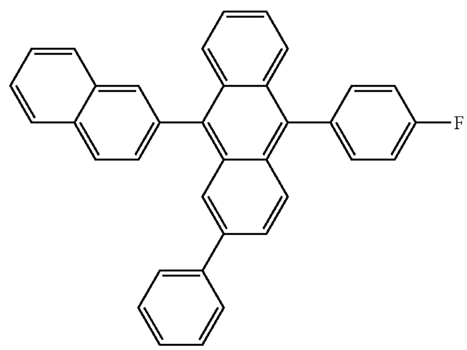
SF326
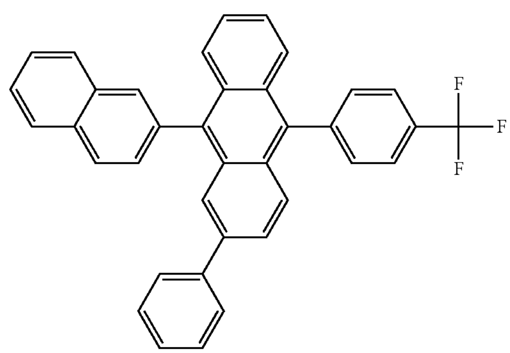
SF327
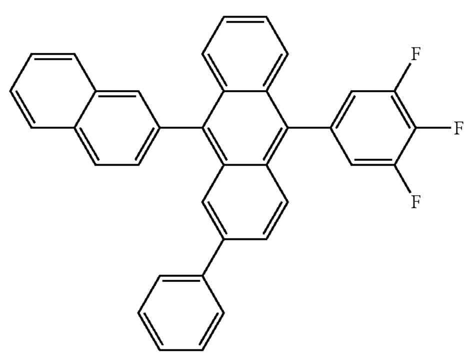

-continued
SF328
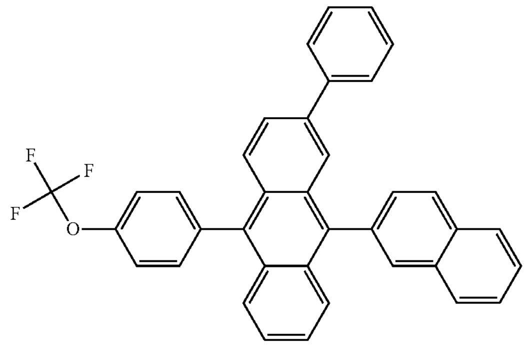
SF329
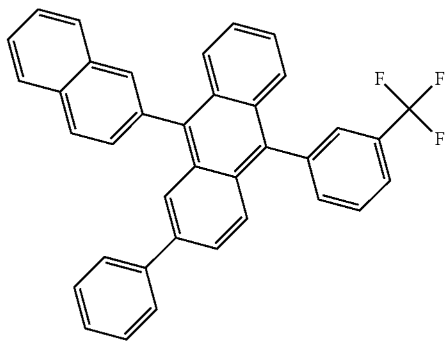
SF330
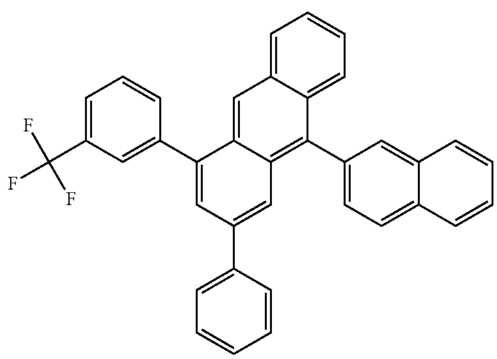
SF331
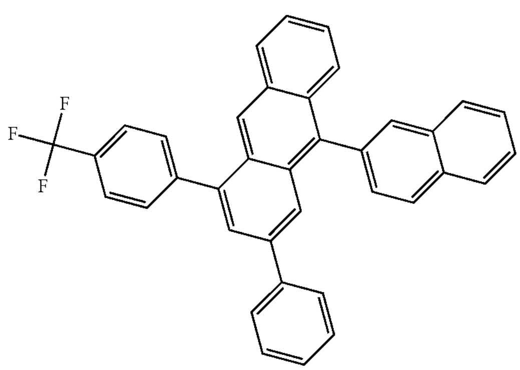
-continued
SF332
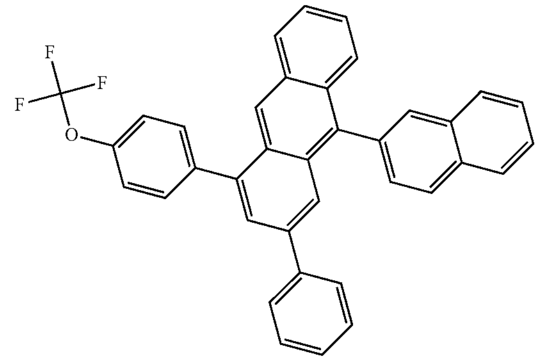
SF333
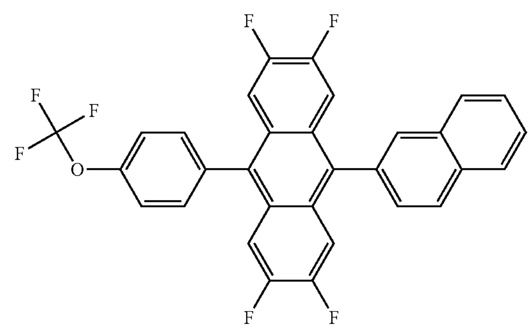
SF334
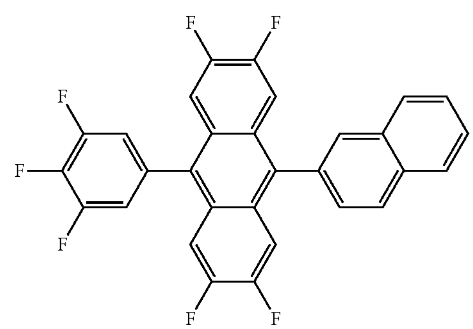
SF335
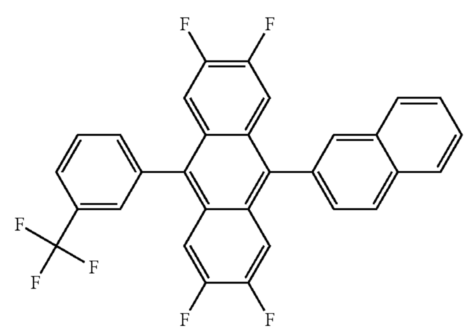

-continued
SF336
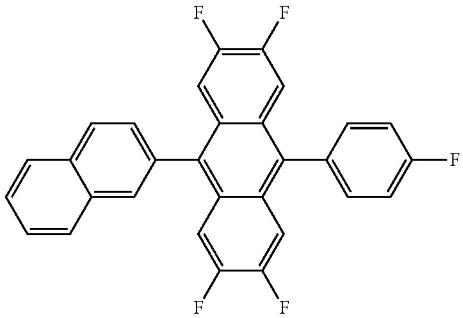
SF337
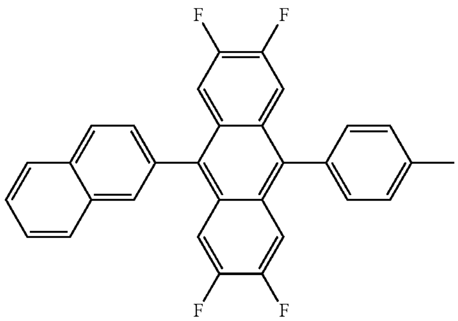
SF338
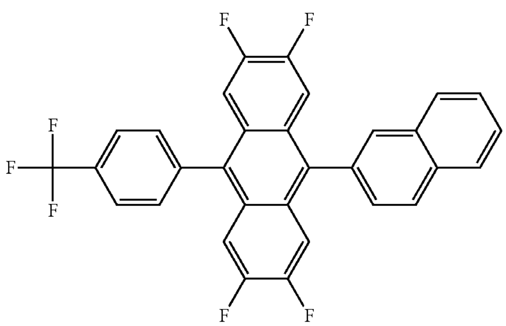
SF339
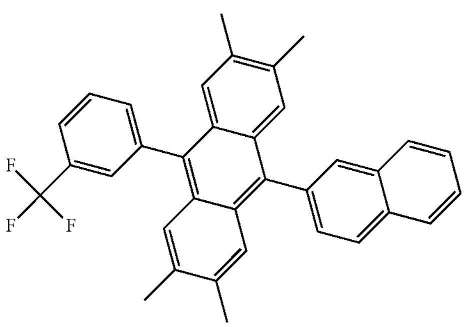
SF340
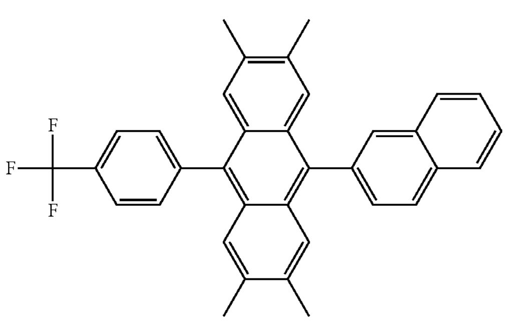
-continued
SF341
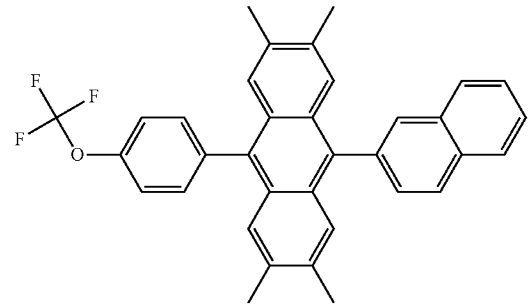
SF342
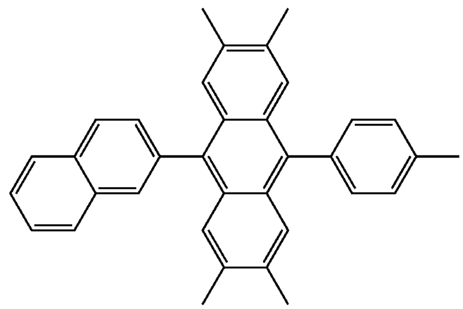
SF343
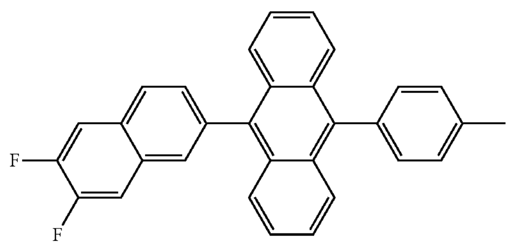
SF344
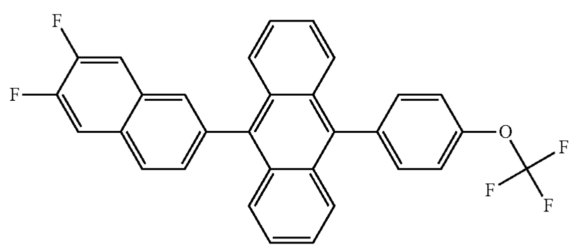
SF345
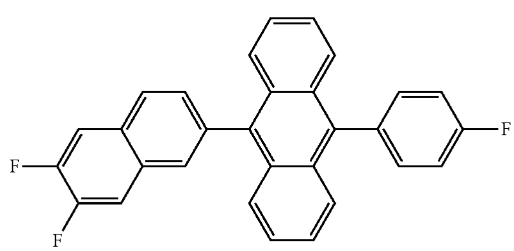

-continued
SF346
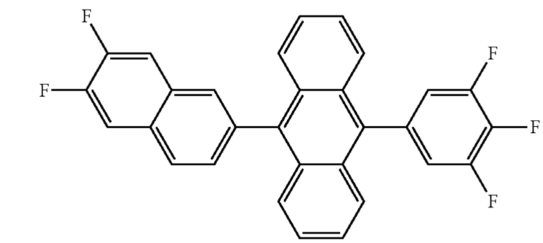
SF347
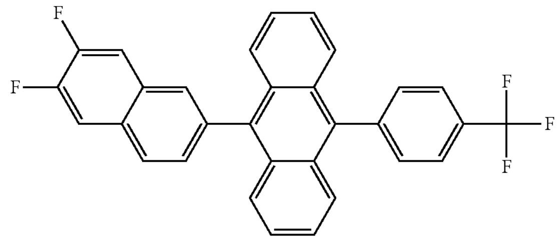
SF348
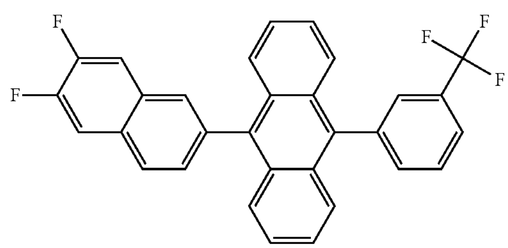
SF349
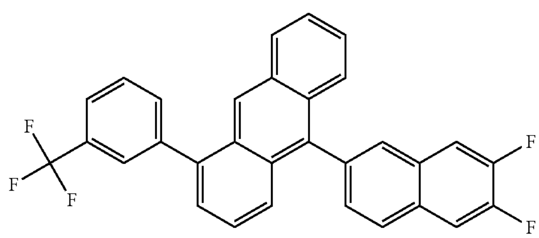
SF350
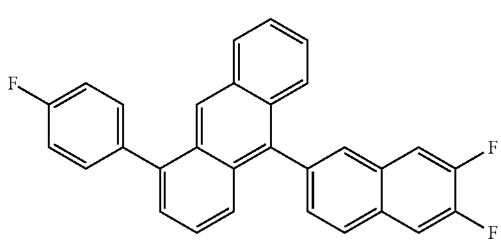
SF351
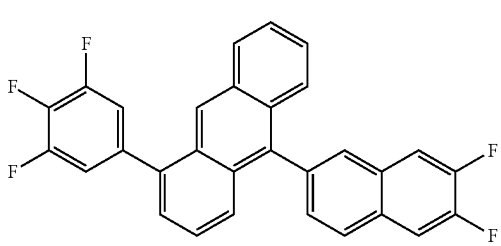
-continued
SF352
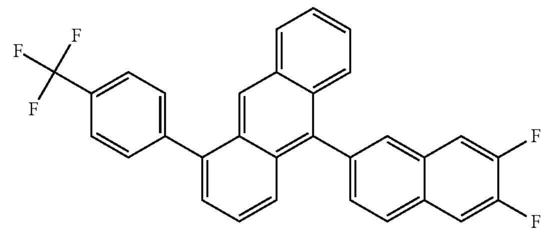
SF353
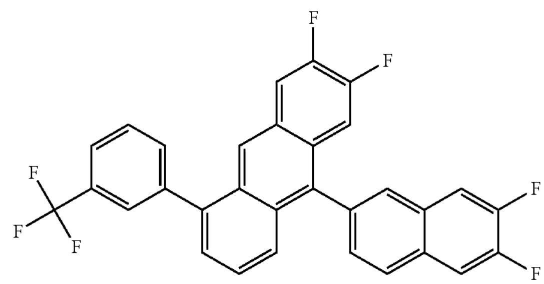
SF354
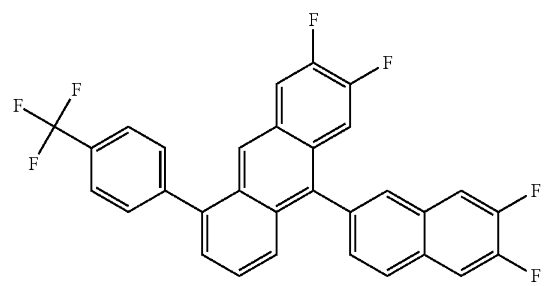
SF355
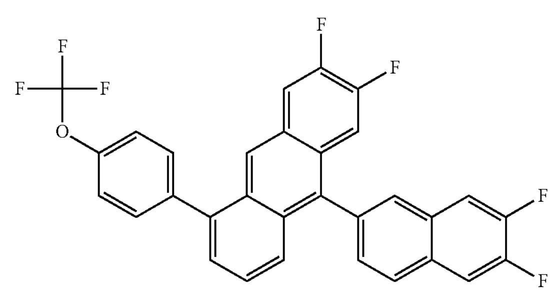
SF356
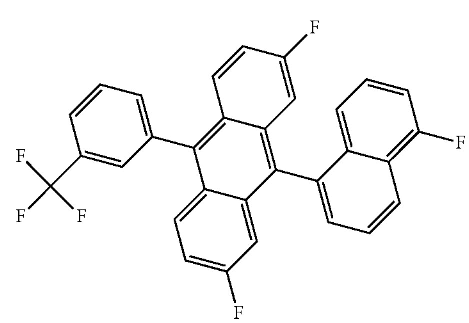

-continued
SF357
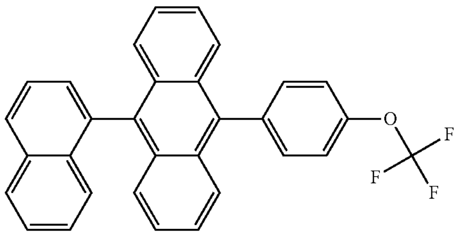
SF358
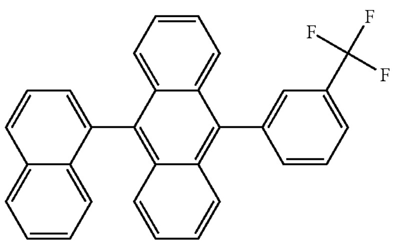
SF359
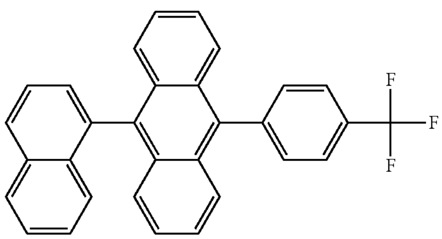
SF360
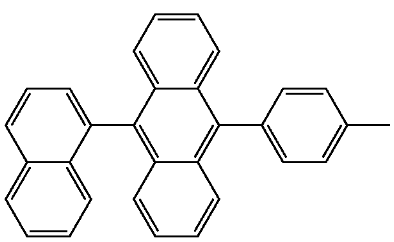
SF361
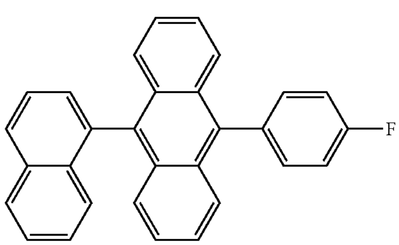
SF362
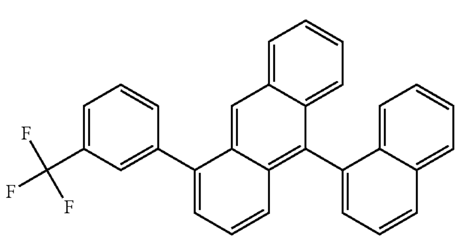
-continued
SF363
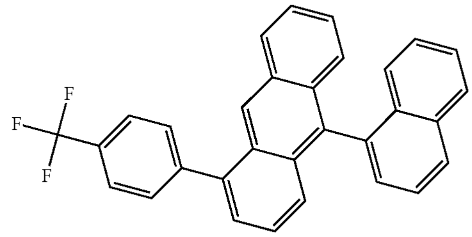
SF364
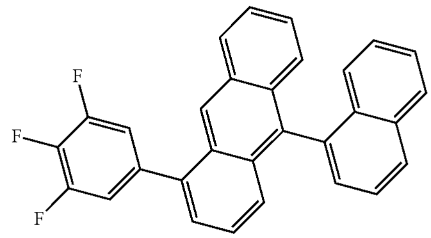
SF365
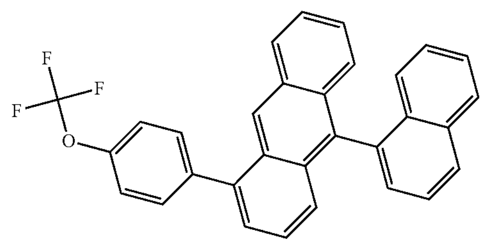
SF366
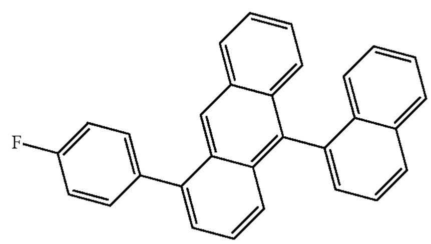
SF367
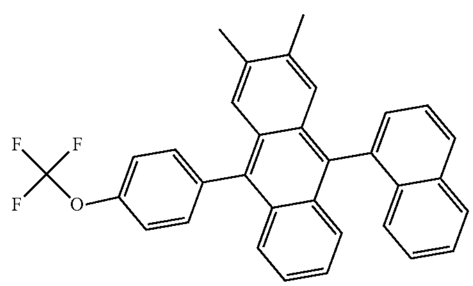
SF368
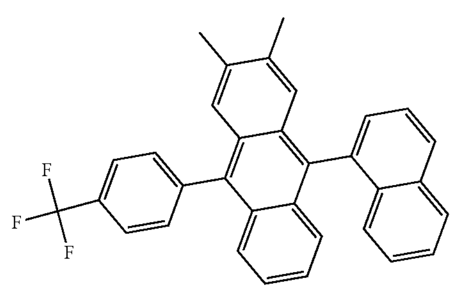

-continued

SF369

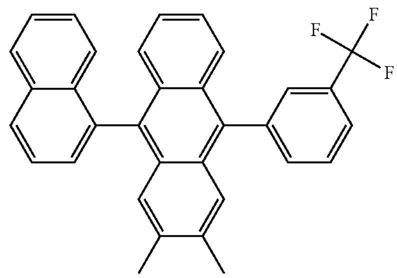

Suitable nucleation inhibiting materials include polymeric materials. Examples of such polymeric materials include: fluoropolymers, including but not limited to perfluorinated polymers and polytetrafluoroethylene (PTFE); polyvinylbiphenyl; polyvinylcarbazole (PVK); and polymers formed by polymerizing a plurality of the polycyclic aromatic compounds as described above. In another example, polymeric materials include polymers formed by polymerizing a plurality of monomers, wherein at least one of the monomers includes a terminal moiety that is, or includes, a moiety represented by (I-A), (I-B), or (I-C), (I-E), (I-F), (I-G) or a polycyclic aromatic moiety including fused ring structures as described above.

Aspects of some embodiments will now be illustrated and described with reference to the following examples, which are not intended to limit the scope of the present disclosure in any way.

EXAMPLES

Synthesis of Compound 1 ("SF13"): 9-(naphthalen-1-yl)-10-phenylanthracene. The following reagents were mixed in a 500 mL reaction vessel: 9-bromo-10-(naphthalene-1-yl) anthracene (1.500 g, 3.91 mmol); tetrakis(triphenylphosphine)palladium(0) ($Pd(PPh_3)_4$, 0.678 g, 0.587 mmol); potassium carbonate ($K_2CO_3$, 1.623 g, 11.7 mmol); and 0.0782 mol of a boronic acid. In the present example, phenylboronic acid (0.954 g) was used as the boronic acid. The reaction vessel containing the mixture was placed on a heating plate mantle and stirred using a magnetic stirrer. The reaction vessel was also connected to a water condenser. A well stirred 300 ml solvent mixture containing a 20:5:3 volumetric ratio of toluene, ethanol and water, was prepared separately in a round-bottom flask. The flask containing the solvent mixture was sealed and degassed using $N_2$ for a minimum of 30 minutes before a cannula was used to transfer the solvent mixture from the round-bottom flask to the reaction vessel without exposure to air. Once all of the solvent mixture was transferred, the reaction vessel was purged with nitrogen, and heated to a temperature of 65° C. while stirring at around 1200 RPM and left to react for at least 12 hours under a nitrogen environment. Once the reaction was determined to be complete, the mixture was cooled to room temperature before the solvent mixture was removed using a vacuum rotary evaporator. The contents of the flask were then re-dissolved in dichloromethane (DCM), and washed four times with a 500 mL of 1M NaOH solution, followed by washing twice with 500 mL of water. The organic phase was washed over magnesium sulfate and filtered. The resulting product was purified by passing twice through a silica gel plug column under vacuum suction. The DCM solvent was removed to produce the product in a powdered form. The powdered product was then further purified using train sublimation under reduced pressure of 20-50 mTorr and using $CO_2$ as a carrier gas. Yield after purification using the silica gel plug column was 0.940 g (31.5%). The yield of the sublimation step was approximately 74%. $^1$H NMR (600 MHz, $CD_2Cl_2$) δ 8.14 (ddd, J=8.3, 3.3, 0.9 Hz, 1H), 8.11-8.04 (m, 1H), 7.81-7.59 (m, 7H), 7.59-7.51 (m, 2H), 7.52-7.41 (m, 2H), 7.41-7.31 (m, 2H), 7.33-7.20 (m, 3H), 7.15 (dt, J=8.5, 1.0 Hz, 1H). $\lambda_{Abs}$=376.1 nm (DCM)

Synthesis of Compound 2 ("SF360"): 9-(naphthalen-1-yl)-10-4-tolyphenylanthracene. Compound 2 was synthesized using an identical procedure to Compound 1 as described above, with the exception of 4-tolylphenylboronic acid (1.064 g) being used as the boronic acid reactant. Yield after purification using the silica gel plug column was 1.176 g (38.0%). The yield of the sublimation step was approximately 81%. $^1$H NMR (400 MHz, $CD_2Cl_2$) δ 8.09 (d, J=8.3 Hz, 1H), 8.04 (d, J=8.2 Hz, 1H), 7.81-7.68 (m, 3H), 7.57 (dd, J=7.0, 1.3 Hz, 1H), 7.52-7.42 (m, 4H), 7.26-7.17 (m, 3H), 2.55 (s, 3H). $\lambda_{Abs}$=376.6 nm (DCM), $\lambda_{fluo}$=nm (Toluene).

Synthesis of Compound 3 ("SF361"): 9-(naphthalen-1-yl)-10-4-fluorophenylanthracene. Compound 3 was synthesized using an identical procedure to Compound 1 as described above, with the exception of 4-fluorophenylboronic acid (1.095 g) being used as the boronic acid reactant. Yield after purification using the silica gel plug column was 1.064 g (34.1%). The yield of the sublimation step was approximately 74%. $^1$H NMR (600 MHz, $CD_2Cl_2$) δ 8.14 (dt, J=8.3, 1.1 Hz, 1H), 8.08 (dt, J=8.3, 0.9 Hz, 1H), 7.80-7.73 (m, 3H), 7.63-7.56 (m, 2H), 7.56-7.51 (m, 2H), 7.45 (ddd, J=8.8, 1.3, 0.8 Hz, 2H), 7.43-7.36 (m, 4H), 7.27 (dddd, J=8.0, 6.3, 5.0, 1.3 Hz, 3H), 7.15-7.12 (m, 1H). $\lambda_{abs}$=375.6 nm (DCM).

Synthesis of Compound 4 ("SF359"): 9-(naphthalen-1-yl)-10-4-trifluoromethylphenylanthracene. Compound 4 was synthesized using an identical procedure to Compound 1 as described above, with the exception of 4-trifluoromethylphenylboronic acid (1.487 g) being used as the boronic acid reactant. Yield after purification using the silica gel plug column was 0.899 g (25.6%). The yield of the sublimation step was approximately 74%. $^1$H NMR (600 MHz, $CD_2Cl_2$) δ 8.15 (dd, J=8.3, 1.1 Hz, 1H), 8.09 (dt, J=8.4, 0.9 Hz, 1H), 8.02-7.91 (m, 2H), 7.83-7.74 (m, 2H), 7.74-7.66 (m, 3H), 7.62 (dd, J=6.8, 1.2 Hz, 1H), 7.55 (ddd, J=8.1, 6.6, 1.2 Hz, 1H), 7.47 (dt, J=8.9, 1.0 Hz, 2H), 7.39 (ddd, J=8.9, 6.4, 1.3 Hz, 2H), 7.32-7.22 (m, 3H), 7.14 (dd, J=8.5, 1.1 Hz, 1H). $\lambda_{abs}$=375.3 nm (DCM).

Synthesis of Compound 5 ("SF16"): 9-(naphthalen-1-yl)-10-4-methoxyphenylanthracene. Compound 5 was synthesized using an identical procedure to Compound 1 as described above, with the exception of 4-methoxyphenylboronic acid (1.189 g) being used as the boronic acid reactant. Yield after purification using the silica gel plug column was 1.387 g (43.2%). The yield of the sublimation step was approximately 74%. $^1$H NMR (600 MHz, $CD_2Cl_2$) δ 8.14 (dt, J=8.3, 1.1 Hz, 1H), 7.85-7.67 (m, 4H), 7.63-7.53 (m, 2H), 7.52 (d, J=1.4 Hz, 1H), 7.52-7.44 (m, 3H), 7.44-7.41 (m, 1H), 7.37 (ddd, J=8.9, 6.4, 1.3 Hz, 2H), 7.30-7.18 (m, 6H), 7.16-7.08 (m, 2H), 4.01 (s, 3H). $\lambda_{abs}$=377.4 nm (DCM).

Synthesis of Compound 6 ("SF358"): 9-(3-Trifluoromethylphenyl)-10-(naphthalene-1-yl)anthracene. Compound 6 was synthesized using an identical procedure to Compound 1 as described above, with the exception of 3-Trifluoromethylphenylboronic acid (1.49 g) being used as the boronic acid reactant. Yield after purification using the silica gel plug column was 1.14 g. The yield of the sublimation step was approximately 79%. GC/MS elution time 5.53 min with an abundance of $1.1\times10^6$. $^1$H NMR (400 MHz, $CDCl_3$) δ 8.06 (d, J=8.2 Hz, 1H), 8.01 (d, J=8.3 Hz, 1H), 7.86-7.67 (m, 5H), 7.61 (d, J=8.8 Hz, 2H), 7.55 (d, J=6.3 Hz, 1H), 7.52-7.41 (m, 3H), 7.37-7.30 (m, 2H), 7.27-7.18 (m, 3H), 7.13 (t, J=7.6 Hz, 1H). λAbs=397 nm (DCM), λfluo=411 nm (DCM).

Synthesis of Compound 7 ("SF4"): 9-(3,4,5-Trifluorophenyl)-10-(naphthalene-1-yl)anthracene. Compound 7 was synthesized using an identical procedure to Compound 1 as described above, with the exception of 3,4,5-Trifluorophenylboronic acid (1.38 g) being used as the boronic acid reactant. Yield after purification using the silica gel plug column was 1.01 g. The yield of the sublimation step was approximately 82%. GC/MS elution time 5.707 min with an abundance of $5.0\times10^6$. $^1$H NMR (400 MHz, $CDCl_3$) δ 8.06 (d, J=8.3 Hz, 1H), 8.01 (d, J=8.2 Hz, 1H), 7.73-7.61 (m, 3H), 7.56-7.32 (m, 5H), 7.27-7.06 (m, 5H). λAbs=396 nm (DCM), Xfluo=430 nm (DCM).

Synthesis of Compound 8 ("SF25"): 9-(2-Fluorophenyl)-10-(naphthalene-1-yl) anthracene. Compound 8 was synthesized using an identical procedure to Compound 1 as described above, with the exception of 2-fluorophenylboronic acid (1.10 g) being used as the boronic acid reactant. Yield after purification using the silica gel plug column was 1.32 g. The yield of the sublimation step was approximately 81%. GC/MS elution time 6.475 min with an abundance of 8.4×106. $^1$H NMR (400 MHz, $CDCl_3$) δ 8.06 (d, J=8.1 Hz, 1H), 8.00 (d, J=8.2 Hz, 1H), 7.68 (d, J=9.0 Hz, 3H), 7.46 (dddd, J=60.9, 29.3, 13.0, 7.7 Hz, 10H), 7.25-7.11 (m, 4H). λAbs=397 nm (DCM), λfluo=407 nm (DCM).

Synthesis of Compound 9 ("SF316"): 9-(4-Trifluoromethylphenyl)-10-(naphthalene-2-yl)anthracene. The following reagents were mixed in a 1 L reaction vessel: 9-bromo-10-(naphthalene-2-yl)anthracene (0.853 g, 2.23 mmol); Tetrakis(triphenylphosphine)palladium ($Pd(PPh_3)_4$, 0.385 g, 15 mol %); potassium carbonate ($K_2CO_3$, 0.923 g, 6.69 mmol); and 4.46 mmol of a boronic acid. In the present example, 4-Trifluoromethylphenylboronic acid (0.845 g) was used as the boronic acid. The reaction vessel containing the mixture was placed on a heating plate mantle and stirred using a magnetic stirrer. The reaction vessel was also connected to a water condenser. A well stirred 191 ml solvent mixture containing a 6.6:3.3:1 volumetric ratio of toluene, ethanol and water, was prepared separately in a round-bottom flask. The flask containing the solvent mixture was sealed and degassed using $N_2$ for a minimum of 30 minutes before a cannula was used to transfer the solvent mixture from the round-bottom flask to the reaction vessel without exposure to air. Once all of the solvent mixture was transferred, the reaction vessel was purged with nitrogen, and heated to a temperature of 65° C. while stirring at around 1200 RPM and left to react for at least 12 hours under a nitrogen environment. Once the reaction was determined to be complete, the mixture was cooled to room temperature before the solvent mixture was removed using a vacuum rotary evaporator. The contents of the flask were then re-dissolved in dichloromethane (DCM), and washed with 1M NaOH solution, followed by washing with water. The organic phase was washed over magnesium sulfate and filtered. The resulting product was purified by passing through a silica gel plug column under vacuum suction. The DCM solvent was removed to produce the product in a powdered form. The powdered product was then further purified using train sublimation under reduced pressure of 20-50 mTorr and using $CO_2$ as a carrier gas. $^1$H NMR ($CDCl_3$): 8.09 (d, J=8.58 Hz, 1H), 8.04 (m, 1H), 7.98 (s, 1H), 7.91 (m, 1H), 7.74 (m, 2H), 7.63 (m, 7H), 7.35 (m, 4H). $^{19}$F NMR ($CDCl_3$): 62.32 (s). λAbs=397 nm (DCM), λfluo=423 nm (DCM). Yield (purified)=61%, Yield (sublimed)=88%. MS (m/z, %): 436.3 (M+, 100) GC retention time=7.30 minutes.

Synthesis of Compound 10 ("SF317"): 9-(3,4,5-Trifluorophenyl)-10-(naphthalene-2-yl)anthracene. Compound 10 was synthesized using an identical procedure to Compound 9 as described above, with the exception of 3,4,5-Trifluorophenlylboronic acid (0.809 g, 4.60 mmol) being used as the boronic acid reactant, and being combined with: 9-bromo-10-(naphthalene-2-yl)anthracene (0.882 g, 2.30 mmol), 3,4,5-trifluorophenlylboronic acid (0.809 g, 4.60 mmol), potassium carbonate (0.954 g, 6.90 mmol) and tetrakis(triphenylphosphine)palladium (0.399 g, 15 mol %). $^1$H NMR ($CDCl_3$): 8.09 (d, J=8.58 Hz, 1H), 8.04 (m, 1H), 7.97 (s, 1H), 7.93 (m, 1H), 7.74 (m, 2H), 7.62 (m, 5H), 7.38 (m, 4H), 7.16 (m, 2H). $^{13}$C NMR ($CDCl_3$): 152.76, 150.26 138.35, 136.28, 133.52, 132.98, 130.32, 130.12, 129.77, 129.43, 128.25, 128.09, 127.28, 126.72, 126.52, 126.13, 126.02, 125.48, 115.92, 115.86, 115.77, 115.72. $^{19}$F NMR ($CDCl_3$): 134.38 (m), 161.64 (m). λAbs=395 nm (DCM), λfluo=418 nm (DCM). Yield (purified)=75%, Yield (sublimed)=91%. MS (m/z, %): 434.3 (M+, 100). GC retention time=7.07 minutes.

Synthesis of Compound 11 ("SF319"): 9-(3-Trifluoromethylphenyl)-10-(naphthalene-2-yl)anthracene. Compound 11 was synthesized using an identical procedure to Compound 9 as described above, with the exception of the amount of solvent used (Toluene/Ethanol/Water, 287 mL), and 3-trifluoromethylphenlylboronic acid (1.268 g, 6.68 mmol) being used as the boronic acid, which was combined with 9-bromo-10-(naphthalene-2-yl)anthracene (1.280 g, 3.34 mmol), 3-trifluorophenlylboronic acid (1.268 g, 6.68 mmol), potassium carbonate (1.385 g, 10.02 mmol) and Tetrakis(triphenylphosphine)palladium (0.578 g, 15 mol %). $^1$H NMR ($CDCl_3$): 8.10 (d, J=8.73 Hz, 1H), 8.04 (m, 1H), 7.99 (s, 1H), 7.93 (m, 1H), 7.78 (m, 6H), 7.62 (m, 5H), 7.35 (m, 4H). $^{13}$C NMR ($CDCl_3$): 140.17, 137.87, 136.47, 135.34, 134.91, 133.54, 132.95, 131.38, 131.06, 130.36, 130.17, 129.97, 129.56, 129.18, 128.23, 128.08, 127.38, 126.66, 126.53, 126.47, 125.74, 125.38, 124.65. $^{19}$F NMR ($CDCl_3$): 62.34 (s). λAbs=395 nm (DCM), λfluo=419 nm (DCM). Yield (purified)=75%, Yield (sublimed)=90%. MS (m/z, %): 448.3 (M+, 100). GC retention time=6.89 minutes.

Synthesis of Compound 12 ("SF19"): 9-(2-tolyphenyl)-10-(naphthalene-2-yl)anthracene. Compound 12 was synthesized using an identical procedure to Compound 11 as described above, with the exception of 2-tolylboronic acid (1.033 g, 7.60 mmol) being used as the boronic acid, which was combined with 9-bromo-10-(naphthalene-2-yl)anthracene (1.457 g, 3.80 mmol), potassium carbonate (1.575 g, 11.4 mmol) and tetrakis(triphenylphosphine)-palladium (0.658 g, 15 mol %). $^1$H NMR ($CDCl_3$): 8.10 (dd, J=8.60, 2.36 Hz, 1H), 8.03 (m, 2H), 7.94 (m, 1H), 7.76 (m, 2H), 7.63 (m, 5H), 7.47 (m, 3H), 7.33 (m, 5H). $^{13}$C NMR ($CDCl_3$): 138.60, 138.09, 136.89, 136.77, 133.57, 132.90, 131.47, 130.46, 130.45, 130.28, 130.21, 129.80, 128.26, 128.24, 128.08, 128.05, 128.04, 127.30, 126.82, 126.57, 126.36, 126.05, 125.33, 125.29, 20.02. λAbs=397 nm (DCM), λfluo=415 nm (DCM). Yield (purified)=75%, Yield (sublimed)=73%. MS (m/z, %): 394.3 (M+, 100). GC retention time=7.81 minutes.

Synthesis of Compound 13 ("SF20"): 9-(3-tolyphenyl)-10-(naphthalene-2-yl)anthracene. Compound 13 was synthesized using an identical procedure to Compound 9 as described above, with the exception that 3-Tolylboronic acid (0.668 g, 5.06 mmol) was used as the boronic acid, which was combined with 9-bromo-10-(naphthalene-2-yl)anthracene (0.971 g, 2.53 mmol), potassium carbonate (1.05 g, 7.60 mmol) and tetrakis(triphenylphosphine)palladium (0.438 g, 15 mol). $^{1}$H NMR ($CDCl_3$): 8.09 (d, J=8.04 Hz, 1H), 8.04 (m, 1H), 7.99 (s, 1H), 7.93 (m, 1H), 7.74 (m, 4H), 7.62 (m, 3H), 7.34 (m, 7H). $^{13}$C NMR ($CDCl_3$): 139.13, 138.13, 137.66, 138.87, 133.58, 132.88, 132.13, 130.38, 130.20, 130.06, 129.75, 128.53, 128.42, 128.34, 128.09, 128.04, 127.29, 127.14, 126.55, 126.35, 125.23, 125.10, 31.09, 21.71. $^{19}$F NMR ($CDCl_3$): 113.22 (m). λAbs=395 nm (DCM), λfluo=420 nm (DCM). Yield (purified)=69%, Yield (sublimed)=81%. MS (m/z, %): 394.3 (M+, 100). GC retention time=9.21 minutes.

Synthesis of Compound 14 ("SF21"): 9-(3,5-bis(Trifluoromethyl)phenyl)-10-(naphthalene-2-yl)anthracene. Compound 14 was synthesized using an identical procedure to Compound 9 as described above, with the exception of 3,5-bis(Trifluoromethyl)phenylboronic acid (0.998 g, 3.87 mmol) being used as the boronic acid, which was combined with 9-bromo-10-(naphthalene-2-yl)anthracene (0.744 g, 1.94 mmol), potassium carbonate (0.803 g, 5.81 mmol) and tetrakis(triphenylphosphine)palladium (0.335 g, 15 mol %). $^{1}$H NMR ($CDCl_3$): 8.02 (m, 7H), 7.76 (m, 2H), 7.61 (m, 3H), 7.51 (m, 2H), 7.38 (m, 4H). $^{13}$C NMR ($CDCl_3$): 207.07, 141.75, 138.81, 136.17, 133.57, 133.23, 133.03, 132.45, 132.04, 131.73, 130.28, 130.16, 129.89, 129.41, 128.27, 128.09, 127.62, 126.74, 126.57, 126.34, 125.83, 125.51, 31.07. 19F NMR ($CDCl_3$): 62.59 (s). λAbs=395 nm (DCM), λfluo=425 nm (DCM). Yield (purified)=58%, Yield (sublimed)=85%. MS (m/z, %): 516.3 (M+, 100). GC retention time=4.87 minutes.

Synthesis of Compound 15 ("SF1"): 9-(4-methylphenyl)-10-phenylanthracene. The following reagents were mixed in a reaction vessel: 9-bromo-10-phenylanthracene (1.45 g, 4.35 mmol); Tetrakis(triphenylphosphine)palladium ($Pd(PPh_3)_4$, 0.75 g, 0.65 mmol); potassium carbonate ($K_2CO_3$, 1.80 g, 13.05 mmol); and 8.70 mmol of a boronic acid. In the present example, 4-methylbenzeneboronic acid (1.18 g) was used as the boronic acid. The reaction vessel containing the mixture was placed on a heating plate mantle and stirred using a magnetic stirrer. The reaction vessel was also connected to a water condenser. A well stirred 333 ml solvent mixture containing a 1:25:0.15 volumetric ratio of toluene, ethanol and water, was prepared separately in a round-bottom flask. The flask containing the solvent mixture was sealed and degassed using $N_2$ for a minimum of 30 minutes before a cannula was used to transfer the solvent mixture from the round-bottom flask to the reaction vessel without exposure to air. Once all of the solvent mixture was transferred, the reaction vessel was purged with nitrogen, and heated to a temperature of 65° C. while stirring at around 1200 RPM and left to react for at least 12 hours under a nitrogen environment. Once the reaction was determined to be complete, the mixture was cooled to room temperature before the solvent mixture was removed using a vacuum rotary evaporator. The contents of the flask were then re-dissolved in dichloromethane (DCM), and washed five times with NaOH solution, water, and brine. The organic phase was washed over magnesium sulfate and filtered. The resulting product was purified by passing through a silica gel plug column under vacuum suction. The DCM solvent was removed to produce the product in a powdered form. The powdered product was then further purified using train sublimation under reduced pressure of 20-50 mTorr and using $CO_2$ as a carrier gas. $^{1}$H NMR ($CDCl_3$): 7.72 (m, 4H), 7.58 (m, 3H), 7.49 (m, 2H), 7.41 (m, 4H), 7.33 (m, 4H), 2.55 (s, 3H). $^{13}$C NMR ($CDCl_3$): 139.28, 137.38, 137.21, 137.07, 136.10, 131.48, 131.34, 130.13, 130.03, 129.25, 128.53, 127.57, 127.20, 127.08, 125.10, 125.02, 21.55. λAbs=393 nm (iPrOH), λfluo=408.03 nm (iPrOH). Yield (purified) =53%, Yield (sublimed)=73%

Synthesis of Compound 16 ("SF7"): Synthesis of 9-(4-trifluoromethylphenyl)-10-phenylanthracene. Compound 16 was synthesized using an identical procedure to Compound 15 as described above, with the exception of 4-(trifluoromethyl)benzeneboronic acid (1.43 g, 7.52 mmol) being used as the boronic acid, which was combined with 9-bromo-10-phenylanthracene (1.25 g, 3.76 mmol), $K_2CO_3$ (1.60 g, 11.28 mmol) and $Pd(PPh_3)_4$ (0.65 g, 0.56 mmol). $^{1}$H NMR ($CDCl_3$): 7.89 (d, 2H), 7.73 (m, 2H), 7.60 (m, 7H), 7.49 (m, 2H), 7.36 (m, 4H). $^{13}$C NMR ($CDCl_3$): 143.31, 138.95, 135.32, 131.92, 131.37, 129.99, 129.86, 128.60, 127.74, 127.30, 126.48, 125.87, 125.60, 125.58, 125.27, 123.16. $^{19}$F NMR ($CDCl_3$): −62.31 (s, 3F). λAbs=392 nm (iPrOH), λfluo=406.96 nm (iPrOH). Yield (purified)=53%, Yield (sublimed)=67%.

Synthesis of Compound 17 ("SF5"): 9-(4-tert-butylphenyl)-10-phenylanthracene. Compound 17 was synthesized using an identical procedure to Compound 15 as described above, with the exception that 4-tert-butylbenzeneboronic acid (1.38 g, 7.76 mmol) was used as the boronic acid, which was combined with 9-bromo-10-phenylanthracene (1.29 g, 3.88 mmol), $K_2CO_3$ (1.61 g, 11.64 mmol) and $Pd(PPh_3)_4$ (0.67 g, 0.58 mmol). $^{1}$H NMR ($CDCl_3$): 7.72 (m, 4H), 7.58 (m, 5H), 7.50 (m, 2H), 7.42 (m, 2H), 7.33 (m, 4H), 1.49 (s, 9H). $^{13}$C NMR ($CDCl_3$): 150.41, 139.32, 137.50, 137.02, 135.99, 131.49, 131.08, 130.17, 130.04, 128.54, 127.57, 127.32, 127.05, 125.40, 125.11, 124.99, 34.90. λAbs=393 nm (iPrOH), λfluo=408.03 nm (iPrOH).

Synthesis of Compound 18 ("SF24"): 9-(3-trifluoromethylphenyl)-10-phenylanthracene. Compound 18 was synthesized using an identical procedure to Compound 15 as described above, with the exception of the volume of solvent (222 mL) and 3-(trifluoromethyl)benzeneboronic acid (0.95 g, 5.02 mmol) being used as the boronic acid, which was combined with 9-bromo-10-phenylanthracene (0.84 g, 2.51 mmol), $K_2CO_3$ (1.04 g, 7.53 mmol) and $Pd(PPh_3)_4$ (0.44 g, 0.38 mmol) at room temperature. $^{1}$H NMR ($CDCl_3$): 7.84 (m, 1H), 7.74 (m, 5H), 7.60 (m, 5H), 7.50 (m, 2H), 7.37 (m, 4H). $^{13}$C NMR ($CDCl_3$): 140.18, 138.97, 138.08, 135.19, 134.90, 131.38, 131.03, 130.00, 129.93, 129.15, 128.61, 128.23, 127.75, 127.32, 126.46, 125.68, 125.27, 124.61, 123.03. $^{19}$F NMR ($CDCl_3$): −62.38 (s, 3F). λAbs=392 nm (iPrOH), λfluo=406.06 nm (iPrOH).

Synthesis of Compound 19 ("SF8"): 9-(3-methylphenyl)-10-phenylanthracene. Compound 19 was synthesized using an identical procedure to Compound 18 as described above, with the exception of 3-methylbenzeneboronic acid (0.79 g, 5.80 mmol) being used as the boronic acid, which was combined with 9-bromo-10-phenylanthracene (0.97 g, 2.90 mmol), $K_2CO_3$ (1.20 g, 8.70 mmol) and $Pd(PPh_3)_4$ (0.51 g, 0.44 mmol). $^{1}$H NMR ($CDCl_3$): 7.72 (m, 4H), 7.56 (m, 6H), 7.34 (m, 7H), 2.49 (m, 3H). $^{13}$C NMR ($CDCl_3$): 139.28, 139.13, 138.12, 137.49, 137.10, 132.13, 131.49, 130.01, 130.01, 128.54, 128.52, 128.40, 128.31, 127.59, 127.22, 127.08, 125.11, 125.05, 21.69. λAbs=392 nm (iPrOH), λfluo=406.06 nm (iPrOH).

Synthesis of Compound 20 ("SF357"): 9-(4-Trifluoromethoxyphenyl)-10-(naphthalene-1-yl)anthracene. Compound 20 was synthesized using an identical procedure to Compound 1, except 4-trifluoromethoxyphenylboronic acid (1.49 g, 7.82 mmol) was used as the boronic acid. $^{1}$H NMR (400 MHz, $CDCl_3$) δ 8.06 (d, J=8.2 Hz, 1H), 8.01 (d, J=8.3 Hz, 1H), 7.86-7.67 (m, 5H), 7.61 (d, J=8.8 Hz, 2H), 7.55 (d, J=6.3 Hz, 1H), 7.52-7.41 (m, 3H), 7.37-7.30 (m, 2H), 7.27-7.18 (m, 3H), 7.13 (t, J=7.6 Hz, 1H). λAbs,max=376 nm (DCM), λfluo,max=430 nm (DCM).

Synthesis of Compound 21 ("SF170"): 9-(4-trifluorophenyl)-10-(phenanthrene-1-yl) anthracene. The following reagents were mixed in a 500 mL reaction vessel: 9-bromo-10-(phenanthracene-10-yl)anthracene (1.500 g, 3.91 mmol); tetrakis(triphenylphosphine) palladium(0) ($Pd(PPh_3)_4$, 0.678 g, 0.587 mmol); potassium carbonate ($K_2CO_3$, 1.623 g, 11.7 mmol); and 7.82 mmol of a boronic acid. In the present example, 4-Trifluoromethylphenylboronic acid (1.49 g) was used as the boronic acid. The reaction vessel containing the mixture was placed on a heating plate mantle and stirred using a magnetic stirrer. The reaction vessel was also connected to a water condenser. A well stirred 300 ml solvent mixture containing a 25:3 volumetric ratio of N,N-dimethylformamide (DMF) and water was prepared separately in a round-bottom flask. The flask containing the solvent mixture was sealed and degassed using $N_2$ for a minimum of 30 minutes before a cannula was used to transfer the solvent mixture from the round-bottom flask to the reaction vessel without exposure to air. Once all of the solvent mixture was transferred, the reaction vessel was purged with nitrogen, and heated to a temperature of 65° C. while stirring at around 1200 RPM and left to react for at least 12 hours under a nitrogen environment. Once the reaction was determined to be complete, the mixture was cooled to room temperature before being transferred to a 2 L beaker. 1500 mL of water was slowly added to the beaker while gently stirring the mixture to cause separation into two phases. The precipitate was filtered out and dried to produce a powdered product. The powdered product was then further purified using train sublimation under reduced pressure of 20-50 mTorr and using $CO_2$ as a carrier gas. An observed yield of 139.2 mol % (2.40 g) was obtained after synthesis, and an overall molar yield of 63.2 mol %, after train sublimation. GC/MS elution time 12.136 min with an abundance of 6.5×106. $^1H$ NMR (400 MHz, $CDCl_3$) δ 8.87 (dd, J=8.4, 3.6 Hz, 2H), 7.90 (t, J=7.1 Hz, 3H), 7.85 (s, 1H), 7.81-7.74 (m, 1H), 7.74-7.69 (m, 1H), 7.65 (dd, J=13.9, 7.8 Hz, 5H), 7.58 (d, J=8.8 Hz, 2H), 7.37-7.29 (m, 3H), 7.24-7.18 (m, 3H). λAbs,max=377 nm (DCM), λfluo,max=432 nm (DCM).

Synthesis of Compound 22 ("SF173"): 9-(4-Tert-butylpheny)-10-(phenanthrene-1-yl)anthracene. Compound 22 was synthesized using an identical procedure to compound 21 as described above, with the exception that 4-Tert-butylphenylboronic acid (1.39 g, 7.82 mmol) was used as the boronic acid. An observed yield of 100.3 mol % (1.69 g) was obtained after synthesis, and an overall molar yield of 67.1 mol %, after train sublimation. GC/MS elution time 22.185 min with an abundance of 1.1×106. $^1H$ NMR (400 MHz, $CDCl_3$) δ 8.06 (d, J=8.3 Hz, 2H), 8.01 (d, J=8.2 Hz, 2H), 7.73-7.61 (m, 6H), 7.56-7.32 (m, 10H), 7.27-7.06 (m, 10H). λAbs,max=378 nm (DCM), λfluo,max=436 nm (DCM).

In addition to the above, the following Compounds 23-36 were synthesized: 9-(3-(naphthalen-1-yl)phenyl)-10-(naphthalen-1-yl)anthracene (Compound 23 ("SF168")); 9-(3-(naphthalen-1-yl)phenyl)-10-(phenanthren-9-yl)anthracene (Compound 24 ("SF169")); 2,6-bis(4-fluorophenyl)-9,10-di(naphthalen-2-yl)anthracene (Compound 25 ("SF3")); 2,6-bis(4-tert-butyl)phenyl)-9,10-di(naphthalen-2-yl)anthracene (Compound 26 ("SF2")); 9,10-di(naphthalen-2-yl)-2-(4-(trifluoromethyl)phenyl)anthracene (Compound 27 ("SF 157")); 9-(4-trifluoromethoxyphenyl)-10-(naphthalene-2-yl)anthracene (Compound 28 ("SF315")); 9,10-diphenylanthracene (Compound 29); 9-(4-methoxyphenyl)-10-phenylanthracene (Compound 30); 9-(4-fluorophenyl)-10-phenylanthracene (Compound 31); 9-phenyl-10-(3,4,5-trifluorophenyl)anthracene (Compound 32); 9-(2-methylphenyl)-10-phenylanthracene (Compound 33); 9-phenyl-10-(phenanthren-9-yl)anthracene (Compound 34); 9-(3-chloro-4-fluorophenyl)-10-phenylanthracene (Compound 35 ("SF0")); and 9-(3,4,5-trifluorophenyl)-10-(phenanthren-9-yl)anthracene (Compound 36 ("SF171")).

Compound 29

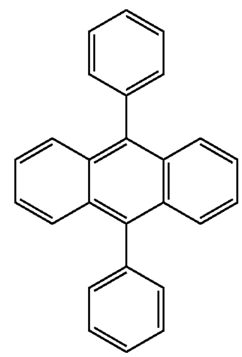

Compound 30

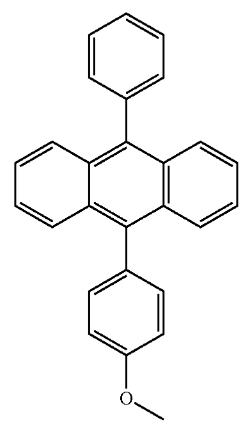

Compound 31

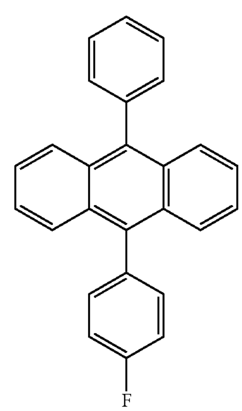

-continued

Compound 32

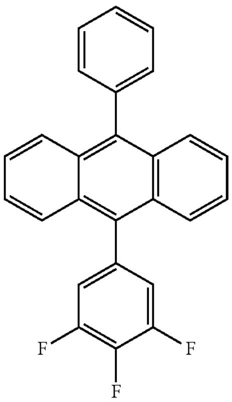

Compound 33

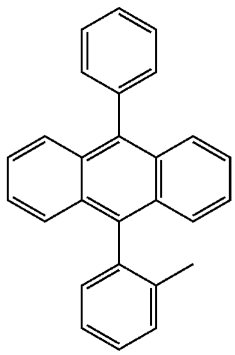

Compound 34

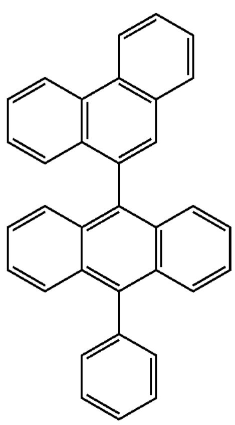

Example 1: Low Rate Evaluation of Compounds 1-5. In order to characterize an effect of using various materials to form a nucleation inhibiting coating, a series of samples were prepared using each of Compounds 1 to 5 to form the nucleation inhibiting coating.

As used in the examples herein, a reference to a layer thickness of a material refers to an amount of the material deposited on a target surface (or target region(s) of the surface in the case of selective deposition), which corresponds to an amount of the material to cover the target surface with a uniformly thick layer of the material having the referenced layer thickness. By way of example, depositing a layer thickness of 10 nm indicates that an amount of the material deposited on the surface corresponds to an amount of the material to form a uniformly thick layer of the material that is 10 nm thick. It will be appreciated that, for example, due to possible stacking or clustering of molecules or atoms, an actual thickness of the deposited material may be non-uniform. For example, depositing a layer thickness of 10 nm may yield some portions of the deposited material having an actual thickness greater than 10 nm, or other portions of the deposited material having an actual thickness less than 10 nm. A certain layer thickness of a material deposited on a surface can correspond to an average thickness of the deposited material across the surface.

A series of samples were fabricated by depositing an approximately 20 nm thick organic layer formed by 2-(4-(9,10-di(naphthalene-2-yl)anthracene-2-yl)phenyl)-1-phenyl-1H-benzo-[D]imidazole (LG201) over a glass substrate, followed by deposition of a nucleation inhibiting coating having a thickness of about 30 nm over the LG201 organic layer. The surface of the nucleation inhibiting coating was then subjected to open mask deposition of magnesium. Each sample was subjected to a magnesium vapor flux having an average evaporation rate of about 2.5 Å/s. In conducting the deposition of the magnesium coating, a deposition time of about 2000 seconds was used in order to obtain a reference layer thickness of magnesium of about 500 nm.

Once the samples were fabricated, optical transmission measurements were taken to determine the relative amount of magnesium deposited on the surface of the nucleation inhibiting coating. As will be appreciated, relatively thin magnesium coatings having, for example, thickness of less than a few nm are substantially transparent. However, light transmission decreases as the thickness of the magnesium coating is increased. Accordingly, the relative performance of various nucleation inhibiting coating materials may be assessed by measuring the light transmission through the samples, which directly correlates to the amount or thickness of magnesium coating deposited thereon from the magnesium deposition process. The material used to form the nucleation inhibiting coating in each sample, and the optical transmission measurement for each sample are summarized in Table 3 below. In calculating the optical transmission measurement, any loss or absorption of light caused by the presence of the glass substrate, the LG201 organic layer, and the nucleation inhibiting coating was subtracted from the measured transmittance. As such, the optical transmission value provided in Table 3 reflects solely the transmission of light (taken at wavelength of about 550 nm) through any magnesium coating which may be present on the surface of the nucleation inhibiting coating.

TABLE 3

Table of Optical Transmission Measurement Data

| Nucleation Inhibiting Coating Material | Optical Transmission (%) |
|---|---|
| Compound 1 | 100 |
| Compound 2 | 97 |
| Compound 3 | 96 |
| Compound 4 | 99 |
| Compound 5 | 100 |

Example 2: Low Rate Evaluation of Compounds 6-22. In order to characterize an effect of using various materials to form a nucleation inhibiting coating, a series of samples were prepared using each of Compounds 6, 7 and 9 to 22 for forming the nucleation inhibiting coating.

The series of samples were fabricated by depositing a nucleation inhibiting coating over glass substrate. The surface of the nucleation inhibiting coating was then subjected to open mask deposition of magnesium. Each sample was subjected to a magnesium vapor flux having an average evaporation rate of about 2 Å/s. In conducting the deposition of the magnesium coating, a deposition time of about 1000 seconds was used in order to obtain a reference layer thickness of magnesium of about 200 nm.

The material used to form the nucleation inhibiting coating in each sample, and the optical transmission measurement for each sample are summarized in Table 4 below.

TABLE 4

Table of Optical Transmission Measurement Data

| Nucleation Inhibiting Coating Material | Optical Transmission (%) |
|---|---|
| Compound 6 | 100 |
| Compound 7 | 100 |
| Compound 9 | 98 |
| Compound 10 | 98 |
| Compound 11 | 100 |
| Compound 12 | 99 |
| Compound 13 | 99 |
| Compound 14 | 98 |
| Compound 15 | 93 |
| Compound 16 | 100 |
| Compound 17 | 99 |
| Compound 18 | 100 |
| Compound 19 | 100 |
| Compound 20 | 98 |
| Compound 21 | 99 |
| Compound 22 | 100 |
| Compound 29 | 0 |
| Compound 30 | 0 |
| Compound 31 | 0 |
| Compound 32 | 19 |
| Compound 33 | 17 |
| Compound 34 | 0 |

Based on the above, it can be seen that relatively high optical transmission of above 90% was measured for samples fabricated using Compounds 1 to 7 and 9 to 22 as the nucleation inhibiting coating material. As explained above, high optical transmission can directly be attributed to a relatively small amount of magnesium coating, if any, being present on the surface of the nucleation inhibiting coating to absorb the light being transmitted through the sample. Accordingly, these nucleation inhibiting coating materials generally exhibit relatively low affinity or initial sticking probability to magnesium and thus may be particularly useful for achieving selective deposition and patterning of magnesium coating in certain applications. In contrast, samples fabricated using Compounds 29 to 34 as the nucleation inhibiting coating material exhibited relatively low or no optical transmission, indicating that a substantial thickness of magnesium coating was deposited. Accordingly, Compounds 29-34 have been found to generally perform poorly as a nucleation inhibiting coating material.

As used in this and other examples described herein, a reference layer thickness refers to a layer thickness of magnesium that is deposited on a reference surface exhibiting a high initial sticking coefficient (e.g., a surface with an initial sticking coefficient of about or close to 1.0). Specifically, for these examples, the reference surface was a surface of a quartz crystal positioned inside a deposition chamber for monitoring a deposition rate and the reference layer thickness. In other words, the reference layer thickness does not indicate an actual thickness of magnesium deposited on a target surface (i.e., a surface of the nucleation inhibiting coating). Rather, the reference layer thickness refers to the layer thickness of magnesium that would be deposited on the reference surface upon subjecting the target surface and reference surface to identical magnesium vapor flux for the same deposition period (i.e. the surface of the quartz crystal). As would be appreciated, in the event that the target surface and reference surface are not subjected to identical vapor flux simultaneously during deposition, an appropriate tooling factor may be used to determine and monitor the reference thickness.

Example 3: High Rate Evaluation of Compounds 1-5. In order to determine what effects the magnesium evaporation rate may have on the nucleation inhibiting properties of various materials, a series of samples were prepared using each of compounds 1-5 to form the nucleation inhibiting coating and then exposed to relatively high magnesium vapor flux. A series of samples were fabricated by depositing an approximately 20 nm thick organic layer formed LG201 over a glass substrate, followed by deposition of a nucleation inhibiting coating having a thickness of about 30 nm over the LG201 organic layer. The samples were subjected to a magnesium flux having an average deposition rate of about 10 Å/s, as measured using the reference surface. In conducting the deposition of the magnesium coating, a deposition time of about 500 seconds was used in order to obtain a reference layer thickness of magnesium of about 500 nm.

Once the samples were fabricated, optical transmission measurements were taken to determine the relative amount of magnesium deposited on the surface of the nucleation inhibiting coating. The thickness of the nucleation inhibiting coating and the optical transmission measurement for each sample is summarized in Table 4 below. In calculating the optical transmission measurement, any loss or absorption of light caused by the presence of the glass substrate and the nucleation inhibiting coating was subtracted from the measured transmittance. As such, the optical transmission value provided in Table 4 reflects solely the transmission of light (taken at wavelength of about 550 nm) through any magnesium coating which may be present on the surface of the nucleation inhibiting coating.

TABLE 5

Table of Optical Transmission Measurement Data

| Nucleation Inhibiting Coating Material | Optical Transmission (%) |
|---|---|
| Compound 1 | 1 |
| Compound 2 | 6 |
| Compound 3 | 26 |
| Compound 4 | 100 |
| Compound 5 | 66 |

Example 4: High Rate Evaluation of Compounds 6-22. In order to determine what effects the magnesium evaporation rate may have on the nucleation inhibiting properties of various materials, a series of samples were prepared using each of compounds 6-22 to form the nucleation inhibiting coating and then exposed to relatively high magnesium vapor flux. A series of samples were fabricated by depositing a nucleation inhibiting coating over glass substrates. The samples were subjected to a magnesium flux having an average deposition rate of about 10 Å/s, as measured using the reference surface. In conducting the deposition of the magnesium coating, a deposition time of about 200 seconds was used in order to obtain a reference layer thickness of magnesium of about 200 nm.

Once the samples were fabricated, optical transmission measurements were taken to determine the relative amount of magnesium deposited on the surface of the nucleation inhibiting coating. The thickness of the nucleation inhibiting coating and the optical transmission measurement for each sample is summarized in Table 6 below. In calculating the optical transmission measurement, any loss or absorption of light caused by the presence of the glass substrate and the nucleation inhibiting coating was subtracted from the measured transmittance. As such, the optical transmission value provided in Table 6 reflects solely the transmission of light (taken at wavelength of about 550 nm) through any magnesium coating which may be present on the surface of the nucleation inhibiting coating.

TABLE 6

Table of Optical Transmission Measurement Data

| Nucleation Inhibiting Coating Material | Optical Transmission (%) |
|---|---|
| Compound 6 | 100 |
| Compound 7 | 92 |
| Compound 8 | 100 |
| Compound 9 | 97 |
| Compound 10 | 97 |
| Compound 11 | 100 |
| Compound 12 | 33 |
| Compound 13 | 35 |
| Compound 14 | 49 |
| Compound 15 | 0 |
| Compound 16 | 90 |
| Compound 17 | 97 |
| Compound 18 | 0 |
| Compound 19 | 46 |
| Compound 20 | 36 |
| Compound 21 | 97 |
| Compound 22 | 100 |
| Compound 29 | 0 |
| Compound 30 | 0 |
| Compound 31 | 0 |
| Compound 32 | 0 |
| Compound 33 | 0 |
| Compound 34 | 0 |

Based on the above, it can be seen that relatively high optical transmission of above 90% was measured only for sample fabricated using Compounds 4, 6, 7, 8, 9, 10, 11, 1 6, 17, 21 and 22 as the nucleation inhibiting coating material. As explained above, high optical transmission can directly be attributed to a relatively small amount of magnesium coating, if any, being present on the surface of the nucleation inhibiting coating. Accordingly, such nucleation inhibiting coating material may be particularly useful for achieving selective deposition and patterning of magnesium coating in certain applications. For example, such material may be particularly suitable for applications in which the deposition rate of magnesium coating is substantially higher than about 2 Å/s. In addition, samples fabricated using Compounds 29 to 34 as the nucleation inhibiting coating material exhibited no optical transmission, indicating that a substantial thickness of magnesium coating was deposited. Accordingly, Compounds 29-34 have been found to generally perform poorly as a nucleation inhibiting coating material.

The samples fabricated using Compound 5, 12, 13, 14, 19 and 20 as the nucleation inhibiting coating material exhibited optical transmission of about 66%, 33%, 35%, 49%, 46%, and 36%, respectively. While it is generally more favorable to use a material exhibiting higher optical transmission and thus superior nucleation inhibiting properties (i.e. low initial sticking probability) for applications requiring highly selective deposition of magnesium coating, materials such as Compound 5, 12, 13, 14, 19 and 20 may nevertheless be useful in forming the nucleation inhibiting coating for certain applications.

Samples fabricated using Compounds 1, 2, 15 and 18 all exhibited relatively low optical transmission. In particular, samples fabricated using Compound 15 and Compound 18 exhibited no transmission. This is indicative of a relatively large amount or thick layer of magnesium coating being deposited on the surface of the nucleation inhibiting coating, which results in significant absorption of light. Accordingly, these materials may be undesirable for use in achieving selective deposition of magnesium coating, particularly in applications requiring selective deposition of a relatively thick magnesium coating at a high deposition rate greater than about 2 Å/s (e.g. deposition rate of about 10 Å/s).

By comparing the results of Example 3 and 4 to those of Example 1 and 2, it has been determined, somewhat surprisingly, that some materials substantially inhibit deposition of magnesium thereon when subjected to magnesium vapor flux at relatively low deposition rate or evaporation rate, but the degree to which magnesium deposition is inhibited is substantially decreased when a relatively high deposition rate or evaporation rate of magnesium is used. In other words, it has been observed that selective deposition of magnesium coating may be successfully achieved using certain nucleation inhibiting coating materials (such as, for example, Compounds 1, 2, 15, and 18) at relatively low magnesium deposition rate of about 2 Å/s. However, at relatively high deposition rate of about 10 Å/s, highly selective deposition of magnesium coating could not successfully be achieved using the same nucleation inhibiting coating materials.

It has also been observed that some nucleation inhibiting coating materials appear to be effective at inhibiting deposition of magnesium thereon, irrespective of the magnesium deposition rate used in these examples. Based on the experimental results, Compounds 4, 6, 7, 8, 9, 10, 11, 16, 17, 21, and 22 may be used to form an effective nucleation inhibiting coating for achieving highly selective deposition of magnesium coating at magnesium deposition rate of at least up to about 10 Å/s.

In addition, it has also been found that samples fabricated similarly to those of Example 4 except using Compounds 23-28, 35 and 36 as the nucleation inhibiting coating also exhibited relatively high light transmission, thus indicating that such materials may also be suitable for forming the nucleation inhibiting coating in at least some applications.

Without wishing to be bound by a particular theory, it is postulated, based on the theory of nucleation and growth discussed above, that surfaces formed by depositing materials such as Compound 1 generally exhibit a relatively low desorption energy ($E_{des}$) for adsorbed magnesium adatoms, a high activation energy ($E_S$) for diffusion of a magnesium adatom, or both. In this way, the critical nucleation rate ($\dot{N}_i$), which is determined according to the equation below, remains relatively low even when the vapor impingement rate of magnesium ($\dot{R}$) is increased, thus substantially inhibiting deposition of magnesium.

$$\dot{N}_i = \dot{R} a_0^2 n_0 \left(\frac{\dot{R}}{v n_0}\right)^i \exp\left(\frac{(i+1)E_{des} - E_S + E_i}{kT}\right)$$

It is postulated that the temperature of the substrate may be increased when the vapor impingement rate (i.e. the evaporation rate) is increased. For example, the evaporation source is typically operated at a higher temperature when the evaporation rate is increased. Accordingly, at higher evaporation rate, the substrate may be subjected to higher level of thermal radiation, which can heat up the substrate. Other factors, which may result in increased substrate temperature, include heating of the substrate caused by energy transfer from greater number of evaporated molecules being incident on the substrate surface, as well as increased rate of condensation or desublimation of molecules on the substrate surface releasing energy in the process and causing heating.

For further clarity, the term "selectivity" when used in the context of nucleation inhibiting coating would generally be understood to refer to the degree to which the nucleation inhibiting coating inhibits or prevents deposition of the conductive coating thereon, upon being subjected to the vapor flux of the material used to form the conductive coating. For example, a nucleation inhibiting coating exhibiting relatively high selectivity for magnesium would generally better inhibit or prevent deposition of magnesium coating thereon compared to a nucleation inhibiting coating having relatively low selectivity. In general, it has been observed that a nucleation inhibiting coating exhibiting relatively high selectivity would also exhibit relatively low initial sticking probability, and a nucleation inhibiting coating exhibiting relatively low selectivity would exhibit relatively high initial sticking probability.

Figure 39:
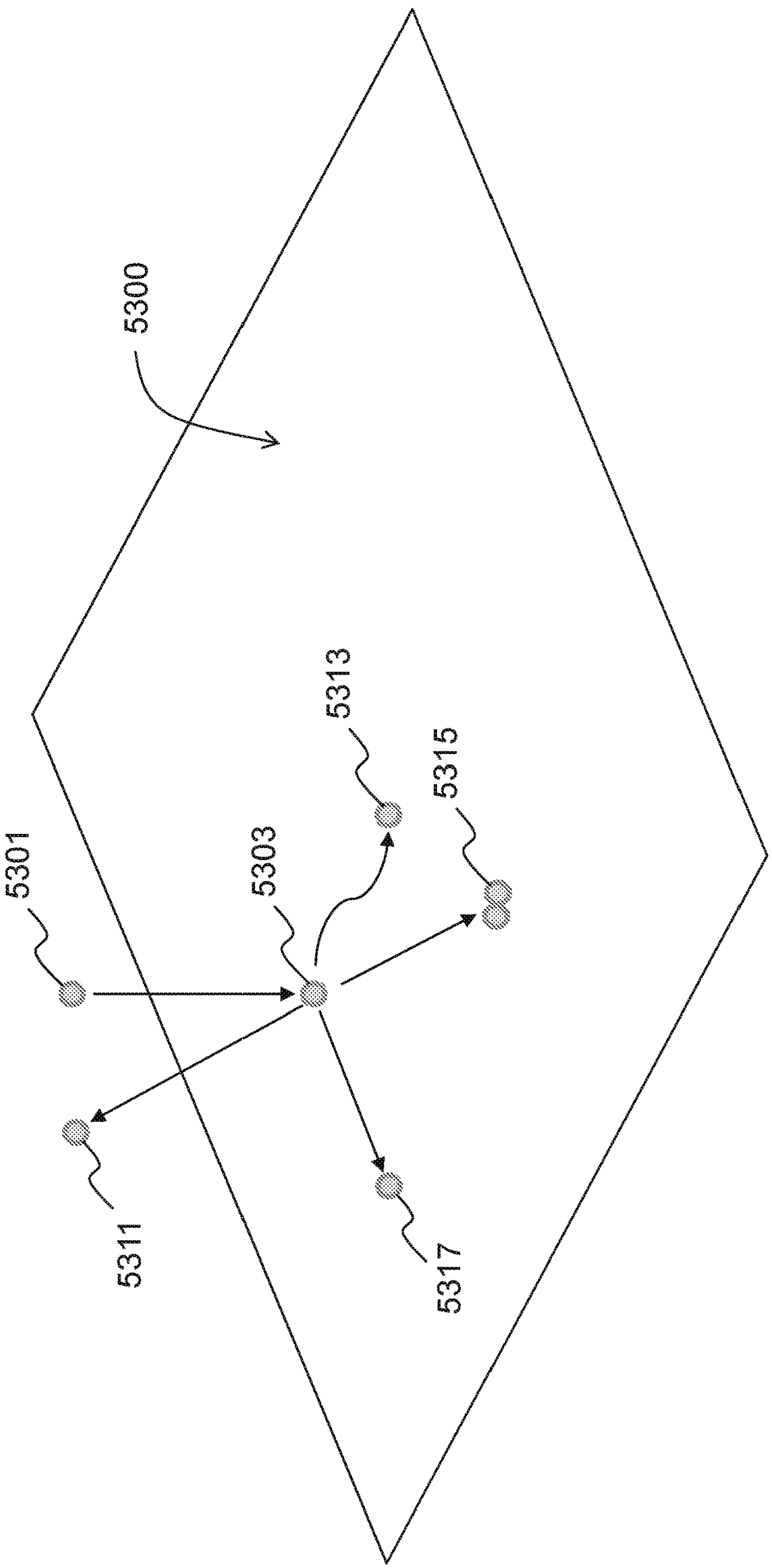
FIG. 39 is a schematic diagram illustrating various events taken into consideration under an example simulation model.

Example 4. A series of kinetic Monte Carlo (KMC) calculations were conducted to simulate the deposition of metallic adatoms on surfaces exhibiting various activation energies. Specifically, the calculations were conducted to simulate the deposition of metallic adatoms, such as magnesium adatoms, on surfaces having varying activation energy levels associated with desorption ($E_{des}$), diffusion ($E_s$), dissociation ($E_i$), and reaction to the surface ($E_b$) by subjecting such surfaces to evaporated vapor flux at a constant rate of monomer flux. FIG. 39 is a schematic illustration of the various "events" taken into consideration for the current example. In FIG. 39, an atom 5301 in the vapor phase is illustrated as being incident onto a surface 5300. Once the atom 5301 is adsorbed onto the surface 5300, it becomes an adatom 5303. The adatom 5303 may undergo various events including: (i) desorption, upon which a desorbed atom 5311 is created; (ii) diffusion, which gives rise to an adatom 5313 diffusing on the surface 5300; (iii) nucleation, in which a critical number of adatoms 5315 cluster to form a nucleus; and (iv) reaction to the surface, in which an adatom 5317 is reacted and becomes bound to the surface 5300.

The rate (R) at which desorption, diffusion, or dissociation occurs is calculated from the frequency of attempt (ω), activation energy of the respective event (E), the Boltzmann constant ($k_B$), and the temperature of the system (T), in accordance with the equation provided below:

$$R = \omega \exp\left(\frac{-E}{k_B T}\right)$$

For the purpose of the above calculations, i, the critical cluster size (i.e. critical number of adatoms to form a stable nucleus) was selected to be 2. The activation energy of diffusion for adatom-adatom interaction was selected to be greater than about 0.6 eV, the activation energy of desorption for adatom-adatom interaction was selected to be greater than about 1.5 eV, and the activation energy of desorption for adatom-adatom interaction was selected to be greater than about 1.25 times the activation energy of desorption for surface-adatom interaction. The above values and conditions were selected based on the values reported for magnesium-magnesium interactions. For the purpose of the simulations, a temperature (T) of 300 K was used. The calculations were repeated using values reported for other metal adatom-metal adatom activation interactions, such as that of tungsten-tungsten. The above referenced values have been reported, for example, in Neugbauer, C. A., 1964, *Physics of Thin Films,* 2, 1, *Structural Disorder Phenomena in Thin Metal Films.*

Based on the results of the simulations, a cumulative sticking probability was determined by calculating the fraction of the number of adsorbed monomers which remain on a surface ($N_{ads}$) out of the total number of monomers which impinged on the surface ($N_{total}$) over a simulated period, in accordance with the equation provided below:

$$S = \frac{N_{ads}}{N_{total}}$$

The simulations were conducted to simulate depositions using a vapor flux rate corresponding to about 2 Å/s over a deposition period greater than about 8 minutes, which corresponded to a time period for depositing a film having a reference thickness greater than about 96 nm.

For typical surfaces, the desorption activation energy ($E_{des}$) is generally greater than or equal to the diffusion activation energy ($E_s$). Based on the simulations, it has now been found, at least in some cases, that surfaces exhibiting a relatively small difference between the desorption activation energy ($E_{des}$) and the diffusion activation energy ($E_s$) may be particularly useful in acting as surfaces of nucleation inhibiting coatings. In some embodiments, the desorption activation energy is greater than or equal to the diffusion activation energy of the surface and is less than or equal to about 1.1 times, less than or equal to about 1.3 times, less than or equal to about 1.5 times, less than or equal to about 1.6 times, less than or equal to about 1.75 times, less than or equal to about 1.8 times, less than or equal to about 1.9 times, less than or equal to about 2 times, or less than or equal to about 2.5 times the diffusion activation energy of the surface. In some embodiments, the difference (e.g., in terms of absolute value) between the desorption activation energy and the diffusion activation energy is less than about or equal to about 0.5 eV, less than or equal to about 0.4 eV, less than or equal to about 0.35 eV, and more preferably less than or equal to about 0.3 eV, or less than or equal to about 0.2 eV. In some embodiments, the difference between the desorption activation energy and the diffusion activation energy is between about 0.05 eV and about 0.4 eV, between about 0.1 eV and about 0.3 eV, or between about 0.1 eV and about 0.2 eV.

It has also now been found, at least in some cases, that surfaces exhibiting a relatively small difference between the desorption activation energy ($E_{des}$) and the dissociation activation energy ($E_i$) may be particularly useful in acting as surfaces of nucleation inhibiting coatings. In some embodiments, the desorption activation energy ($E_{des}$) is less than or equal to a multiplier times the dissociation activation energy ($E_i$). In some embodiments, the desorption activation energy is less than or equal to about 1.5 times, less than or equal to about 2 times, less than or equal to about 2.5 times, less than or equal to about 2.8 times, less than or equal to about 3 times, less than or equal to about 3.2 times, less than or equal to about 3.5 times, less than or equal to about 4 times, or less than or equal to about 5 times the dissociation activation energy of the surface.

It has also now been found, at least in some cases, that surfaces exhibiting a relatively small difference between the diffusion activation energy ($E_s$) and the dissociation activation energy ($E_i$) may be particularly useful in acting as surfaces of nucleation inhibiting coatings. In some embodiments, the diffusion activation energy ($E_s$) is less than or equal to a multiplier times the dissociation activation energy ($E_i$). In some embodiments, the diffusion activation energy is less than or equal to about 2 times, less than or equal to about 2.5 times, less than or equal to about 2.8 times, less than or equal to about 3 times, less than or equal to about 3.2 times, less than or equal to about 3.5 times, less than or equal to about 4 times, or less than or equal to about 5 times the dissociation activation energy of the surface.

In some embodiments, the relationship between the desorption activation energy ($E_{des}$), the diffusion activation energy ($E_s$), and the dissociation activation energy ($E_i$) of a surface of a nucleation inhibiting coating may be represented as follows:

$$E_{des} \leq \alpha * E_s \leq \beta * E_i$$

wherein α may be any number selected from a range of between about 1.1 and about 2.5, and β may be any number selected from a range of between about 2 and about 5. In some further embodiments, α may be any number selected from a range of between about 1.5 and about 2, and β may be any number selected from a range of between about 2.5 and about 3.5. In another further embodiment, α is selected to be about 1.75 and β is selected to be about 3.

It has now been found that surfaces having the following relationship may, at least in certain cases, exhibit a cumulative sticking probability of less than about 0.1 for magnesium vapor:

$$E_{des} \leq 1.75 * E_s \leq 3 * E_i$$

Accordingly, surfaces having the above activation energy relationship may be particularly advantageous for use as surfaces of nucleation inhibiting coatings in some embodiments.

It has also now been found that surfaces which, in addition to the above activation energy relationships, exhibit a relatively small difference of less than or equal to about 0.3 eV between the diffusion activation energy and the dissociation activation energy may be particularly useful in certain applications, in which a cumulative sticking probability less than about 0.1 is desired. The energy difference ($\Delta E_{s-i}$) between the diffusion activation energy ($E_s$) and the dissociation activation energy ($E_i$) may be calculated according to the following equation:

$$\Delta E_{s-i} = E_s - E_i$$

For example, it has now been found that, at least in some cases, surfaces wherein the energy difference between the diffusion activation energy and the dissociation activation energy is less than or equal to about 0.25 eV exhibits a cumulative sticking probability of less than or equal to about 0.07 for magnesium vapor. In other examples, AEs, less than or equal to about 0.2 eV results in a cumulative sticking probability of less than or equal to about 0.05, $\Delta E_{s-i}$ less than or equal to about 0.1 eV results in a cumulative sticking probability of less than or equal to about 0.04, and $\Delta E_{s-1}$ less than or equal to about 0.05 eV results in a cumulative sticking probability of less than or equal to about 0.025.

Accordingly, in some embodiments, surfaces are characterized by: a is any number selected from a range of between about 1.1 and about 2.5, or more preferably a range of between about 1.5 and about 2, such as for example about 1.75, and β is any number selected from a range of between about 2 and about 5, or more preferably a range of between about 2.5 and about 3.5, such as for example about 3, in the following inequality relationship:

$$E_{des} \leq \alpha * E_s \leq \beta * E_i$$

and wherein $\Delta E_{s-i}$ calculated according to the following equation is less than or equal to about 0.3 eV, less than or equal to about 0.25 eV, less than or equal to about 0.2 eV, less than or equal to about 0.15 eV, less than or equal to about 0.1 eV, or less than or equal to about 0.05 eV in the following equation:

$$\Delta E_{s-i} = E_s - E_i$$

The results of the calculations were also analyzed to determine the simulated initial sticking probability, which, in the present example, was specified to be the sticking probability of magnesium on a surface upon depositing onto such surface that yields a magnesium coating having an average thickness of about 1 nm. Based on the analysis of the results, it has now been found that, at least in some cases, surfaces wherein the desorption activation energy ($E_{des}$) is less than about 2 times the diffusion activation energy ($E_s$), and the diffusion activation energy ($E_s$) is less than about 3 times the dissociation activation energy ($E_i$) generally exhibits a relatively low initial sticking probability of less than about 0.1.

Without wishing to be bound by any particular theory, it is postulated that the activation energies of various events and the respective relationships between these energies as described above would generally apply to surfaces wherein the activation energy of adatom reaction to the surface ($E_b$) is greater than the desorption activation energy ($E_{des}$). For surfaces wherein the activation energy of adatom reaction to the surface ($E_b$) is less than the desorption activation energy ($E_{des}$), it is postulated the initial sticking probability of adatoms on such surface would generally be greater than about 0.1.

It would be appreciated that various activation energies described above are treated as non-negative values measured in any unit of energy, such as in electron volt (eV). In such cases, the various inequalities and equations relating to activation energies discussed above may be generally applicable.

While simulated values of various activation energies have been discussed above, it will be appreciated that these activation energies may also be experimentally measured and/or derived using various techniques. Examples of techniques and instruments which may be used for such purpose include, but are not limited to, thermal desorption spectroscopy, field ion microscopy (FIM), scanning tunneling microscopy (STM), transmission electron microscopy (TEM), and neutron activation-tracer scanning (NATS).

Generally, various activation energies described herein may be derived by conducting quantum chemistry simulations if the general composition and structure of the surface and adatoms are specified (e.g. through experimental measurements and analysis). For simulations, quantum chemistry simulations using methods such as, for example, single energy points, transition states, energy surface scan, and local/global energy minima may be used. Various theories such as, for example, Density Functional Theory (DFT), Hartree-Fock (HF), Self Consistent Field (SCF), and Full Configuration Interaction (FCI) may be used in conjunction with such simulation methods. As would be appreciated, various events such as diffusion, desorption and nucleation may be simulated by examining the relative energies of the initial state, the transition state and the final state. For example, the relative energy difference between the transition state and the initial state may generally provide a relatively accurate estimate of the activation energy associated with various events.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component, or "covering" or which "covers" another component, can encompass cases where the former component is directly on (e.g., in physical contact with) the latter component, as well as cases where one or more intervening components are located between the former component and the latter component.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

Although the present disclosure has been described with reference to certain specific embodiments, various modifications thereof will be apparent to those skilled in the art. Any examples provided herein are included solely for the purpose of illustrating certain aspects of the disclosure and are not intended to limit the disclosure in any way. Any drawings provided herein are solely for the purpose of illustrating certain aspects of the disclosure and may not be drawn to scale and do not limit the disclosure in any way. The scope of the claims appended hereto should not be limited by the specific embodiments set forth in the above description, but should be given their full scope consistent with the present disclosure as a whole. The disclosures of all documents recited herein are incorporated herein by reference in their entirety.

Other embodiments are set forth in the following claims.

What is claimed is:

1. An opto-electronic device comprising:

a nucleation inhibition coating (NIC) disposed on a first layer surface of the device in a first portion of a lateral aspect thereof; and a conductive coating disposed on a second layer surface of the device in a second portion of the lateral aspect thereof; and wherein:

the NIC comprises a compound of Formula (I)

Formula (I)

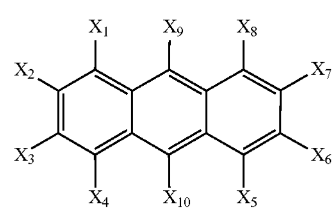

wherein at least two of $X_1$ to $X_{10}$ are each independently selected from the group consisting of: (I-A), (I-B), (I-C), (I-D), (I-E), (I-F), and (I-G), and the remainder of $X_1$ to $X_{10}$ are each independently selected from the group consisting of: H, D (deutero), F, Cl, alkyl, cycloalkyl, silyl, fluoroalkyl, arylalkyl, aryl, heteroaryl, alkoxy, and fluoroalkoxy;

(I-A)

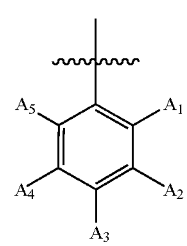

wherein in (I-A), $A_1$, $A_2$, $A_3$, $A_4$, and $A_5$ are each independently selected from the group consisting of H, D (deutero), F, Cl, alkyl, cycloalkyl, silyl, fluoroalkyl, arylalkyl, aryl, heteroaryl, alkoxy, and fluoroalkoxy;

(I-B)

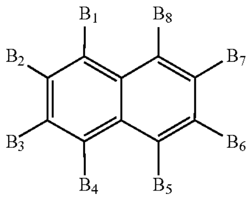

wherein in (I-B), at least one of $B_1$, $B_2$, $B_3$, $B_4$, $B_5$, $B_6$, $B_7$, and $B_8$ represents an attachment to Formula (I), and the remainder of $B_1$, $B_2$, $B_3$, $B_4$, $B_5$, $B_6$, $B_7$, and $B_8$ are each independently selected from the group consisting of H, D (deutero), F, Cl, alkyl, cycloalkyl, silyl, fluoroalkyl, arylalkyl, aryl, heteroaryl, alkoxy, and fluoroalkoxy;

(I-C)

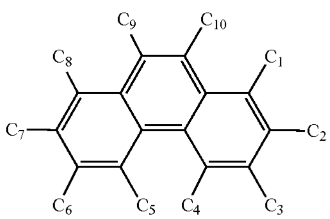

wherein in (I-C), at least one of $C_1$, $C_2$, $C_3$, $C_4$, $C_5$, $C_6$, $C_7$, $C_8$, $C_9$, and $C_{10}$ represents an attachment to Formula (I); and the remainder of $C_1$, $C_2$, $C_3$, $C_4$, $C_5$, $C_6$, $C_7$, $C_8$, $C_9$, and $C_{10}$ are each independently selected from the group consisting of: H, D (deutero), F, Cl, alkyl, cycloalkyl, silyl, fluoroalkyl, arylalkyl, aryl, heteroaryl, alkoxy, and fluoroalkoxy;

(I-D)

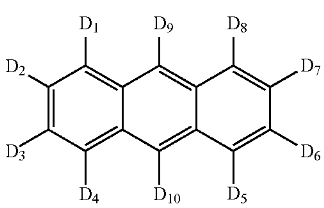

wherein in (I-D), at least one of the $D_1$, $D_2$, $D_3$, $D_4$, $D_5$, $D_6$, $D_7$, $D_8$, $D_9$, and $D_{10}$ represents an attachment to Formula (I), and the remainder of $D_1$, $D_2$, $D_3$, $D_4$, $D_5$, $D_6$, $D_7$, $D_8$, $D_9$, and $D_{10}$ are each independently selected from the group consisting of: H, D (deutero), F, Cl, alkyl, cycloalkyl, silyl, fluoroalkyl, arylalkyl, aryl, heteroaryl, alkoxy, and fluoroalkoxy;

(I-E)

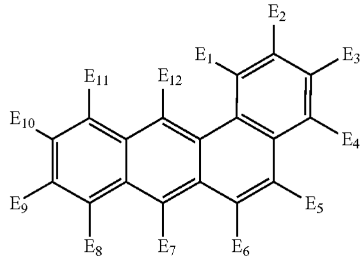

wherein in (I-E), at least one of the $E_1$, $E_2$, $E_3$, $E_4$, $E_5$, $E_6$, $E_7$, $E_8$, $E_9$, $E_{10}$, $E_{11}$, and $E_{12}$ represents an attachment to Formula (I), and the remainder of $E_1$, $E_2$, $E_3$, $E_4$, $E_5$, $E_6$, $E_7$, $E_8$, $E_9$, $E_{10}$, $E_{11}$, and $E_{12}$ are each independently selected from the group consisting of: H, D (deutero), F, Cl, alkyl, cycloalkyl, silyl, fluoroalkyl, arylalkyl, aryl, heteroaryl, alkoxy, and fluoroalkoxy;

(I-F)

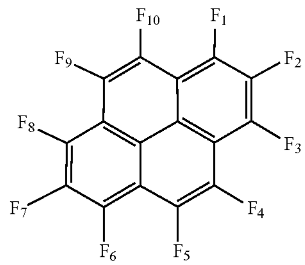

wherein in (I-F), at least one of $F_1$, $F_2$, $F_3$, $F_4$, $F_5$, $F_6$, $F_7$, $F_8$, $F_9$, and $F_{10}$ represents an attachment to Formula (I), and the remainder of $F_1$, $F_2$, $F_3$, $F_4$, $F_5$, $F_6$, $F_7$, $F_8$, $F_9$, and $F_{10}$ are each independently selected from the group consisting of: H, D (deutero), F, Cl, alkyl, cycloalkyl, silyl, fluoroalkyl, arylalkyl, aryl, heteroaryl, alkoxy, and fluoroalkoxy; and (I-G)

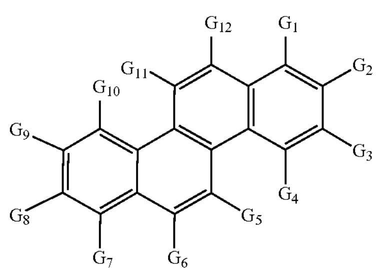

wherein in (I-G), at least one of $G_1$, $G_2$, $G_3$, $G_4$, $G_5$, $G_6$, $G_7$, $G_8$, $G_9$, $G_{10}$, $G_{11}$, and $G_{12}$ represents an attachment to Formula (I), and the remainder of $G_1$, $G_2$, $G_3$, $G_4$, $G_5$, $G_6$, $G_7$, $G_8$, $G_9$, $G_{10}$, $G_{11}$, and $G_{12}$ are each independently selected from the group consisting of: H, D (deutero), F, Cl, alkyl, cycloalkyl, silyl, fluoroalkyl, arylalkyl, aryl, heteroaryl, alkoxy, and fluoroalkoxy.

2. The opto-electronic device of claim 1, wherein at least one of $X_1$, $X_8$, and $X_9$ is selected from the group consisting of: (I-A), (I-B), (I-C), (I-D), (I-E), (I-F), and (I-G) and at least one of $X_4$, $X_5$, and $X_{10}$ is selected from the group consisting of: (I-A), (I-B), (I-C), (I-D), (I-E), (I-F), and (I-G).

3. The opto-electronic device of claim 2, wherein $X_2$, $X_3$, $X_6$, and $X_7$ are each individually selected from the group consisting of: H, D (deutero), F, Cl, $C_1$-$C_6$ alkyl, cycloalkyl, silyl, fluoroalkyl, arylalkyl, aryl, heteroaryl, alkoxy, and fluoroalkoxy.

4. The opto-electronic device of claim 1, wherein at least one of $X_1$, $X_8$, and $X_9$ is selected from the group consisting of: (I-A), (I-B), and (I-C), and at least one of $X_4$, $X_5$, and $X_{10}$ is selected from the group consisting of: (I-A), (I-B), and (I-C).

5. The opto-electronic device of claim 4, wherein $X_2$, $X_3$, $X_6$, and $X_7$ are each individually selected from the group consisting of: H, D (deutero), F, Cl, $C_1$-$C_6$ alkyl, cycloalkyl, silyl, fluoroalkyl, arylalkyl, aryl, heteroaryl, alkoxy, and fluoroalkoxy.

6. The opto-electronic device of claim 1, wherein at least one of $X_1$, $X_8$, and $X_9$ is (I-A), and at least one of $X_4$, $X_5$, and $X_{10}$ is selected from the group consisting (I-B) and (I-C).

7. The opto-electronic device of claim 1, wherein at least one of $X_1$, $X_8$, and $X_9$ is (I-A), and at least one of $X_4$, $X_5$, and $X_{10}$ is (I-B).

8. The opto-electronic device of claim 1, wherein at least one of $X_1$, $X_8$, and $X_9$ is (I-A), and at least one of $X_4$, $X_5$, and $X_{10}$ is (I-C).

9. The opto-electronic device of claim 6, wherein at least one of $A_1$, $A_2$, $A_3$, $A_4$, and $A_5$ is t-butyl, methoxy, trifluoromethoxy, methyl, trifluoromethyl, or F.

10. The opto-electronic device of claim 6, wherein up to three of the $A_1$, $A_2$, $A_3$, $A_4$, and $A_5$ are F.

11. The opto-electronic device of claim 6, wherein $B_1$, $B_2$, $B_3$, $B_4$, $B_5$, $B_6$, $B_7$, $C_1$, $C_2$, $C_3$, $C_4$, $C_5$, $C_6$, and $C_7$ are H.

12. The opto-electronic device of claim 1, wherein $X_9$ is (I-A), and $X_{10}$ is selected from the group consisting of: (I-D), (I-E), (I-F), and (I-G).

13. The opto-electronic device of claim 1, wherein the NIC has a thickness of about 5 nm to about 100 nm.

14. The opto-electronic device of claim 1, wherein the NIC comprises a compound selected from the group consisting of:

SF1

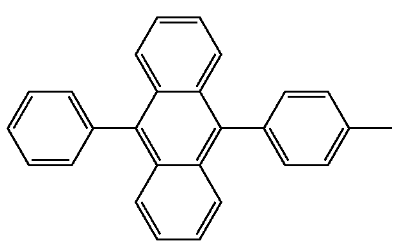

SF4

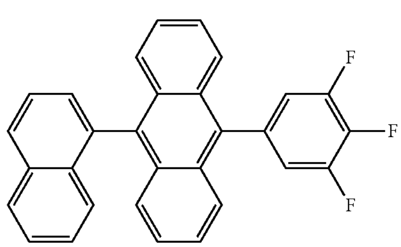

-continued

SF5

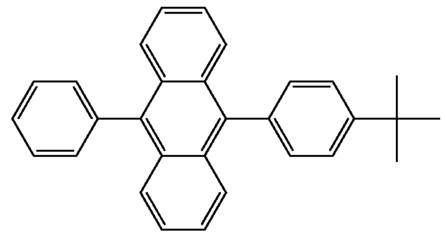

SF7

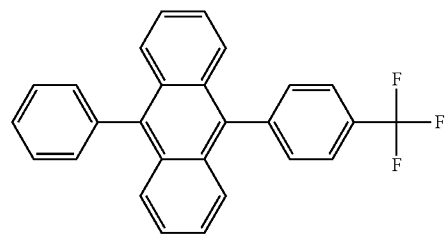

SF8

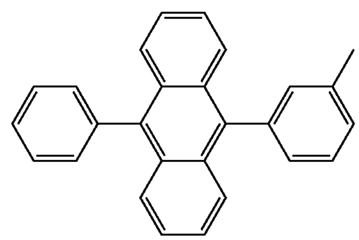

SF9

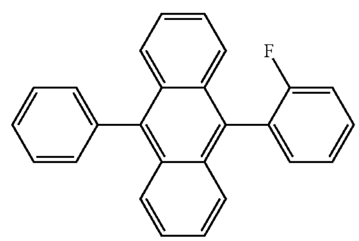

SF10

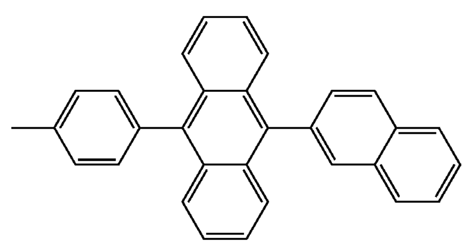

SF11

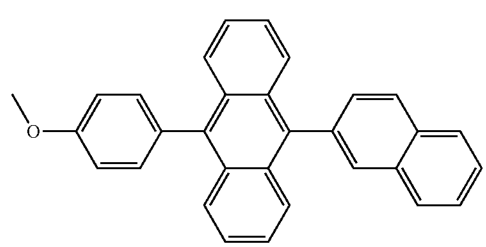

-continued
SF12
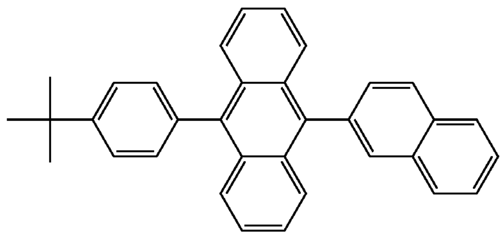
SF13
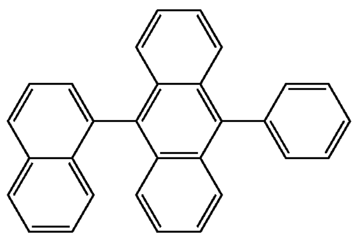
SF16
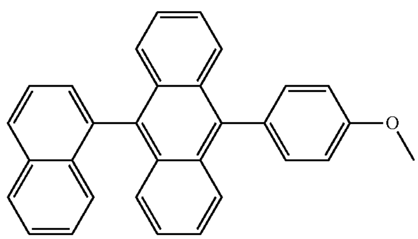
SF19
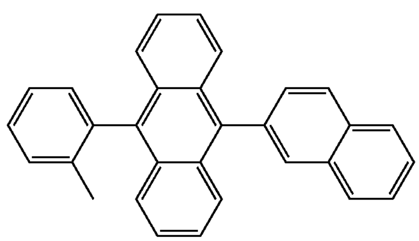
SF20
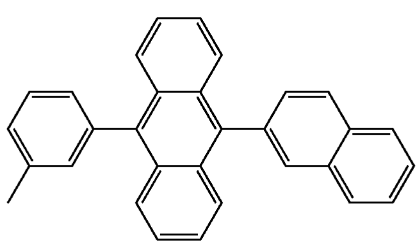
SF21
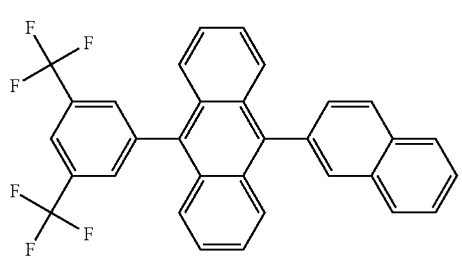
-continued
SF24
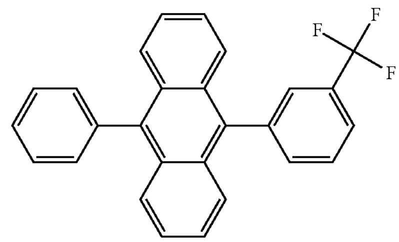
SF170
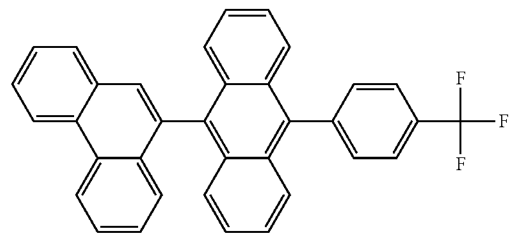
SF173
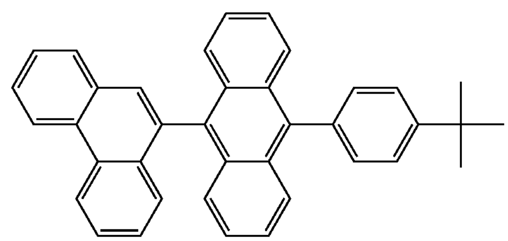
SF316
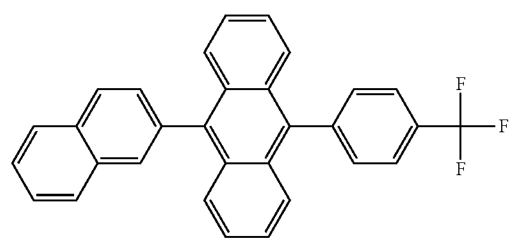
SF317
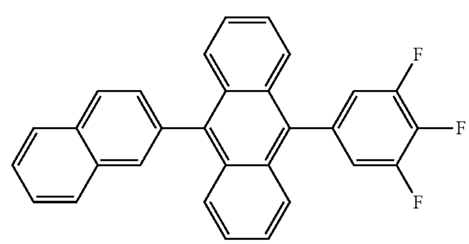
SF319
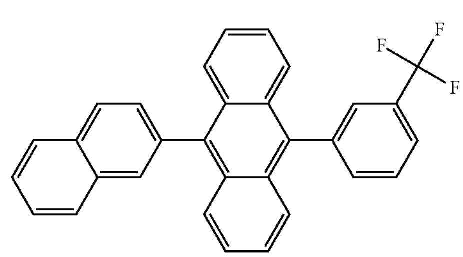

-continued

SF25

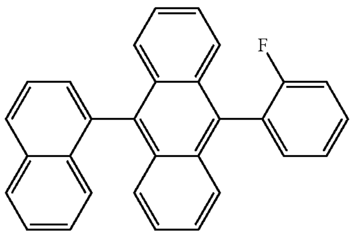

SF357

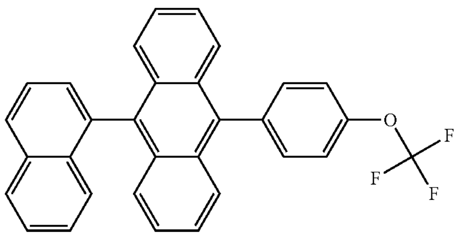

SF358

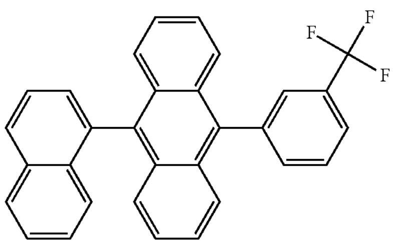

SF359

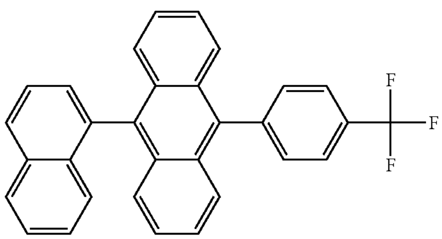

SF360

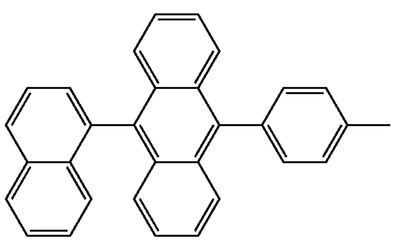

and

SF361

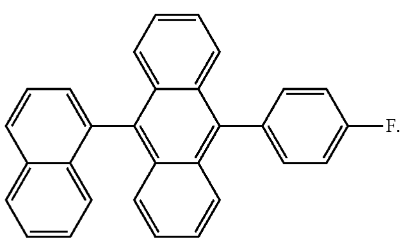

15. The opto-electronic device of claim 1, wherein the first portion comprises at least one emissive region.

16. The opto-electronic device of claim 1, wherein the second portion comprises at least a part of a non-emissive region.

17. The opto-electronic device of claim 1, further comprising a first electrode, a second electrode and a semiconducting layer between the first electrode and the second electrode, wherein the second electrode extends between the NIC and the semiconducting layer in the first portion.

18. The opto-electronic device of claim 17, wherein the conductive coating is electrically coupled to the second electrode.

19. The opto-electronic device of claim 15, wherein at least a first part of the first portion overlaps at least a second part of the second portion.

20. The opto-electronic device of claim 19, wherein the NIC is disposed on the surface of the device in the second part and the conductive coating is disposed over the NIC therein.

21. The opto-electronic device of claim 20, wherein the conductive coating is spaced apart from the NIC in a cross-sectional aspect.

22. The opto-electronic device of claim 19, wherein the conductive coating is electrically coupled to an auxiliary electrode.

23. The opto-electronic device of claim 19, wherein the second portion comprises at least one additional emissive region.

24. The opto-electronic device of claim 23, wherein at least one of the additional emissive regions of the second portion of the device comprises a first electrode, a second electrode and a semiconducting layer between the first electrode and the second electrode, wherein the second electrode comprises the conductive coating.

25. The opto-electronic device of claim 23, wherein a wavelength of light emitted from the at least one additional emissive region of the second portion of the device differs from a wavelength of light emitted from the at least one emissive region of the first portion of the device.

26. The opto-electronic device of claim 15, wherein the conductive coating comprises an auxiliary electrode.

27. The opto-electronic device of claim 1, wherein the second portion comprises at least one emissive region.

28. The opto-electronic device of claim 27, wherein the first portion comprises at least a part of a non-emissive region.

29. The opto-electronic device of claim 27, wherein the first portion is substantially light-transmissive therethrough.

30. The opto-electronic device of claim 27, further comprising a first electrode, a second electrode and a semiconducting layer between the first electrode and the second electrode, wherein the second electrode extends between the NIC and the semiconducting layer in the first portion.

31. The opto-electronic device of claim 30, wherein the second electrode extends between the conductive coating and the semiconducting layer in the second portion.

32. The opto-electronic device of claim 27, further comprising a first electrode, a semiconducting layer between the first electrode and the conductive coating, wherein the conductive coating comprises a second electrode of the device.

* * * * *